US011900993B2

(12) United States Patent
Shuto

(10) Patent No.: US 11,900,993 B2
(45) Date of Patent: Feb. 13, 2024

(54) SEMICONDUCTOR CIRCUIT AND SEMICONDUCTOR CIRCUIT SYSTEM

(71) Applicant: SONY SEMICONDUCTOR SOLUTIONS CORPORATION, Kanagawa (JP)

(72) Inventor: Yusuke Shuto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 99 days.

(21) Appl. No.: 17/637,312

(22) PCT Filed: Aug. 13, 2020

(86) PCT No.: PCT/JP2020/030757
§ 371 (c)(1),
(2) Date: Feb. 22, 2022

(87) PCT Pub. No.: WO2021/044822
PCT Pub. Date: Mar. 11, 2021

(65) Prior Publication Data
US 2022/0277788 A1 Sep. 1, 2022

(30) Foreign Application Priority Data
Sep. 3, 2019 (JP) .................. 2019-160528

(51) Int. Cl.
*G11C 11/413* (2006.01)
*G11C 11/412* (2006.01)
(Continued)

(52) U.S. Cl.
CPC .......... *G11C 11/413* (2013.01); *G11C 11/412* (2013.01); *G11C 11/1697* (2013.01); *H03K 3/037* (2013.01)

(58) Field of Classification Search
CPC . G11C 11/413; G11C 11/412; G11C 11/1697; G11C 11/1675; G11C 11/18;
(Continued)

(56) References Cited

U.S. PATENT DOCUMENTS 6,914,845 B2 * 7/2005 Ooishi ............... G11C 14/0081
365/229
11,450,369 B2 * 9/2022 Kanda ................ G11C 14/0081
(Continued)

FOREIGN PATENT DOCUMENTS

CN 105917582 A 8/2016
CN 109906483 A 6/2019
(Continued)

OTHER PUBLICATIONS

International Search Report and Written Opinion of PCT Application No. PCT/JP2020/030757, dated Sep. 24, 2020, 09 pages of ISRWO.

*Primary Examiner* — Joshua L Schwartz
(74) *Attorney, Agent, or Firm* — CHIP LAW GROUP

(57) ABSTRACT

A semiconductor circuit according to the present disclosure includes: a first circuit configured to apply an inverted voltage of a voltage at a first node to a second node; a second circuit configured to apply an inverted voltage of a voltage at a second node to the first node; a first storage element including first, second, and third terminals; a first transistor including a drain coupled to the first node and a source coupled to the first terminal of the first storage element; a second transistor including a gate coupled to the first node or the second node and a drain coupled to the second terminal of the first storage element; and a third transistor including a gate coupled to the first node or the second node and a drain coupled to the second terminal of the first storage element. The first storage element is configured to set a resistance state between the first terminal and the second and
(Continued)

third terminals in accordance with a direction of a current flowing between the second and third terminals.

39 Claims, 66 Drawing Sheets

(51) Int. Cl.
 *G11C 11/16* (2006.01)
 *H03K 3/037* (2006.01)

(58) Field of Classification Search
 CPC .... G11C 14/0081; G11C 14/00; H03K 3/037; H03K 3/356; H03K 19/18; Y02D 10/00; H01L 27/105; H01L 29/82; H10B 10/00; H10B 99/00
 See application file for complete search history.

(56) References Cited

U.S. PATENT DOCUMENTS

| | | | |
|---|---|---|---|
| 2003/0223283 A1* | 12/2003 | Kunikiyo | G11C 11/16 365/200 |
| 2007/0195616 A1* | 8/2007 | Fallah | G11C 29/026 365/194 |
| 2019/0333574 A1 | 10/2019 | Shuto et al. | |

FOREIGN PATENT DOCUMENTS

| | | |
|---|---|---|
| JP | 2017-510016 A | 4/2017 |
| JP | 2018-107626 A | 7/2018 |
| KR | 10-2019-0084038 A | 7/2019 |
| WO | 2009/028298 A1 | 3/2009 |
| WO | 2015/116416 A1 | 8/2015 |
| WO | 2018/088297 A1 | 5/2018 |

* cited by examiner

[FIG. 1]
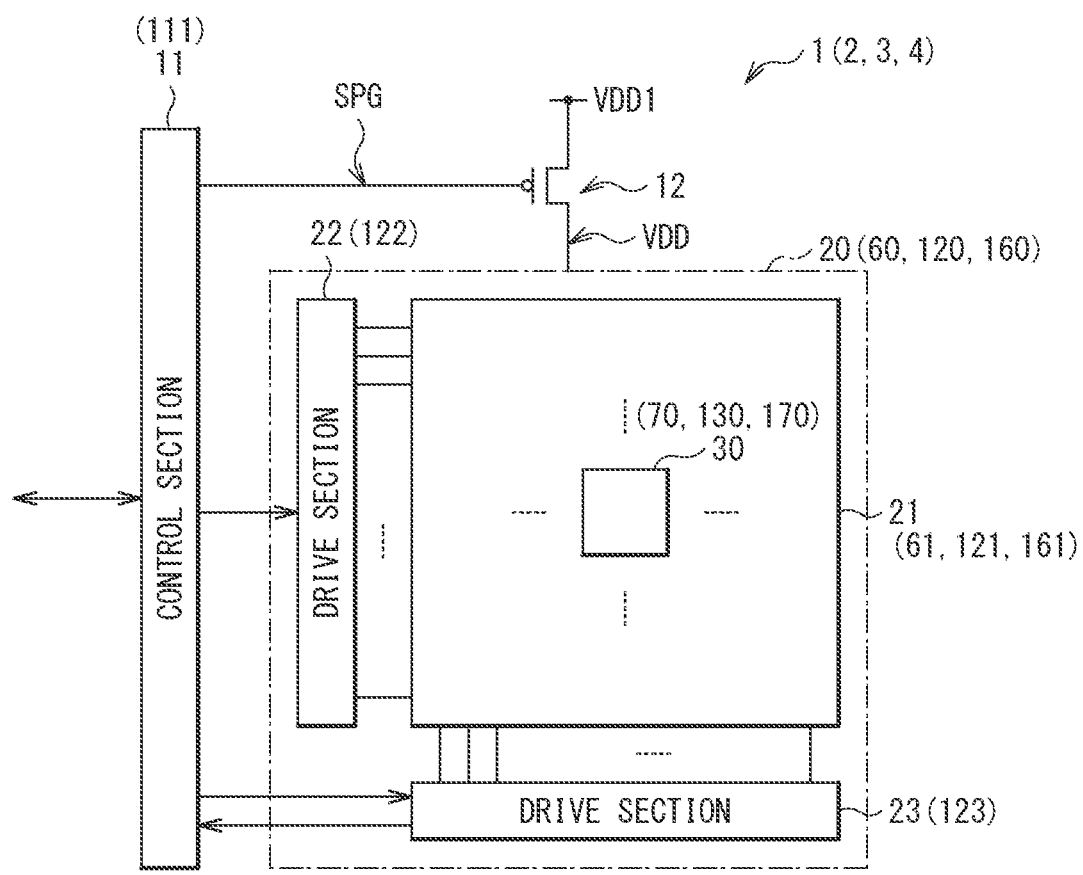

[FIG. 2]
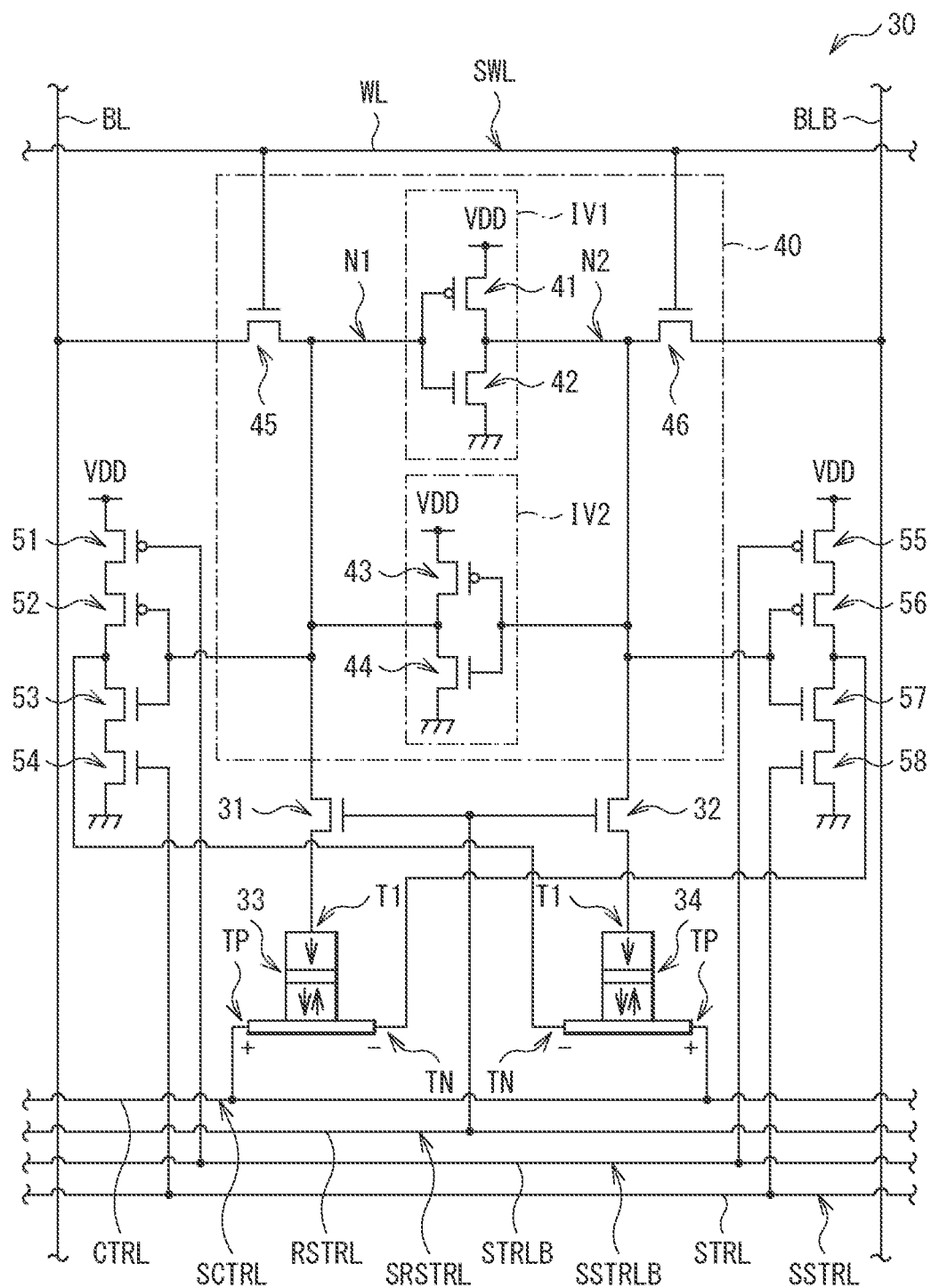

[FIG. 3]
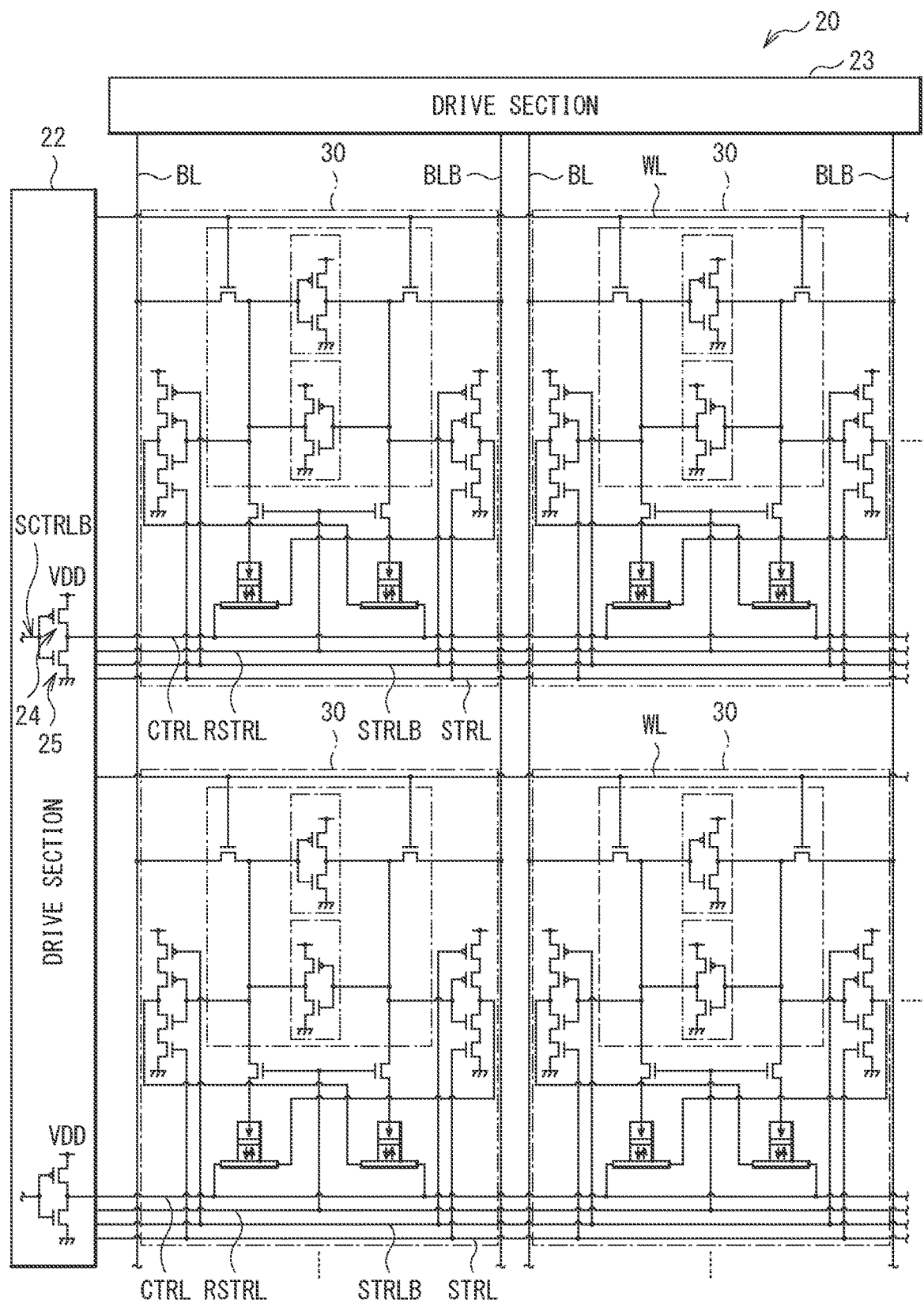

[FIG. 4]
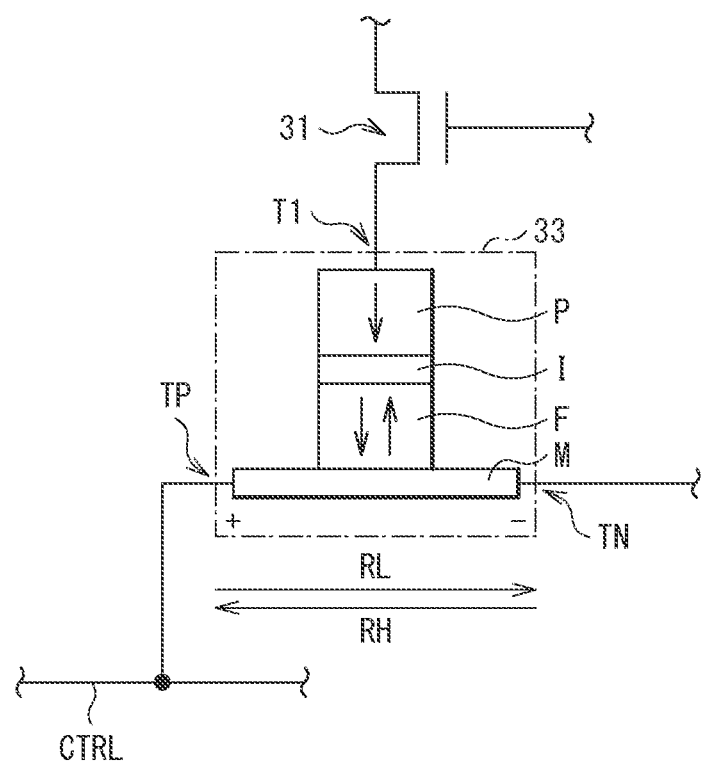

[ FIG. 5 ]
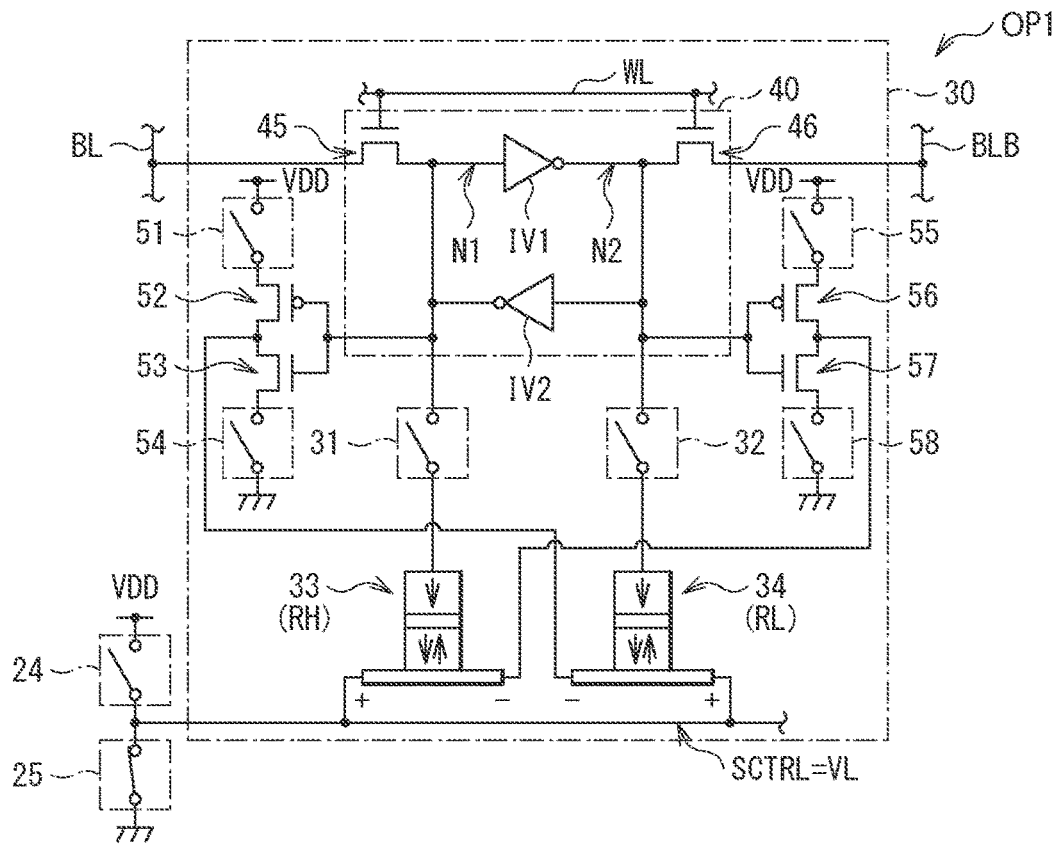
[ FIG. 6A ]

[ FIG. 6B ]
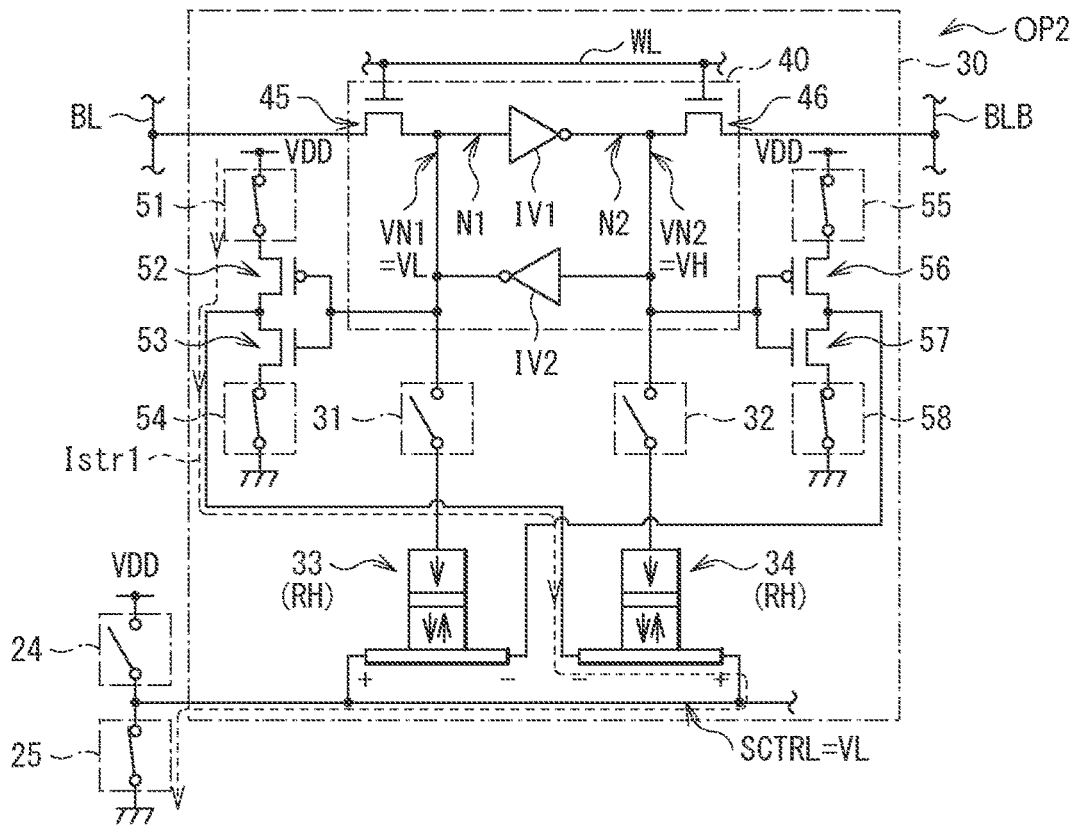
[ FIG. 6C ]
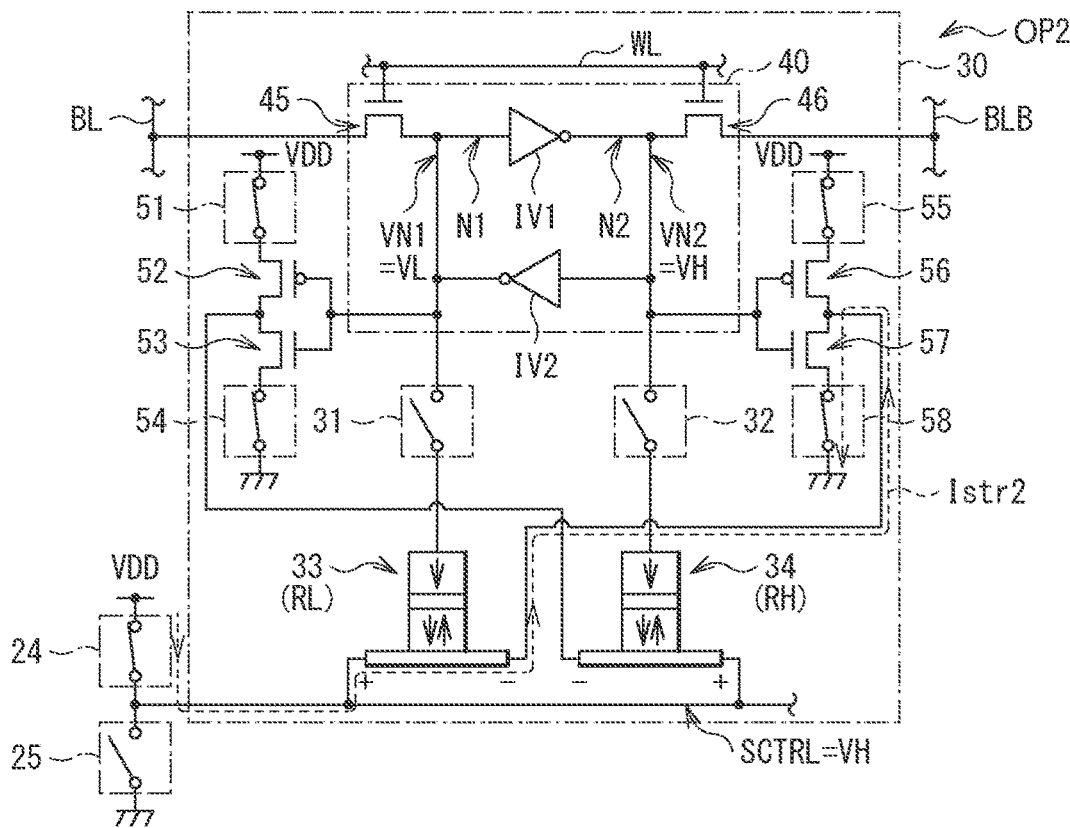

[ FIG. 6D ]
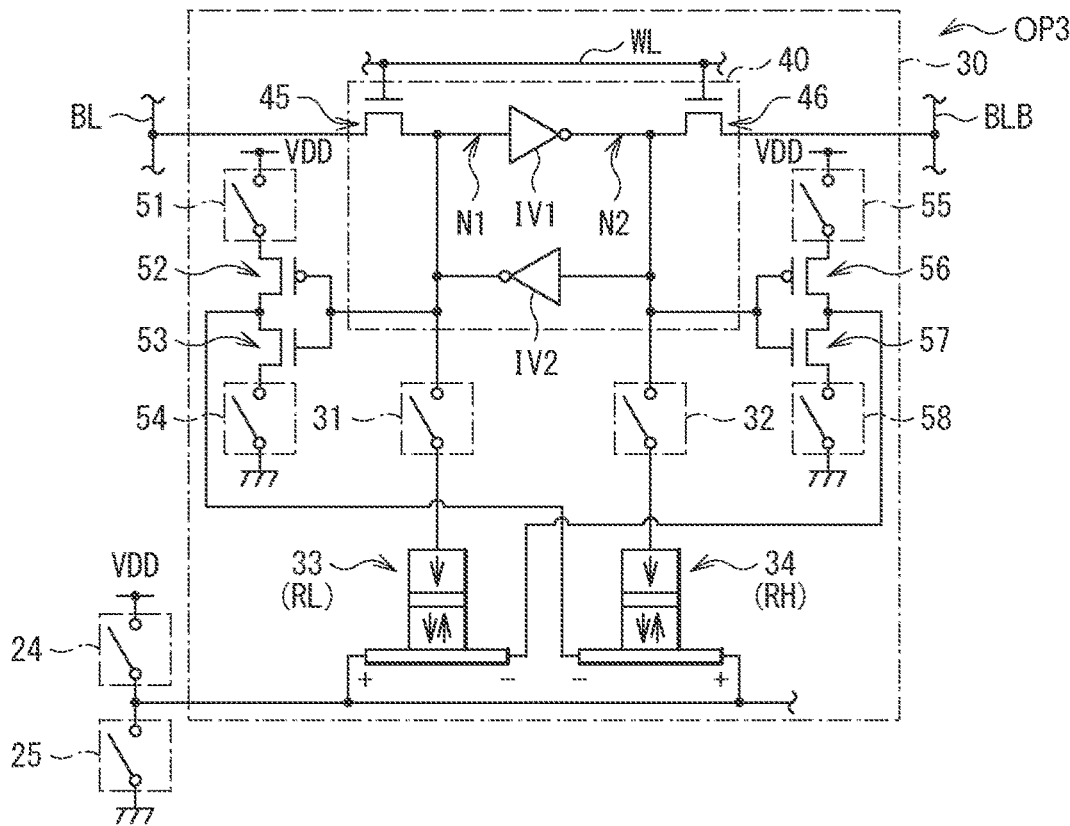
[ FIG. 6E ]
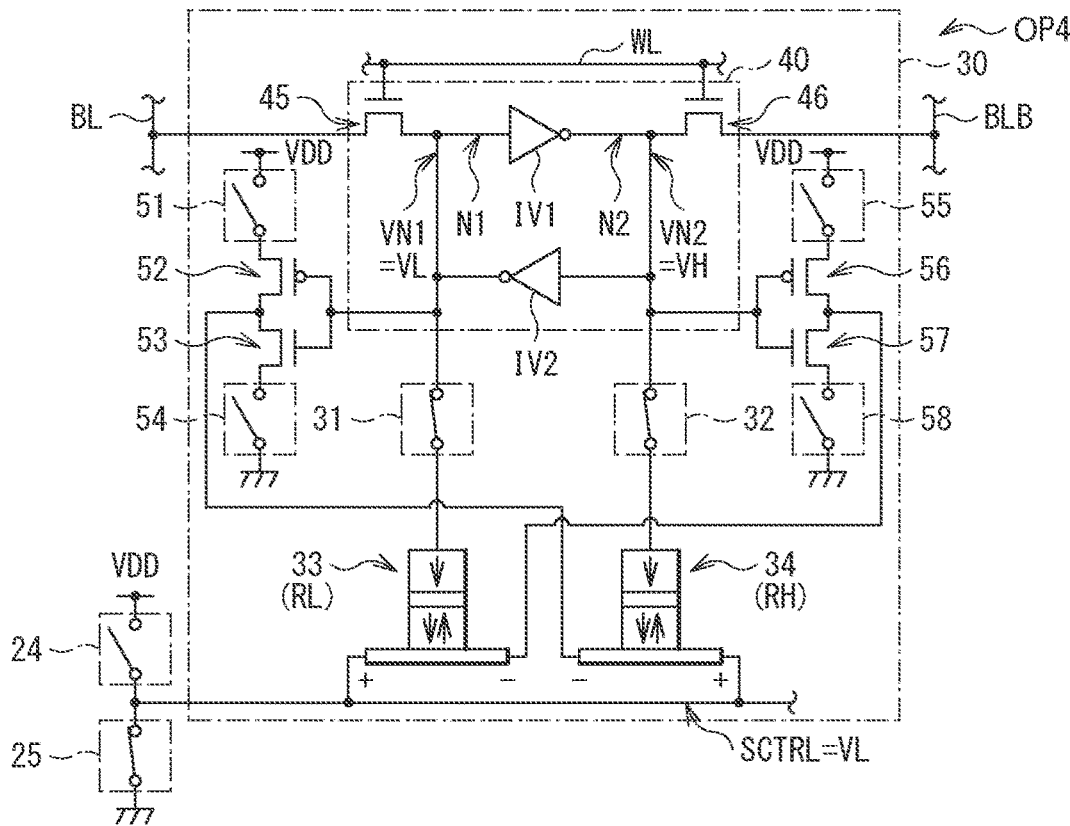

[ FIG. 7A ]
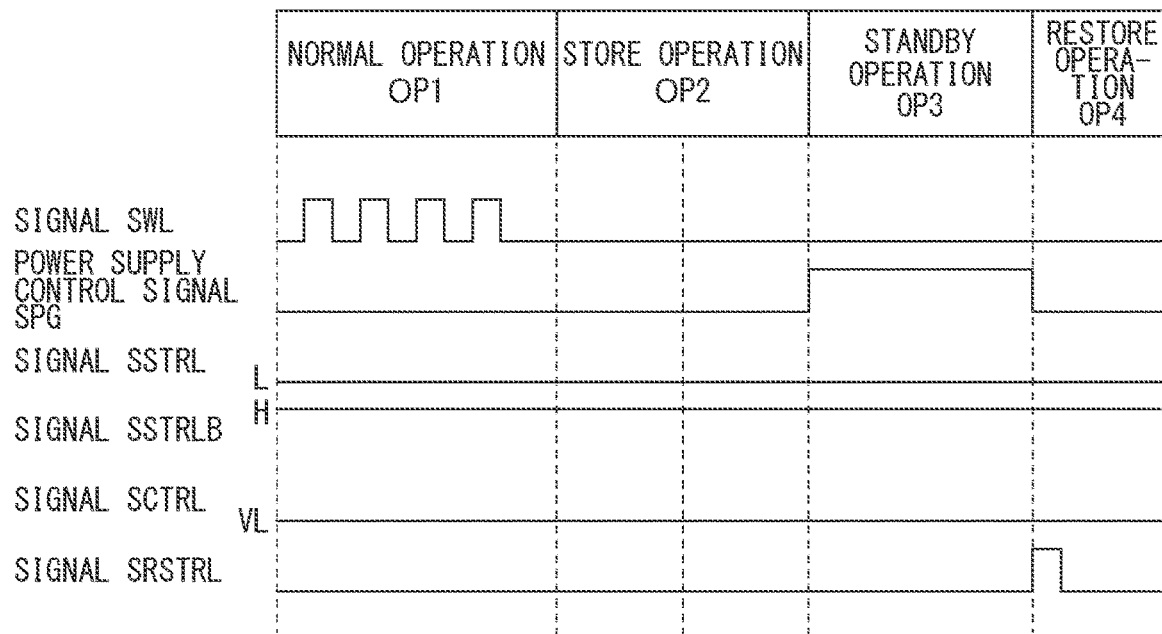
[ FIG. 7B ]
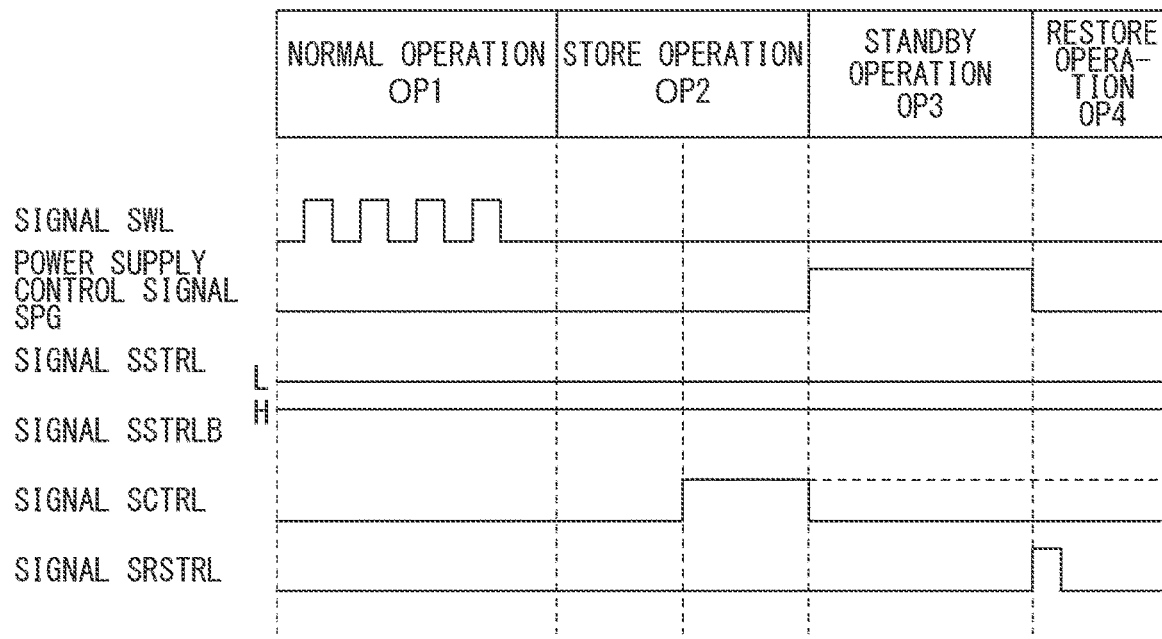

[FIG. 8]
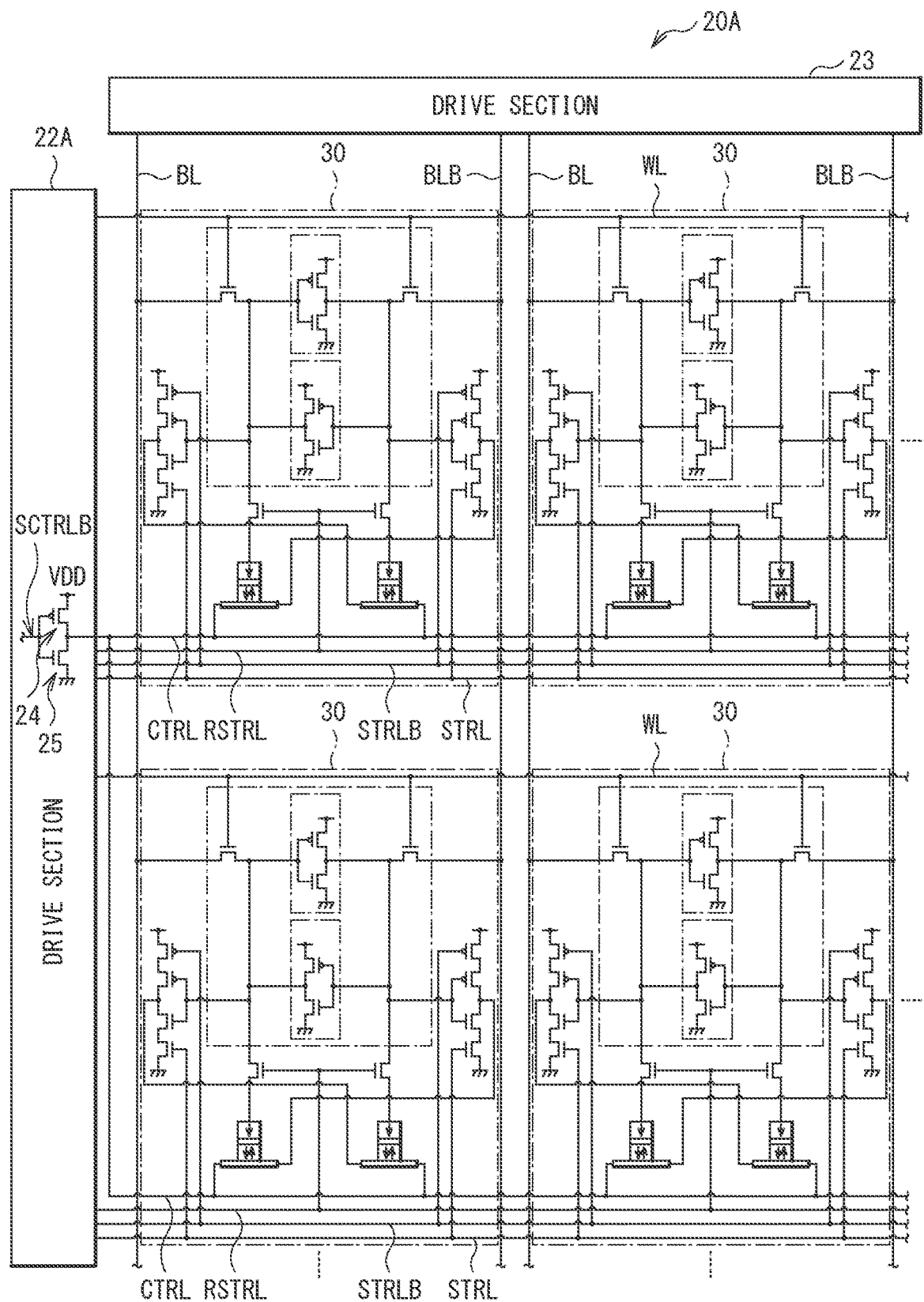

[FIG. 9]
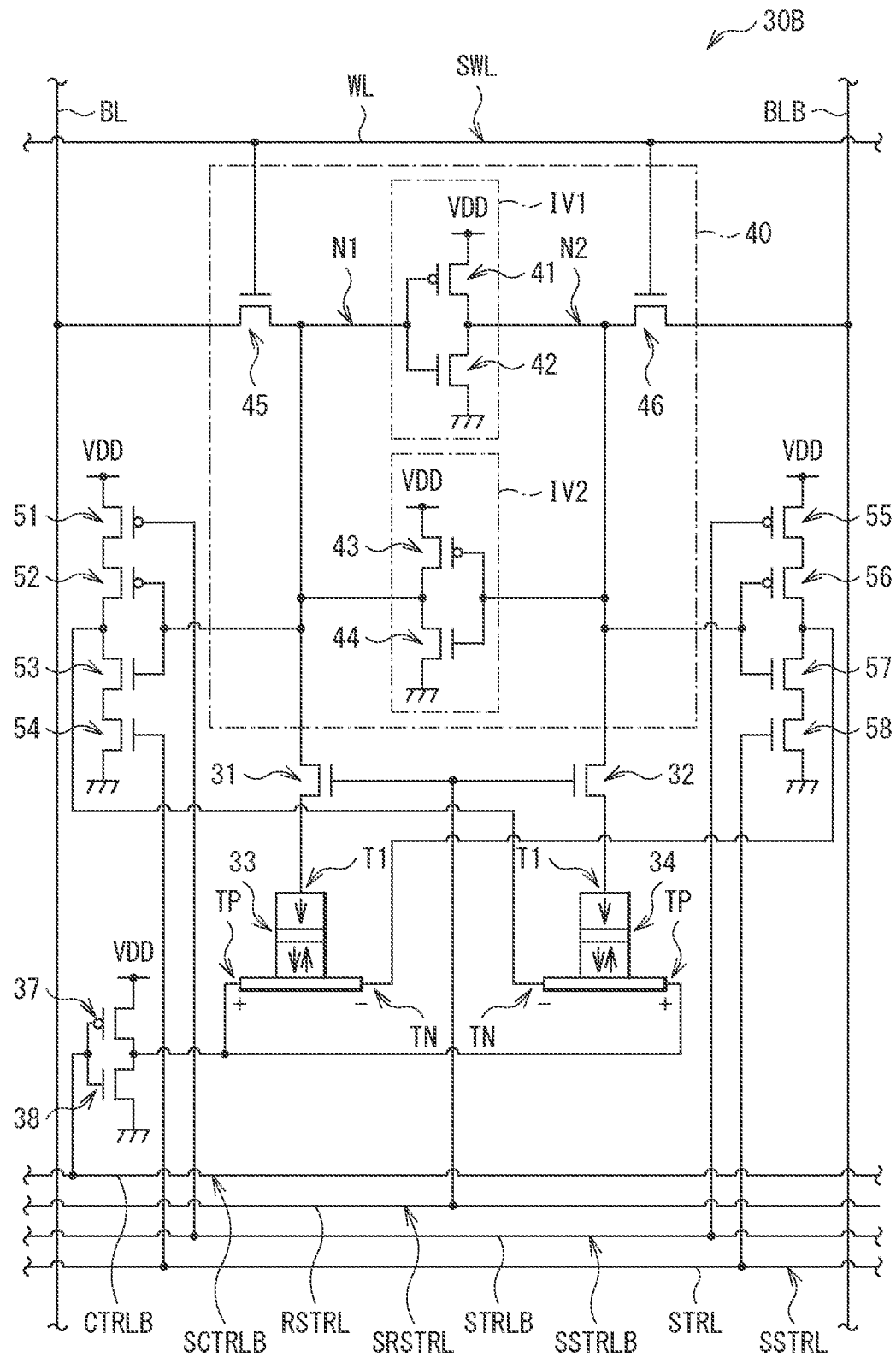

[ FIG. 10 ]
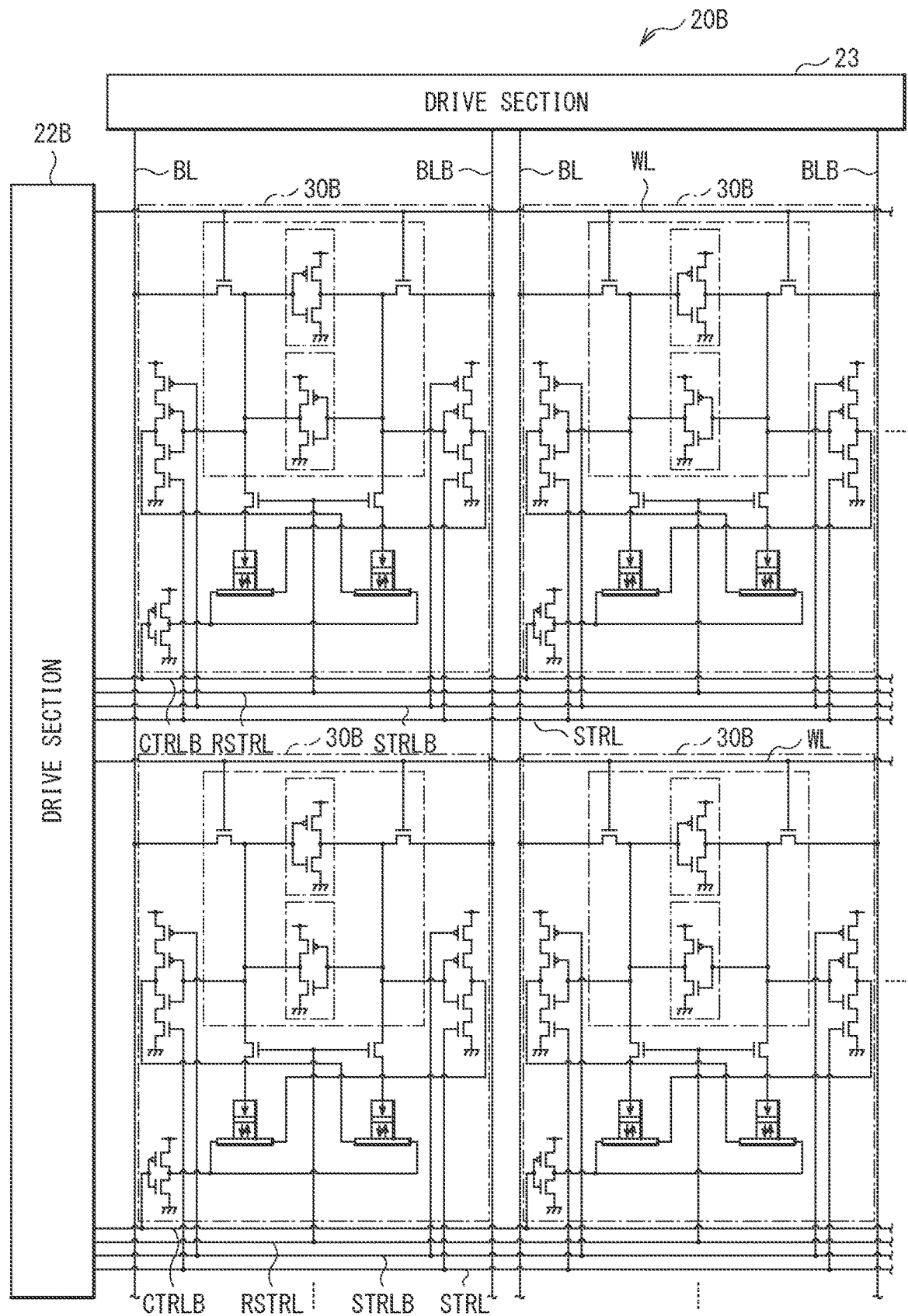

[FIG. 11]
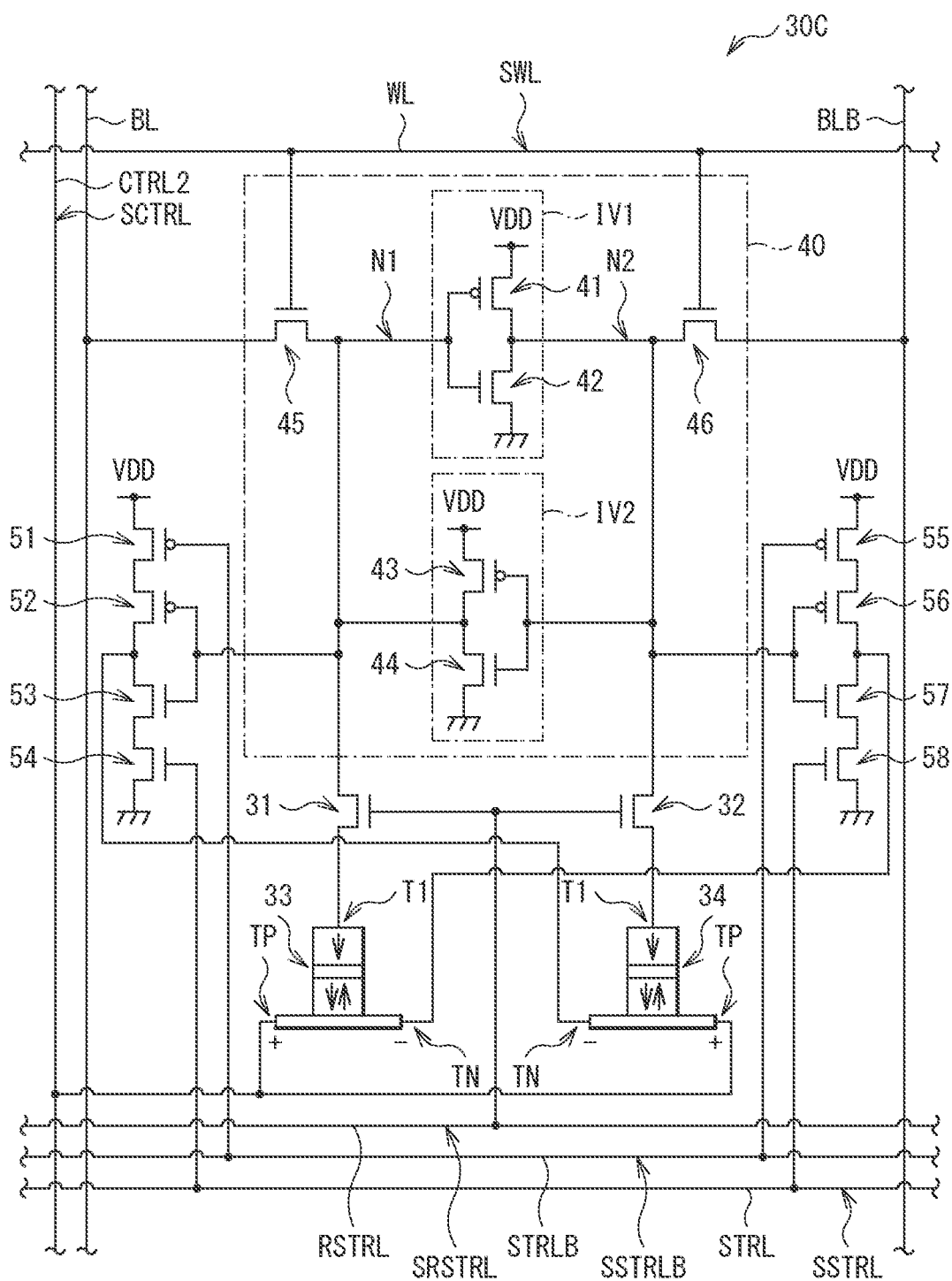

[FIG. 12]
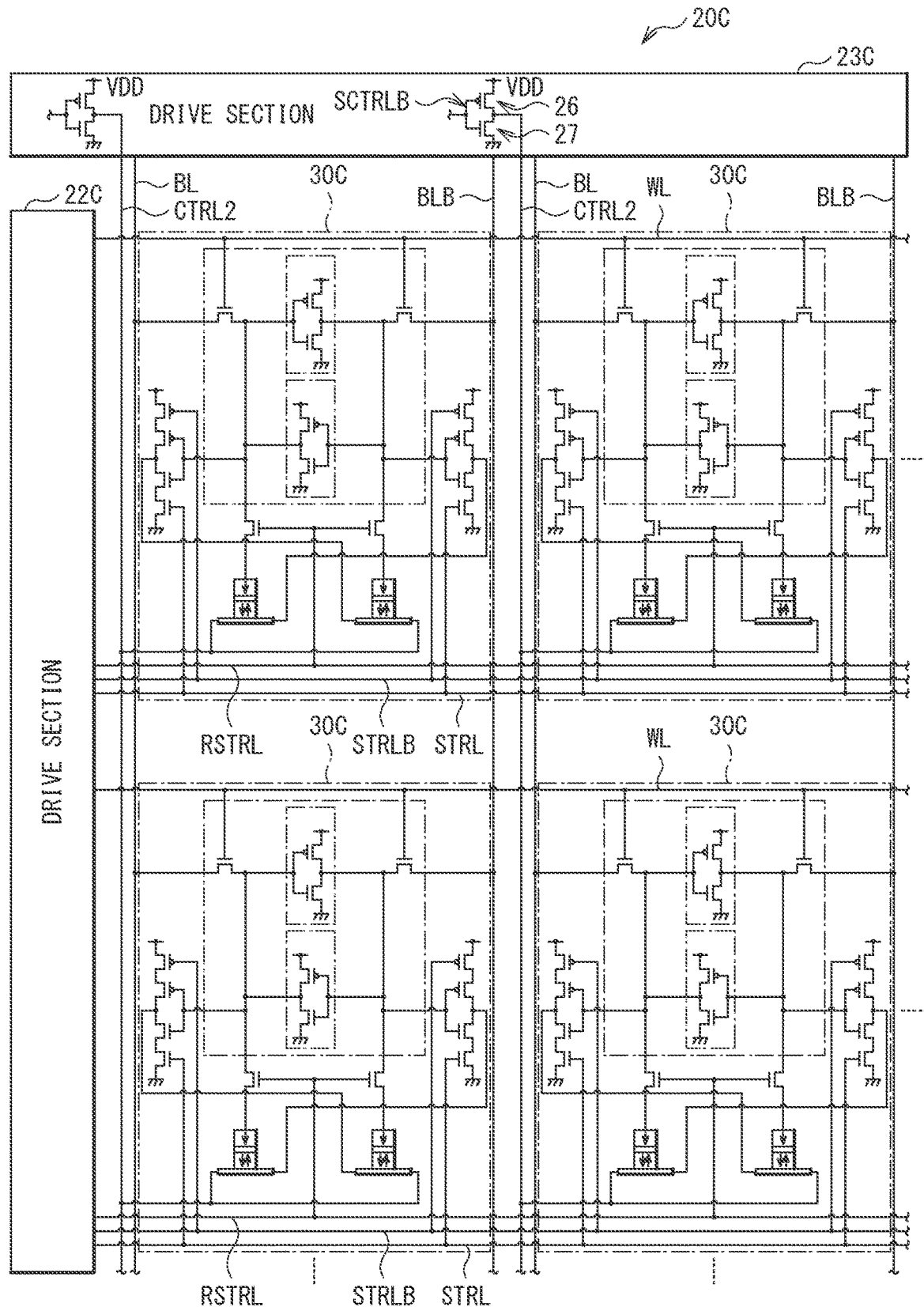

[FIG. 13]
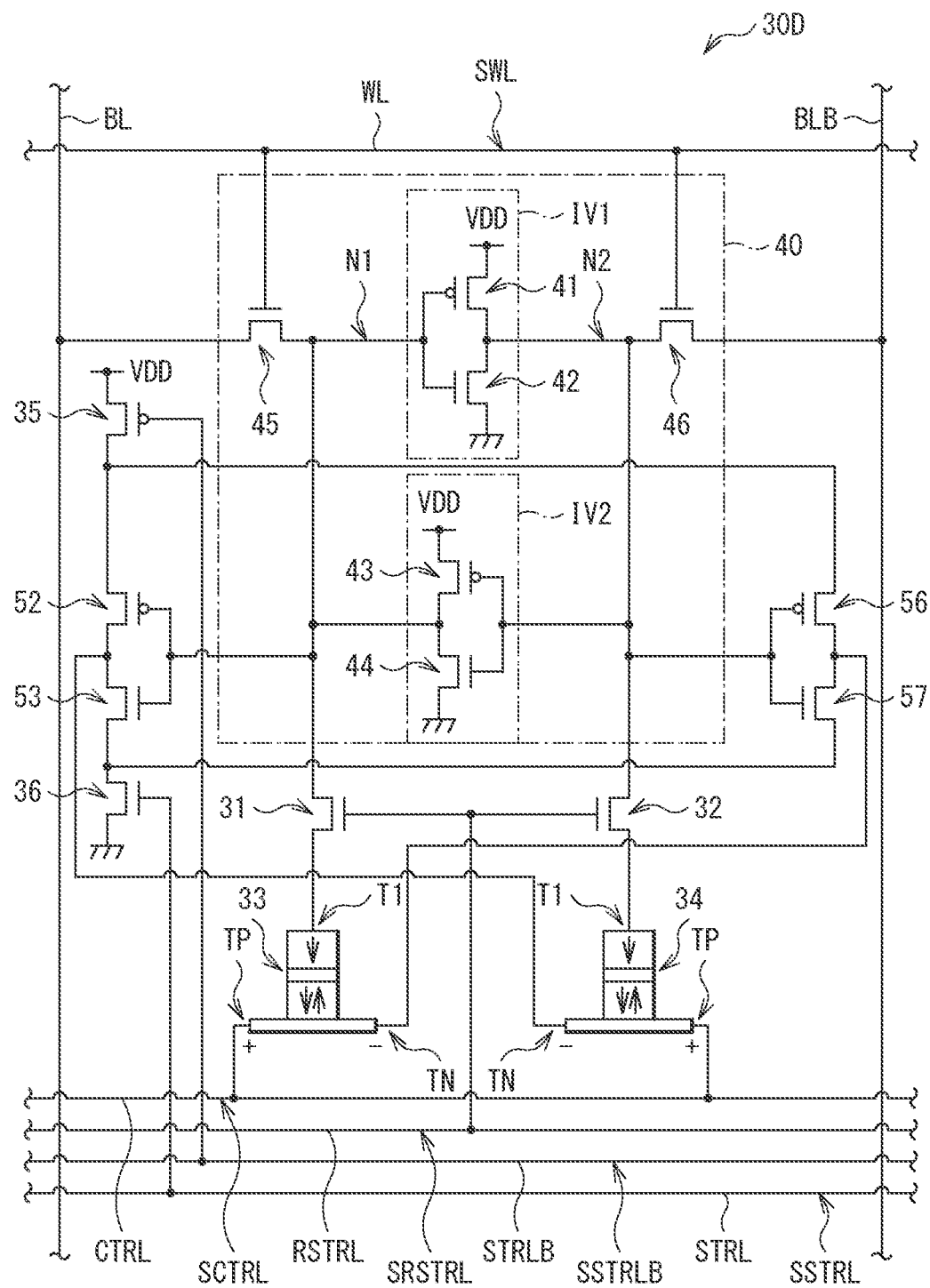

[FIG. 14]
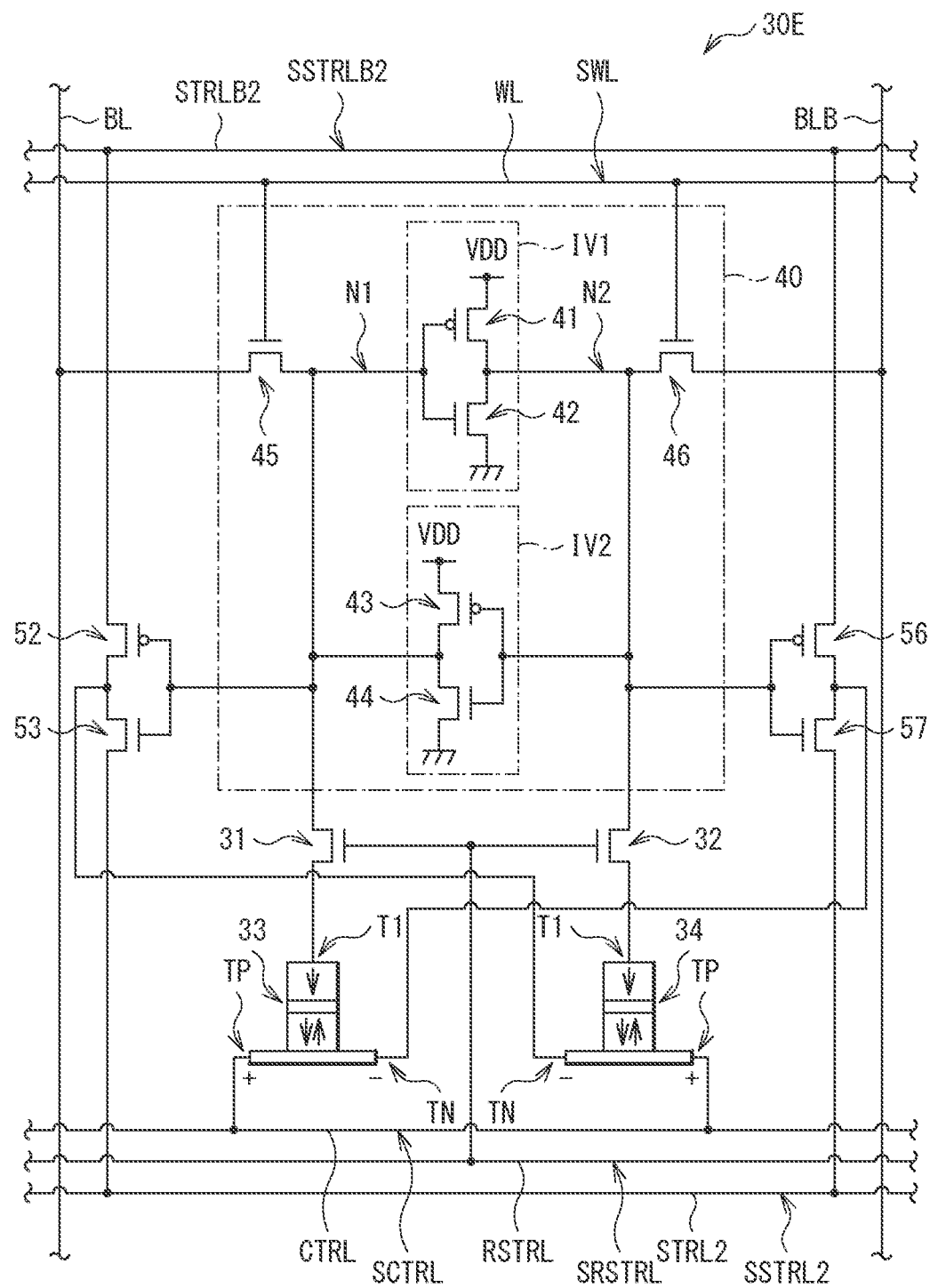

[FIG.15]
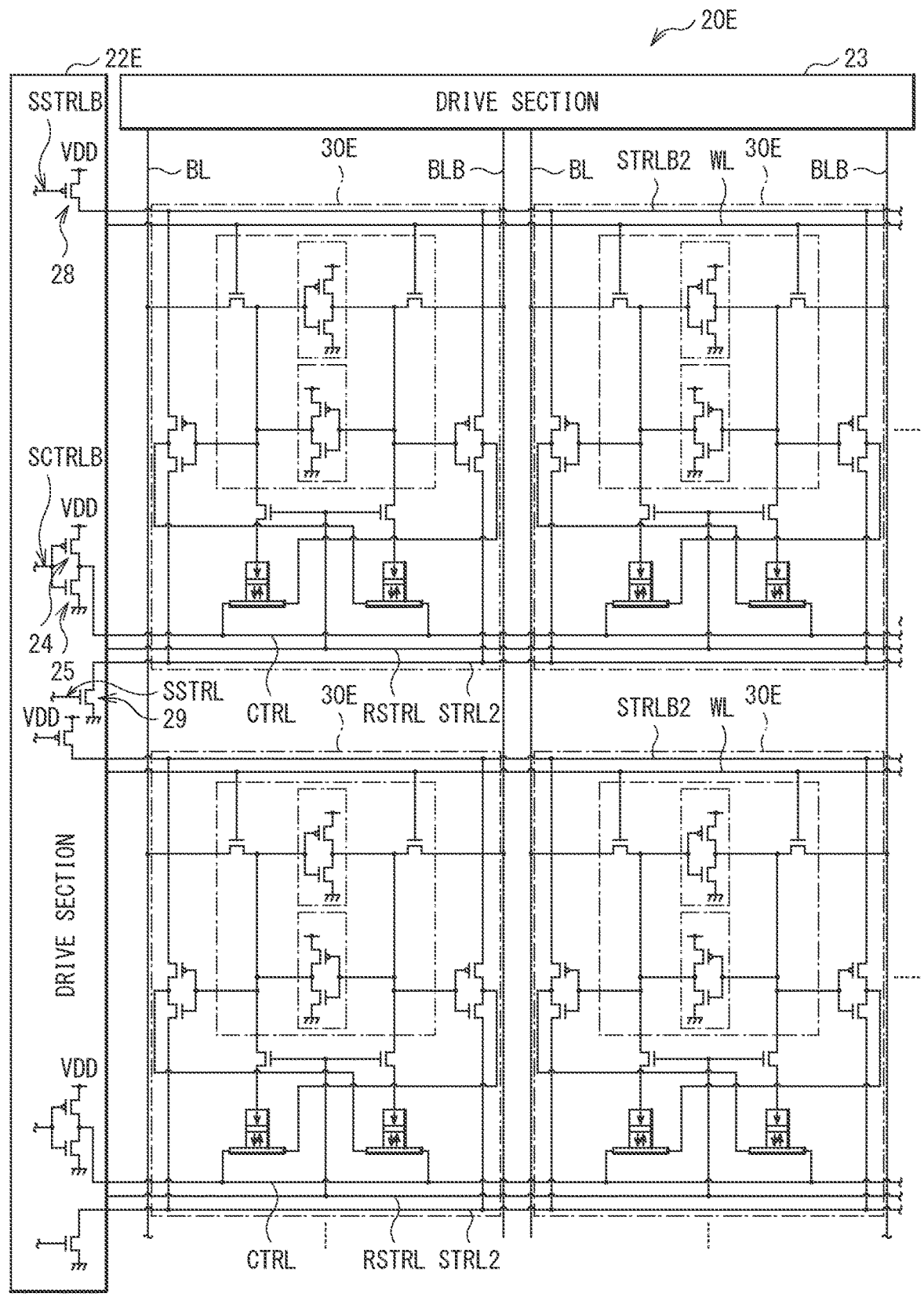

[FIG. 16]
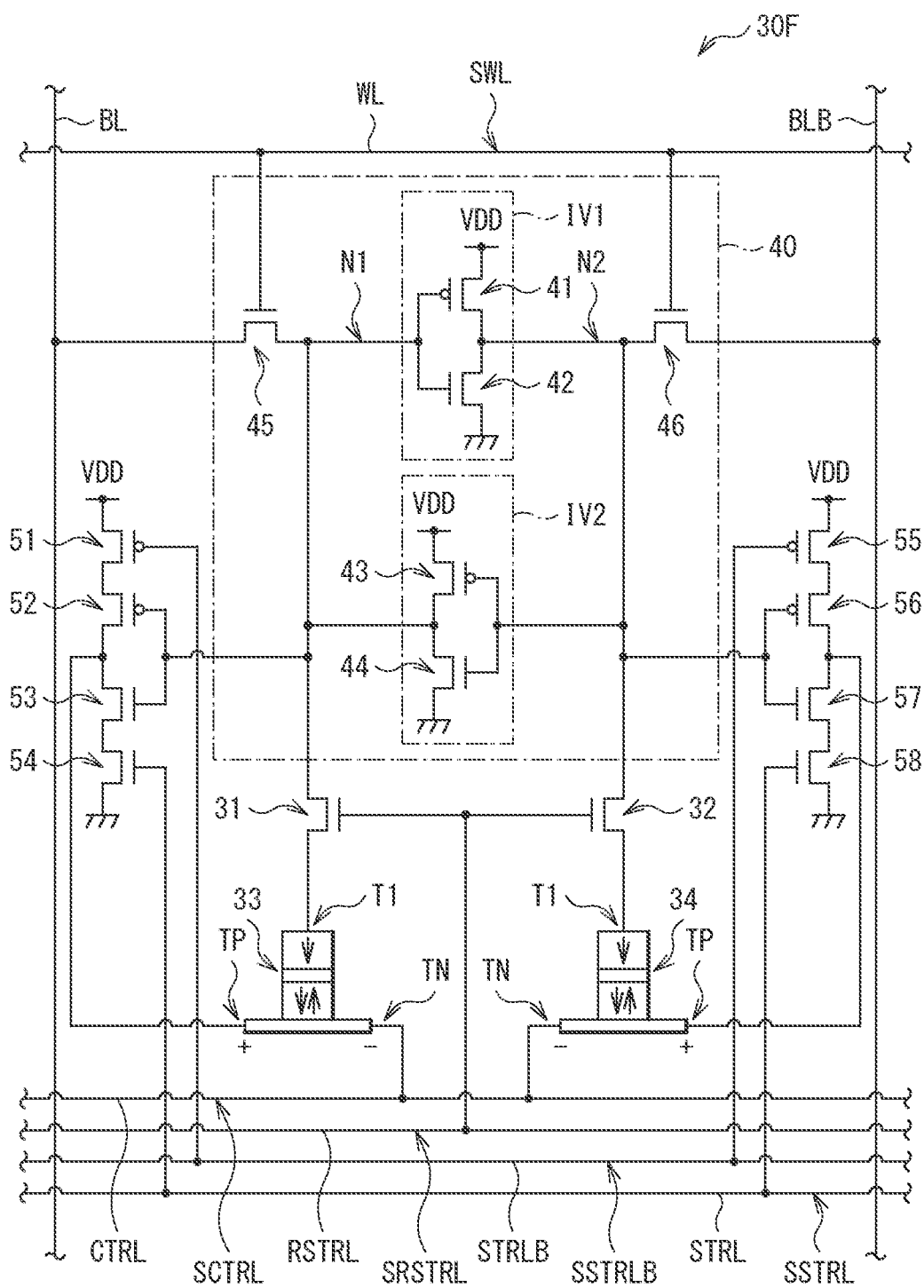

[FIG. 17A]
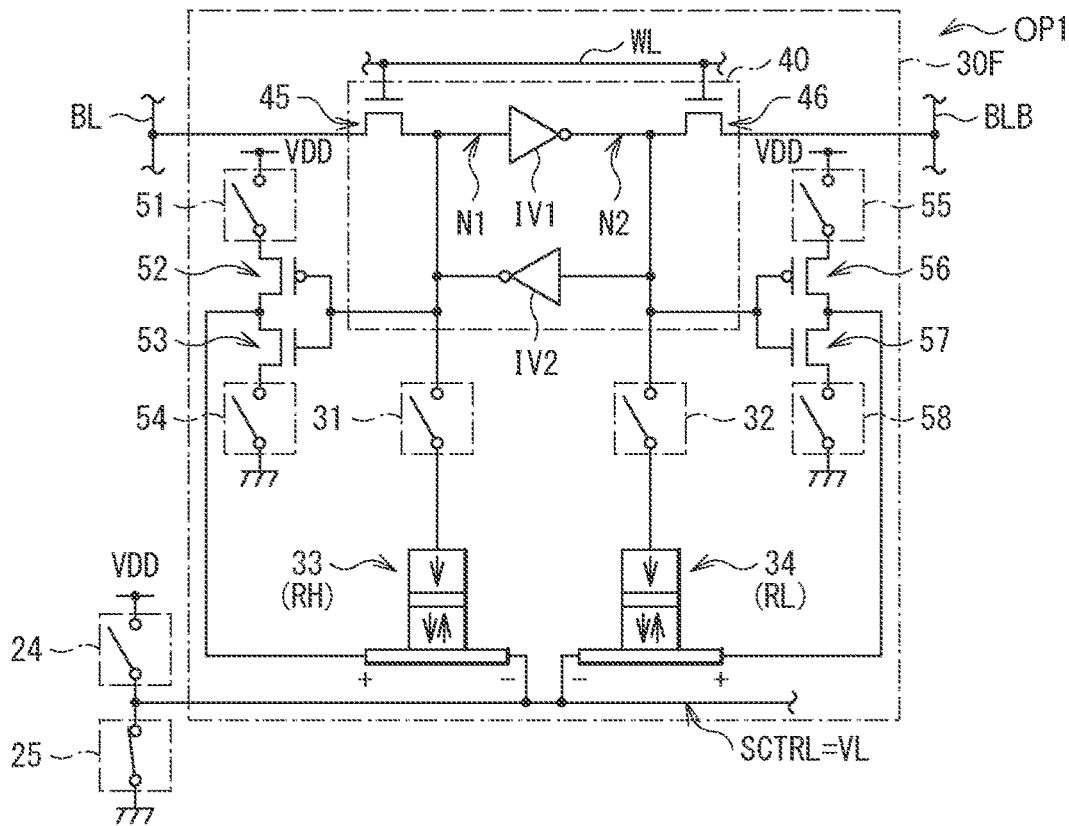
[FIG. 17B]
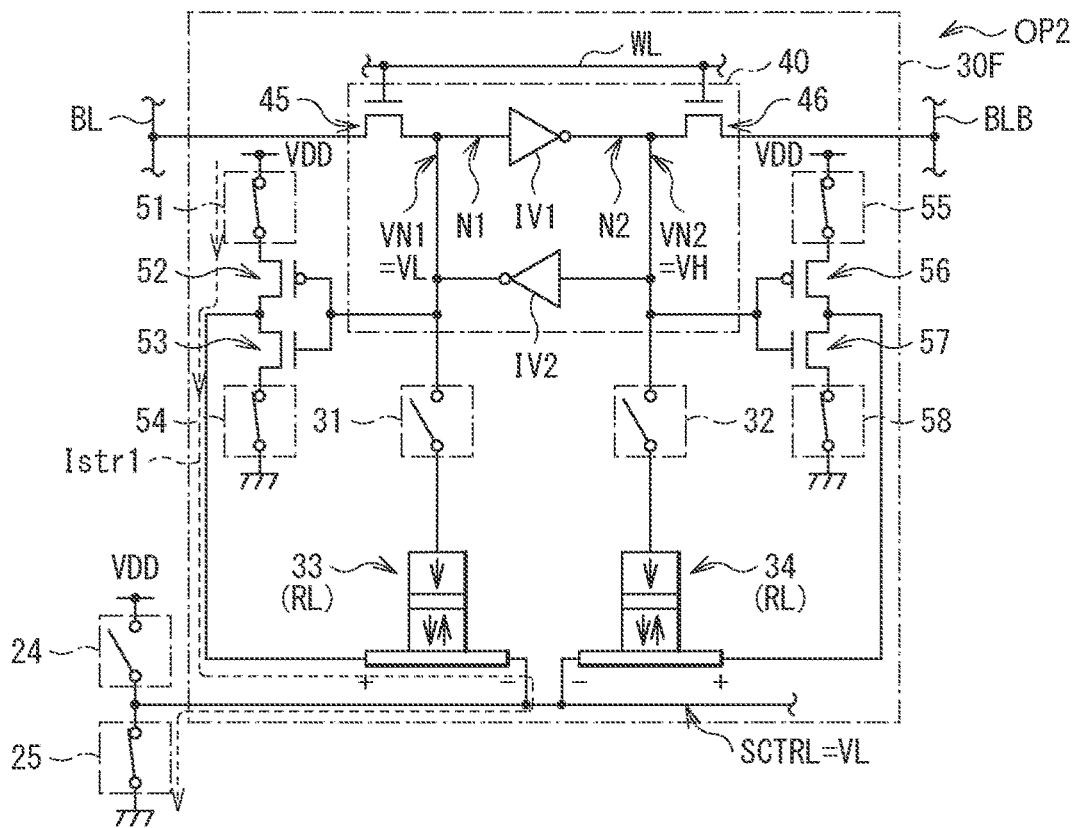

[ FIG. 17C ]
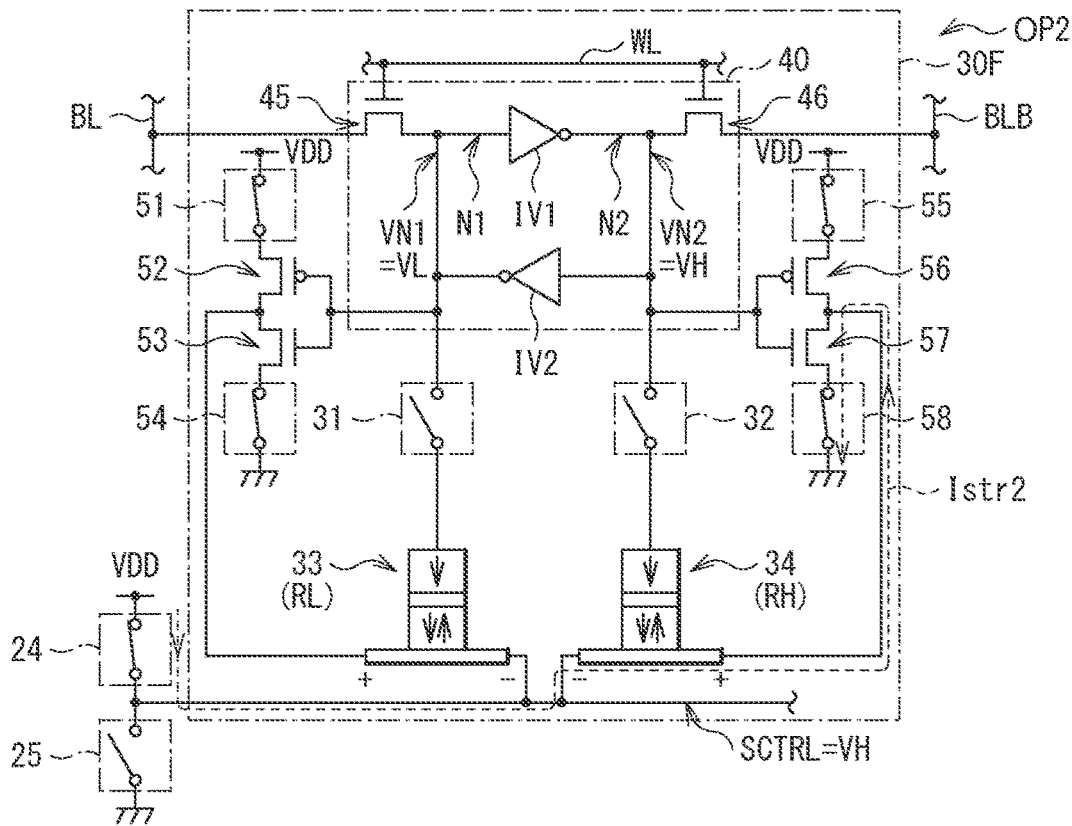
[ FIG. 17D ]
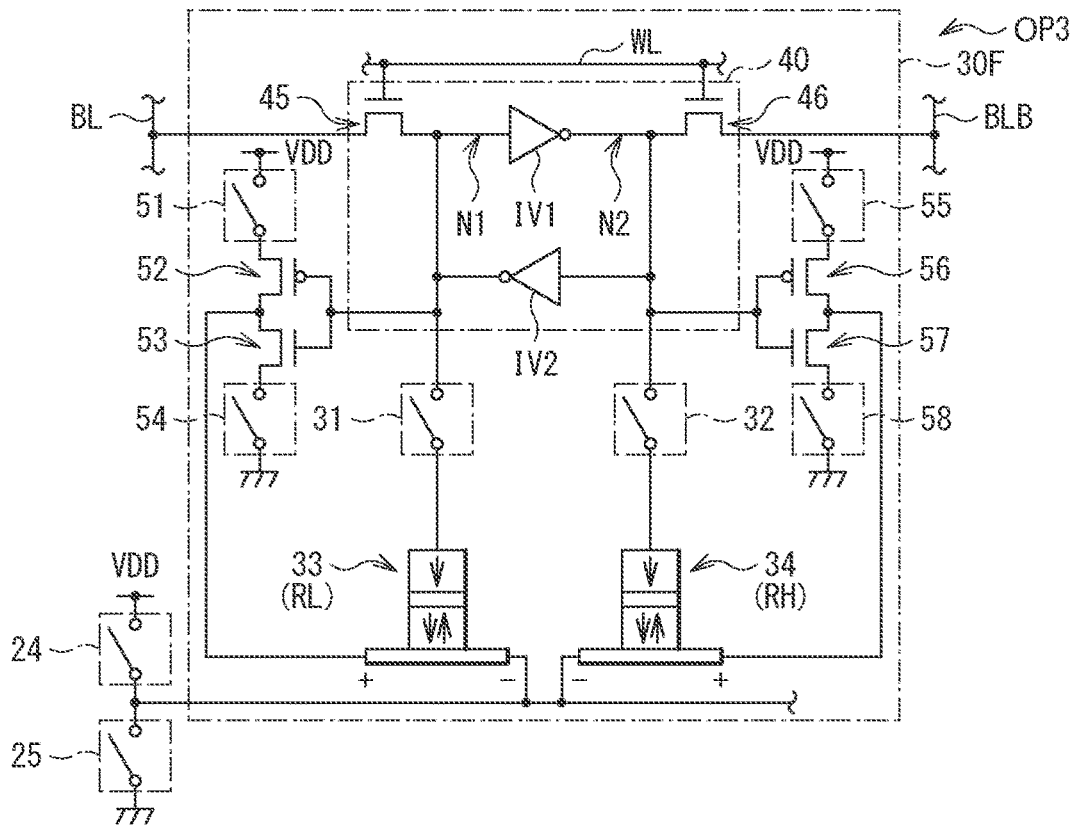

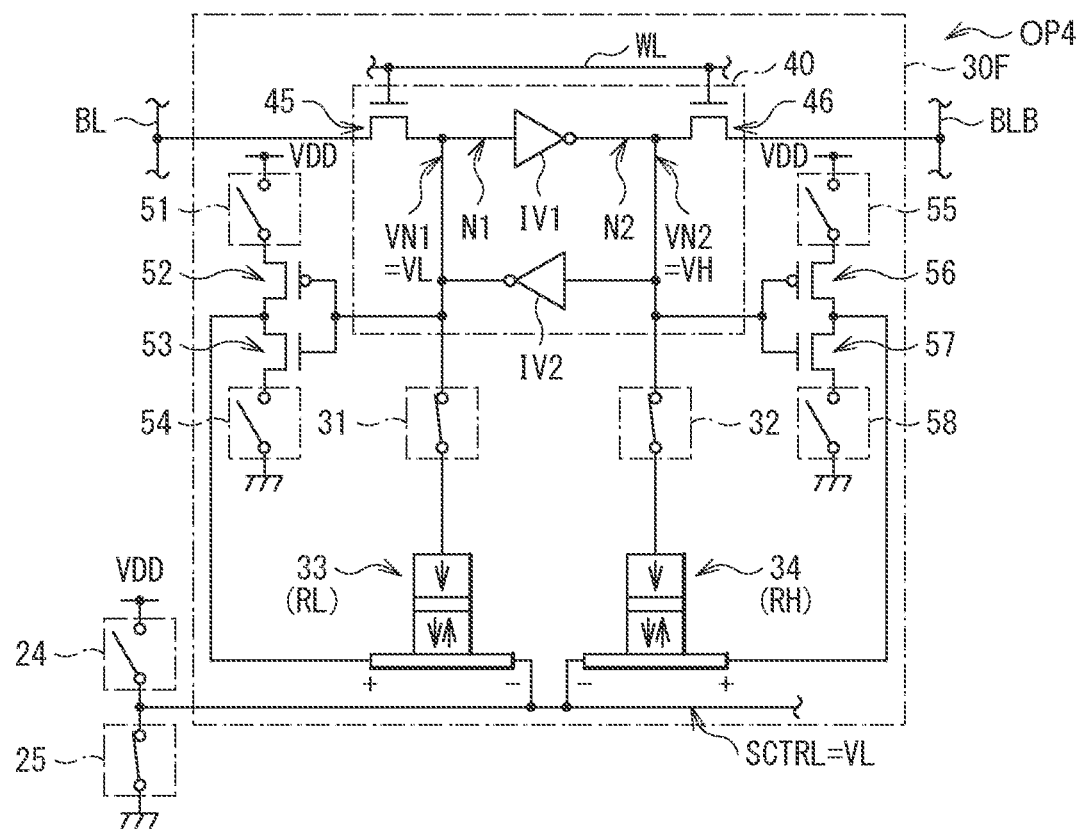
[FIG. 17E]

[ FIG. 18 ]
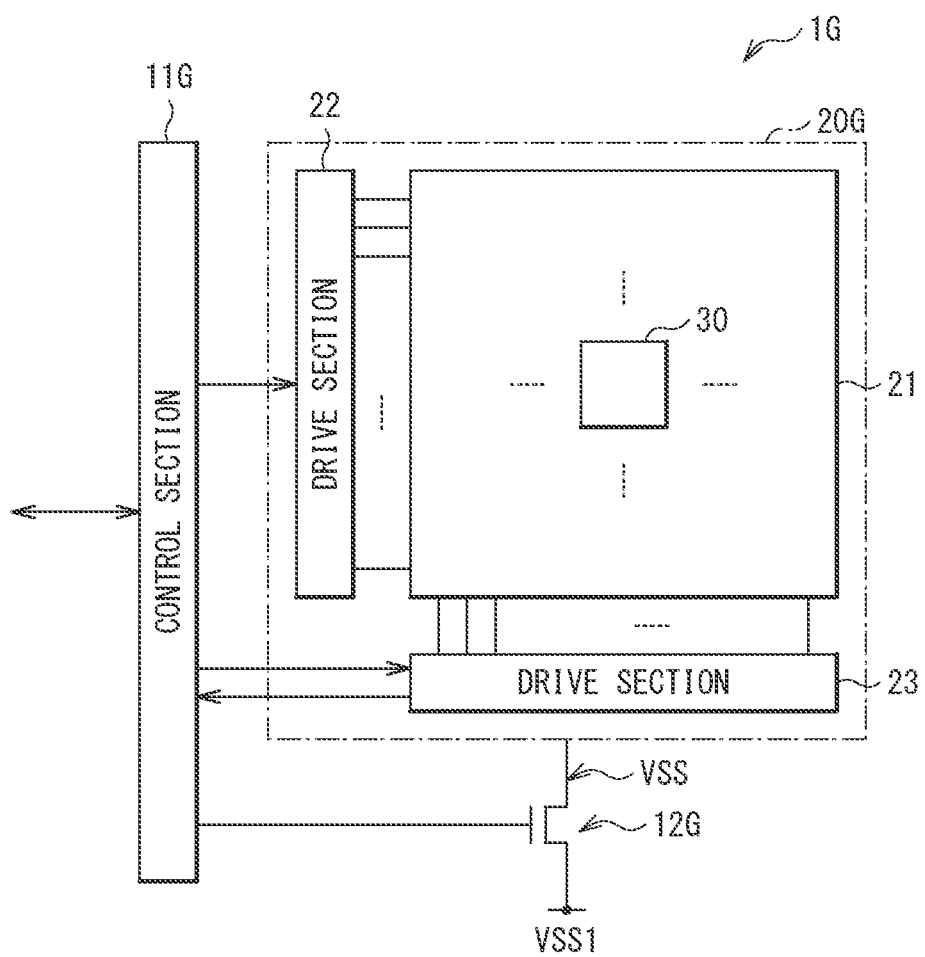

[ FIG. 19 ]
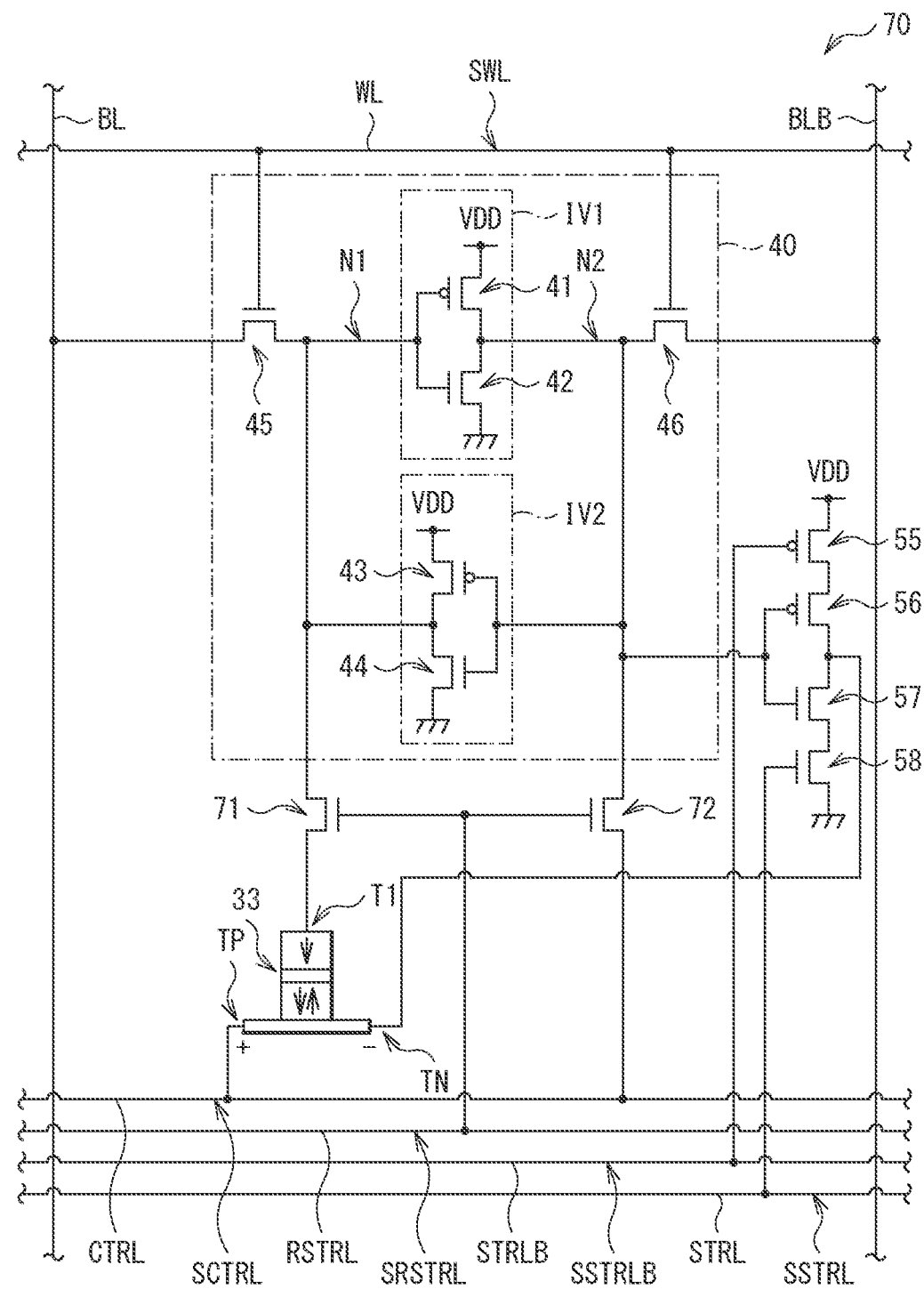

[ FIG. 20 ]
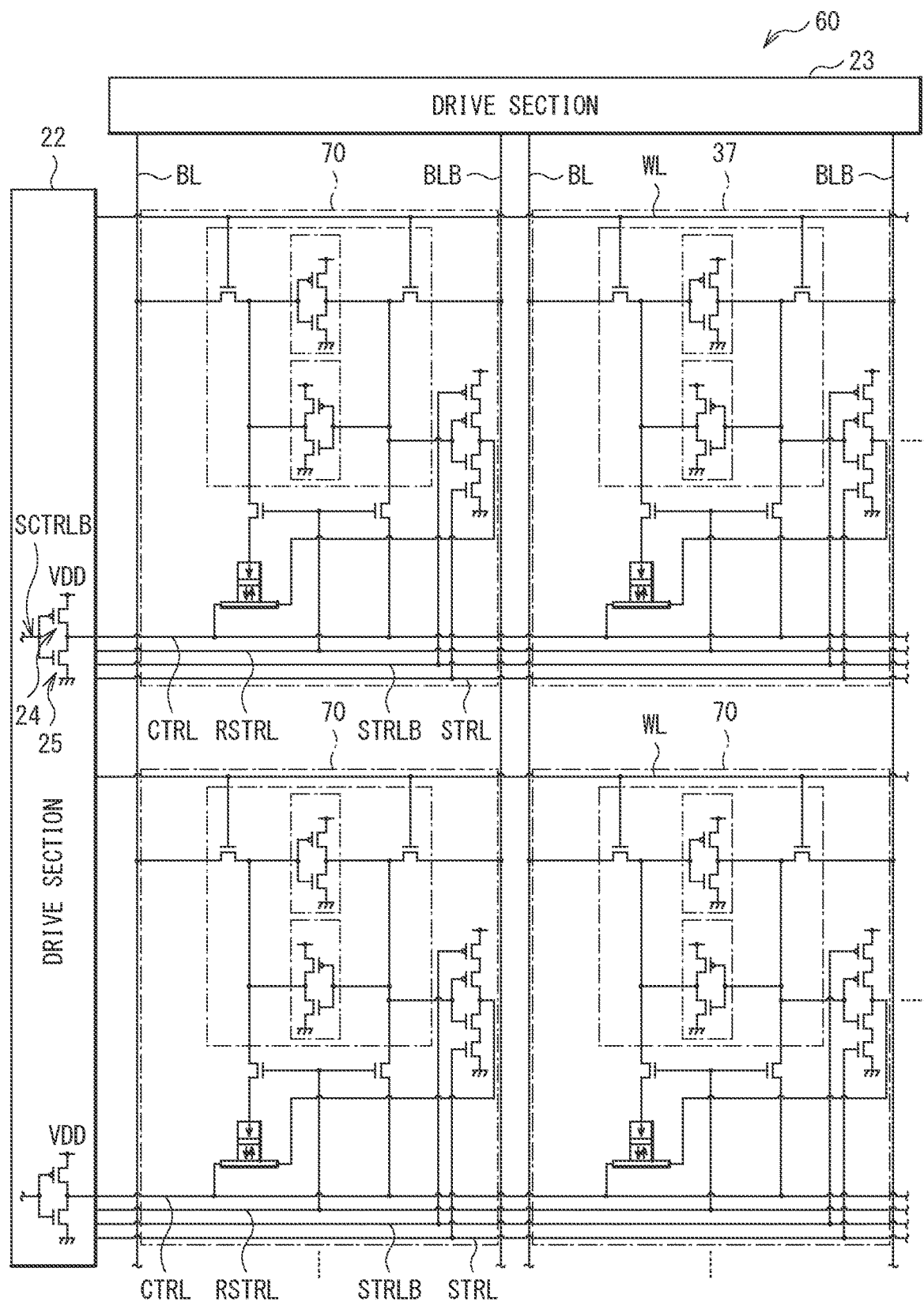

[ FIG. 21 ]
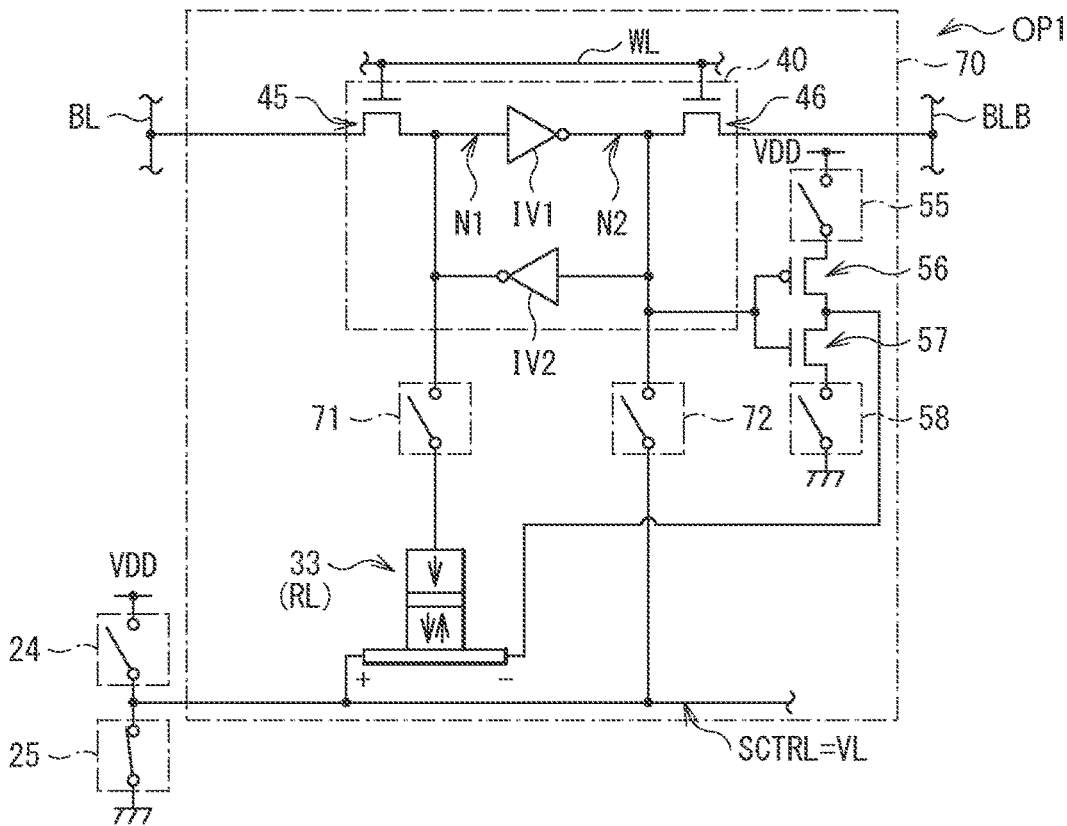
[ FIG. 22A ]
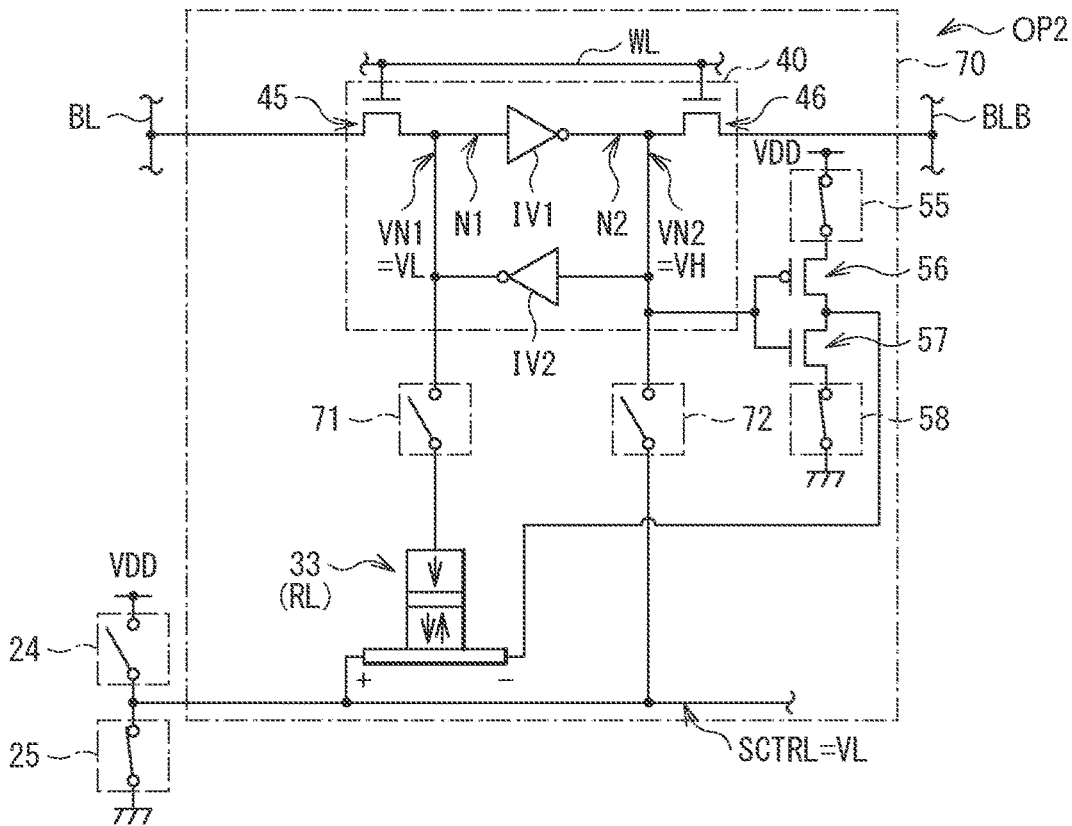

[FIG. 22B]
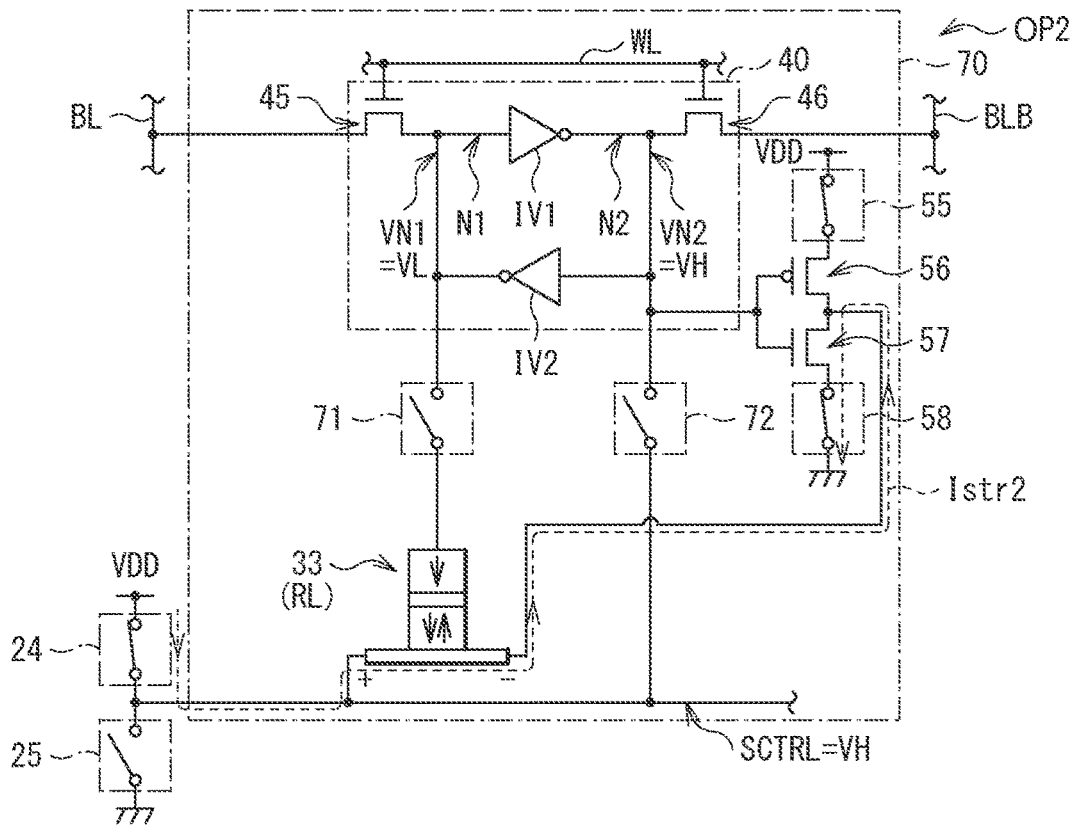
[FIG. 22C]
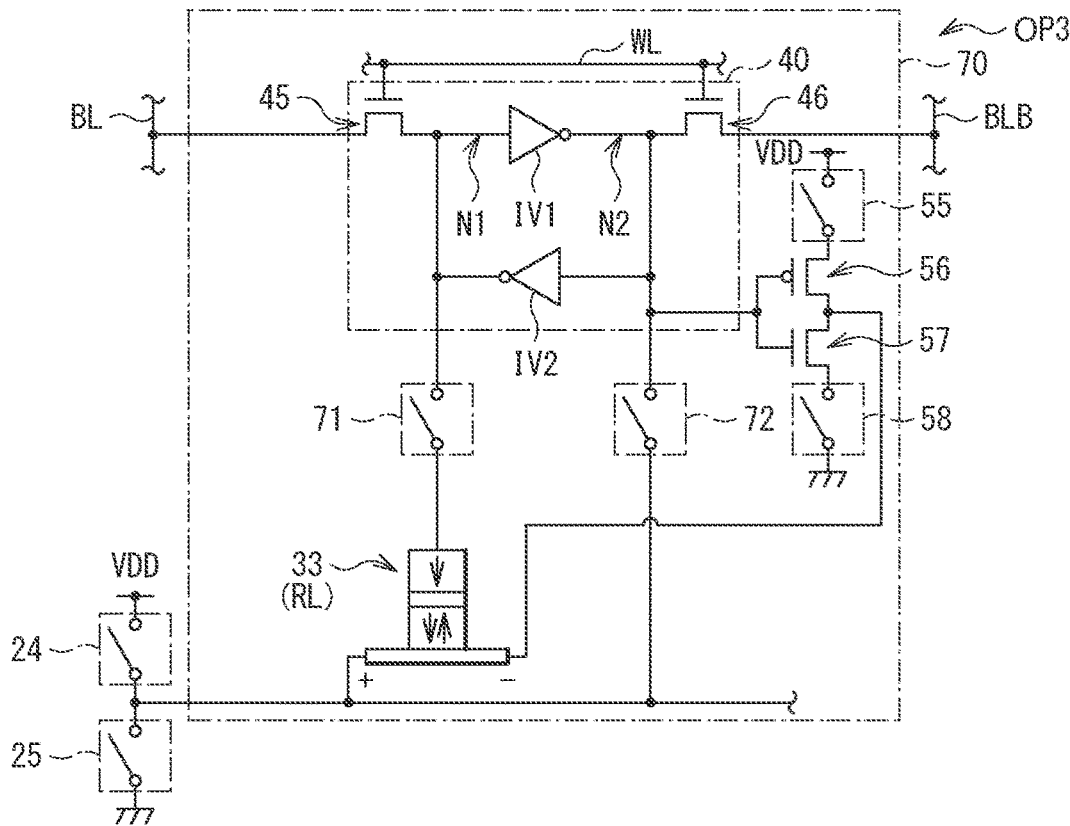

[FIG. 22D]
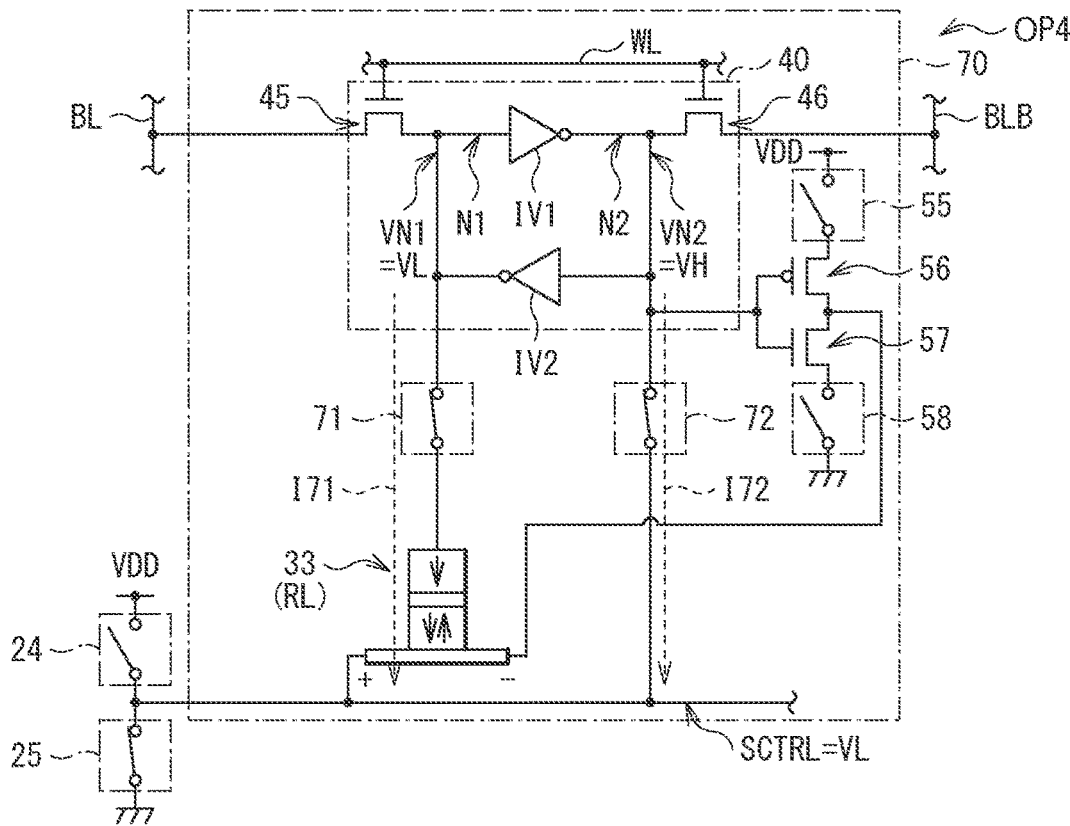
[FIG. 23A]
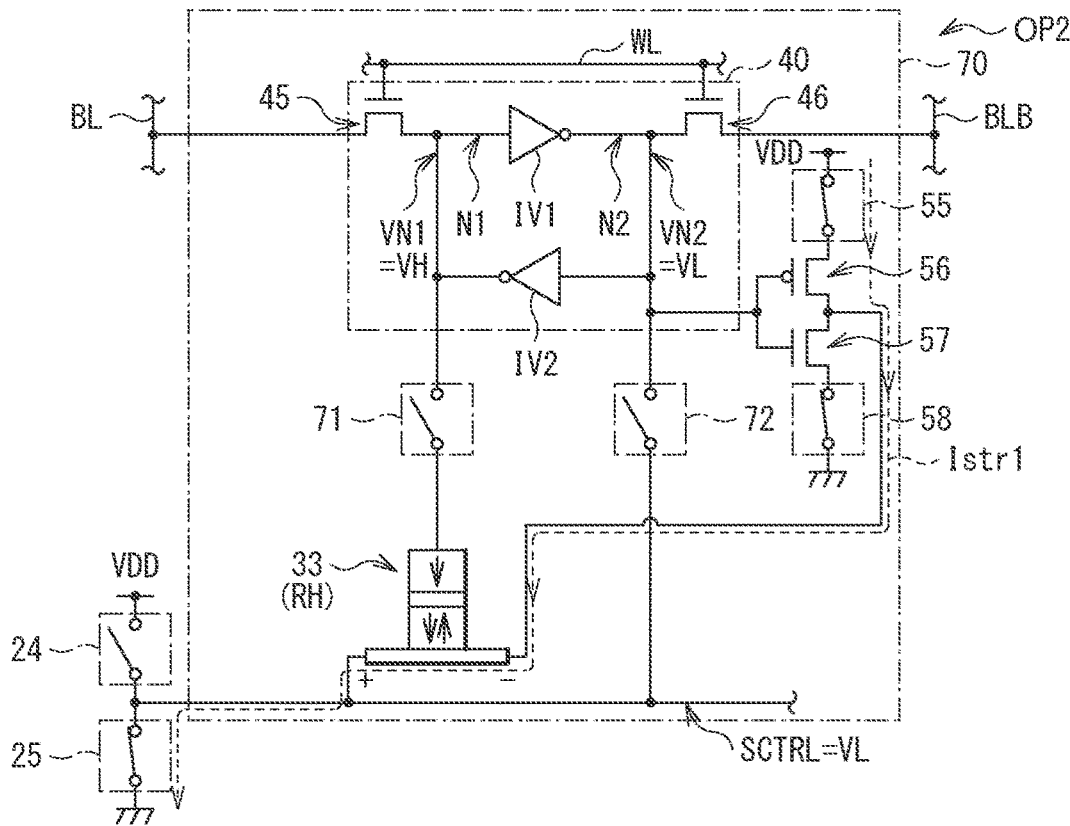

[FIG. 23B]
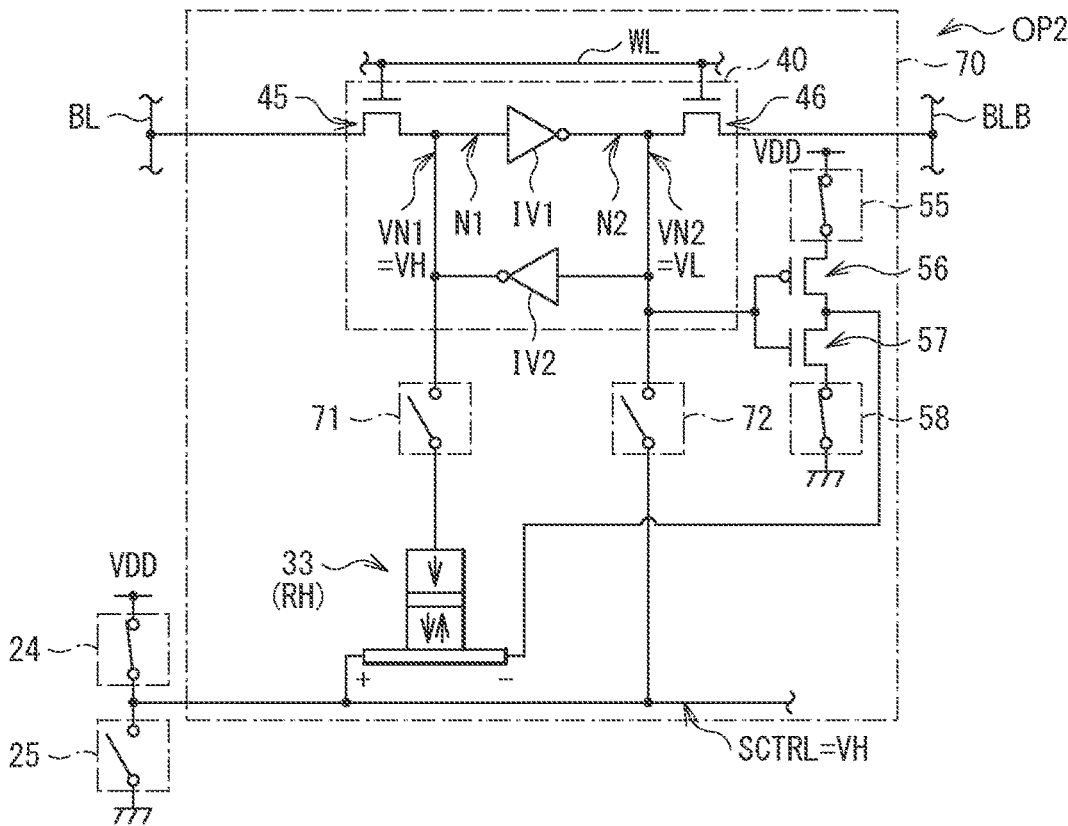
[FIG. 23C]
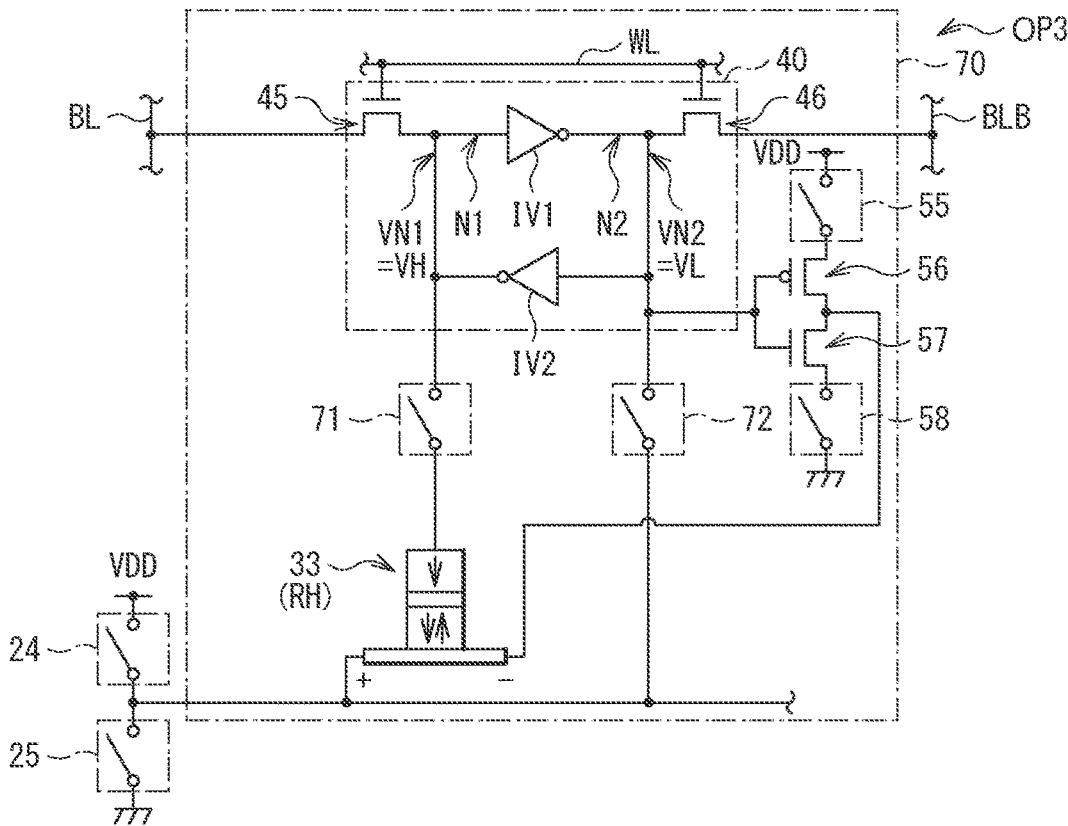

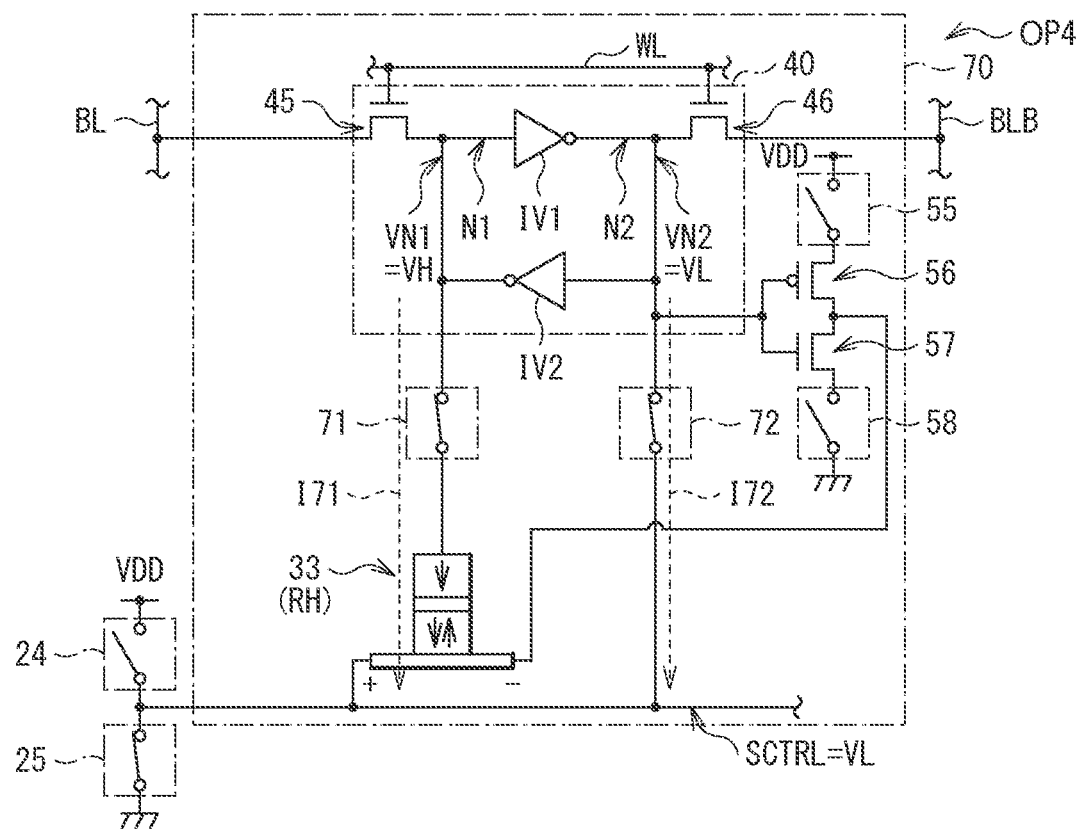
[FIG. 23D]

[ FIG. 24 ]
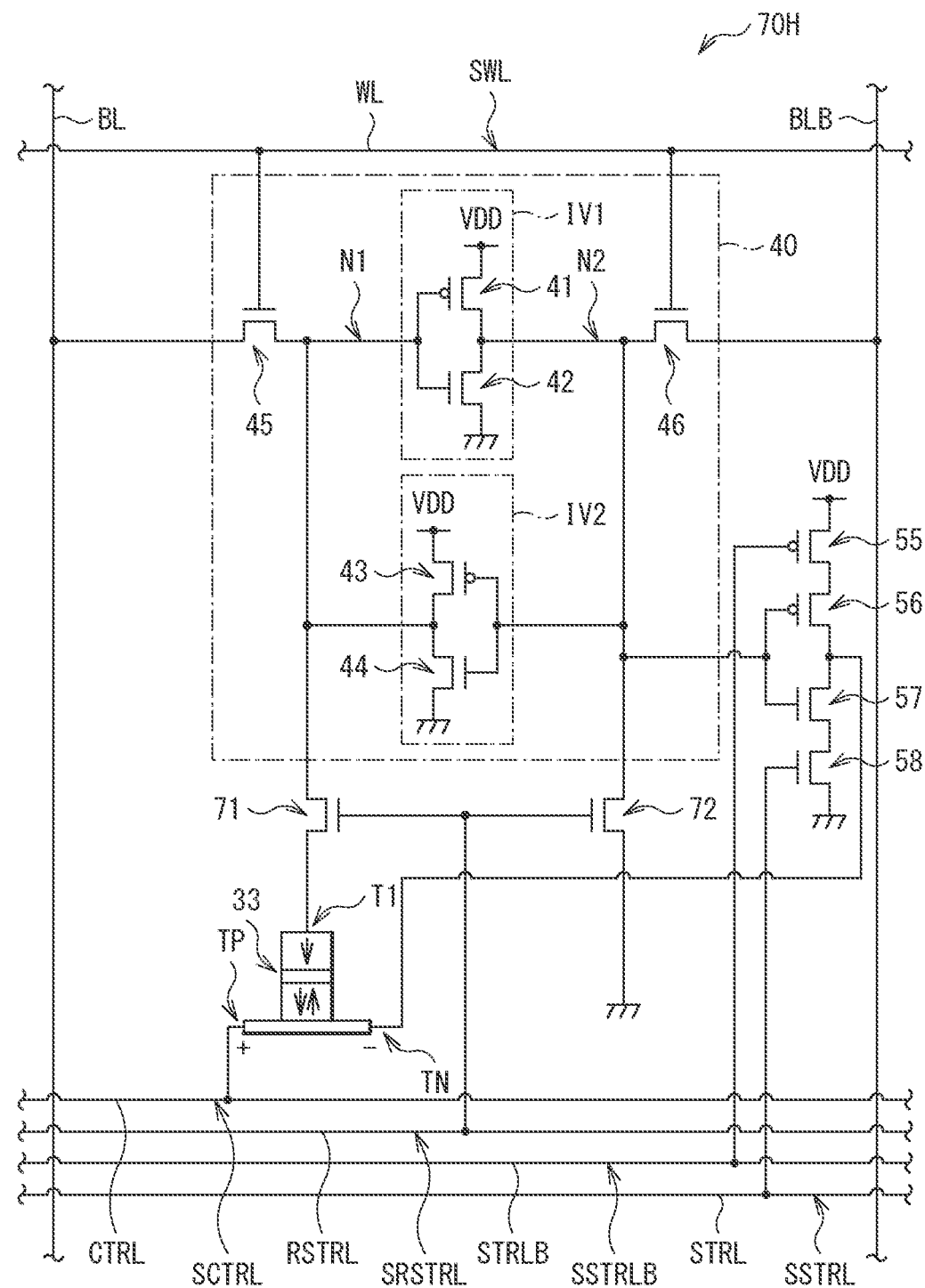

[FIG. 25]
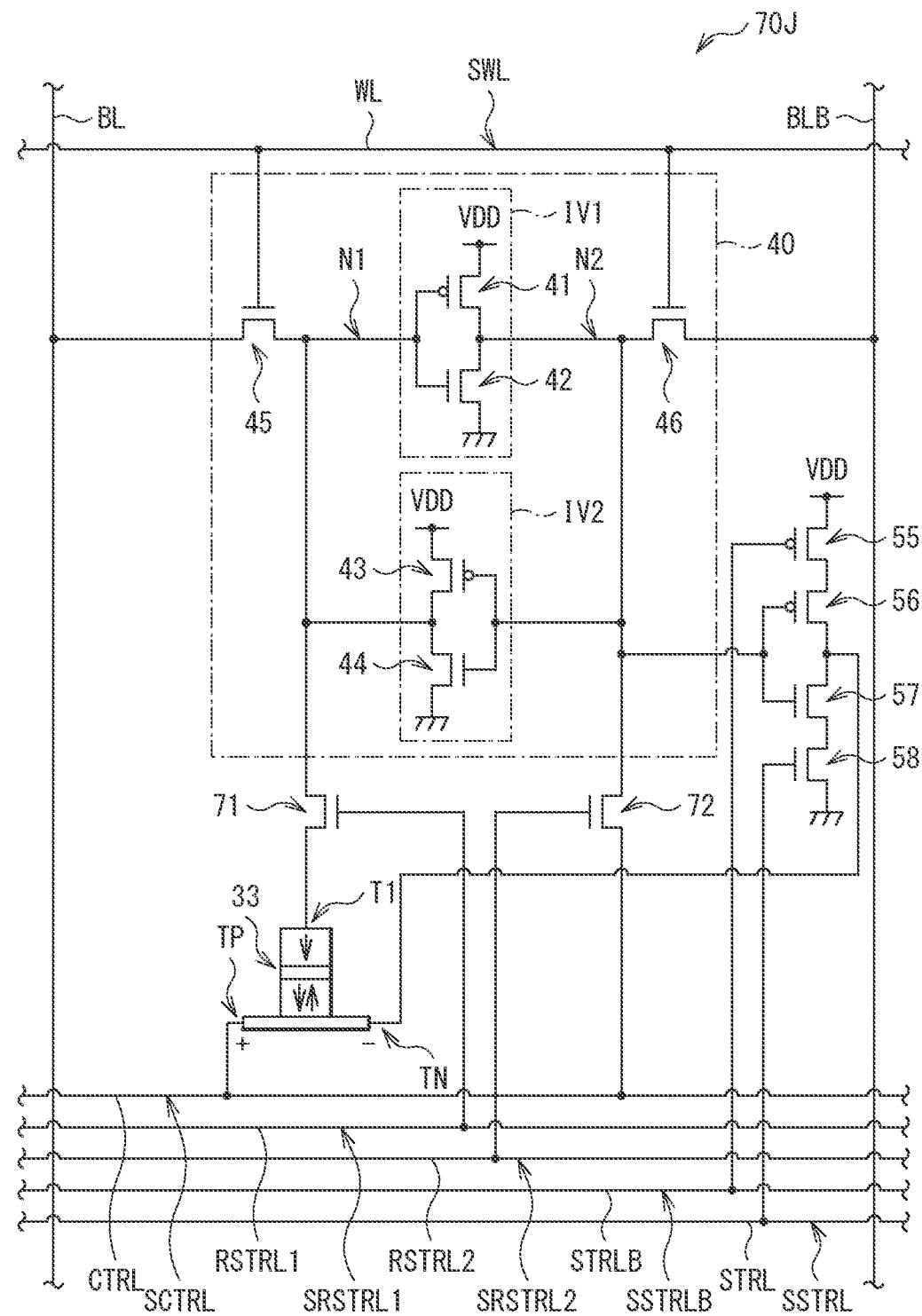

[FIG. 26]
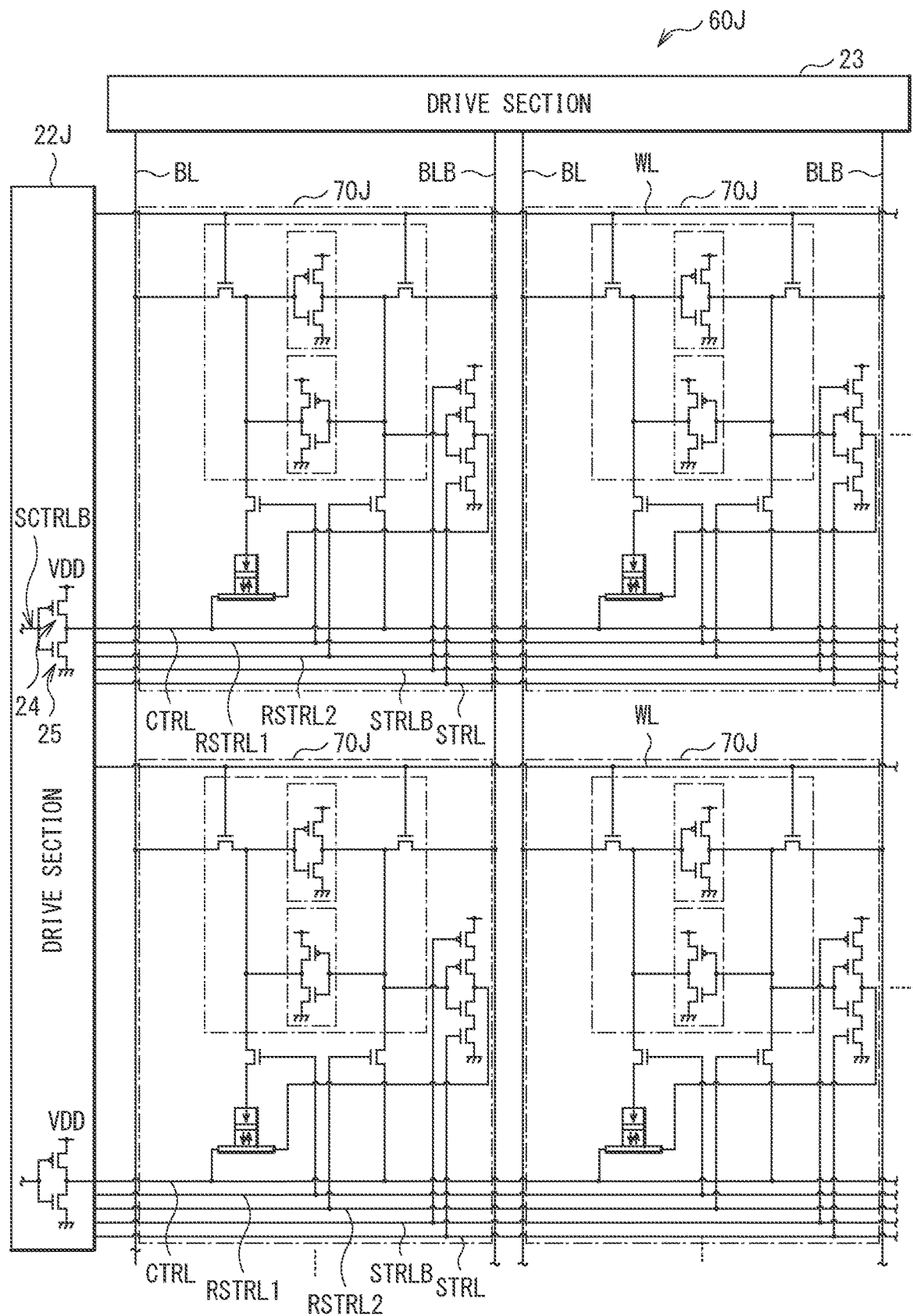

[FIG. 27]
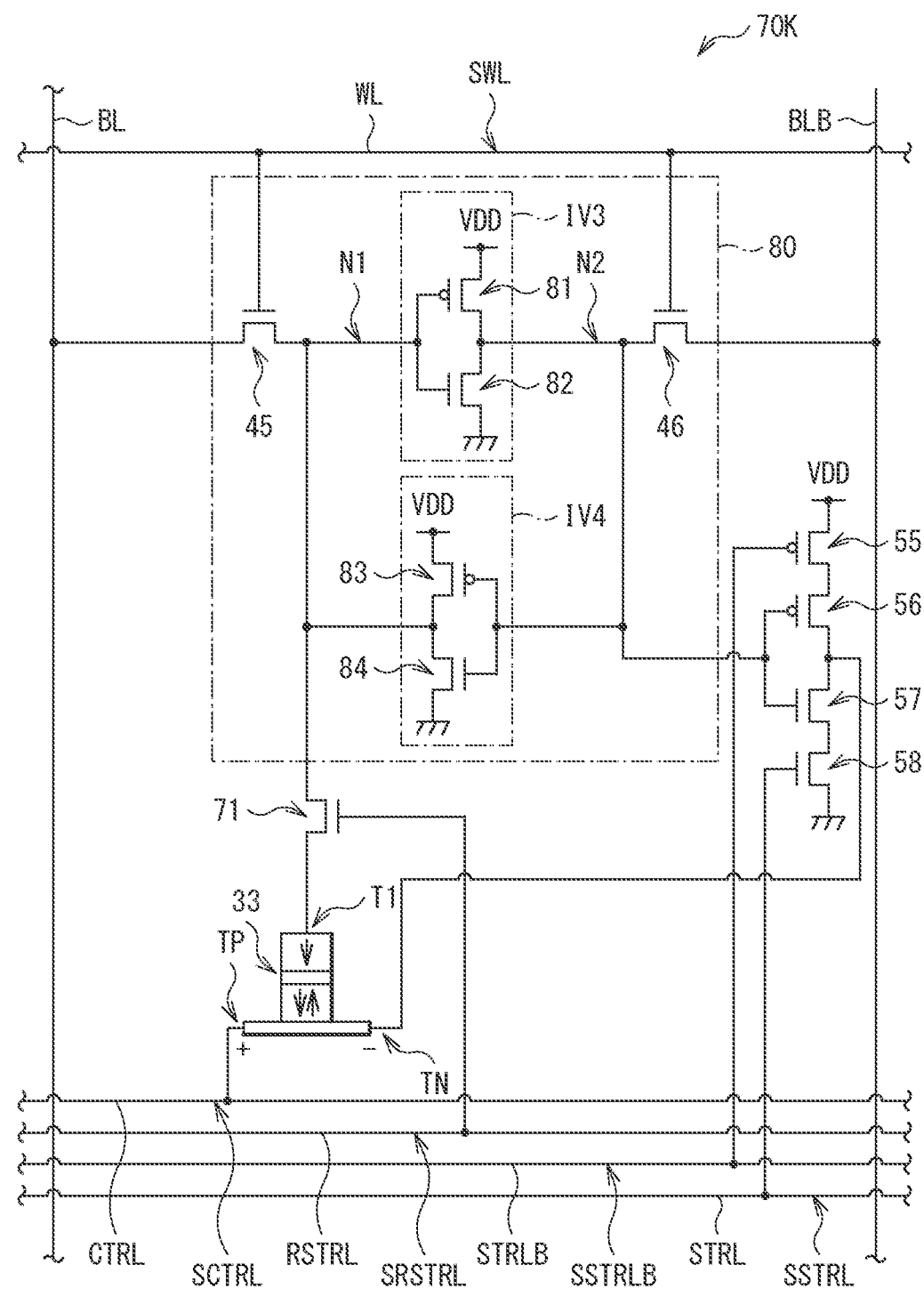

[FIG. 28]
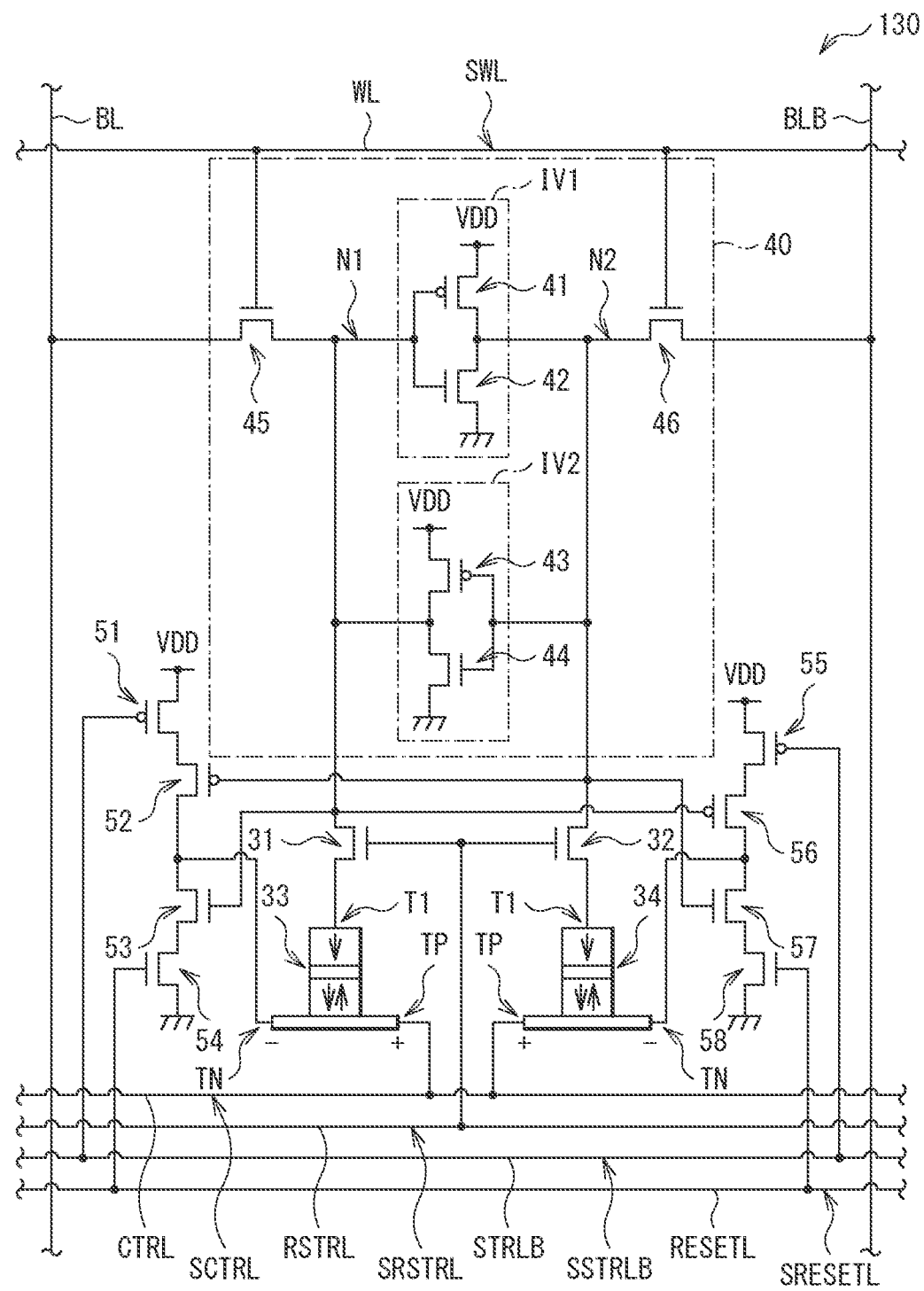

[ FIG. 29 ]
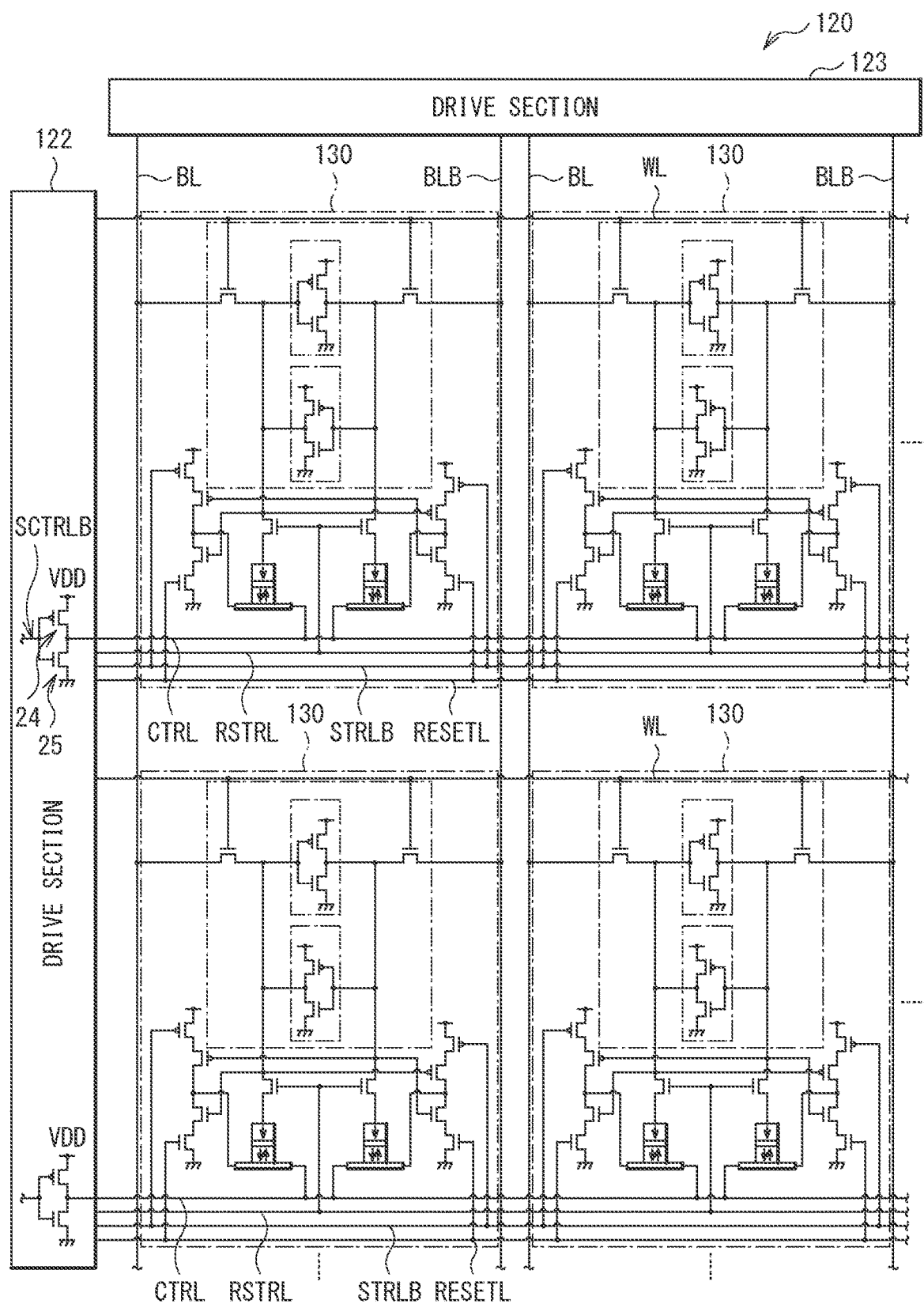

[ FIG. 30 ]
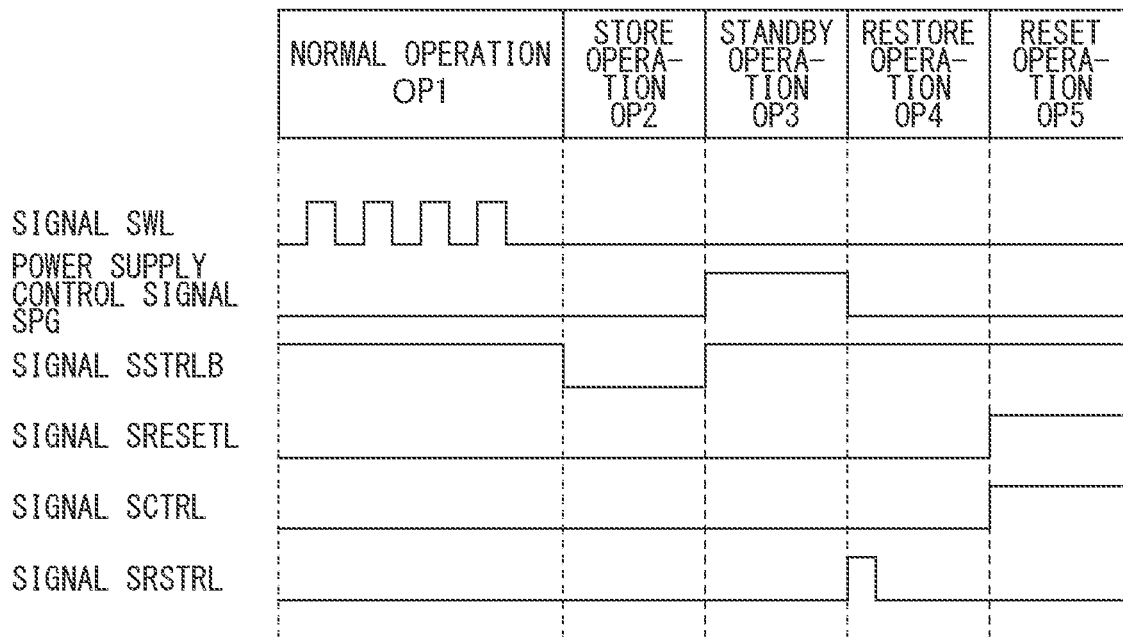
[ FIG. 31A ]
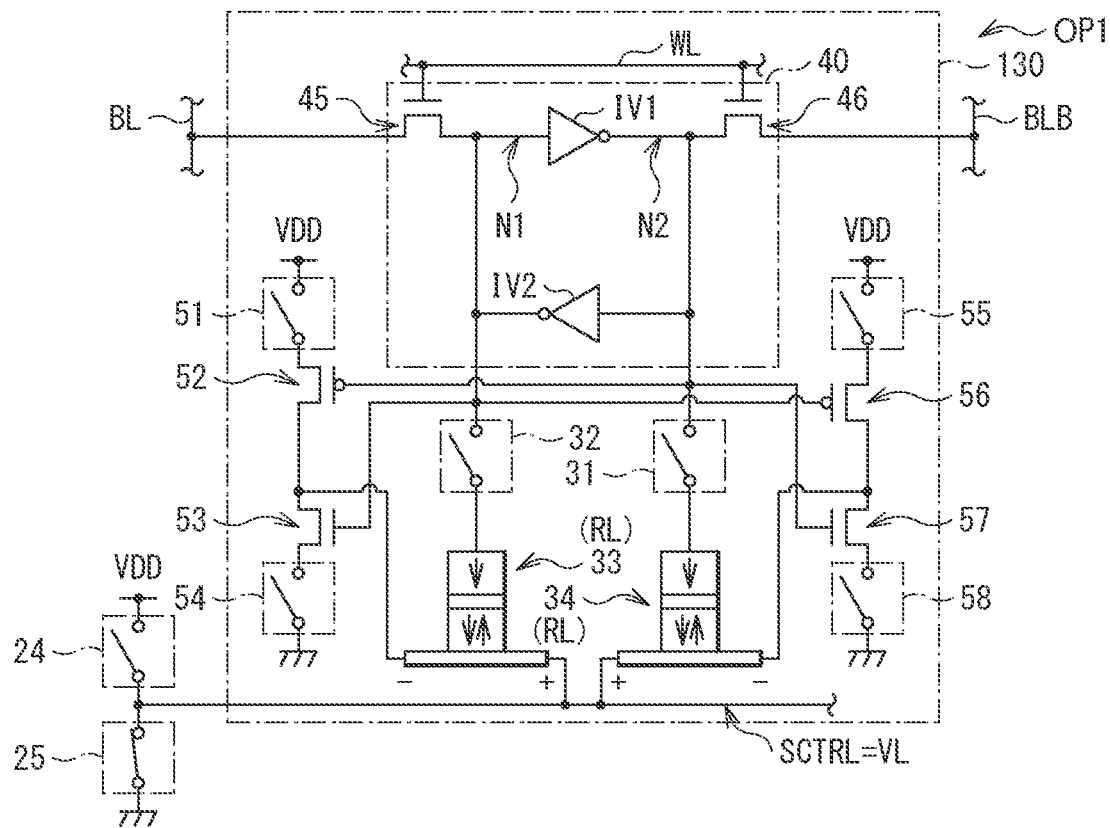

[FIG. 31B]
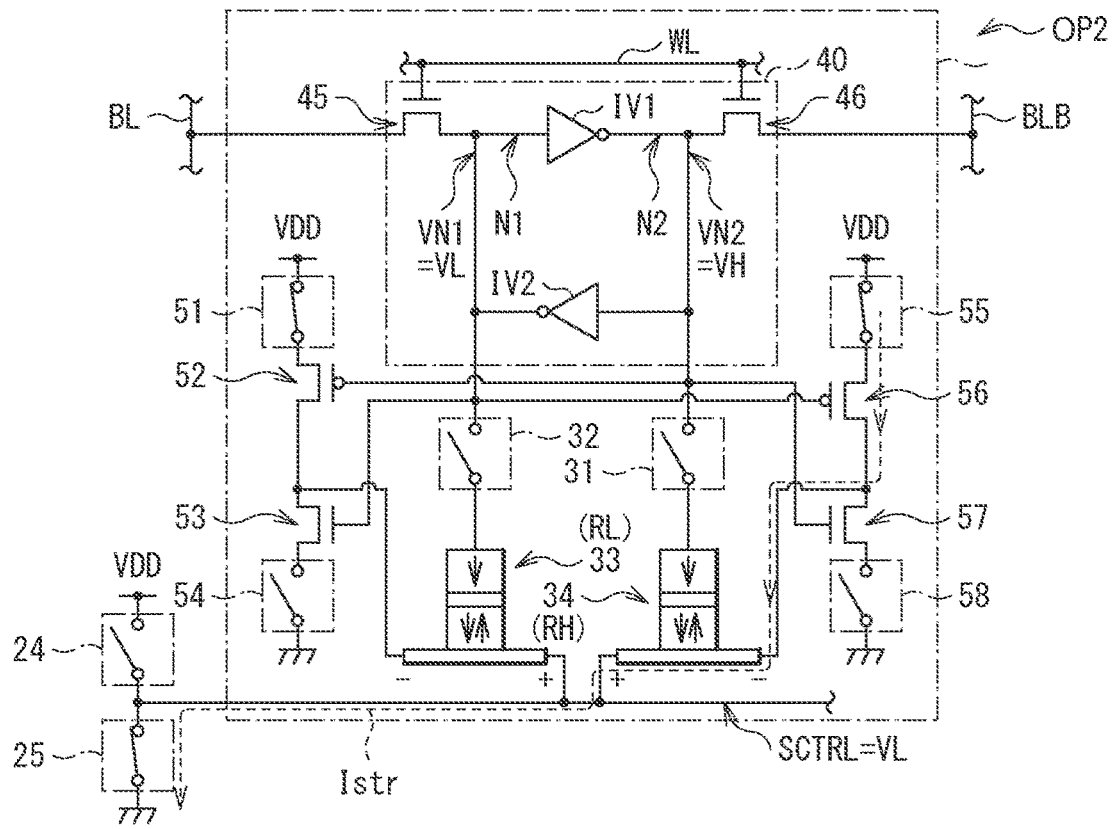
[FIG. 31C]
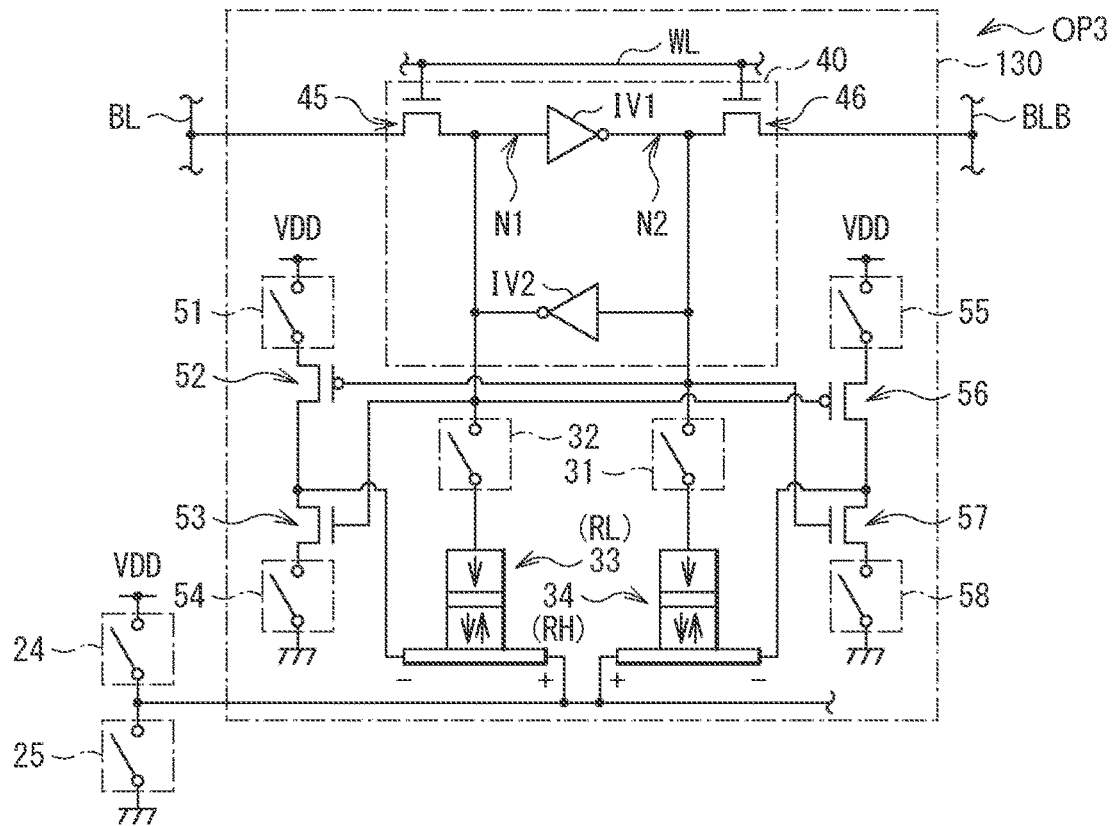

[ FIG. 31D ]
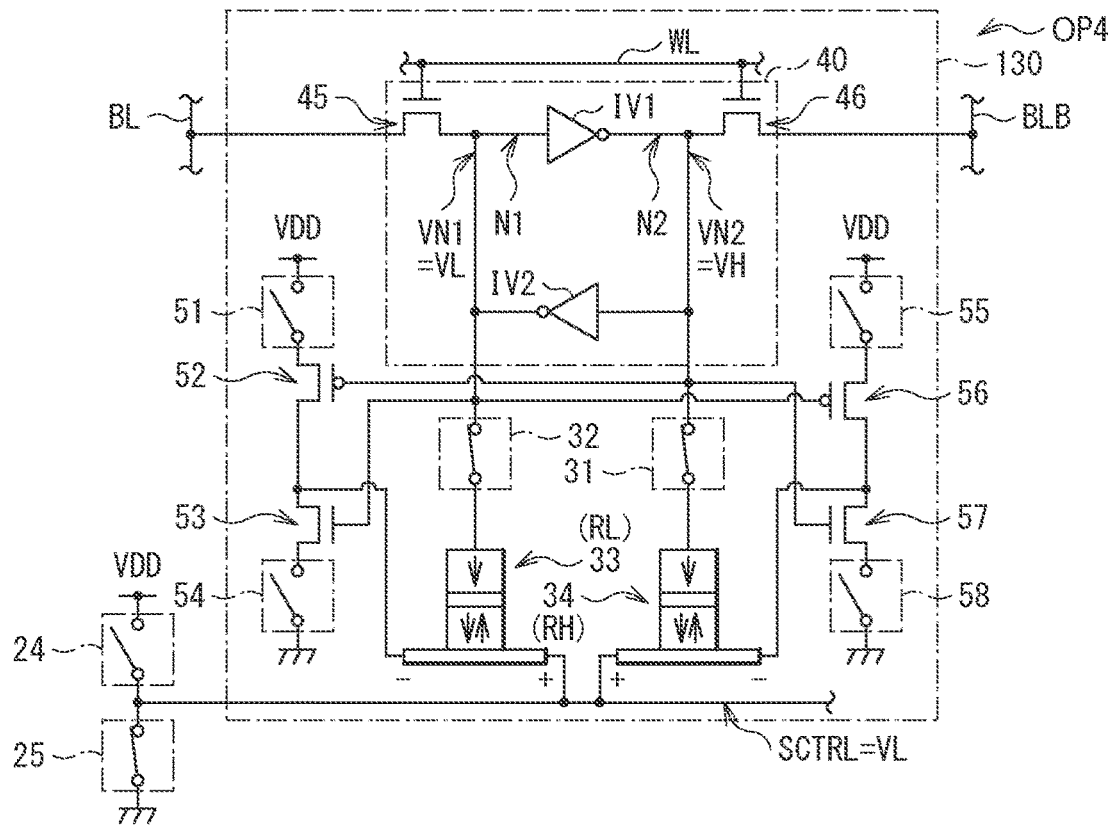
[ FIG. 31E ]
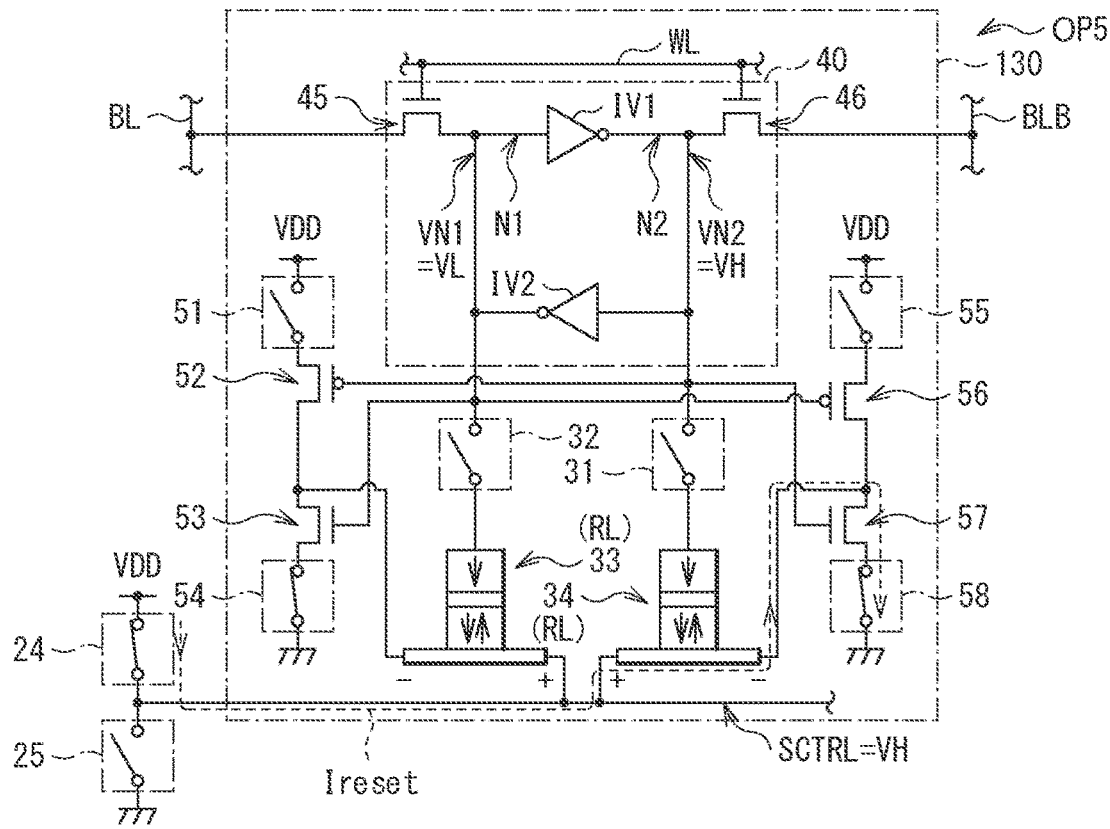

[ FIG. 32A ]
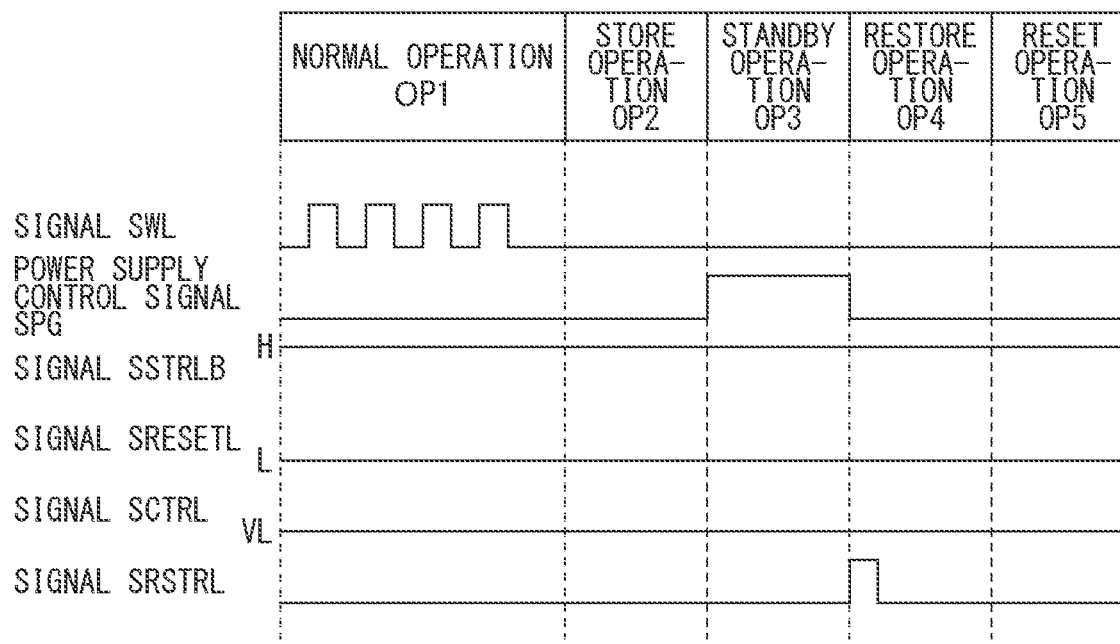
[ FIG. 32B ]
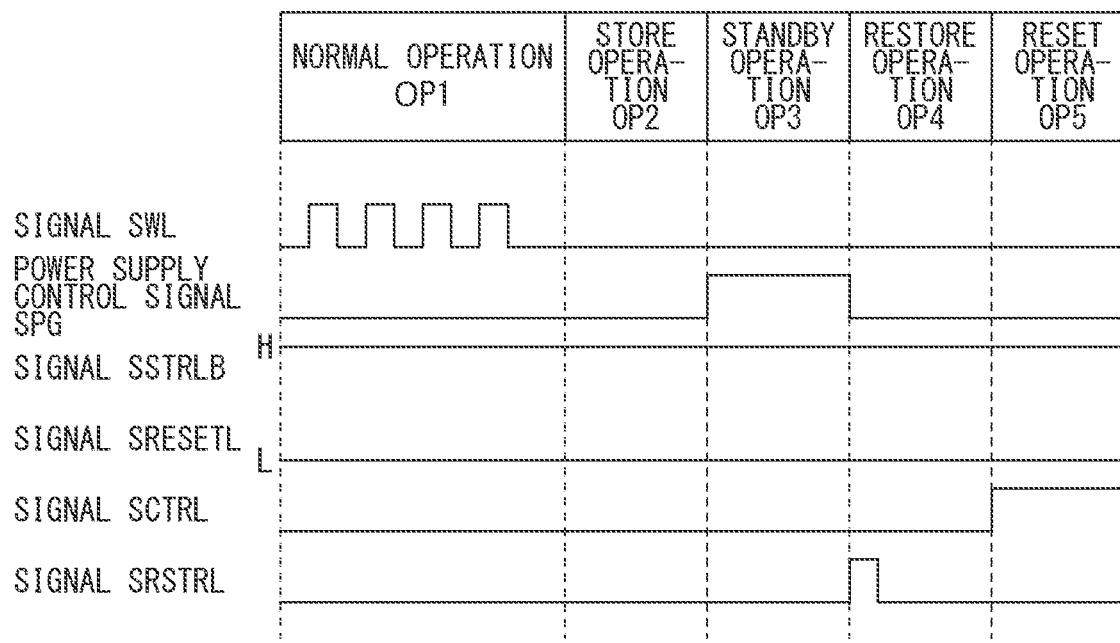

[FIG. 33]
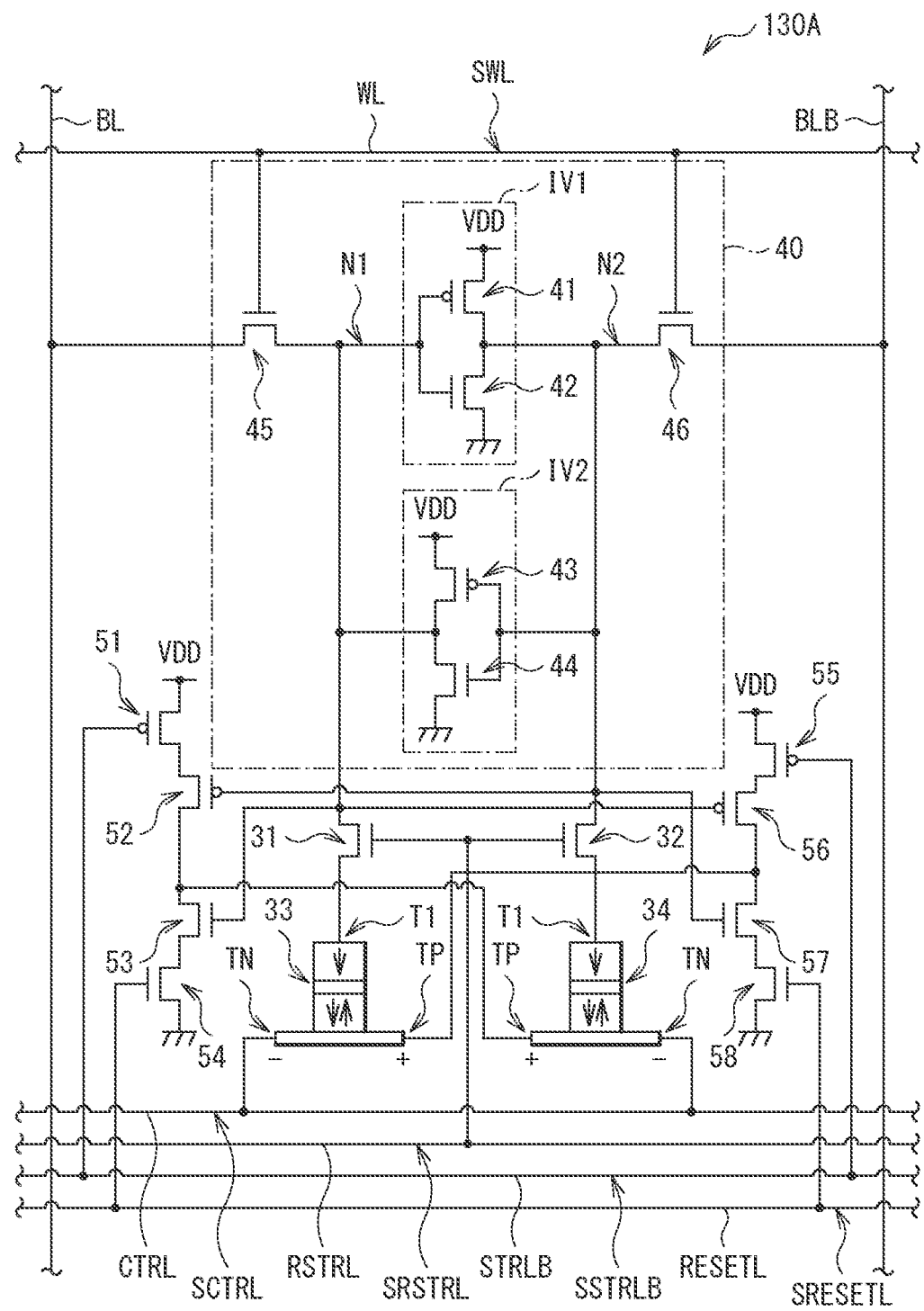

[ FIG. 34A ]
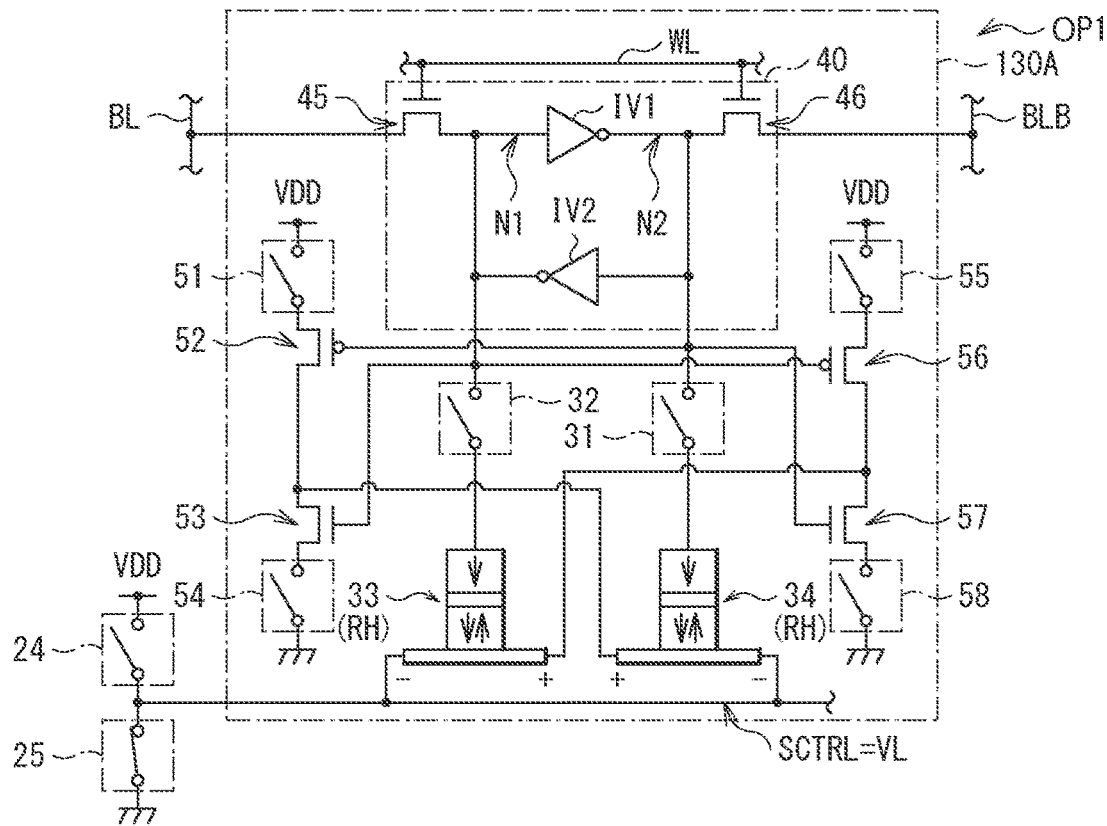
[ FIG. 34B ]
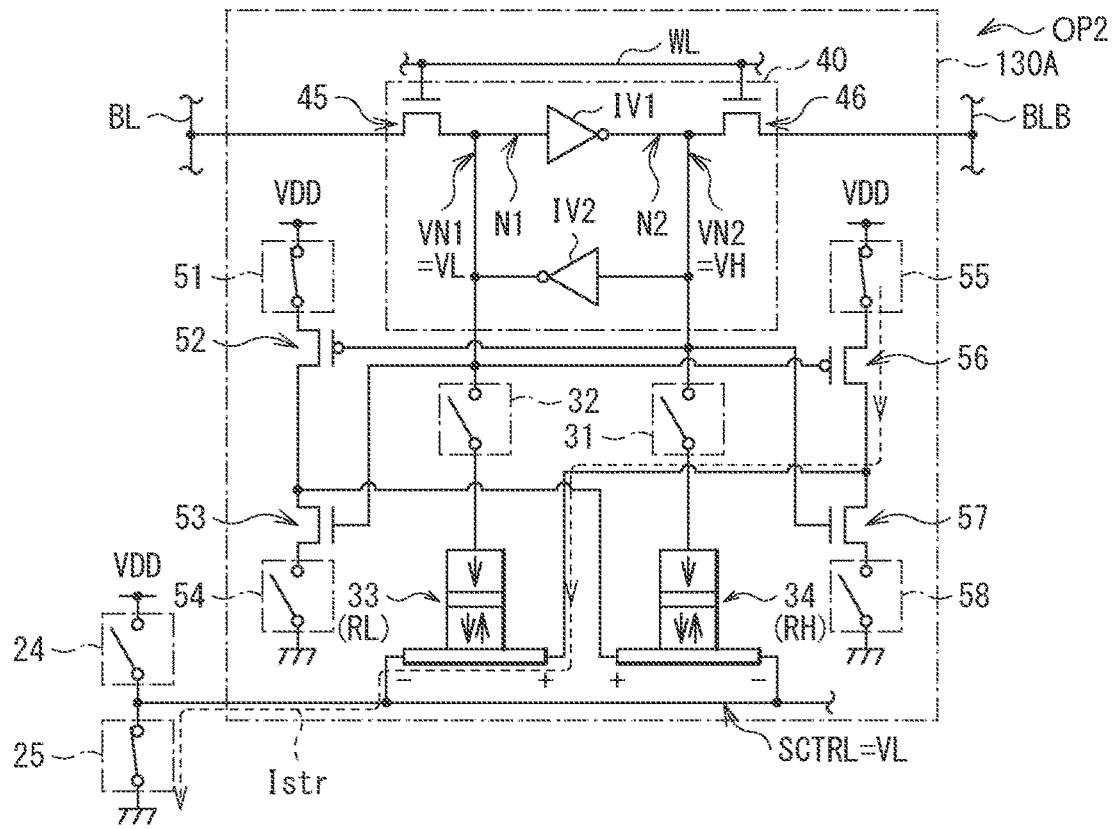

[FIG. 34C]
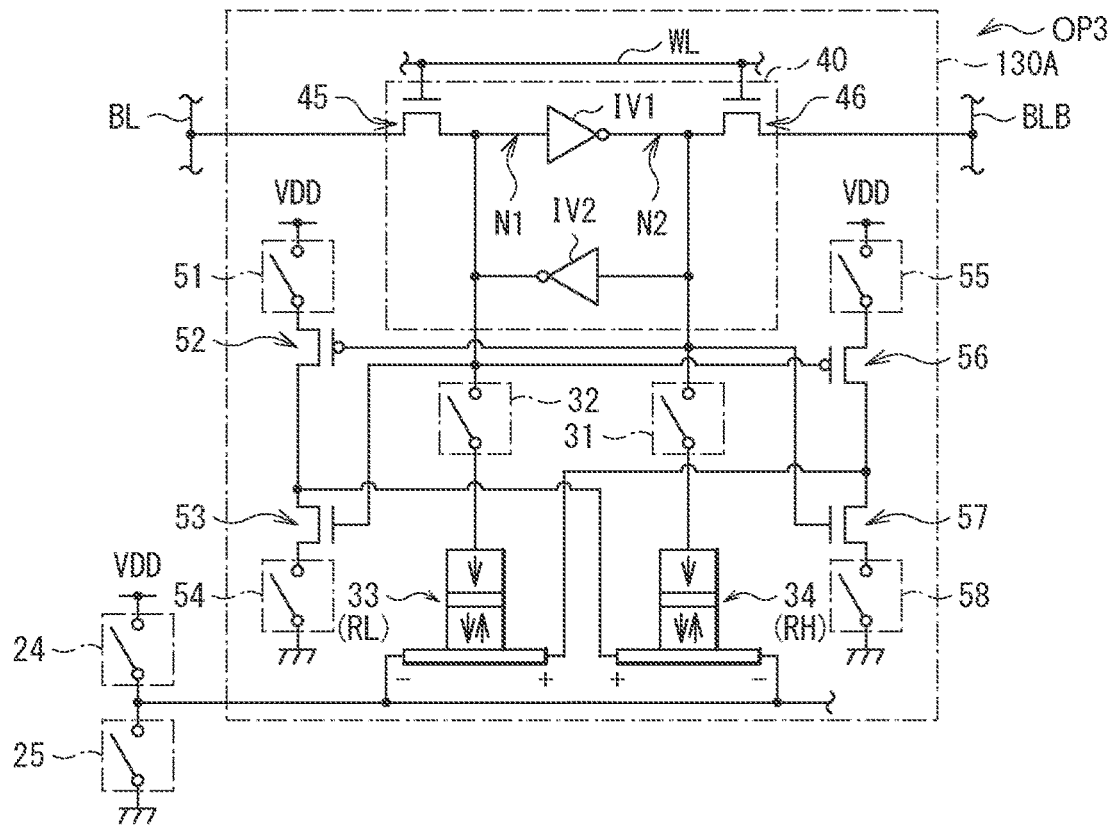
[FIG. 34D]
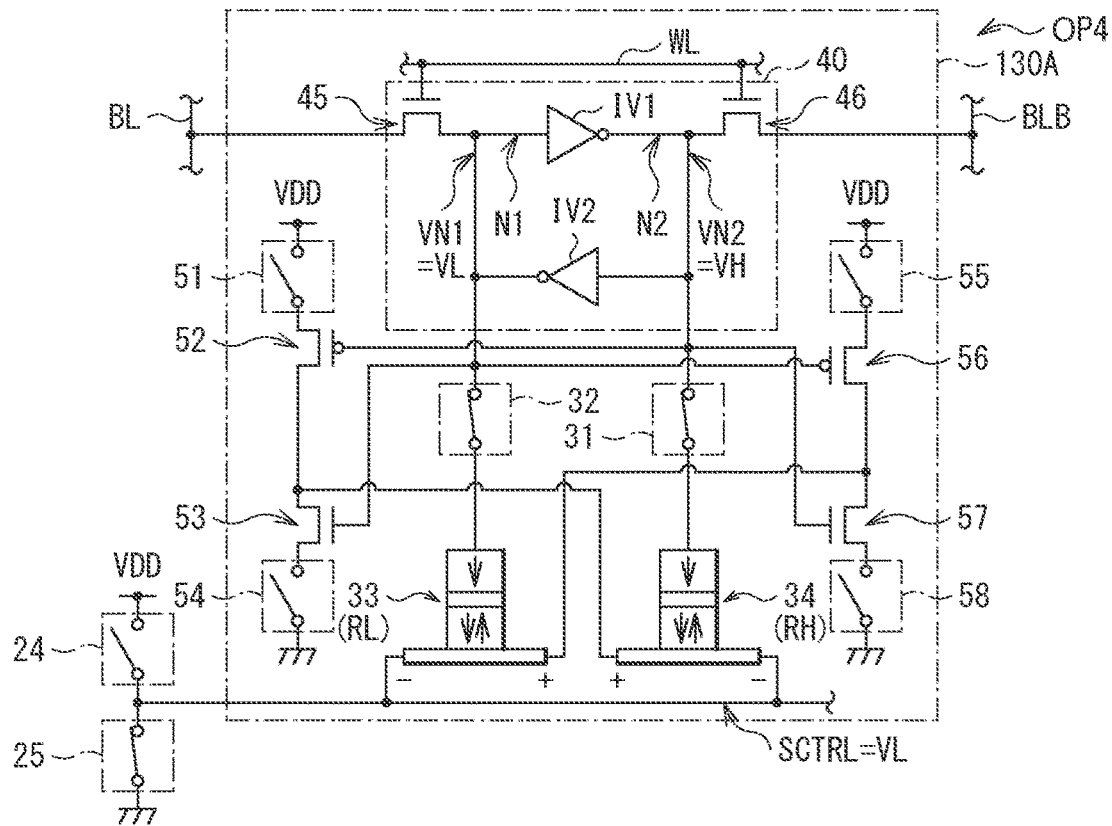

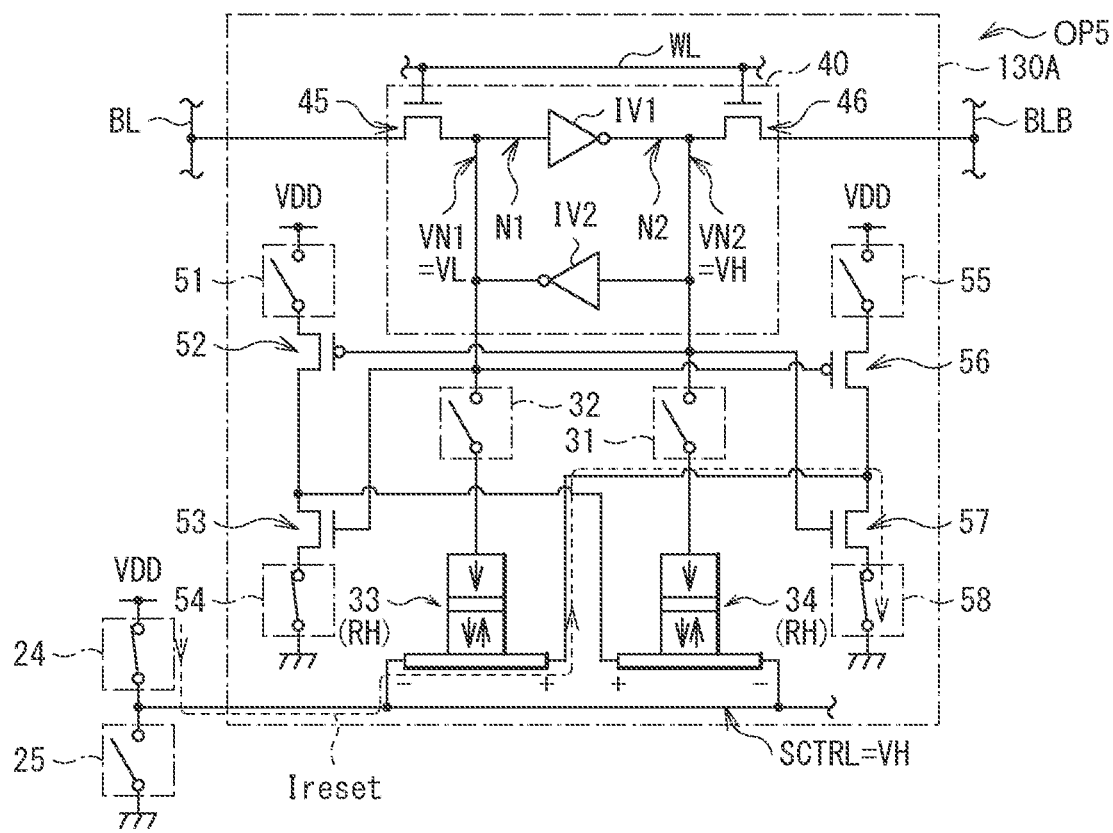
[FIG. 34E]

[FIG. 35]
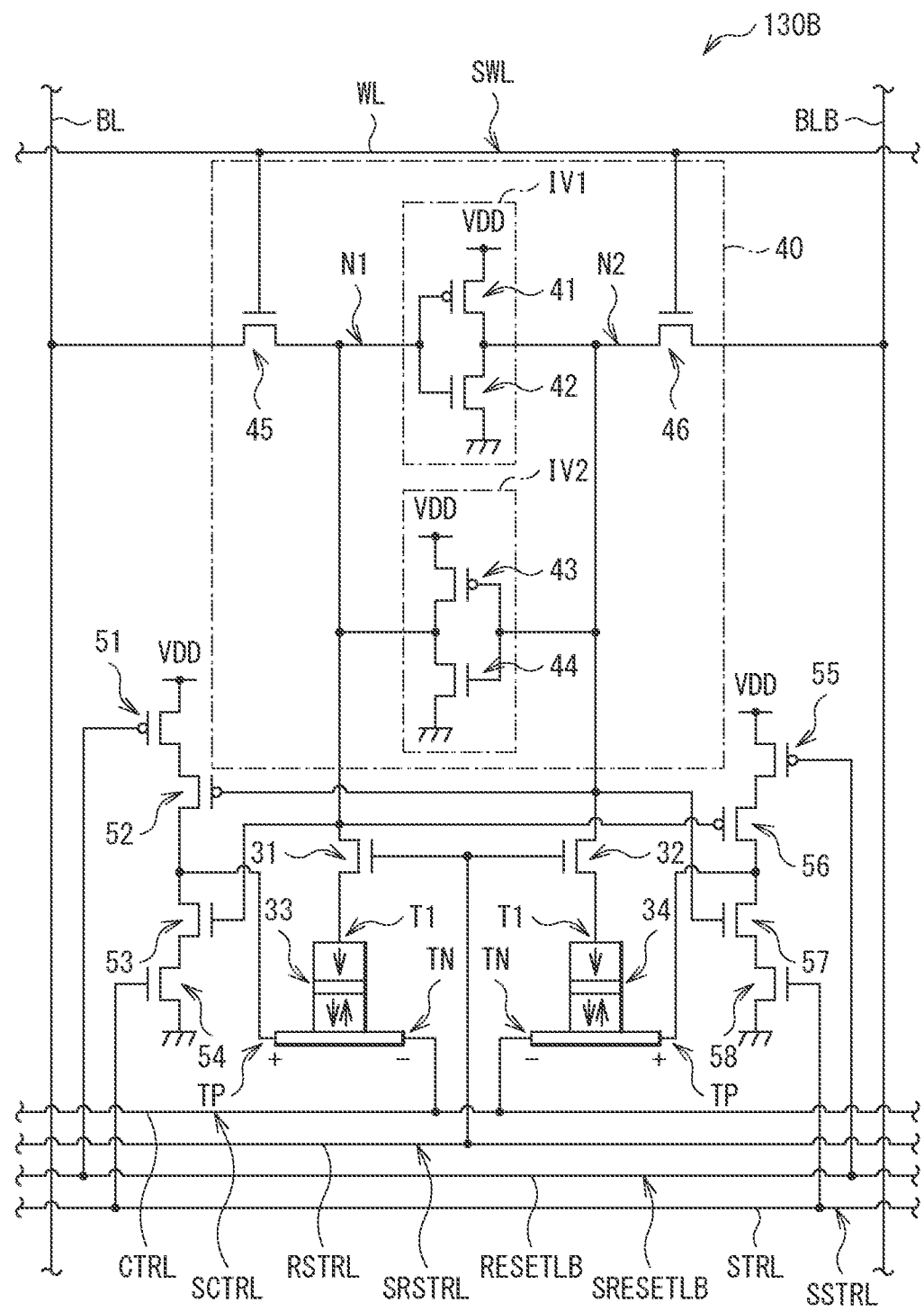

[FIG. 36]
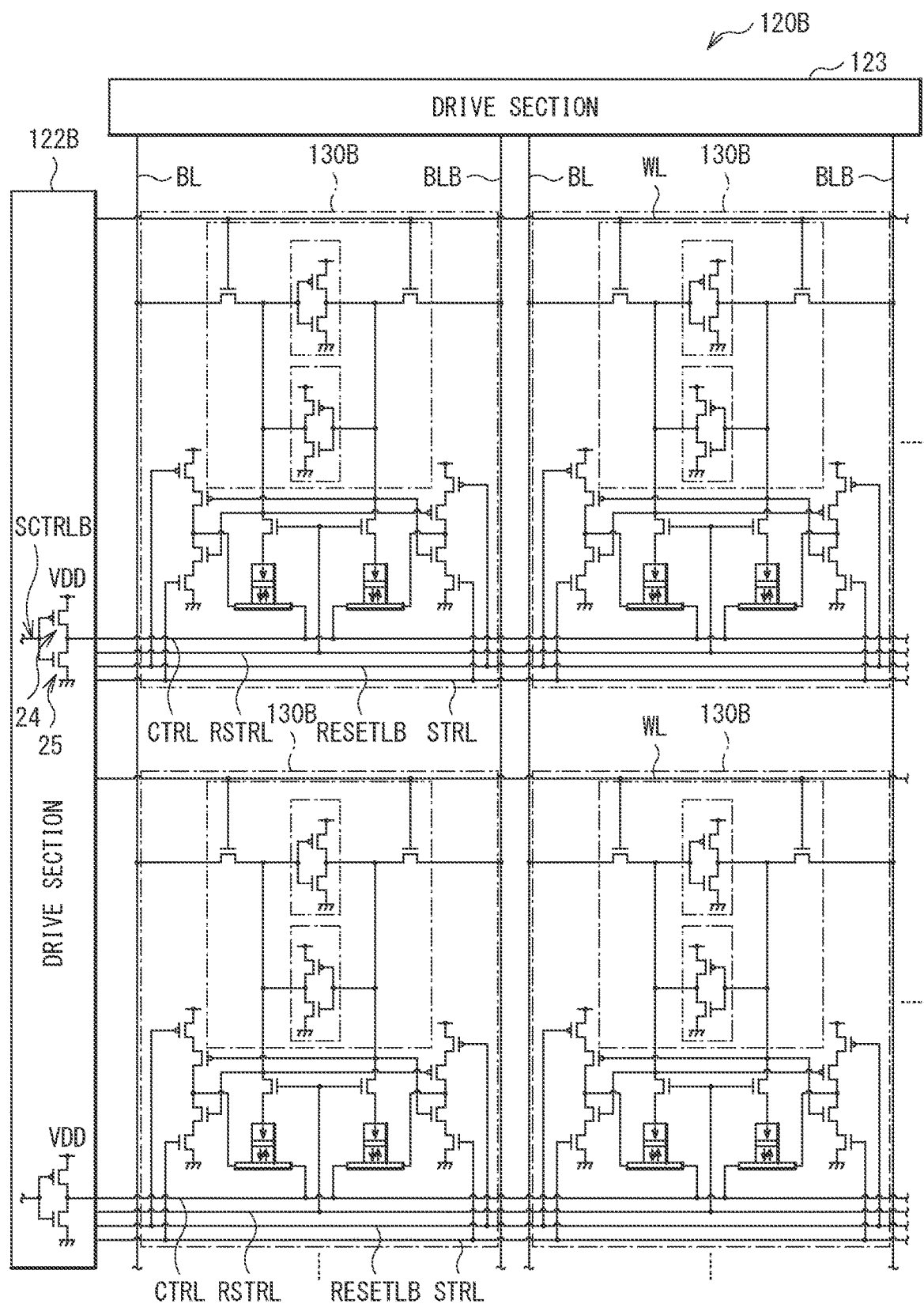

[ FIG. 37 ]
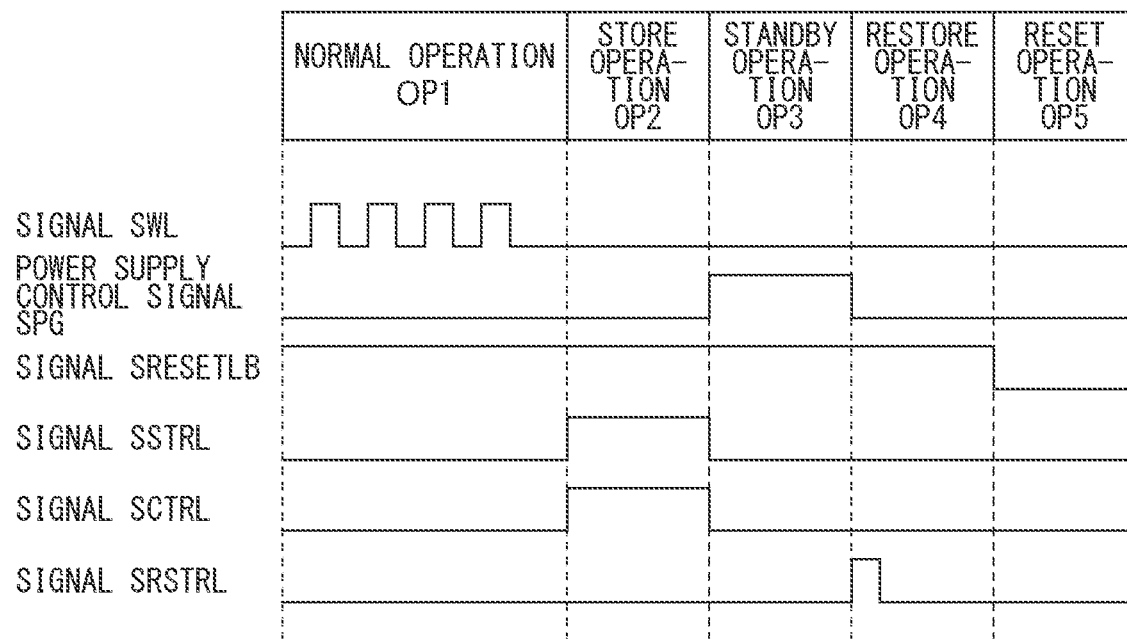
[ FIG. 38A ]
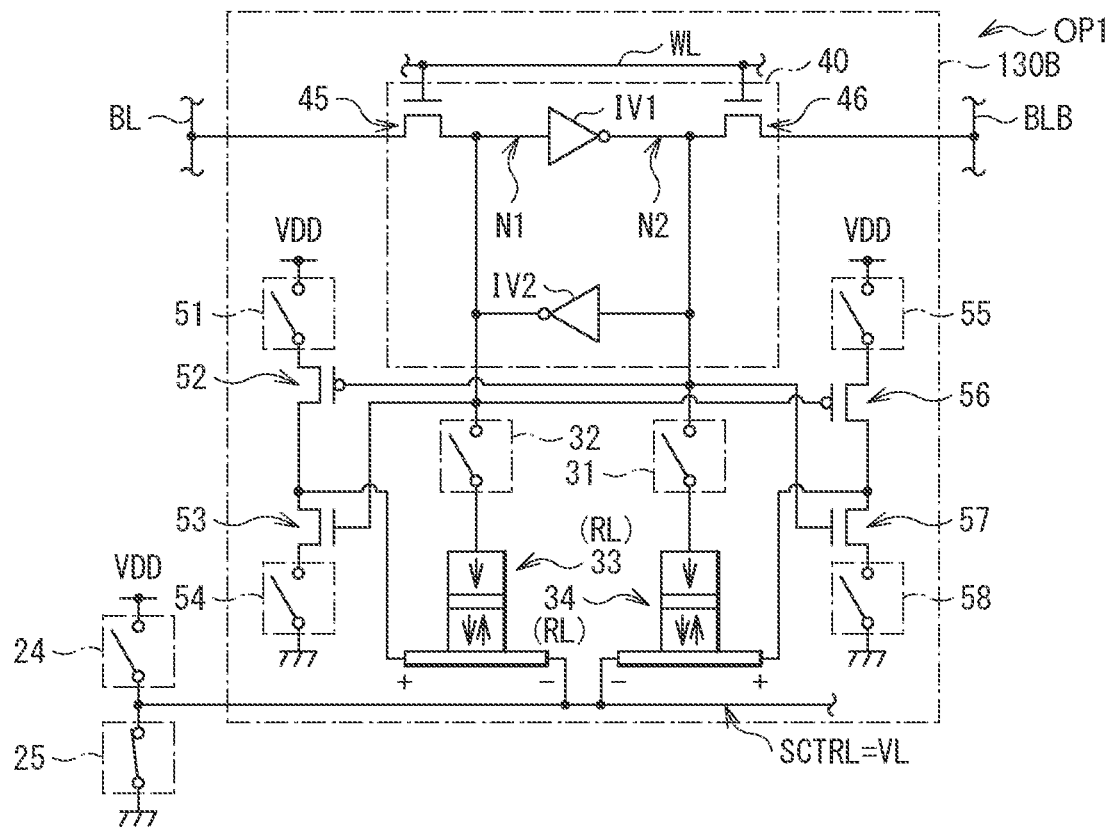

[FIG. 38B]
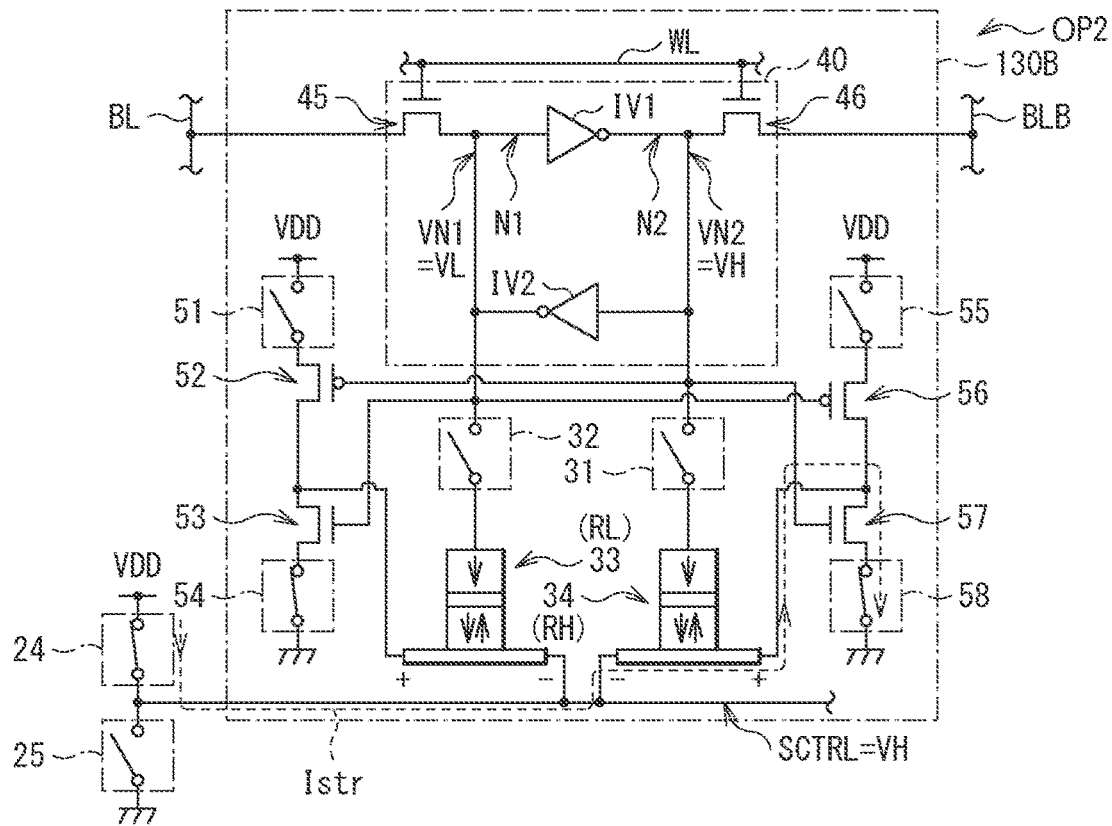
[FIG. 38C]
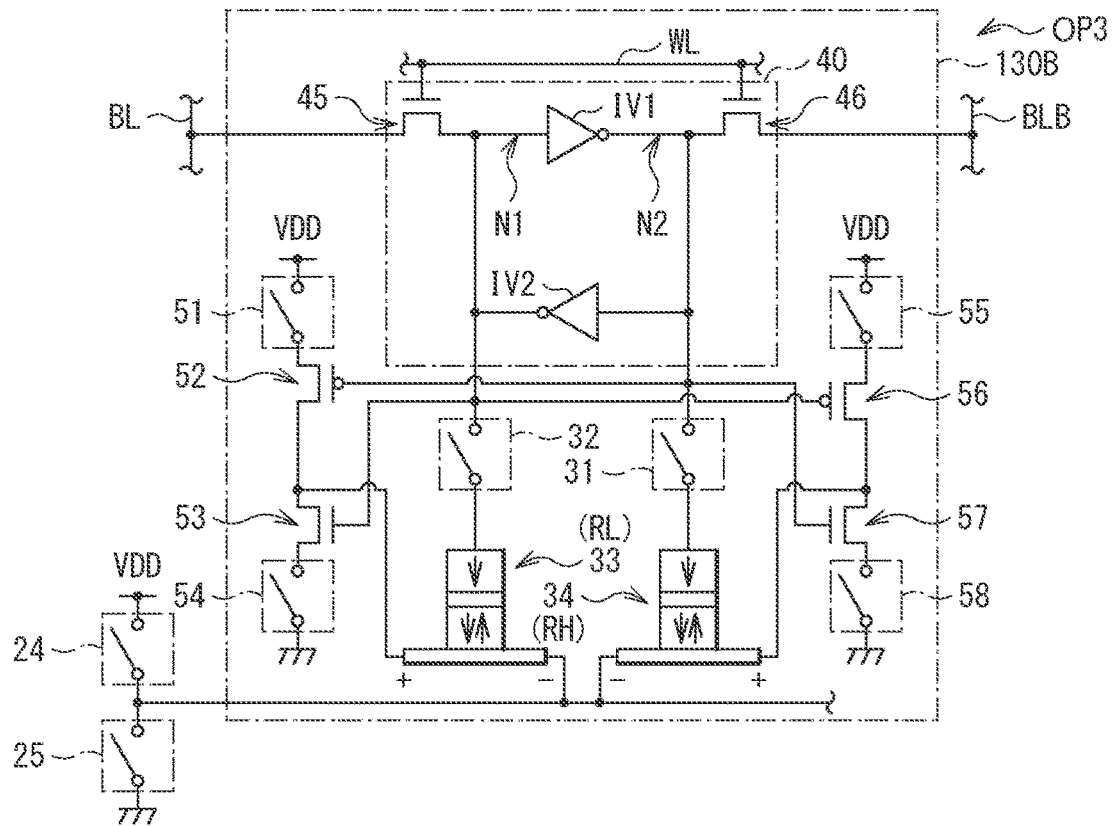

[FIG. 38D]
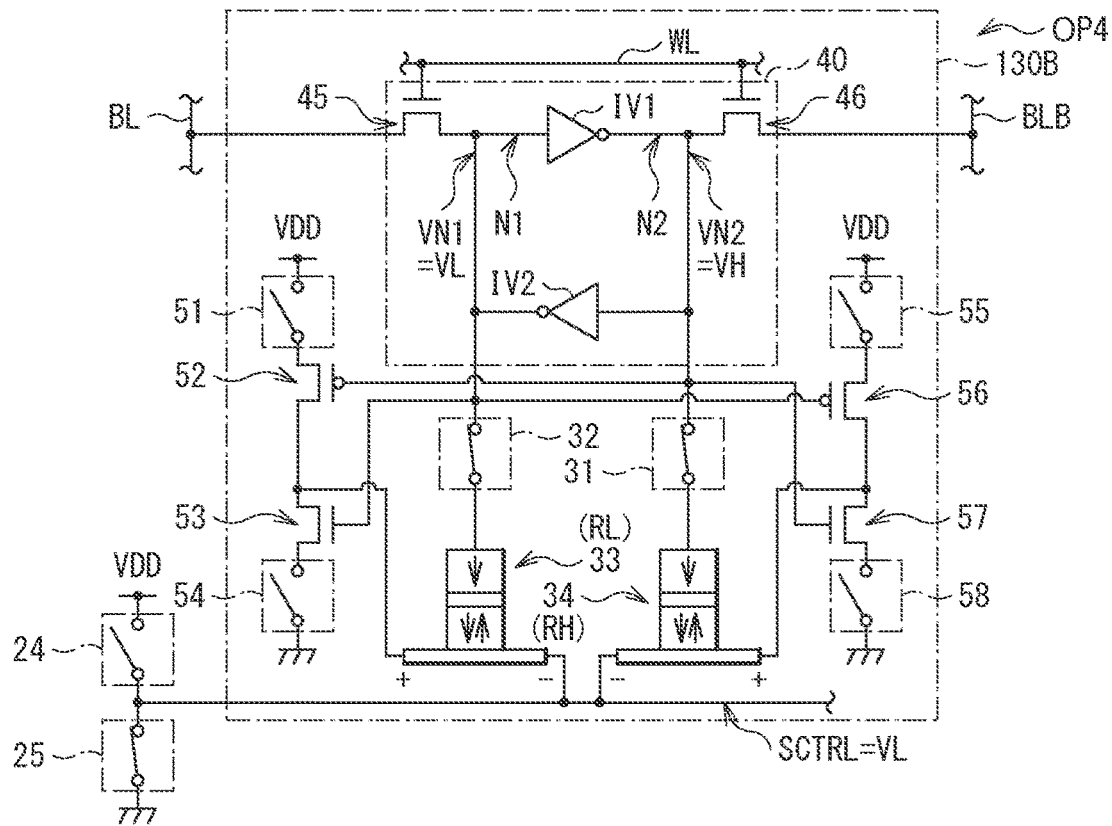
[FIG. 38E]
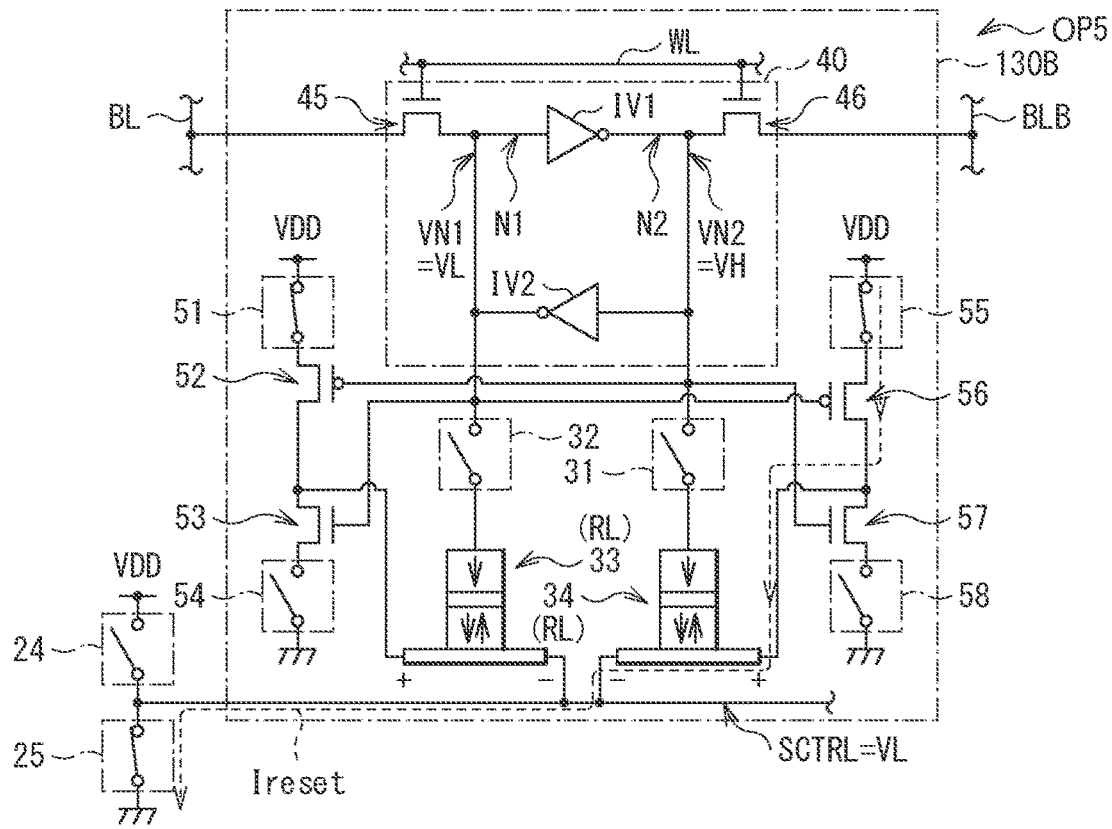

[FIG. 39]
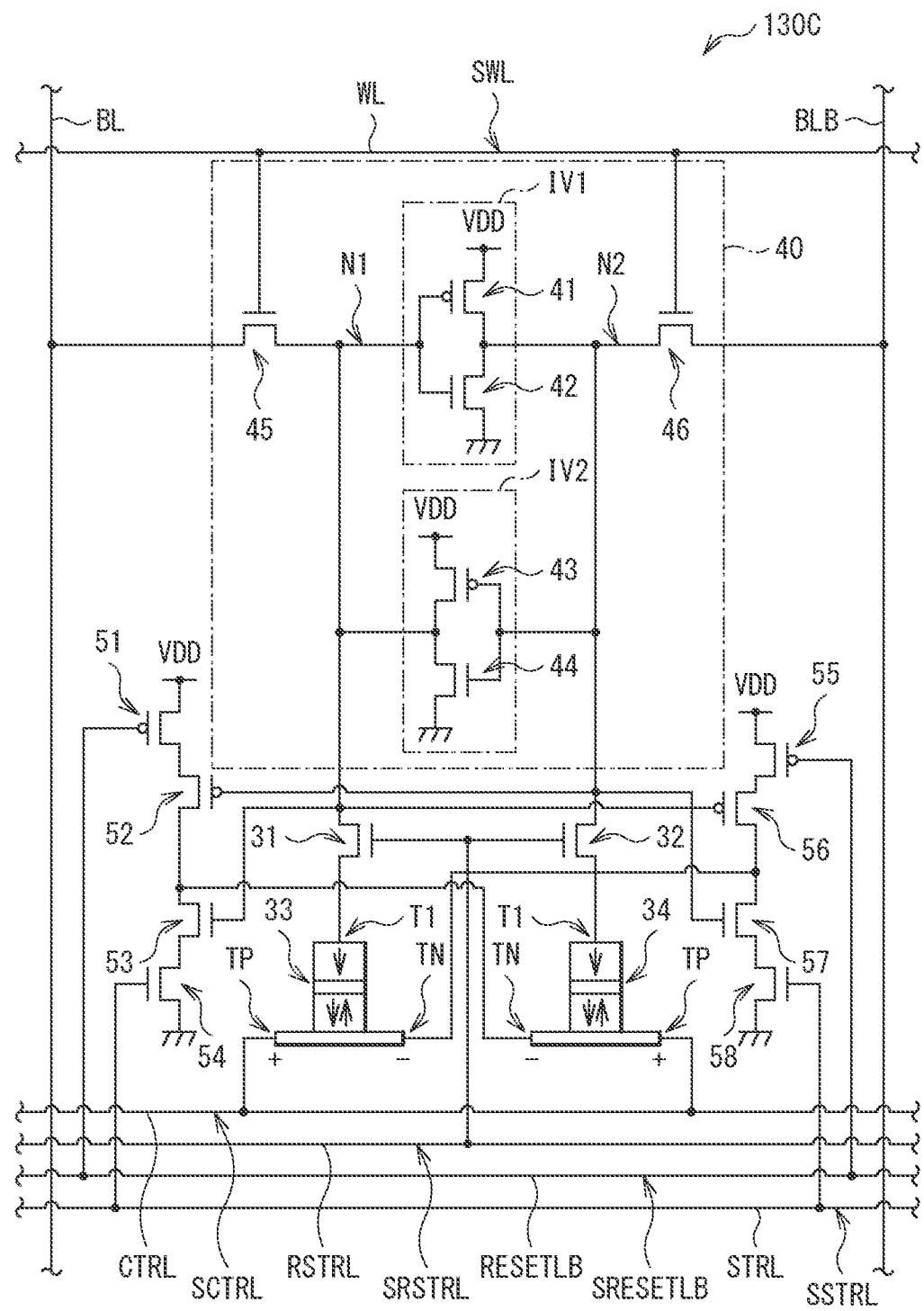

[FIG. 40A]
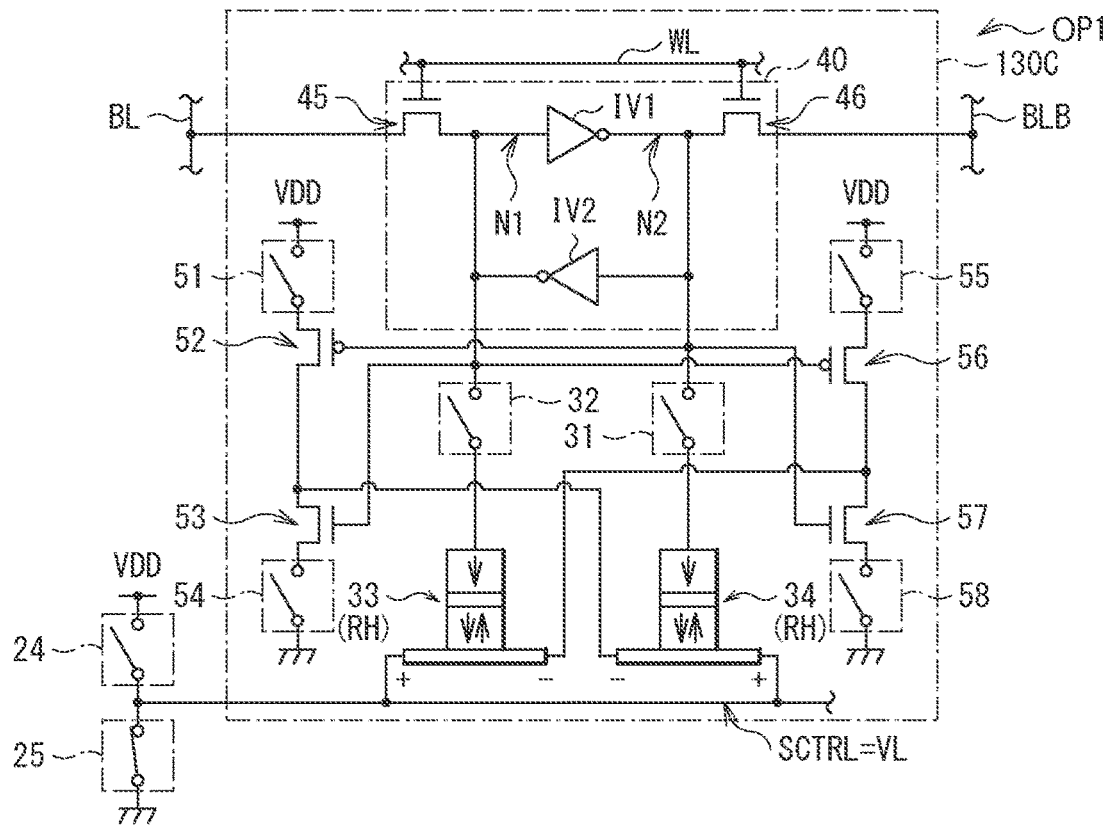
[FIG. 40B]
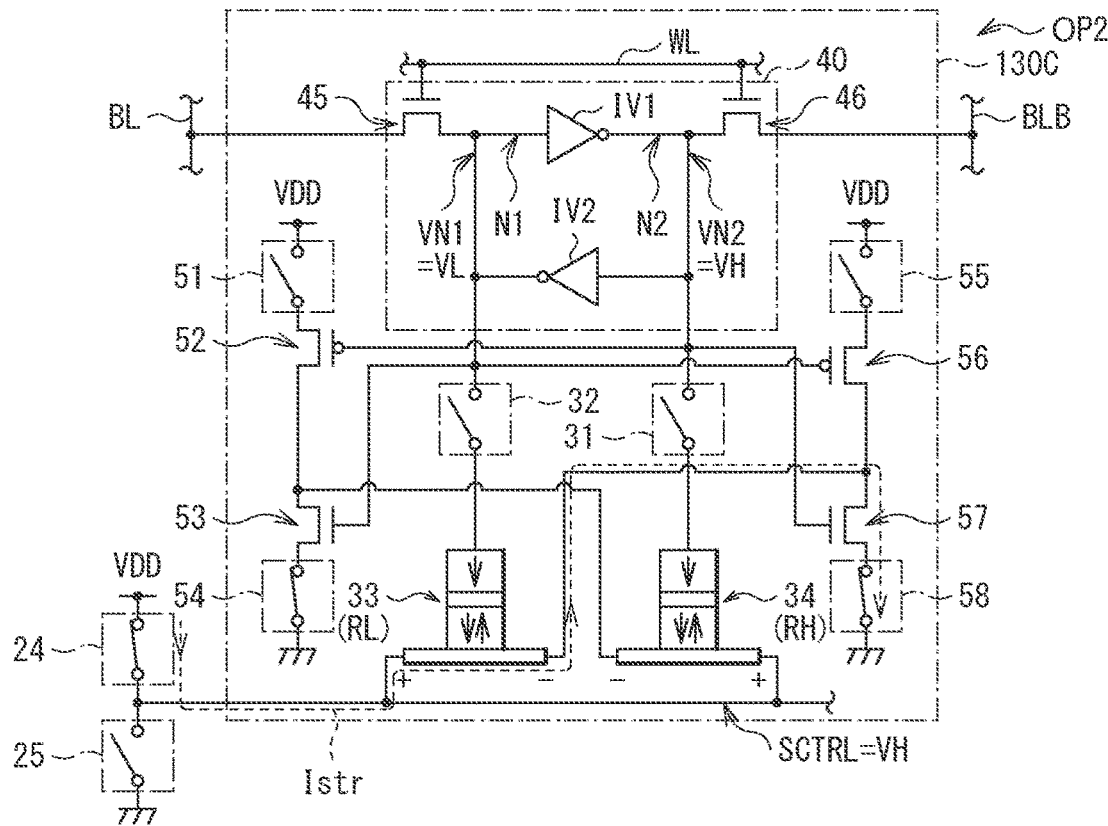

[FIG. 40C]
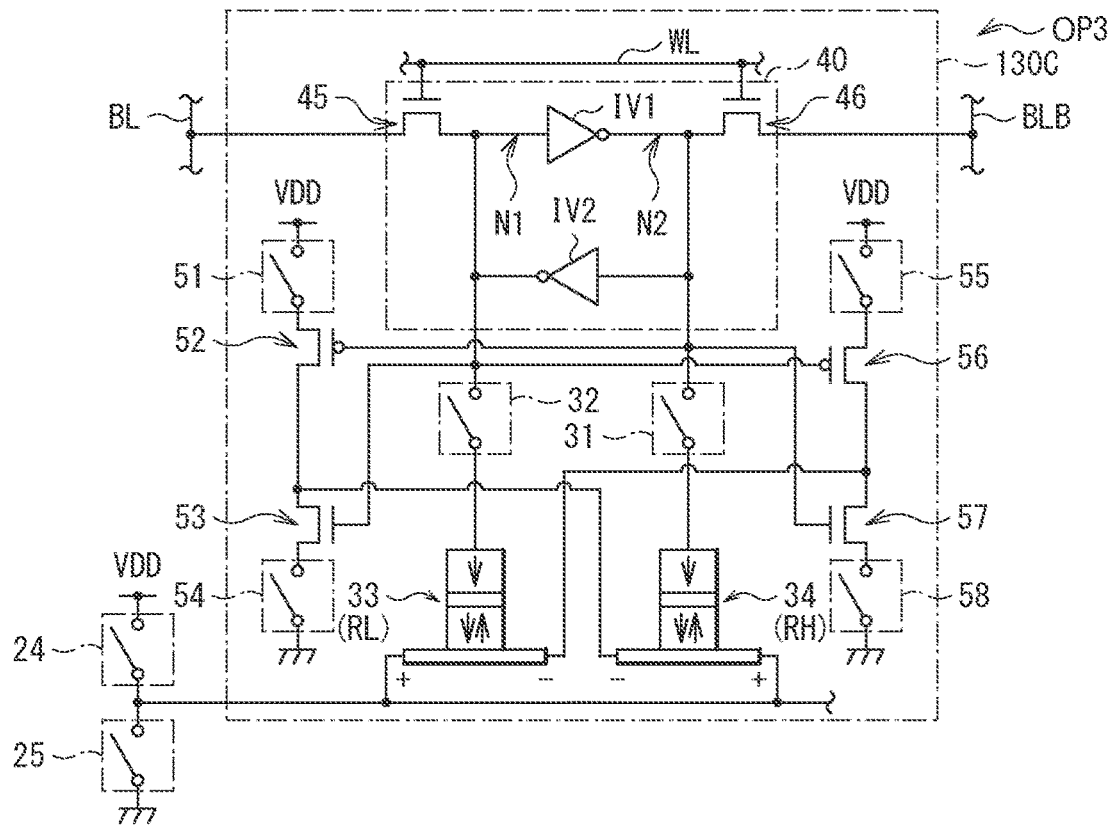
[FIG. 40D]
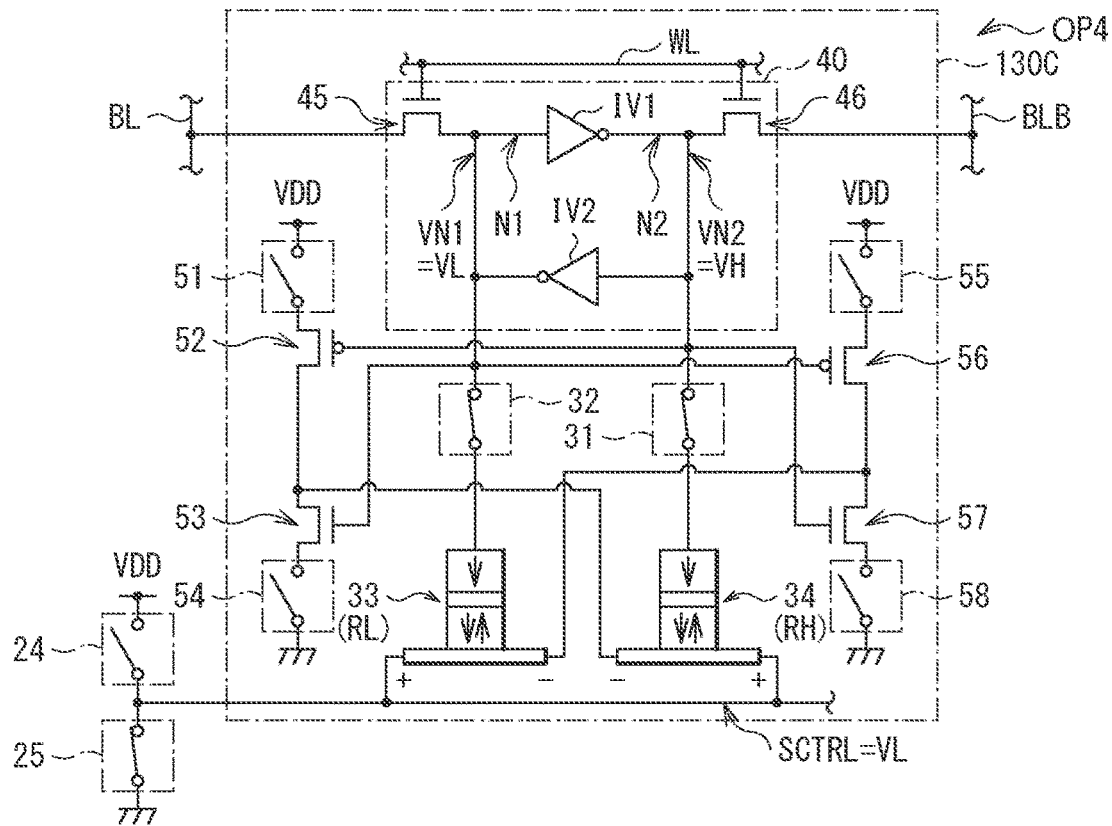

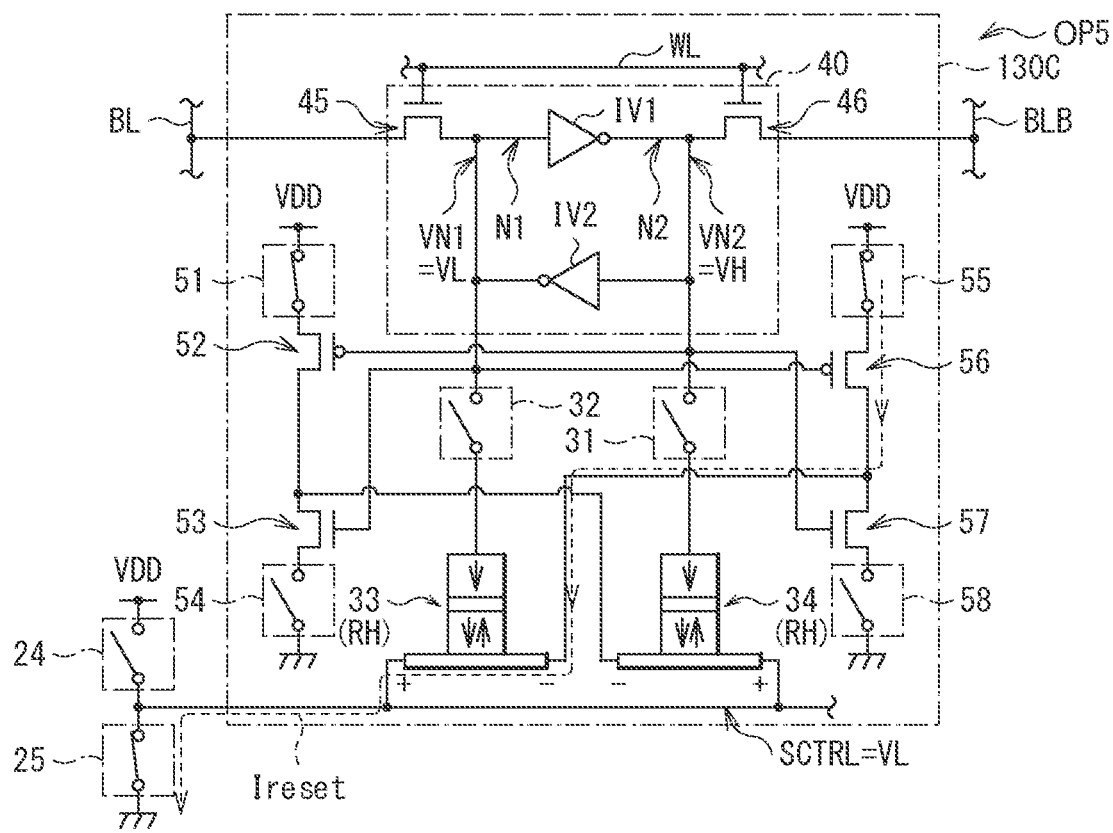
[FIG. 40E]

[FIG. 41]
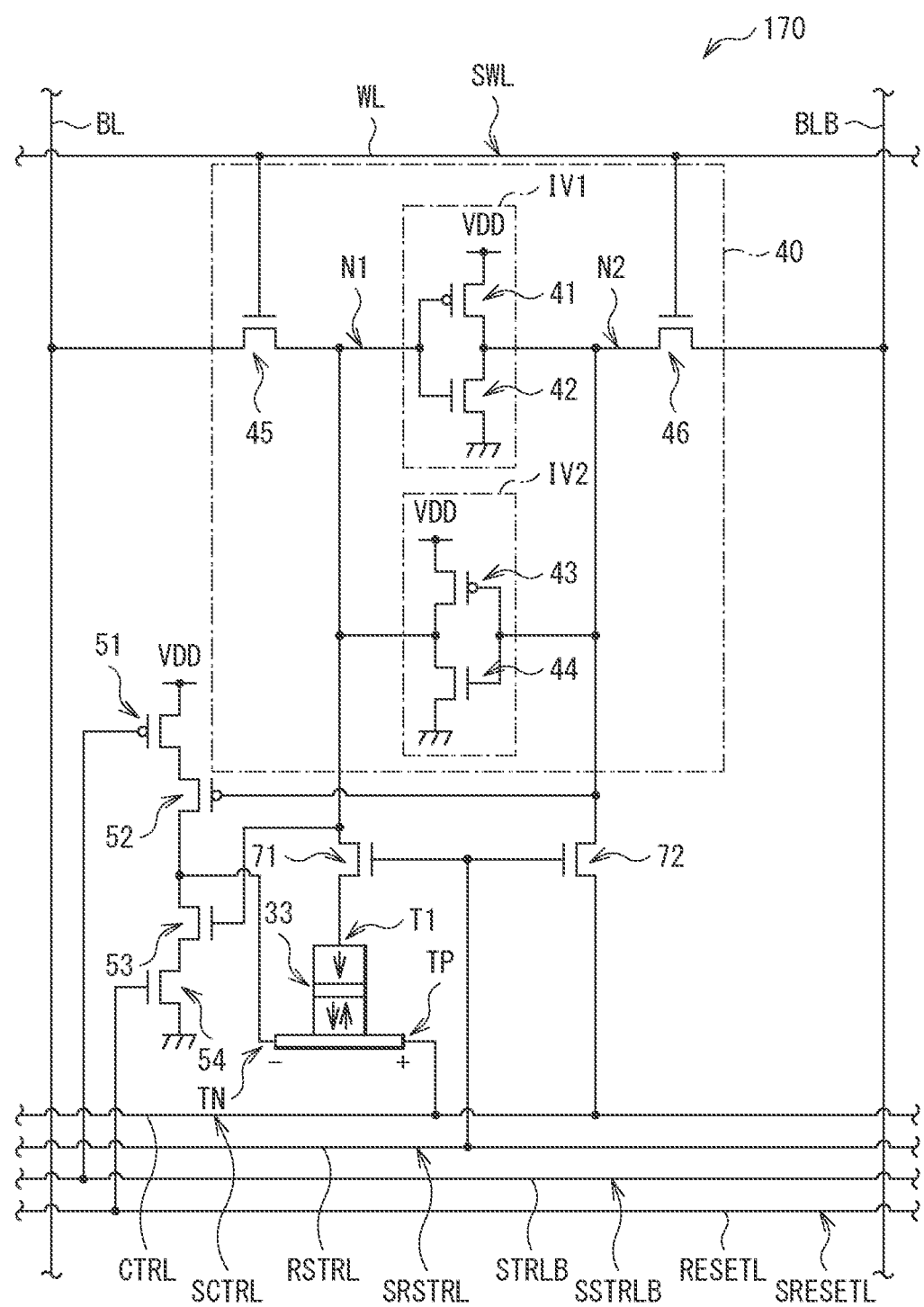

[ FIG. 42 ]
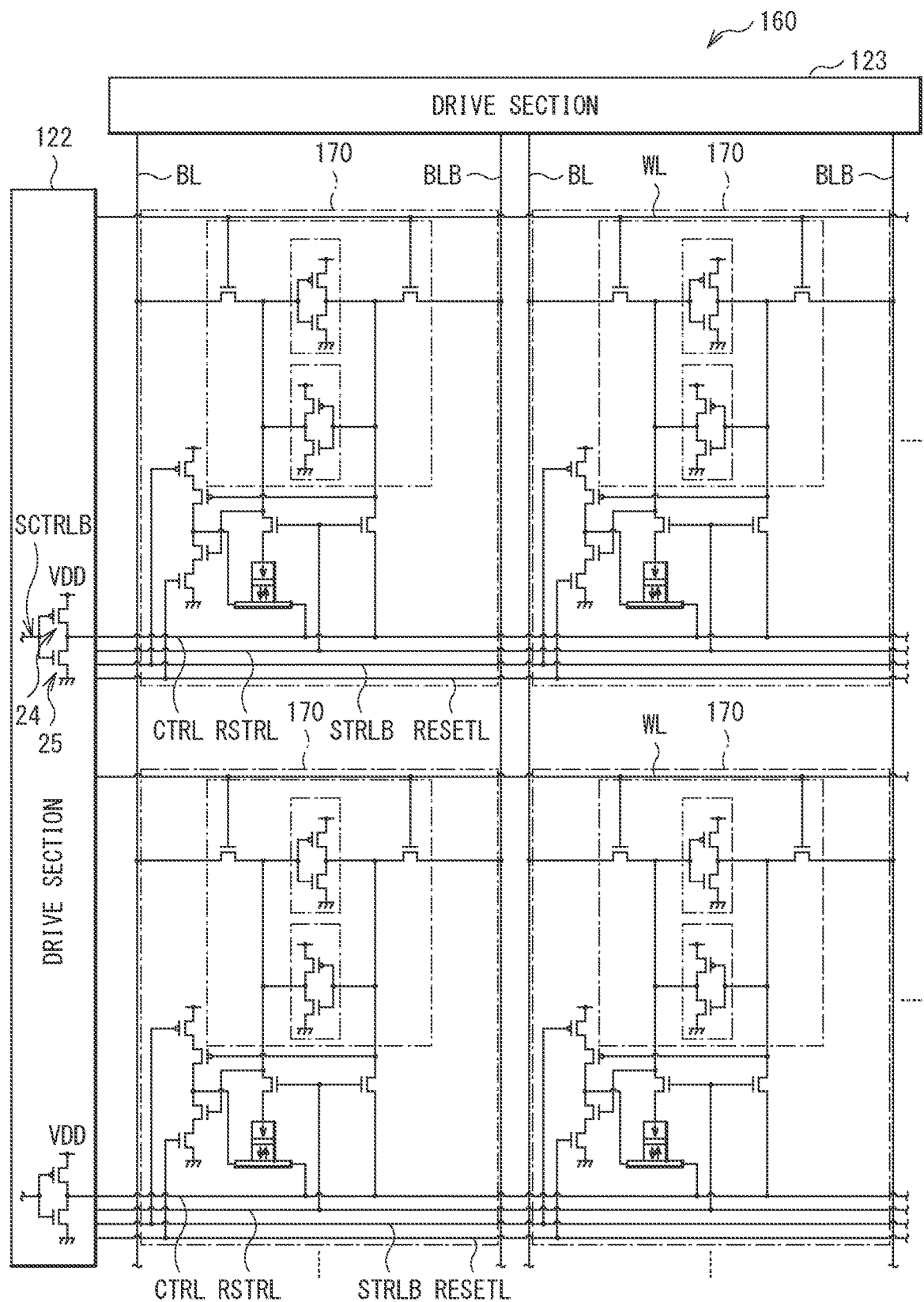

[ FIG. 43 ]
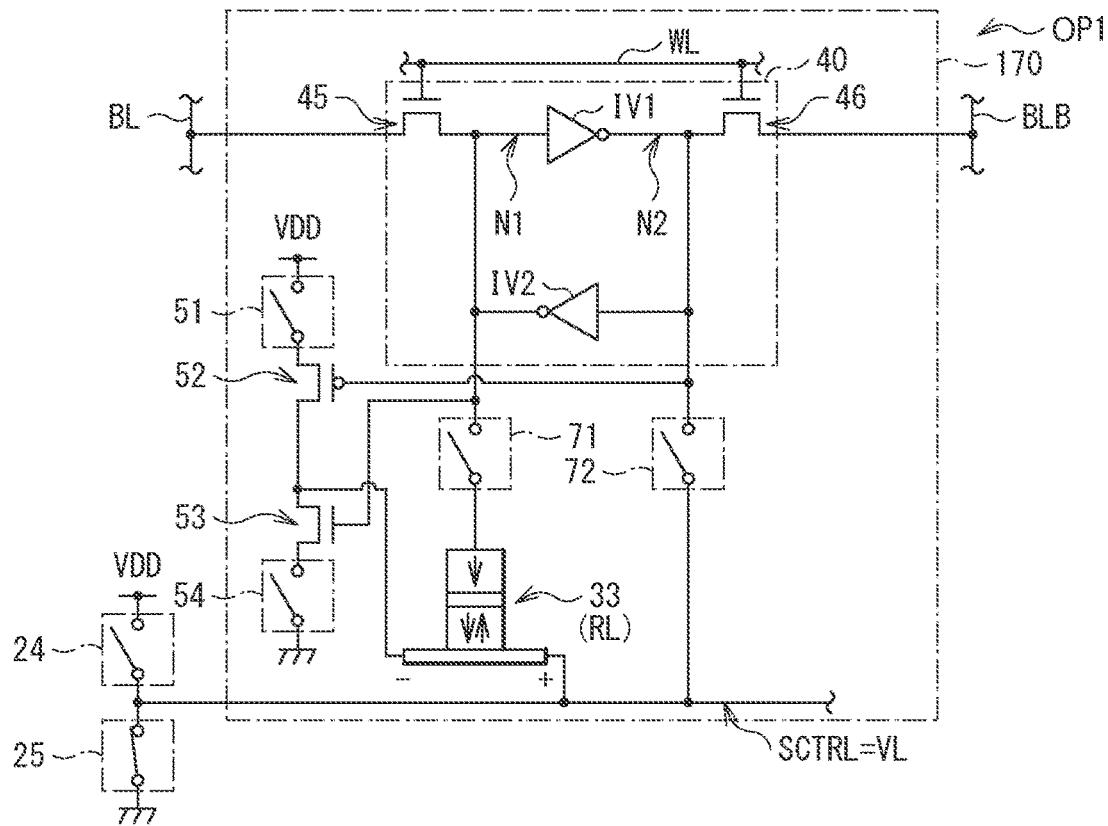
[ FIG. 44A ]
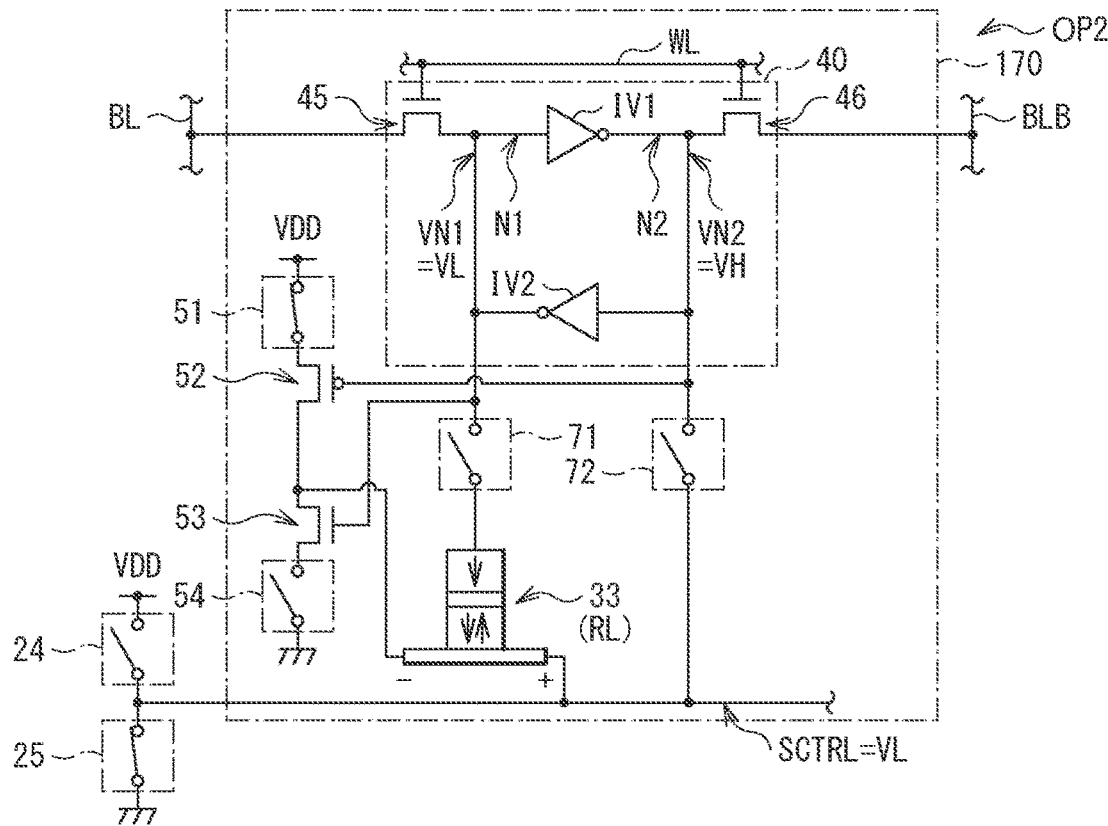

[ FIG. 44B ]
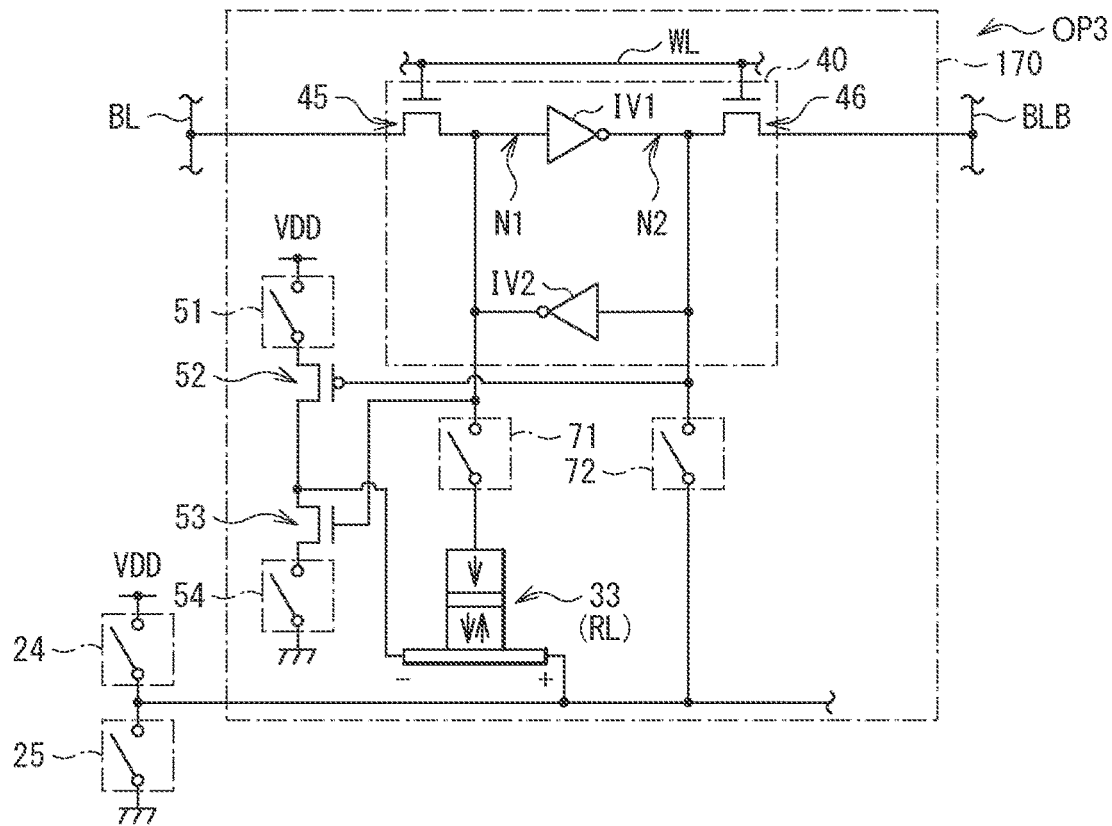
[ FIG. 44C ]
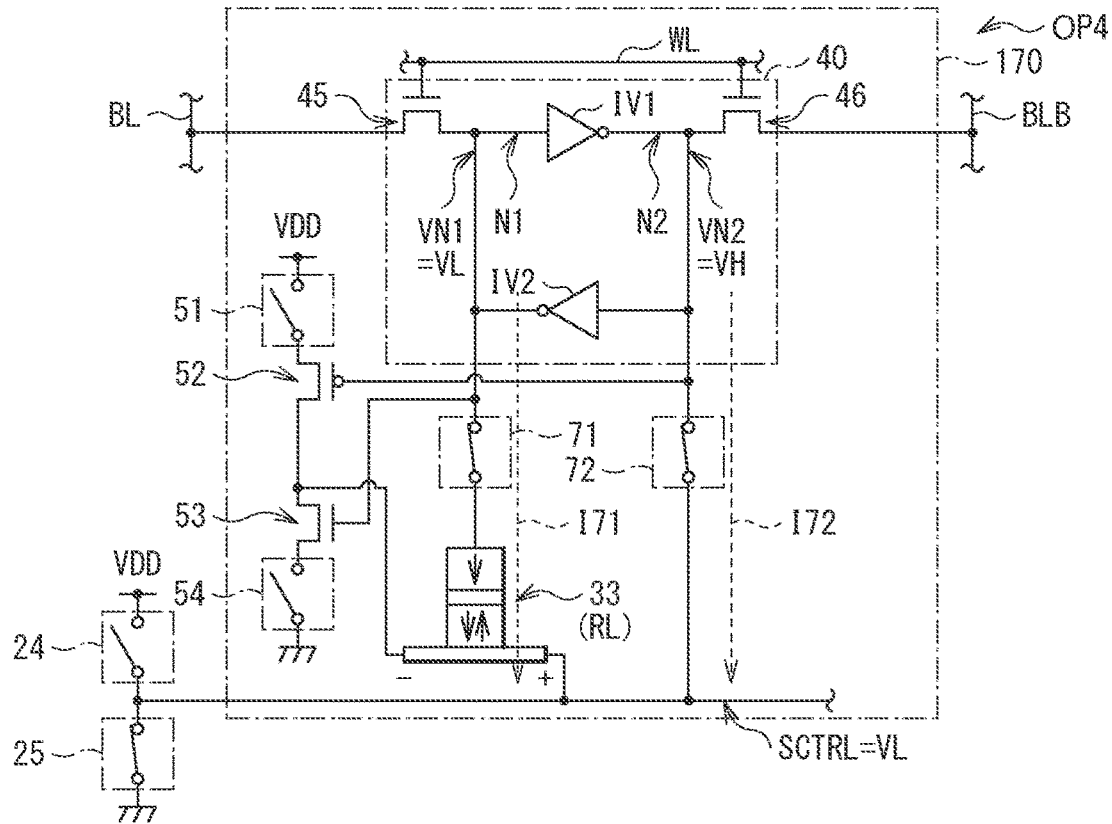

[ FIG. 44D ]
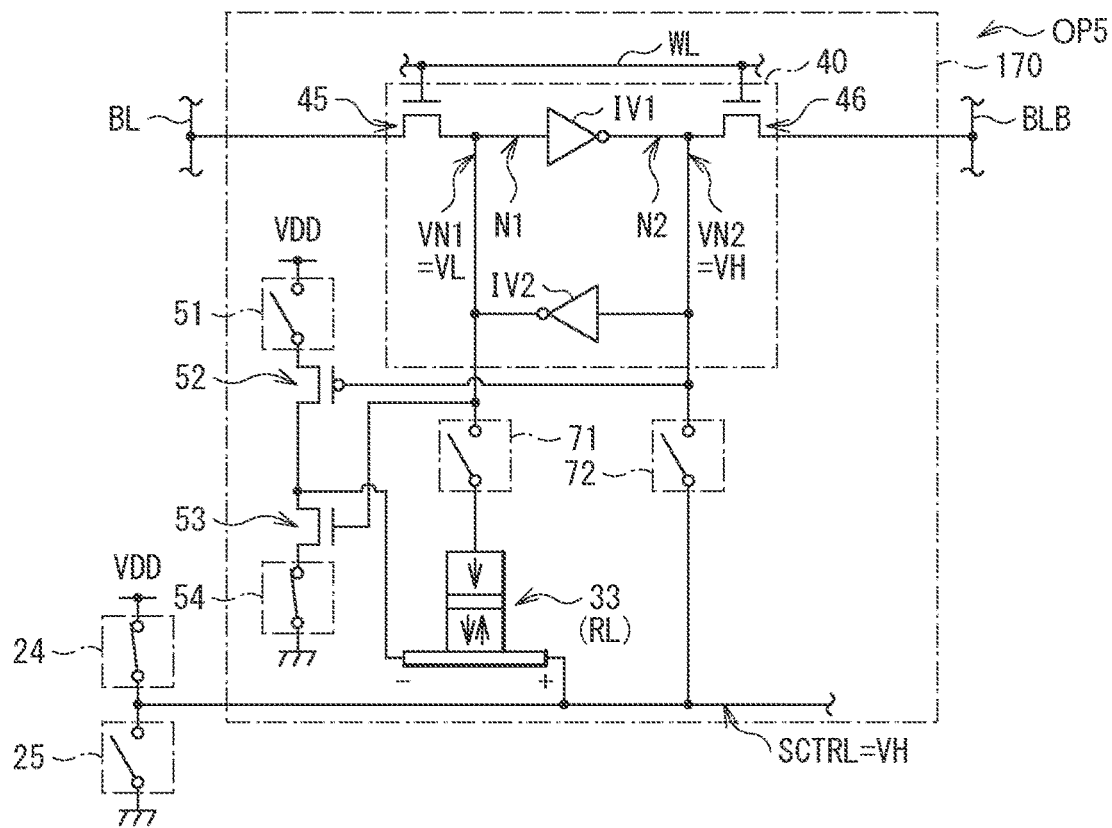
[ FIG. 45A ]
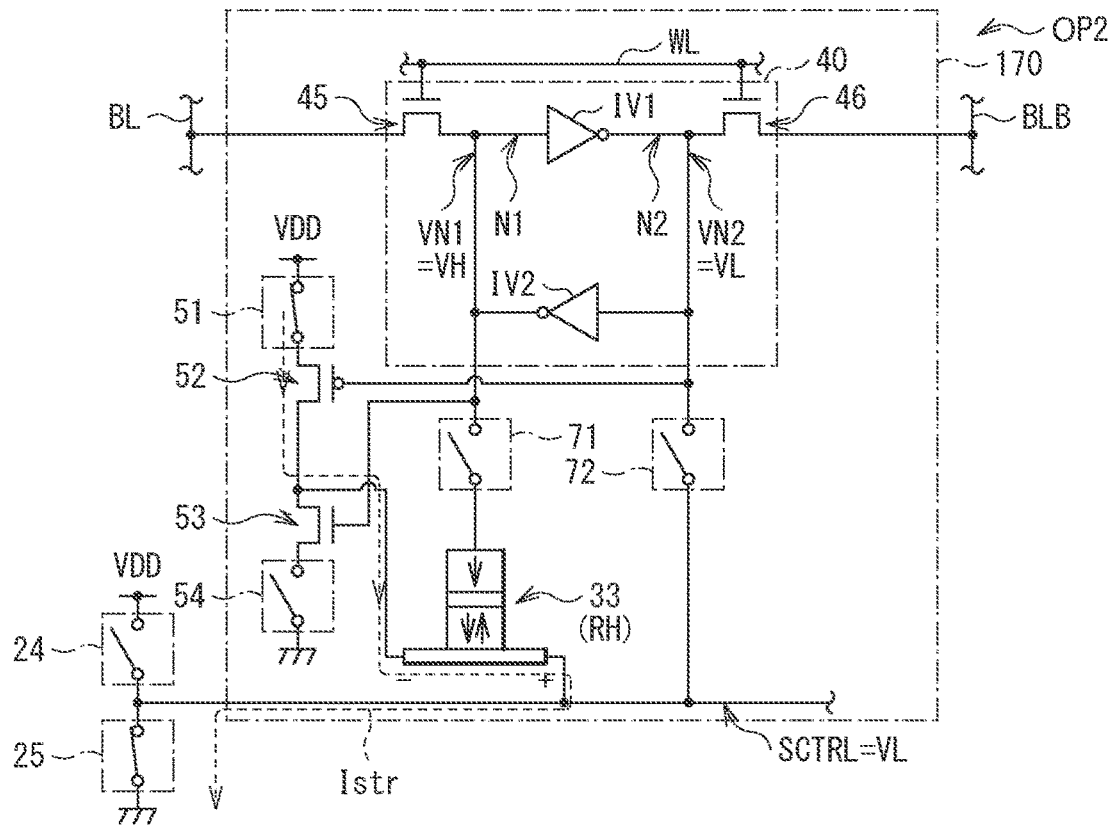

[FIG. 45B]
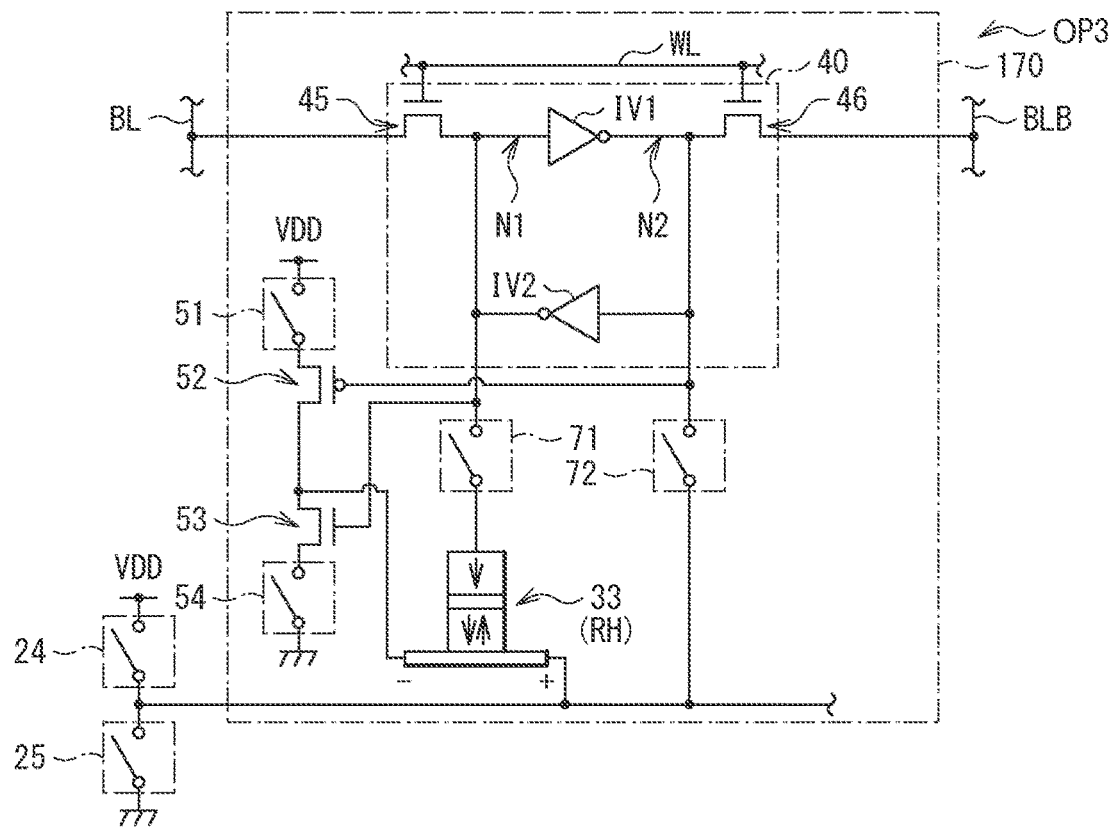
[FIG. 45C]
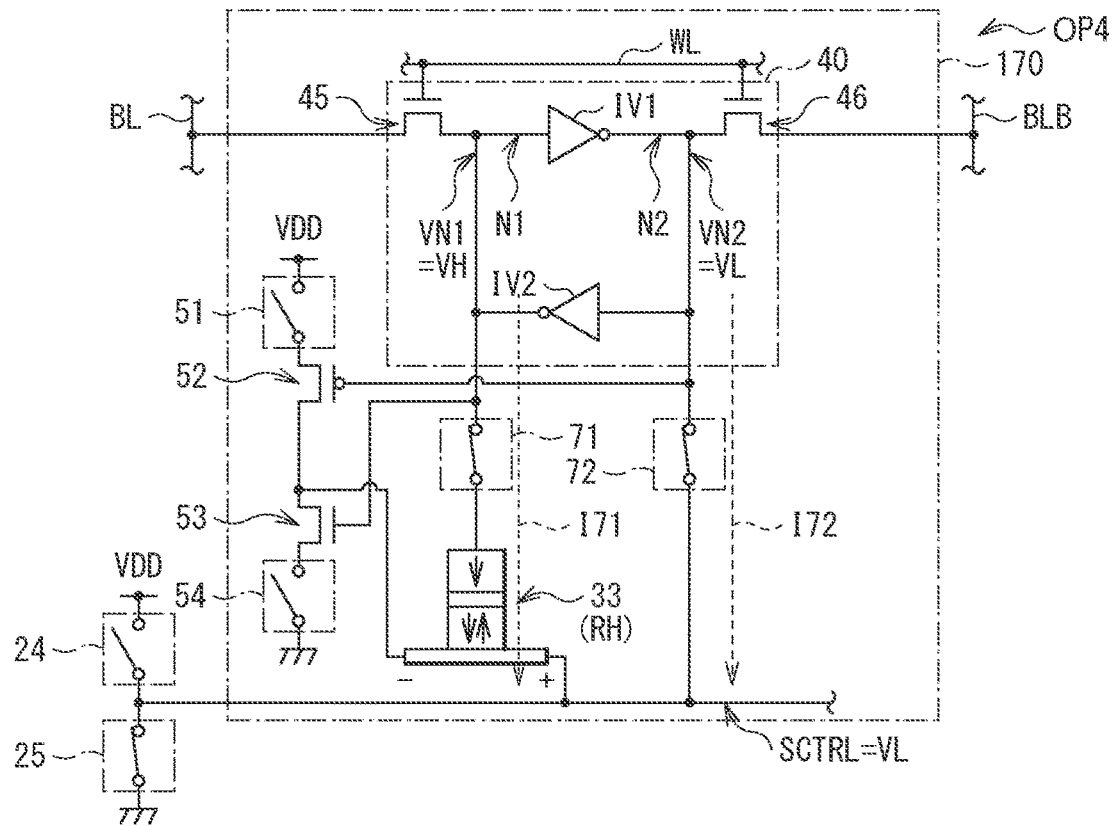

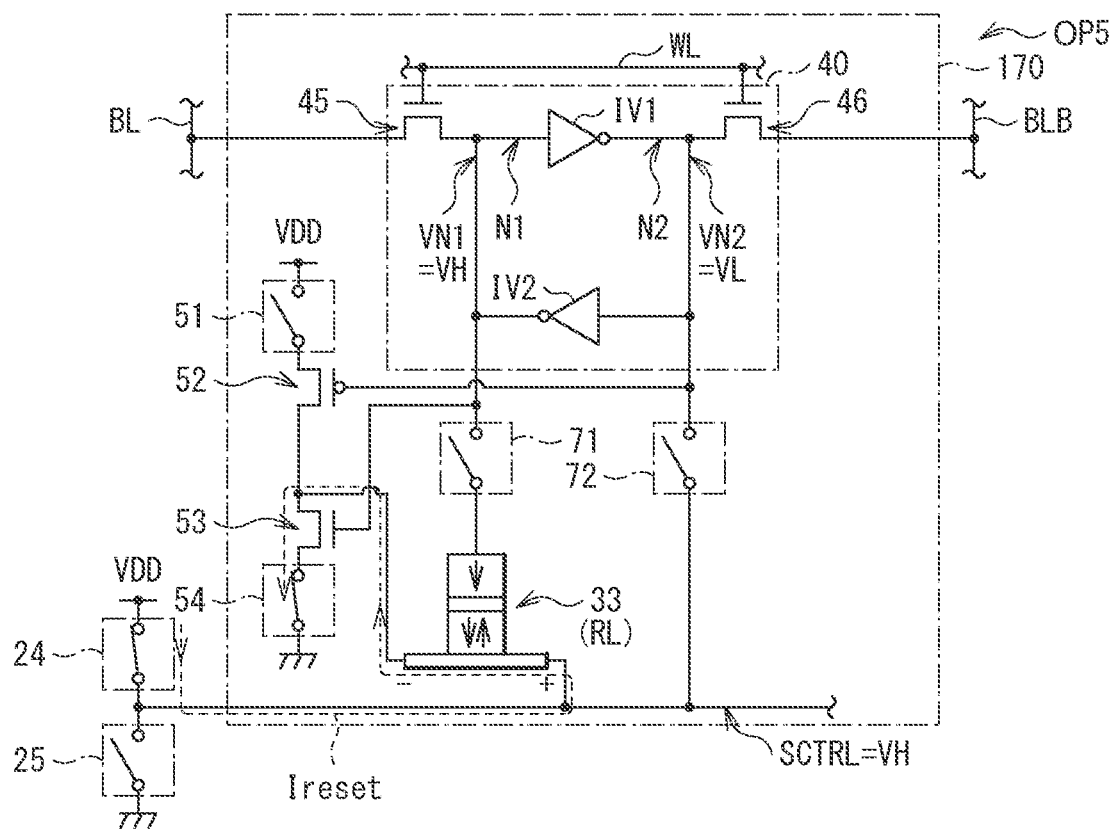
[FIG. 45D]

[ FIG. 46 ]
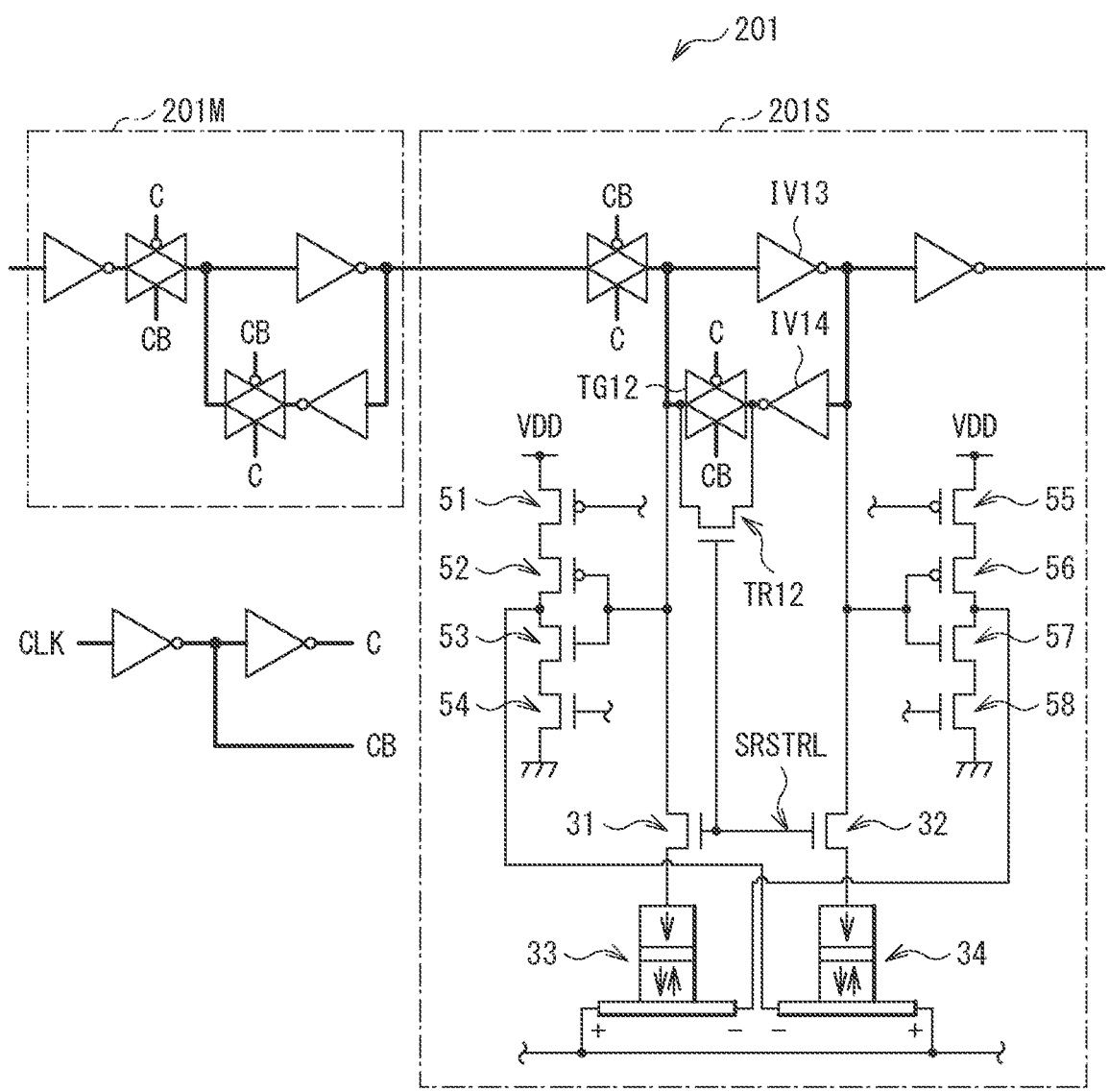

[ FIG. 47 ]
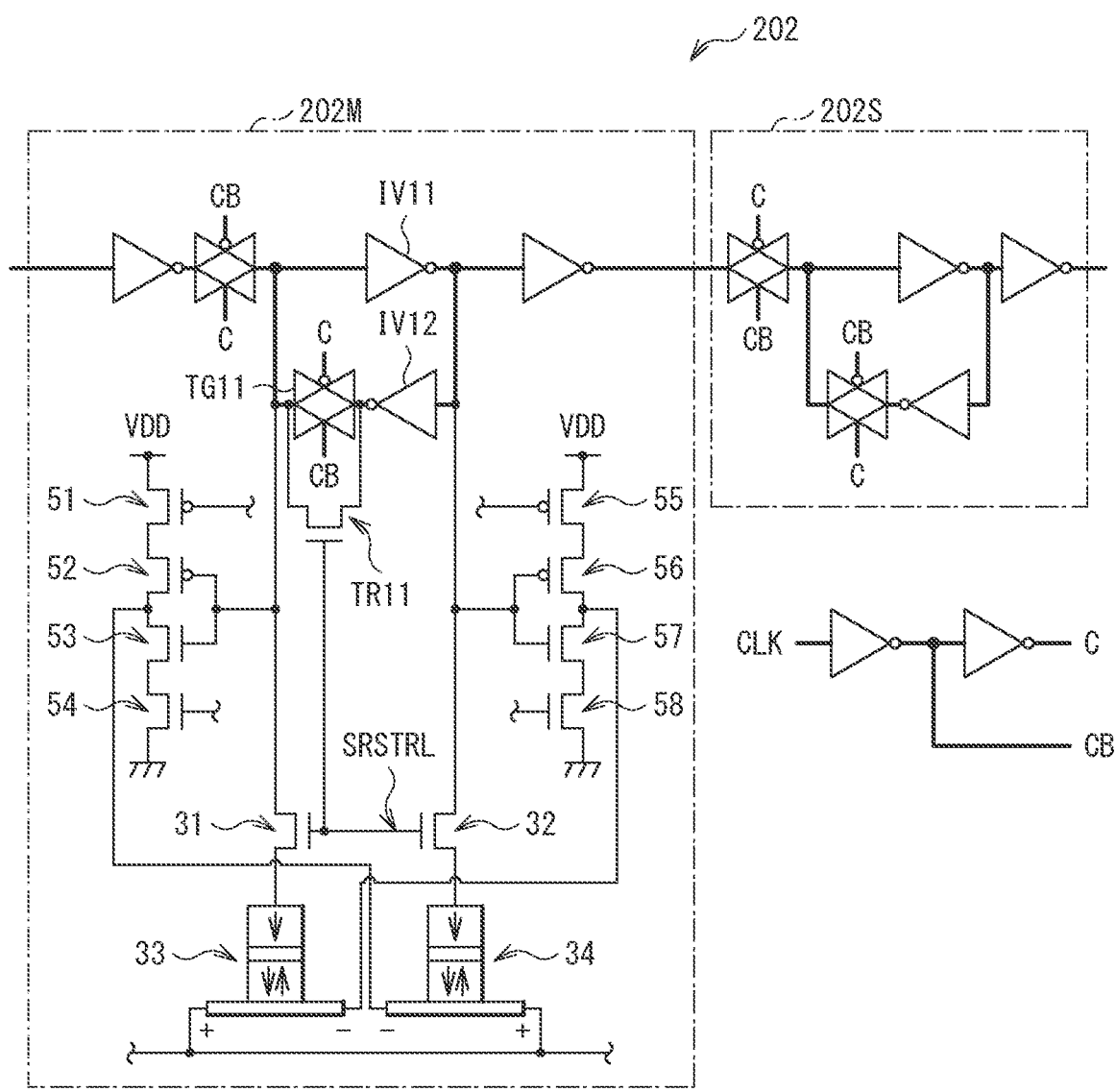

[ FIG. 48 ]
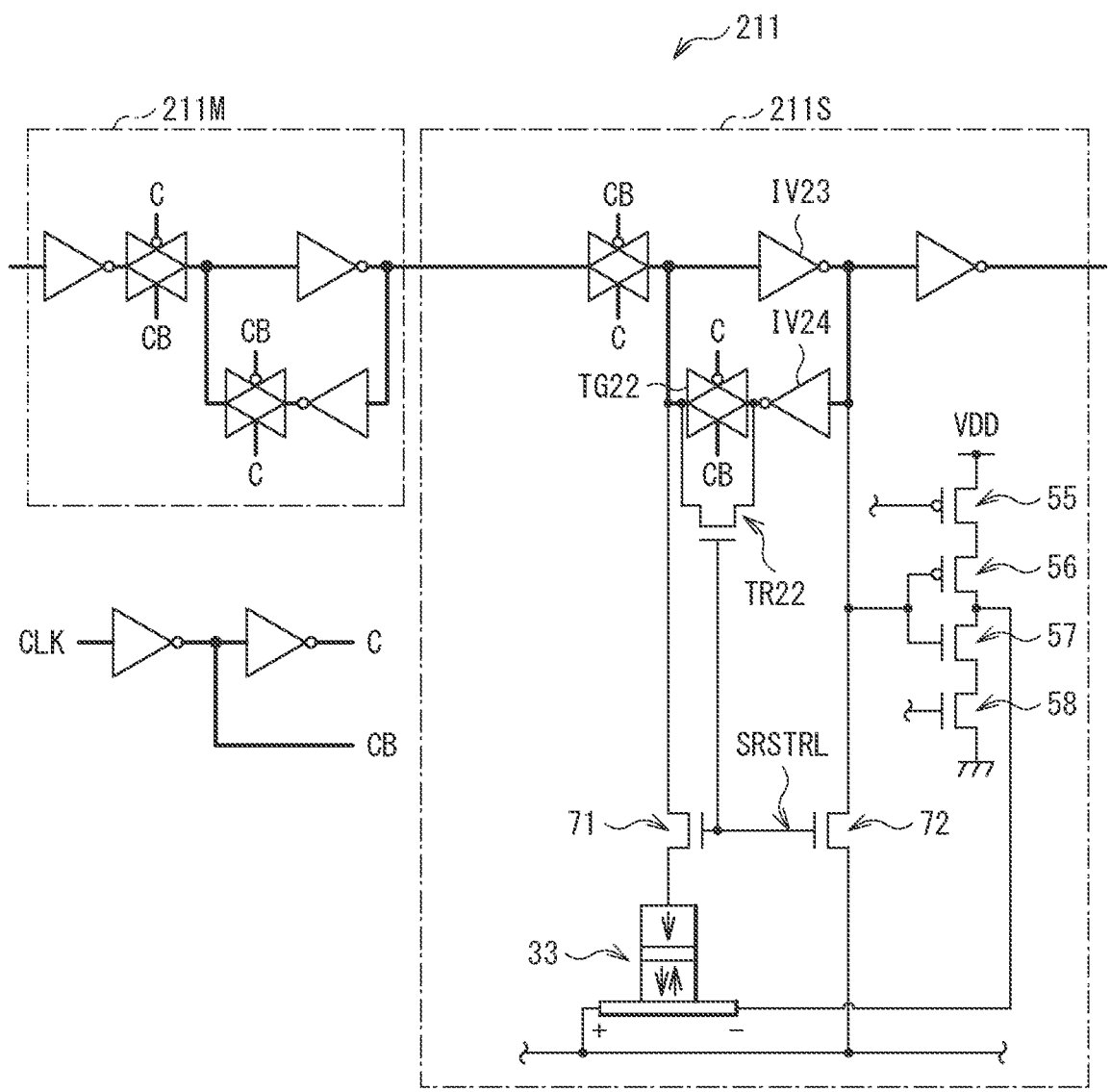

[FIG. 49]
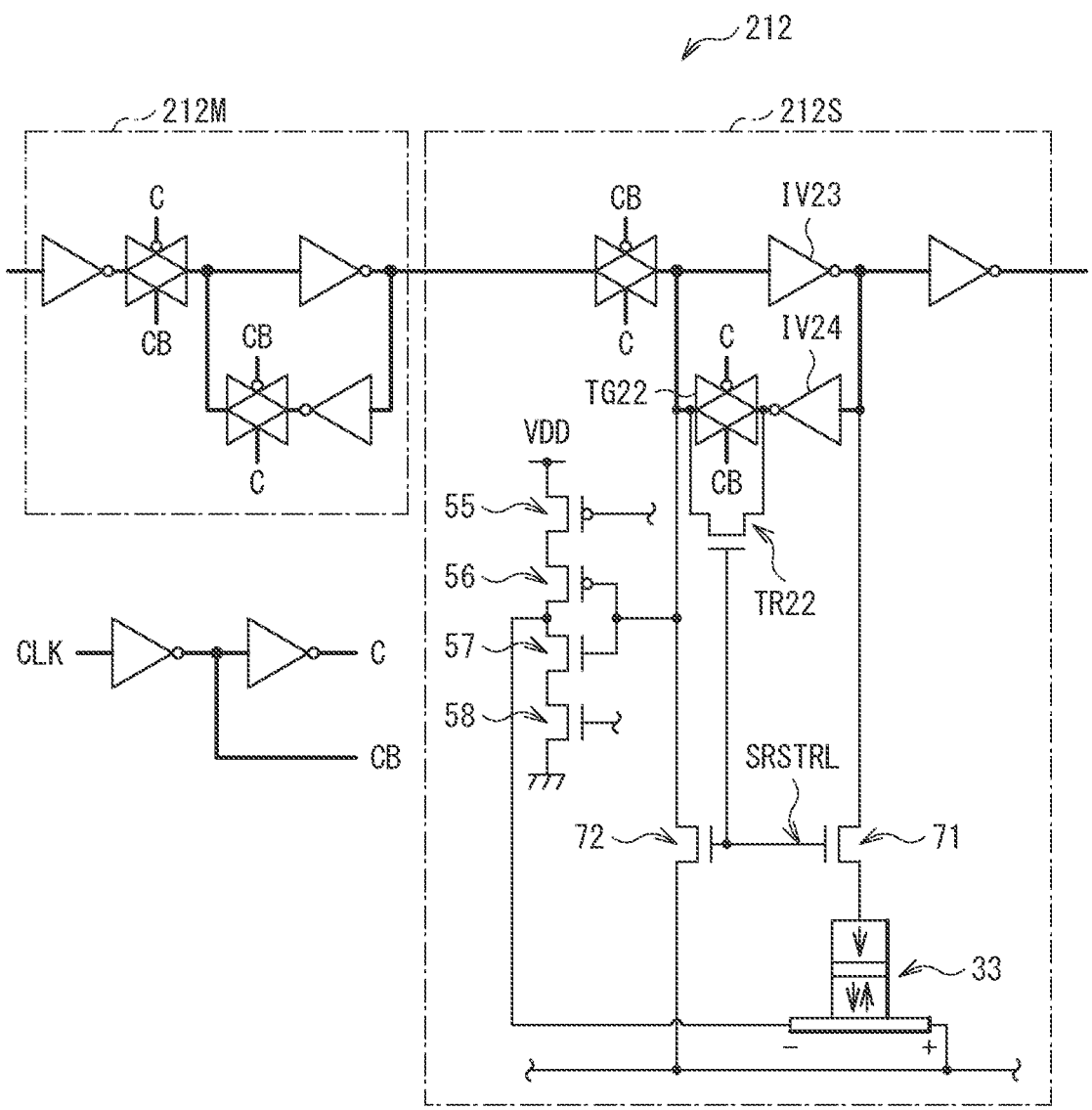

[FIG. 50]
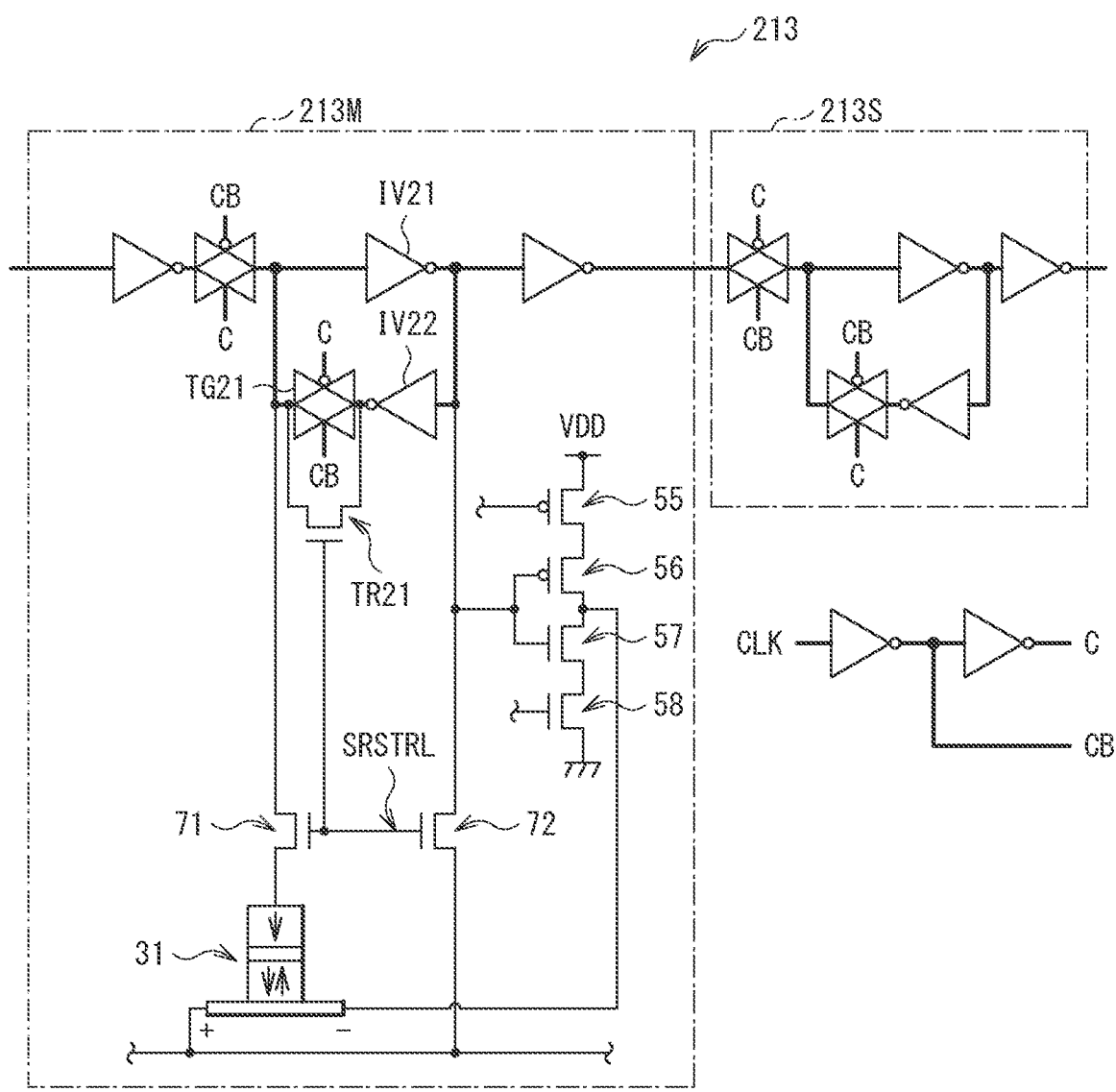

[ FIG. 51 ]
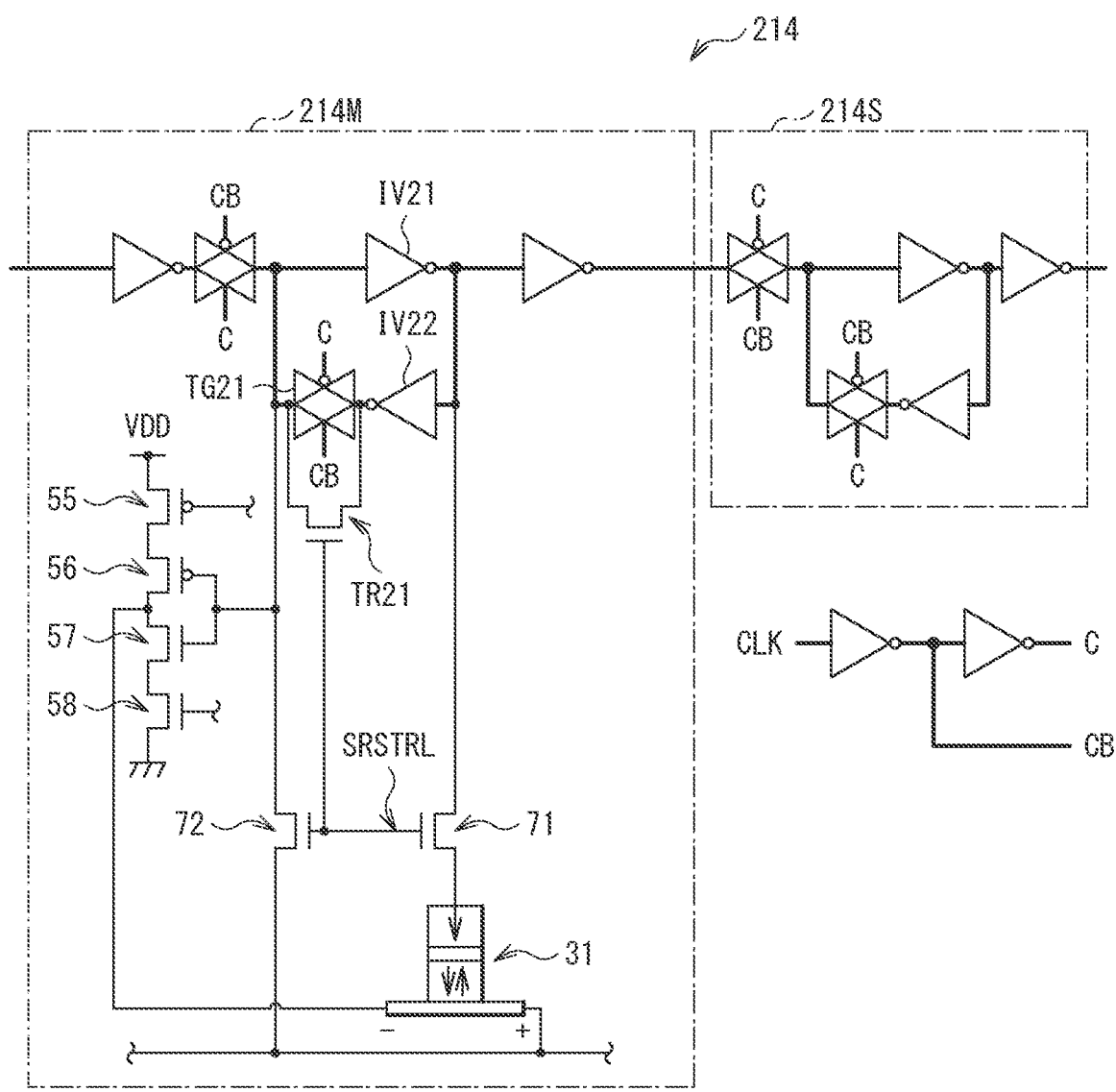

[FIG. 52]
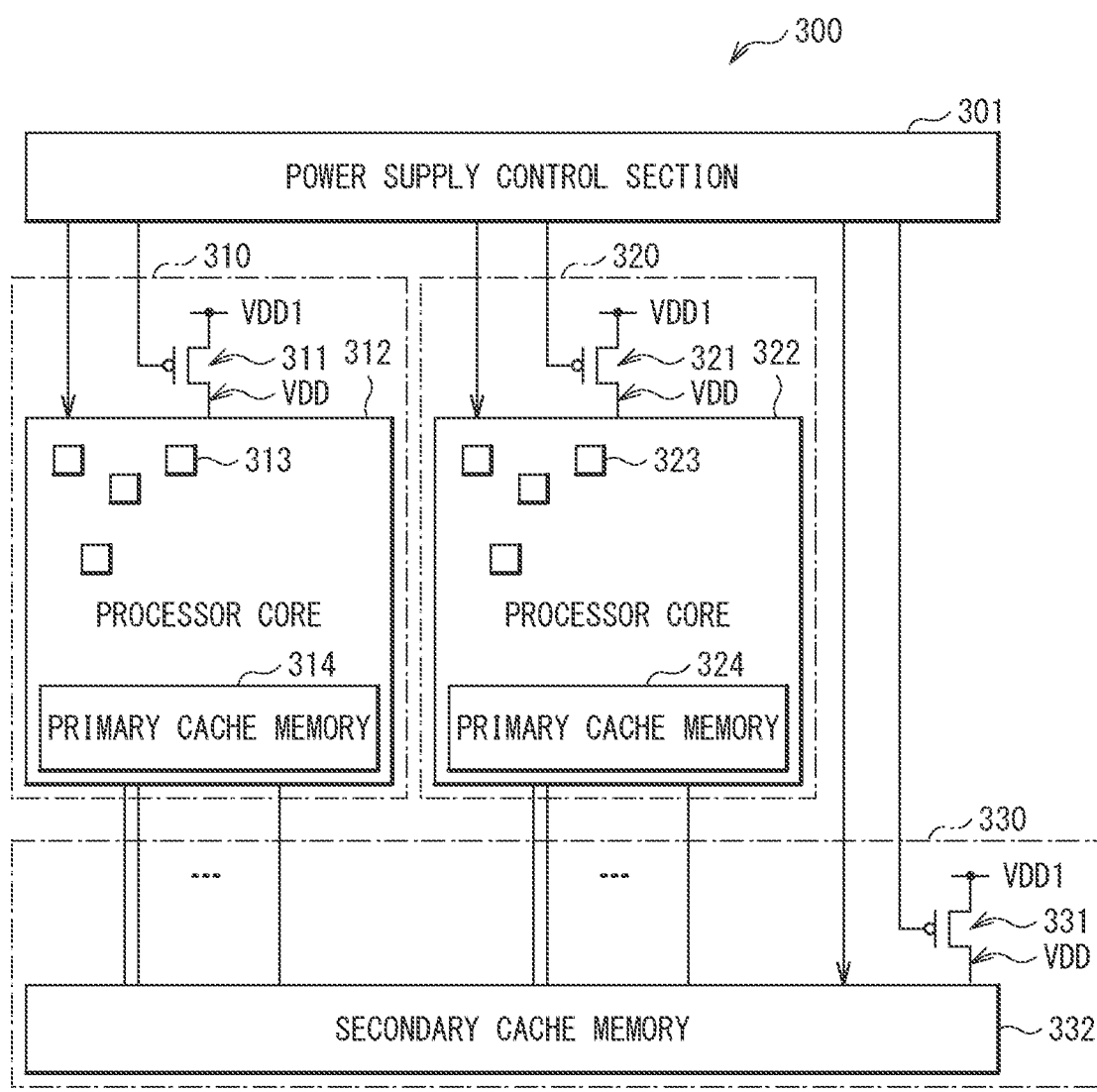

[ FIG. 53 ]
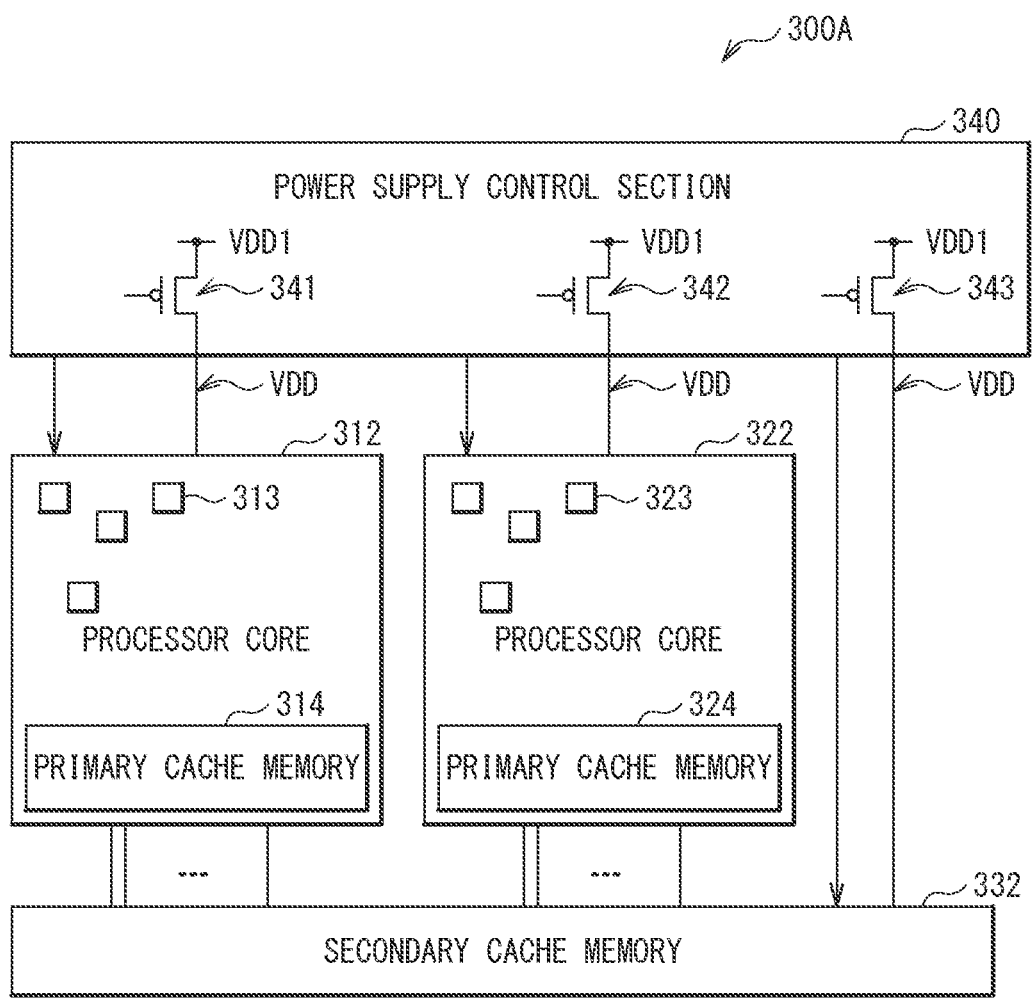

SEMICONDUCTOR CIRCUIT AND SEMICONDUCTOR CIRCUIT SYSTEM

CROSS REFERENCE TO RELATED APPLICATIONS

This application is a U.S. National Phase of International Patent Application No. PCT/JP2020/030757 filed on Aug. 13, 2020, which claims priority benefit of Japanese Patent Application No. JP 2019-160528 filed in the Japan Patent Office on Sep. 3, 2019. Each of the above-referenced applications is hereby incorporated herein by reference in its entirety.

TECHNICAL FIELD

The present disclosure relates to a semiconductor circuit and a semiconductor circuit system that are each configured to store data.

BACKGROUND ART

Electronic apparatuses are each desired to have low power consumption from the viewpoint of ecology. For example, so-called power gating technology is often used for semiconductor circuits. The power gating technology reduces power consumption by selectively stopping power supply to a portion of the circuits. The circuit whose power supply is stopped in this way is desired to return to the operation state in which power supply has not yet been stopped as soon as power supply is restarted. One of methods of achieving such a short-time return operation is to incorporate a nonvolatile storage element in a circuit. For example, PTL 1 discloses a circuit in which SRAM (Static Random Access Memory) that is a volatile memory and a spin transfer torque storage element are combined.

CITATION LIST

Patent Literature

PTL 1: International Publication No. WO 2009/028298

SUMMARY OF THE INVENTION

Incidentally, a circuit including such a storage element is requested to have high reliability such as endurance or retention. Further improvement in reliability is expected.

It is desirable to provide a semiconductor circuit and a semiconductor circuit system that each make it possible to increase reliability.

A semiconductor circuit according to an embodiment of the present disclosure includes: a first circuit; a second circuit; a first storage element; a first transistor; a second transistor; and a third transistor. The first circuit is configured to generate an inverted voltage of a voltage at a first node. The first circuit is configured to apply the inverted voltage to a second node. The second circuit is configured to generate an inverted voltage of a voltage at the second node. The second circuit is configured to apply the inverted voltage to the first node. The first storage element includes a first terminal, a second terminal, and a third terminal. The first storage element is configured to set a resistance state between the first terminal and the second and the third terminals to a first resistance state or a second resistance state in accordance with a direction of a current flowing between the second terminal and the third terminal. The first transistor includes a drain coupled to the first node, a source coupled to the first terminal of the first storage element, and a gate. The first transistor is configured to couple the first node to the first terminal of the first storage element by being turned on. The second transistor includes a gate coupled to the first node or the second node, a drain coupled to the second terminal of the first storage element, and a source. The second transistor is configured to apply a first voltage to the second terminal of the first storage element by being turned on. The third transistor includes a gate coupled to the first node or the second node, a drain coupled to the second terminal of the first storage element, and a source. The third transistor is configured to apply a second voltage to the second terminal of the first storage element by being turned on. The second voltage is different from the first voltage.

A semiconductor circuit system according to an embodiment of the present disclosure includes: a storage section; and a control section. The storage section includes: a first circuit, a second circuit, a first storage element, a first transistor, a second transistor, and a third transistor. The first circuit is configured to generate an inverted voltage of a voltage at a first node. The first circuit is configured to apply the inverted voltage to a second node. The second circuit is configured to generate an inverted voltage of a voltage at the second node. The second circuit is configured to apply the inverted voltage to the first node. The first storage element includes a first terminal, a second terminal, and a third terminal. The first storage element is configured to set a resistance state between the first terminal and the second and the third terminals to a first resistance state or a second resistance state in accordance with a direction of a current flowing between the second terminal and the third terminal. The first transistor includes a drain coupled to the first node, a source coupled to the first terminal of the first storage element, and a gate. The first transistor is configured to couple the first node to the first terminal of the first storage element by being turned on. The second transistor includes a gate coupled to the first node or the second node, a drain coupled to the second terminal of the first storage element, and a source. The second transistor is configured to apply a first voltage to the second terminal of the first storage element by being turned on. The third transistor includes a gate coupled to the first node or the second node, a drain coupled to the second terminal of the first storage element, and a source. The third transistor is configured to apply a second voltage to the second terminal of the first storage element by being turned on. The second voltage is different from the first voltage. The control section is configured to control power supply to the storage section.

In the semiconductor circuit and the semiconductor circuit system according to the respective embodiments of the present disclosure, the first circuit and the second circuit apply the inverted voltages to the first node and the second node. The first node is coupled to the drain of the first transistor. The source of the first transistor is coupled to the first terminal of the first storage element. The second terminal of the first storage element is coupled to the drain of the second transistor and the drain of the third transistor. The gate of the second transistor is coupled to the first node or the second node and the gate of the third transistor is coupled to the first node or the second node. The first storage element is configured to set the resistance state between the first terminal and the second and the third terminals to the first resistance state or the second resistance state in accordance with the direction of the current flowing between the second terminal and the third terminal.

BRIEF DESCRIPTION OF DRAWING

FIG. 1 is a block diagram illustrating a configuration example of a semiconductor circuit according to an embodiment of the present disclosure.

FIG. 2 is a circuit diagram illustrating a configuration example of a memory cell according to a first embodiment.

FIG. 3 is a circuit diagram illustrating a configuration example of a memory circuit including the memory cell illustrated in FIG. 2.

FIG. 4 is an explanatory diagram illustrating a configuration example and an operation example of a storage element illustrated in FIG. 2.

FIG. 5 is an explanatory diagram illustrating an operation example of the memory cell illustrated in FIG. 2.

FIG. 6A is a circuit diagram illustrating an operation example of the memory cell illustrated in FIG. 2.

FIG. 6B is another circuit diagram illustrating an operation example of the memory cell illustrated in FIG. 2.

FIG. 6C is another circuit diagram illustrating an operation example of the memory cell illustrated in FIG. 2.

FIG. 6D is another circuit diagram illustrating an operation example of the memory cell illustrated in FIG. 2.

FIG. 6E is another circuit diagram illustrating an operation example of the memory cell illustrated in FIG. 2.

FIG. 7A is another explanatory diagram illustrating an operation example of the memory cell illustrated in FIG. 2.

FIG. 7B is another explanatory diagram illustrating an operation example of the memory cell illustrated in FIG. 2.

FIG. 8 is a circuit diagram illustrating a configuration example of a memory circuit according to a modification example of the first embodiment.

FIG. 9 is a circuit diagram illustrating a configuration example of a memory cell according to another modification example of the first embodiment.

FIG. 10 is a circuit diagram illustrating a configuration example of a memory circuit including the memory cell illustrated in FIG. 9.

FIG. 11 is a circuit diagram illustrating a configuration example of a memory cell according to another modification example of the first embodiment.

FIG. 12 is a circuit diagram illustrating a configuration example of a memory circuit including the memory cell illustrated in FIG. 11.

FIG. 13 is a circuit diagram illustrating a configuration example of a memory cell according to another modification example of the first embodiment.

FIG. 14 is a circuit diagram illustrating a configuration example of a memory cell according to another modification example of the first embodiment.

FIG. 15 is a circuit diagram illustrating a configuration example of a memory circuit including the memory cell illustrated in FIG. 14.

FIG. 16 is a circuit diagram illustrating a configuration example of a memory cell according to another modification example of the first embodiment.

FIG. 17A is a circuit diagram illustrating an operation example of the memory cell illustrated in FIG. 16.

FIG. 17B is another circuit diagram illustrating an operation example of the memory cell illustrated in FIG. 16.

FIG. 17C is another circuit diagram illustrating an operation example of the memory cell illustrated in FIG. 16.

FIG. 17D is another circuit diagram illustrating an operation example of the memory cell illustrated in FIG. 16.

FIG. 17E is another circuit diagram illustrating an operation example of the memory cell illustrated in FIG. 16.

FIG. 18 is a block diagram illustrating a configuration example of a semiconductor circuit according to another modification example of the first embodiment.

FIG. 19 is a circuit diagram illustrating a configuration example of a memory cell according to a second embodiment.

FIG. 20 is a circuit diagram illustrating a configuration example of a memory circuit including the memory cell illustrated in FIG. 19.

FIG. 21 is a circuit diagram illustrating an operation example of the memory cell illustrated in FIG. 19.

FIG. 22A is a circuit diagram illustrating an operation example of the memory cell illustrated in FIG. 19.

FIG. 22B is another circuit diagram illustrating an operation example of the memory cell illustrated in FIG. 19.

FIG. 22C is another circuit diagram illustrating an operation example of the memory cell illustrated in FIG. 19.

FIG. 22D is another circuit diagram illustrating an operation example of the memory cell illustrated in FIG. 19.

FIG. 23A is another circuit diagram illustrating an operation example of the memory cell illustrated in FIG. 19.

FIG. 23B is another circuit diagram illustrating an operation example of the memory cell illustrated in FIG. 19.

FIG. 23C is another circuit diagram illustrating an operation example of the memory cell illustrated in FIG. 19.

FIG. 23D is another circuit diagram illustrating an operation example of the memory cell illustrated in FIG. 19.

FIG. 24 is a circuit diagram illustrating a configuration example of a memory cell according to a modification example of the second embodiment.

FIG. 25 is a circuit diagram illustrating a configuration example of a memory cell according to another modification example of the second embodiment.

FIG. 26 is a circuit diagram illustrating a configuration example of a memory circuit including the memory cell illustrated in FIG. 25.

FIG. 27 is a circuit diagram illustrating a configuration example of a memory cell according to another modification example of the second embodiment.

FIG. 28 is a circuit diagram illustrating a configuration example of a memory cell according to a third embodiment.

FIG. 29 is a circuit diagram illustrating a configuration example of a memory circuit including the memory cell illustrated in FIG. 28.

FIG. 30 is an explanatory diagram illustrating an operation example of the memory cell illustrated in FIG. 28.

FIG. 31A is a circuit diagram illustrating an operation example of the memory cell illustrated in FIG. 28.

FIG. 31B is another circuit diagram illustrating an operation example of the memory cell illustrated in FIG. 28.

FIG. 31C is another circuit diagram illustrating an operation example of the memory cell illustrated in FIG. 28.

FIG. 31D is another circuit diagram illustrating an operation example of the memory cell illustrated in FIG. 28.

FIG. 31E is another circuit diagram illustrating an operation example of the memory cell illustrated in FIG. 28.

FIG. 32A is another explanatory diagram illustrating an operation example of the memory cell illustrated in FIG. 28.

FIG. 32B is another explanatory diagram illustrating an operation example of the memory cell illustrated in FIG. 28.

FIG. 33 is a circuit diagram illustrating a configuration example of a memory cell according to a modification example of the third embodiment.

FIG. 34A is a circuit diagram illustrating an operation example of the memory cell illustrated in FIG. 33.

FIG. 34B is another circuit diagram illustrating an operation example of the memory cell illustrated in FIG. 33.

FIG. 34C is another circuit diagram illustrating an operation example of the memory cell illustrated in FIG. 33.

FIG. 34D is another circuit diagram illustrating an operation example of the memory cell illustrated in FIG. 33.

FIG. 34E is another circuit diagram illustrating an operation example of the memory cell illustrated in FIG. 33.

FIG. 35 is a circuit diagram illustrating a configuration example of a memory cell according to another modification example of the third embodiment.

FIG. 36 is a circuit diagram illustrating a configuration example of a memory circuit including the memory cell illustrated in FIG. 35.

FIG. 37 is an explanatory diagram illustrating an operation example of the memory cell illustrated in FIG. 35.

FIG. 38A is a circuit diagram illustrating an operation example of the memory cell illustrated in FIG. 35.

FIG. 38B is another circuit diagram illustrating an operation example of the memory cell illustrated in FIG. 35.

FIG. 38C is another circuit diagram illustrating an operation example of the memory cell illustrated in FIG. 35.

FIG. 38D is another circuit diagram illustrating an operation example of the memory cell illustrated in FIG. 35.

FIG. 38E is another circuit diagram illustrating an operation example of the memory cell illustrated in FIG. 35.

FIG. 39 is a circuit diagram illustrating a configuration example of a memory cell according to another modification example of the third embodiment.

FIG. 40A is a circuit diagram illustrating an operation example of the memory cell illustrated in FIG. 39.

FIG. 40B is another circuit diagram illustrating an operation example of the memory cell illustrated in FIG. 39.

FIG. 40C is another circuit diagram illustrating an operation example of the memory cell illustrated in FIG. 39.

FIG. 40D is another circuit diagram illustrating an operation example of the memory cell illustrated in FIG. 39.

FIG. 40E is another circuit diagram illustrating an operation example of the memory cell illustrated in FIG. 39.

FIG. 41 is a circuit diagram illustrating a configuration example of a memory cell according to a fourth embodiment.

FIG. 42 is a circuit diagram illustrating a configuration example of a memory circuit including the memory cell illustrated in FIG. 41.

FIG. 43 is a circuit diagram illustrating an operation example of the memory cell illustrated in FIG. 41.

FIG. 44A is a circuit diagram illustrating an operation example of the memory cell illustrated in FIG. 41.

FIG. 44B is another circuit diagram illustrating an operation example of the memory cell illustrated in FIG. 41.

FIG. 44C is another circuit diagram illustrating an operation example of the memory cell illustrated in FIG. 41.

FIG. 44D is another circuit diagram illustrating an operation example of the memory cell illustrated in FIG. 41.

FIG. 45A is another circuit diagram illustrating an operation example of the memory cell illustrated in FIG. 41.

FIG. 45B is another circuit diagram illustrating an operation example of the memory cell illustrated in FIG. 41.

FIG. 45C is another circuit diagram illustrating an operation example of the memory cell illustrated in FIG. 41.

FIG. 45D is another circuit diagram illustrating an operation example of the memory cell illustrated in FIG. 41.

FIG. 46 is a circuit diagram illustrating a configuration example of a flip-flop circuit to which the technology according to the first embodiment is applied.

FIG. 47 is a circuit diagram illustrating another configuration example of the flip-flop circuit to which the technology according to the first embodiment is applied.

FIG. 48 is a circuit diagram illustrating a configuration example of a flip-flop circuit to which the technology according to the second embodiment is applied.

FIG. 49 is a circuit diagram illustrating another configuration example of the flip-flop circuit to which the technology according to the second embodiment is applied.

FIG. 50 is a circuit diagram illustrating another configuration example of the flip-flop circuit to which the technology according to the second embodiment is applied.

FIG. 51 is a circuit diagram illustrating another configuration example of the flip-flop circuit to which the technology according to the second embodiment is applied.

FIG. 52 is a block diagram illustrating a configuration example of an information processing device to which the technology of an embodiment is applied.

FIG. 53 is a block diagram illustrating another configuration example of the information processing device to which the technology of the embodiment is applied.

MODES FOR CARRYING OUT THE INVENTION

The following describes embodiments of the present disclosure in detail with reference to the drawings. It is to be noted that description is given in the following order.

1. First Embodiment
2. Second Embodiment
3. Third Embodiment
4. Fourth Embodiment
5. Application Examples
6. Practical Application Example 1. First Embodiment

[Configuration Example]

FIG. 1 illustrates a configuration example of a semiconductor circuit (a semiconductor circuit 1) according to an embodiment. The semiconductor circuit 1 is a circuit that stores data. The semiconductor circuit 1 includes a control section 11, a power supply transistor 12, and a memory circuit 20.

The control section 11 is configured to control an operation of the memory circuit 20. Specifically, the control section 11 writes data in the memory circuit 20 on the basis of a write command and write data supplied from the outside and reads out data from the memory circuit 20 on the basis of a readout command supplied from the outside. In addition, the control section 11 also has a function of controlling power supply to the memory circuit 20 by supplying the power supply transistor 12 with a power supply control signal SPG to turn on and off the power supply transistor 12.

The power supply transistor 12 is a P-type MOS (Metal Oxide Semiconductor) transistor in this example. The power supply transistor 12 has the gate supplied with the power supply control signal SPG, the source supplied with a power supply voltage VDD1, and a drain coupled to the memory circuit 20.

This configuration causes the semiconductor circuit 1 to turn on the power supply transistor 12 and supply the memory circuit 20 with the power supply voltage VDD1 as a power supply voltage VDD in a case where the memory circuit 20 is brought into operation. In addition, in a case where the semiconductor circuit 1 does not bring the memory circuit 20 into operation, the power supply transistor 12 is turned off and the supply of the power supply voltage VDD to the memory circuit 20 is stopped. So-called power gating like this allows the semiconductor circuit 1 to reduce power consumption.

The memory circuit 20 is configured to store data. The memory circuit 20 includes a memory cell array 21 and drive sections 22 and 23.

The memory cell array 21 includes a plurality of memory cells 30 disposed in a matrix.

FIG. 2 illustrates a configuration example of the memory cell 30. FIG. 3 illustrates a configuration example of the memory circuit 20. The memory cell array 21 includes a plurality of word lines WL, a plurality of bit lines BL, a plurality of bit lines BLB, a plurality of control lines CTRL, a plurality of restore control lines RSTRL, a plurality of store control lines STRLB, and a plurality of store control lines STRL. The word lines WL extend in the horizontal direction in FIGS. 2 and 3. One end of each of the word lines WL is coupled to the drive section 22. The drive section 22 applies a signal SWL to this word line WL. The bit lines BL extend in the vertical direction in FIGS. 2 and 3. One end of each of the bit lines BL is coupled to the drive section 23. The bit lines BLB extend in the vertical direction in FIGS. 2 and 3. One end of each of the bit lines BLB is coupled to the drive section 23. The control lines CTRL extend in the horizontal direction in FIGS. 2 and 3. One end of each of the control lines CTRL is coupled to the drive section 22. The drive section 22 applies a signal SCTRL to this control line CTRL. The restore control lines RSTRL extend in the horizontal direction in FIGS. 2 and 3. One end of each of the restore control lines RSTRL is coupled to the drive section 22. The drive section 22 applies a signal SRSTRL to this restore control line RSTRL. The store control lines STRLB extend in the horizontal direction in FIGS. 2 and 3. One end of each of the store control lines STRLB is coupled to the drive section 22. The drive section 22 applies a signal SSTRLB to this store control line STRLB. The store control lines STRL extend in the horizontal direction in FIGS. 2 and 3. One end of each of the store control lines STRL is coupled to the drive section 22. The drive section 22 applies a signal SSTRL to this store control line STRL.

The memory cell 30 includes an SRAM (Static Random Access Memory) circuit 40, transistors 31, 32, and 51 to 58, and storage elements 33 and 34.

The SRAM circuit 40 is configured to store data for one bit by positive feedback. The SRAM 40 includes transistors 41 to 46. The transistors 41 and 43 are P-type MOS transistors and the transistors 42, 44, 45, and 46 are N-type MOS transistors.

The transistor 41 has the gate coupled to a node N1, the source supplied with the power supply voltage VDD, and the drain coupled to a node N2. The transistor 42 has the gate coupled to the node N1, the source grounded, and the drain coupled to the node N2. The transistors 41 and 42 are included in an inverter IV1. The inverter IV1 inverts a voltage VN1 at the node N1 and outputs a result of the inversion to the node N2. The transistor 43 has the gate coupled to the node N2, the source supplied with the power supply voltage VDD, and the drain coupled to the node N1. The transistor 44 has the gate coupled to the node N2, the source grounded, and the drain coupled to the node N1. The transistors 43 and 44 are included in an inverter IV2. The inverter IV2 inverts a voltage VN2 at the node N2 and outputs a result of the inversion to the node N1. The transistor 45 has the gate coupled to the word line WL, the source coupled to the bit line BL, and the drain coupled to the node N1. The transistor 46 has the gate coupled to the word line WL, the source coupled to the bit line BLB, and the drain coupled to the node N2.

This configuration couples the input terminal of the inverter IV1 and the output terminal of the inverter IV2 to each other through the node N1 and couples the input terminal of the inverter IV2 and the output terminal of the inverter IV1 to each other through the node N2. This causes the SRAM circuit 40 to store data for one bit by positive feedback. The transistors 45 and 46 are then turned on. This writes data in the SRAM circuit 40 or reads out data from the SRAM circuit 40 through the bit lines BL and BLB.

The transistors 31 and 32 are N-type MOS transistors. The transistor 31 has the gate coupled to the restore control line RSTRL, the drain coupled to the node N1, and the source coupled to a terminal T1 of the storage element 33. The transistor 32 has the gate coupled to the restore control line RSTRL, the drain coupled to the node N2, and the source coupled to the terminal T1 of the storage element 34. It is to be noted that N-type MOS transistors are used as the transistors 31 and 32 in this example, but this is not limitative. For example, P-type MOS transistors may be used in place of the N-type MOS transistors. In this case, for example, it is desirable to change the polarity or the like of the signal SRSTRL.

The transistors 51 and 52 are P-type MOS transistors and the transistors 53 and 54 are N-type MOS transistors. The transistor 51 has the gate coupled to the store control line STRLB, the source supplied with the power supply voltage VDD, and the drain coupled to the source of the transistor 52. The transistor 52 has the gate coupled to the node N1, the source coupled to the drain of the transistor 51, and the drain coupled to the drain of the transistor 53 and a terminal TN of the storage element 34. The transistor 53 has the gate coupled to the node N1, the drain coupled to the drain of the transistor 52 and the terminal TN of the storage element 34, and the source coupled to the drain of the transistor 54. The transistor 54 has the gate coupled to the store control line STRL, the drain coupled to the source of the transistor 53, and the source grounded.

The transistors 55 and 56 are P-type MOS transistors and the transistors 57 and 58 are N-type MOS transistors. The transistor 55 has the gate coupled to the store control line STRLB, the source supplied with the power supply voltage VDD, and the drain coupled to the source of the transistor 56. The transistor 56 has the gate coupled to the node N2, the source coupled to the drain of the transistor 55, and the drain coupled to the drain of the transistor 57 and the terminal TN of the storage element 33. The transistor 57 has the gate coupled to the node N2, the drain coupled to the drain of the transistor 56 and the terminal TN of the storage element 33, and the source coupled to the drain of the transistor 58. The transistor 58 has the gate coupled to the store control line STRL, the drain coupled to the source of the transistor 57, and the source grounded.

The storage elements 33 and 34 are nonvolatile storage elements. In this example, the storage elements 33 and 34 are SOT magnetic tunnel junction (MTJ; Magnetic Tunnel Junction) elements each configured to store data by changing the resistance state by using spin orbit torque (SOT: Spin Orbit Torque). Each of the storage elements 33 and 34 include the terminals T1, TP, and TN. The storage element 33 has the terminal T1 coupled to the source of the transistor 31, the terminal TP coupled to the control line CTRL, and the terminal TN coupled to the drains of the transistors 56 and 57. The storage element 34 has the terminal T1 coupled to the source of the transistor 32, the terminal TP coupled to the control line CTRL, and the terminal TN coupled to the drains of the transistors 52 and 53.

FIG. 4 illustrates a configuration example of the storage element 33. The same applies to the storage element 34. The storage element 33 includes a pinned layer P, a tunnel barrier layer I, a free layer F, and a metal layer M. The pinned layer P, the tunnel barrier layer I, the free layer F, and the metal layer M are disposed in this order. The pinned layer P includes a ferromagnetic substance in which the direction of magnetization is fixed. The free layer F includes a ferromagnetic substance in which the direction of magnetization changes. The tunnel barrier layer I is configured to break the magnetic bond between the pinned layer P and the free layer F and allow a tunnel current to flow. The metal layer M is configured by using a metal having strong spin orbit interaction. The terminal T1 is coupled to the pinned layer P. The terminal TP is coupled to one end of the metal layer M. The terminal TN is coupled to the other end of the metal layer M.

This configuration allows the storage element 33 to set the state (the resistance state) of the resistance value between the terminal T1 and the terminals TP and TN to a high resistance state RH or a low resistance state RL by changing the direction of the magnetization in the free layer F in accordance with the direction of a current flowing between the terminal TP and the terminal TN. The high resistance state RH is a state in which the resistance value between the terminal T1 and the terminals TP and TN is high and the low resistance state RL is a state in which the resistance value between the terminal T1 and the terminals TP and TN is low. Specifically, in the storage element 33, the resistance state between the terminal T1 and the terminals TP and TN is set to the high resistance state RH by a predetermined current flowing from the terminal TN to the terminal TP. In addition, in the storage element 33, the resistance state between the terminal T1 and the terminals TP and TN is set to the low resistance state RL by a predetermined current flowing from the terminal TP to the terminal TN. In this way, no current flows in the storage element 33 between the terminal T1 and the terminals TP and TN through the tunnel barrier layer I, but a current flows between the terminal TP and the terminal TN through the metal layer M. This makes it possible to set the resistance state.

In this way, the memory cell 30 is provided with the transistors 31, 32, and 51 to 58 and the storage elements 33 and 34 in addition to the SRAM circuit 40. Accordingly, for example, in a case where a standby operation is performed by turning off the power supply transistor 12, performing a store operation immediately before the standby operation makes it possible to cause the storage elements 33 and 34 each of which is a nonvolatile memory to each store the data stored in the SRAM circuit 40 that is a volatile memory. The semiconductor circuit 1 allows the SRAM circuit 40 to store the data stored in each of the storage elements 33 and 34 by performing a restore operation immediately after the standby operation. This allows the semiconductor circuit 1 to cause the state of each of the memory cells 30 to return, in a short period of time after power supply is restarted, to the state in which power supply has not yet been stopped.

The drive section 22 is configured to apply the signal SWL to the word line WL, apply the signal SCTRL to the control line CTRL, apply the signal SRSTRL to the restore control line RSTRL, apply the signal SSTRLB to the store control line STRLB, and apply the signal SSTRL to the store control line STRL on the basis of a control signal supplied from the control section 11.

As illustrated in FIG. 3, the drive section 22 includes transistors 24 and 25. The transistor 24 is a P-type MOS transistor. The transistor 24 has the gate supplied with a signal SCTRLB, the source supplied with the power supply voltage VDD, and the drain coupled to the control line CTRL. The transistor 25 is an N-type MOS transistor. The transistor 25 has the gate supplied with the signal SCTRLB, the drain coupled to the control line CTRL, and the source grounded. These transistors 24 and 25 are included in an inverter. Each of the transistors 24 and 25 generates the signal SCTRL on the basis of the signal SCTRLB. The drive section 22 drives the control line CTRL by using this inverter.

The drive section 23 is configured to write data in the memory cell array 21 or read out data from the memory cell array 21 through the bit lines BL and BLB. Specifically, the drive section 23 writes data in the memory cell array 21 through the bit lines BL and BLB on the basis of a control signal and data supplied from the control section 11. In addition, the drive section 23 reads out data from the memory cell array 21 through the bit lines BL and BLB and supplies the read-out data to the control section 11 on the basis of a control signal supplied from the control section 11.

Here, the inverter IV1 corresponds to a specific example of a "first circuit" according to the present disclosure. The inverter IV2 corresponds to a specific example of a "second circuit" according to the present disclosure. The node N1 corresponds to a specific example of a "first node" according to the present disclosure. The node N2 corresponds to a specific example of a "second node" according to the present disclosure. The storage element 33 corresponds to a specific example of a "first storage element" according to the present disclosure. The storage element 34 corresponds to a specific example of a "second storage element" according to the present disclosure. The terminal T1 of each of the storage elements 33 and 34 corresponds to a specific example of a "first terminal" according to the present disclosure, the terminal TN corresponds to a specific example of a "second terminal" according to the present disclosure, and the terminal TP corresponds to a specific example of a "third terminal" according to the present disclosure. The transistor 31 corresponds to a specific example of a "first transistor" according to the present disclosure. The transistor 56 corresponds to a specific example of a "second transistor" according to the present disclosure. The transistor 57 corresponds to a specific example of a "third transistor" according to the present disclosure. The transistor 32 corresponds to a specific example of a "fourth transistor" according to the present disclosure. The transistor 52 corresponds to a specific example of a "fifth transistor" according to the present disclosure. The transistor 53 corresponds to a specific example of a "sixth transistor" according to the present disclosure. The transistor 55 corresponds to a specific example of a "seventh transistor" according to the present disclosure. The transistor 58 corresponds to a specific example of an "eighth transistor" according to the present disclosure. The transistor 51 corresponds to a specific example of a "ninth transistor" according to the present disclosure. The transistor 54 corresponds to a specific example of a "tenth transistor" according to the present disclosure. The transistor 24 corresponds to a specific example of a "thirteenth transistor" according to the present disclosure. The transistor 25 corresponds to a specific example of a "fourteenth transistor" according to the present disclosure. Each of the drive sections 22 and 23 corresponds to a specific example of a "control section" according to the present disclosure. The control section 11 corresponds to a specific example of a "power supply control section" according to the present disclosure.

[Operations and Workings]

Subsequently, the operations and workings of the semiconductor circuit 1 according to the present embodiment are described.

(Overview of Overall Operation)

First, an overview of the overall operation of the semiconductor circuit 1 is described with reference to FIGS. 1 to 3. The control section 11 controls an operation of the memory circuit 20. Specifically, the control section 11 writes data in the memory circuit 20 on the basis of a write command and write data supplied from the outside and reads out data from the memory circuit 20 on the basis of a readout command supplied from the outside. In addition, the control section 11 controls power supply to the memory circuit 20 by supplying the power supply transistor 12 with the power supply control signal SPG to turn on and off the power supply transistor 12. The power supply transistor 12 performs an on/off operation on the basis of a control signal supplied from the control section 11. The power supply transistor 12 is then turned on. This supplies the memory circuit 20 with the power supply voltage VDD1 as the power supply voltage VDD. The drive section 22 of the memory circuit 20 applies the signal SWL to the word line WL, applies the signal SCTRL to the control line CTRL, applies the signal SRSTRL to the restore control line RSTRL, applies the signal SSTRLB to the store control line STRLB, and applies the signal SSTRL to the store control line STRL on the basis of a control signal supplied from the control section 11. The drive section 23 writes data in the memory cell array 21 through the bit lines BL and BLB on the basis of a control signal and data supplied from the control section 11. In addition, the drive section 23 reads out data from the memory cell array 21 through the bit lines BL and BLB and supplies the read-out data to the control section 11 on the basis of a control signal supplied from the control section 11.

(Detailed Operation)

In a normal operation OP1, the semiconductor circuit 1 causes the SRAM circuit 40 that is a volatile memory to store data. For example, in a case where a standby operation OP3 is performed by turning off the power supply transistor 12, the semiconductor circuit 1 causes the storage elements 33 and 34 to each store the data stored in the SRAM circuit 40 by performing a store operation OP2 immediately before the standby operation OP3. Each of the storage elements 33 and 34 is a nonvolatile memory. The SRAM circuit 40 is a volatile memory. The semiconductor circuit 1 then causes the SRAM circuit 40 to store the data stored in each of the storage elements 33 and 34 by performing a restore operation OP4 immediately after the standby operation OP3. The following describes this operation in detail.

FIG. 5 illustrates an operation example of the certain memory cell 30 of interest in the semiconductor circuit 1. Each of FIGS. 6A, 6B, 6C, 6D, and 6E illustrate the operation state of the memory cell 30. FIG. 6A illustrates a state in the normal operation OP1. Each of FIGS. 6B and 6C illustrates a state in the store operation OP2. FIG. 6D illustrates a state in the standby operation OP3. FIG. 6E illustrates a state in the restore operation OP4. Each of FIGS. 6A, 6B, 6C, 6D, and 6E also illustrate the transistors 24 and 25 in the drive section 22. In addition, each of FIGS. 6A, 6B, 6C, 6D, and 6E illustrate the inverters IV1 and IV2 by using symbols and illustrates the transistors 31, 32, 51, 54, 55, and 58 by using switches corresponding to the operation states of the transistors.

(Normal Operation OP1)

The semiconductor circuit 1 writes data in the SRAM circuit 40 that is a volatile memory or reads out data from the SRAM circuit 40 by performing the normal operation OP1.

In the normal operation OP1, the control section 11 sets the voltage of the power supply control signal SPG at the low level as illustrated in FIG. 5. This tuns on the power supply transistor 12 (FIG. 1) and supplies the memory circuit 20 with the power supply voltage VDD. The drive section 22 then sets the voltage of the signal SRSTRL at the low level as illustrated in FIG. 5. This turns off each of the transistors 31 and 32 as illustrated in FIG. 6A. In other words, the SRAM circuit 40 is electrically uncoupled from the storage elements 33 and 34. In addition, as illustrated in FIG. 5, the drive section 22 sets the voltage of the signal SSTRL at the low level and sets the voltage of the signal SSTRLB at the high level. This turns off each of the transistors 51, 54, 55, and 58 as illustrated in FIG. 6A. In addition, the drive section 22 sets the voltage of the signal SCTRL to a low level voltage VL (the ground level) as illustrated in FIG. 5. Specifically, as illustrated in FIG. 6A, the drive section 22 turns off the transistor 24 and turns on the transistor 25 by setting the voltage of the signal SCTRLB (FIG. 3) at the high level. As a result, the voltage of the SCTRL is set to the low level voltage VL.

In this normal operation OP1, data is written in the SRAM circuit 40 of the memory cell 30 or data is read out from the SRAM circuit 40. Specifically, in a case where data is written in the SRAM circuit 40, the drive section 23 first applies, to the bit lines BL and BLB, signals having inverted voltage levels corresponding to the data to be written. The drive section 22 then turns on the transistors 45 and 46 of the SRAM circuit 40 by setting the voltage of the signal SWL at the high level. This causes data corresponding to the voltages of the bit lines BL and BLB to be written in the SRAM circuit 40. In addition, in a case where data is read out from the SRAM circuit 40, the drive section 23 precharges each of the bit lines BL and BLB, for example, with a high level voltage. After that, the drive section 22 turns on the transistors 45 and 46 by setting the voltage of the signal SWL at the high level. This changes the voltage of one of the bit lines BL and BLB in accordance with the data stored in the SRAM circuit 40. The drive section 23 then reads out the data stored in the SRAM circuit 40 by detecting a difference between the voltages of the bit lines BL and BLB.

In this case, as illustrated in FIG. 6A, the transistors 31, 32, 51, 54, 55, and 58 are off. No current therefore flows in the storage elements 33 and 34. The resistance states of the storage elements 33 and 34 are thus maintained. In this example, the resistance state of the storage element 33 is maintained as the high resistance state RH and the resistance state of the storage element 34 is maintained as the low resistance state RL.

(Store Operation OP2)

Next, the store operation OP2 is described. The semiconductor circuit 1 causes each of the storage elements 33 and 34 to store the data stored in the SRAM circuit 40 by performing the store operation OP2 before performing the standby operation OP3.

In the store operation OP2, as illustrated in FIG. 5, the drive section 22 sets the voltage of the signal SSTRL at the high level and sets the voltage of the signal SSTRLB at the low level. This turns on each of the transistors 51, 54, 55, and 58 as illustrated in FIGS. 6B and 6C. In addition, the drive section 22 sets the voltage of the signal SWL at the low level as illustrated in FIG. 5. This turns off the transistors 45 and 46.

In this store operation OP2, each memory cell 30 causes each of the storage elements 33 and 34 to store the data stored in the SRAM circuit 40 by using two steps. First, as illustrated in FIG. 5, the drive section 22 sets the voltage of the signal SCTRL to the low level voltage VL (the ground level) in the first step and sets the voltage of the signal SCTRL to a high level voltage VH (the power supply voltage level) in the second step. This sets the resistance state of each of the storage elements 33 and 34 in accordance with the data stored in the SRAM circuit 40.

Specifically, in the first step, as illustrated in FIG. 6B, the drive section 22 turns off the transistor 24 and turns on the transistor 25 by setting the voltage of the signal SCTRLB (FIG. 3) at the high level. As a result, the voltage of the SCTRL is set to the low level voltage VL. This causes a store current Istr1 to flow in any one of the storage elements 33 and 34.

In this example, the voltage VN1 at the node N1 is the low level voltage VL and the voltage VN2 at the node N2 is the high level voltage VH. The transistors 52 and 57 are thus on and the transistors 53 and 56 are off. This causes the store current Istr1 to flow in the memory cell 30 in the order of the transistor 51, the transistor 52, the storage element 34, and the transistor 25 as illustrated in FIG. 6B. In this case, the store current Istr1 flows in the storage element 34 from the terminal TN to the terminal TP. This sets the resistance state of the storage element 34 to the high resistance state RH.

Next, in the second step, as illustrated in FIG. 6C, the drive section 22 turns on the transistor 24 and turns off the transistor 25 by setting the voltage of the signal SCTRLB (FIG. 3) at the low level. As a result, the voltage of the SCTRL is set to the high level voltage VH. This causes a store current Istr2 to flow in one of the storage elements 33 and 34 in which no current flows in the first step.

In this example, the transistors 52 and 57 are on and the transistors 53 and 56 are off. This causes the store current Istr2 to flow in the order of the transistor 24, the storage element 33, the transistor 57, and the transistor 58 as illustrated in FIG. 6C. In this case, the store current Istr2 flows in the storage element 33 from the terminal TP to the terminal TN. This sets the resistance state of the storage element 33 to the low resistance state RL.

It is to be noted that all of the transistors 51, 54, 55, and 58 are turned on in this example by setting the voltage of the signal SSTRL at the high level and setting the voltage of the signal SSTRLB at the low level in both the first step and the second step, but this is not limitative. For example, the transistors 51 and 55 may be turned on and the transistors 54 and 58 may be turned off by setting both the voltage of the signal SSTRL and the voltage of the signal SSTRLB at the low level in the first step. The transistors 51 and 55 may be then turned off and the transistors 54 and 58 may be turned on by setting both the voltage of the signal SSTRL and the voltage of the signal SSTRLB at the high level in the second step.

In addition, in this example, the voltage of the signal SCTRL is set to the low level voltage VL in the first step and the voltage of the signal SCTRL is set to the high level voltage VH in the second step as illustrated in FIG. 5, but this is not limitative. Instead, for example, the voltage of the signal SCTRL may be set to the high level voltage VH in the first step and the voltage of the signal SCTRL may be set to the low level voltage VL in the second step.

In this way, the store current flows in the storage element 33 in one of the first step and the second step and the store current flows in the storage element 34 in the other of the first step and the second step. As a result, the resistance state of each of the storage elements 33 and 34 is set in the memory cell 30 in accordance with the data stored in the SRAM circuit 40.

It is to be noted that the control line CTRL, the restore control line RSTRL, and the store control lines STRL and STRLB extend in the row direction (the horizontal direction in FIGS. 2 and 3) in this example as illustrated in FIGS. 2 and 3. The store operation OP2 is thus performed in units of rows. It is possible to set, by using, for example, the signals SSTRL and SSTRLB, a row that is subjected to the store operation OP2 and a row that is not subjected to the store operation OP2. Specifically, as illustrated in FIG. 5, the drive section 22 sets the voltage of the signal SSTRL at the high level and sets the voltage of the signal SSTRLB at the low level for a row that is subjected to the store operation OP2. In addition, as illustrated in FIG. 7A, the drive section 22 sets the voltage of the signal SSTRL at the low level and sets the voltage of the signal SSTRLB at the high level for a row that is not subjected to the store operation OP2. In addition, in this example, the drive section 22 changes the voltage of the signal SCTRL for a row that is subjected to the store operation OP2 as illustrated in FIG. 5 and maintains the voltage of the signal SCTRL as the low level voltage VL for a row that is not subjected to the store operation OP2 as illustrated in FIG. 7A. It is to be noted that this is not limitative, but the voltage of the signal SCTRL may also be changed for a row that is not subjected to the store operation OP2 as illustrated in FIG. 7B.

(Standby Operation OP3)

The semiconductor circuit 1 then performs the standby operation OP3 by turning off the power supply transistor 12 after the store operation OP2.

In the standby operation OP3, the control section 11 sets the voltage of the power supply control signal SPG at the high level as illustrated in FIG. 5. This tuns off the power supply transistor 12 (FIG. 1) and stops supplying the memory circuit 20 with power. This sets the voltage of each of the signals SSTRL, SCTRL, and SRSTRL at the low level and sets the voltage of the signal SSTRLB at the high level. In this case, the resistance states of the storage elements 33 and 34 are maintained as illustrated in FIG. 6D.

(Restore Operation OP4)

Next, the restore operation OP4 is described. In a case where the normal operation OP1 is performed after the standby operation OP3, the semiconductor circuit 1 causes the SRAM circuit 40 to store the data stored in each of the storage elements 33 and 34 by performing the restore operation OP4.

In the restore operation OP4, the control section 11 sets the voltage of the power supply control signal SPG at the low level as illustrated in FIG. 5. This tuns on the power supply transistor 12 (FIG. 1) and supplies the memory circuit 20 with the power supply voltage VDD. The drive section 22 then sets the voltage of the signal SRSTRL at the high level only in the period of a predetermined length immediately after the power supply transistor 12 is turned on. This turns on each of the transistors 31 and 32 in this period as illustrated in FIG. 6E. In other words, the SRAM circuit 40 is electrically coupled to the storage elements 33 and 34 in this period. In addition, as illustrated in FIG. 5, the drive section 22 sets the voltage of the signal SSTRL at the low level and sets the voltage of the signal SSTRLB at the high level. This turns off each of the transistors 51, 54, 55, and 58 as illustrated in FIG. 6E. In addition, the drive section 22 sets the voltage of the signal SCTRL to the low level voltage VL (the ground level) as illustrated in FIG. 5. This causes the node N1 to be grounded through the transistor 31 and the storage element 33. The node N2 is grounded through the transistor 32 and the storage element 34. In this case, the resistance states of the storage elements 33 and 34 are different from each other. The voltage state of the SRAM circuit 40 is thus determined in accordance with the resistance states of the storage elements 33 and 34.

In this example, the resistance state of the storage element 33 is the low resistance state RL and the resistance state of the storage element 34 is the high resistance state RH. This causes the node N1 to be pulled down with a low resistance value and causes the node N2 to be pulled down with a high resistance value. The voltage VN1 at the node N1 is set to the low level voltage VL and the voltage VN2 at the node N2 is set to the high level voltage VH. In this way, the memory cell 30 causes the SRAM circuit 40 to store data in accordance with the data stored in each of the storage elements 33 and 34.

It is to be noted that the voltage of the signal SRSTRL is set at the high level only in the period of a predetermined length immediately after the power supply transistor 12 is turned on in this example, but this is not limitative. Instead, for example, the voltage of the signal SRSTRL may be set at the high level in advance before the power supply transistor 12 is turned on.

For example, all of the memory cells 30 in the memory cell array 21 perform the restore operation OP4 at the same time. It is to be noted that this is not limitative, but a portion of the memory cells 30 in the memory cell array 21 may perform the restore operation OP4 and the other memory cells 30 may refrain from performing the restore operation OP4. In this case, as illustrated in FIG. 5, the drive section 22 sets the voltage of the signal SRSTRL at the high level only in a predetermined period for a row that is subjected the restore operation OP4 and maintains the voltage of the signal SRSTRL at the low level for a row that is not subjected the restore operation OP4.

After that, the semiconductor circuit 1 performs the normal operation OP1 (FIG. 6A). Following this, the semiconductor circuit 1 then repeats the store operation OP2, the standby operation OP3, the restore operation OP4, and the normal operation OP1 in this order.

In this way, the semiconductor circuit 1 causes the storage elements 33 and 34 to each store the data stored in the SRAM circuit 40 by performing the store operation OP2 immediately before the standby operation OP3. Each of the storage elements 33 and 34 is a nonvolatile memory. The SRAM circuit 40 is a volatile memory. The semiconductor circuit 1 then causes the SRAM circuit 40 to store the data stored in each of the storage elements 33 and 34 by performing the restore operation OP4 immediately after the standby operation OP3. This allows the semiconductor circuit 1 to cause the state of each of the memory cells 30 to return, in a short period of time after power supply is restarted, to the state in which power supply has not yet been stopped.

In addition, each of the storage elements 33 and 34 is configured in the semiconductor circuit 1 by using a SOT magnetic tunnel junction element. In the store operation OP2, the resistance state between the terminal T1 and the terminals TP and TN is then set in accordance with the direction of a current (a store current) flowing between the terminal TP and the terminal TN of each of the storage elements 33 and 34. This allows the semiconductor circuit 1 to have higher reliability such as endurance and retention.

In other words, for example, in a case where a spin transfer torque (STT; Spin Transfer Torque) magnetic tunnel junction element is used as a storage element as with a circuit described in PTL 1, a current flows to penetrate the free layer, the tunnel barrier layer, and the pinned layer of a storage element in storing data in this storage element. Whenever data is stored in a storage element, a current flows in this way. This may deteriorate the characteristics of the storage element over time and the characteristics such as endurance and retention may decrease. In contrast, in the semiconductor circuit 1 according to the present embodiment, each of the storage elements 33 and 34 is configured by using a SOT magnetic tunnel junction element and the resistance state between the terminal T1 and the terminals TP and TN is set in accordance with the direction of a current flowing between the terminal TP and the terminal TN. In this way, a current does not flow in each of the storage elements 33 and 34 through the tunnel barrier layer I in storing data, but a current flows between the terminal TP and the terminal TN through the metal layer M to set the resistance state. This makes it possible to reduce the possibility that the characteristics of the storage elements 33 and 34 deteriorate over time in the semiconductor circuit 1. As a result, the semiconductor circuit 1 is allowed to have higher reliability such as endurance and retention.

In addition, a current (a store current) flows between the terminal TP and the terminal TN of each of the storage elements 33 and 34 in the semiconductor circuit 1 in this way in the store operation OP2. This sets the resistance state of each of the storage elements 33 and 34. It is thus possible to set the resistance state of each of the storage elements 33 and 34 with less currents. Each of the storage elements 33 and 34 is a SOT magnetic tunnel junction element. In other words, to set the resistance state of a storage element, it is necessary in the circuit described in PTL 1 to cause a large number of currents to flow through the free layer, the tunnel barrier layer, and the pinned layer of the storage element. In contrast, a current flows in the semiconductor circuit 1 according to the present embodiment between the terminal TP and the terminal TN of each of the storage elements 33 and 34 each of which is a SOT magnetic tunnel junction element. This path of each of the storage elements 33 and 34 between the terminals TP and TN includes the metal layer M. This makes it possible to apply, for example, a lower voltage to cause a predetermined current to flow. This allows the semiconductor circuit 1 to have less currents flow in the storage elements 33 and 34 or a lower voltage applied. This makes it possible to decrease the size of each of the transistors 51 to 58 that drive the storage elements 33 and 34 in the store operation OP2 and the size of each of the transistors 24 and 25 of the drive section 22. As a result, it is possible to decrease the area of the memory cell 30 and decrease the area of the semiconductor circuit 1.

In addition, the semiconductor circuit 1 is provided with the transistors 51 to 58. The store currents Istr1 and Istr2 flow in a circuit including these transistors 51 to 58 as illustrated in FIGS. 6B and 6C in a case where the store operation OP2 is performed. In other words, in the semiconductor circuit 1, the store currents Istr1 and Istr2 are prevented from flowing in the SRAM circuit 40. This makes it possible to reduce the possibility of so-called disturbance in the semiconductor circuit 1.

In other words, for example, a current flows in the circuit described in PTL 1 from a SRAM circuit to a storage element to perform a store operation. The data stored in the SRAM circuit is therefore lost in a case where the current has a large current value. There is a possibility that so-called disturbance occurs. In addition, in a case where the size of each of the transistors of the SRAM circuit is increased to avoid this, the area of the circuit increases. In contrast, in the semiconductor circuit 1 according to the present embodiment, the store currents Istr1 and Istr2 flow to a circuit including the transistors 51 to 58 as illustrated in FIGS. 6B and 6C. The store currents Istr1 and Istr2 do not thus flow to SRAM circuit 40. This makes it possible to reduce the possibility of the occurrence of disturbance.

Especially in the semiconductor circuit 1, the drains of the transistors 52 and 53 are coupled to the terminal TN of the storage element 34 and the drains of the transistors 56 and 57 are coupled to the terminal TN of the storage element 33. In other words, in the store operation OP2, each of the transistors 52 and 53 functions as an inverter that drives the storage element 34 and each of the transistors 56 and 57 functions as an inverter that drives the storage element 33. This allows the semiconductor circuit 1 to secure current values for the store currents Istr1 and Istr2 more easily in performing the store operation OP2. In other words, for example, in a case of a configuration in which the source of a transistor is coupled to the terminal TN of a storage element to cause a store current to flow in the store operation OP2 by a so-called source follower, the store current may have a smaller current value due to a negative feedback operation of the source follower. Meanwhile, the drain of a transistor is coupled to the terminal TN of a storage element in the semiconductor circuit 1 and such a negative feedback does not thus occur. This makes it possible to secure current values for the store currents Istr1 and Istr2. In addition, it is possible to secure current values for the store currents Istr1 and Istr2 in this way, making it possible to decrease, for example, the size of each of the transistors 52, 53, 56, and 57. As a result, it is possible to decrease the area of the memory cell 30 and decrease the area of the semiconductor circuit 1.

In addition, in the semiconductor circuit 1, the drain of the transistor 51 and the drain of the transistor 54 are coupled to an inverter including the transistors 52 and 53 and the drain of the transistor 55 and the drain of the transistor 58 are coupled to an inverter including the transistors 56 and 57. This drain coupling similarly makes it possible to secure current values for the store currents Istr1 and Istr2 and decrease the area of the semiconductor circuit 1.

In addition, in the semiconductor circuit 1, the drains of the transistors 24 and 25 of the drive section 22 are coupled to the terminals TP of the storage elements 33 and 34. In other words, each of the transistors 24 and 25 functions as an inverter that drives the storage elements 33 and 34. This allows the semiconductor circuit 1 to secure current values for the store currents Istr1 and Istr2 as in cases of the transistors 52 and 53 and the transistors 56 and 57 described above and makes it possible to decrease the area of the semiconductor circuit 1.

[Effects]

As described above, in the present embodiment, a storage element is configured by using a SOT magnetic tunnel junction element in the semiconductor circuit 1. In the store operation, the resistance state between the terminal T1 and the terminals TP and TN is set in accordance with the direction of a current flowing between the terminal TP and the terminal TN of the storage element. This makes it possible to increase reliability such as endurance and retention.

In addition, in the present embodiment, a current flows between the terminal TP and the terminal TN of a storage element that is a SOT magnetic tunnel junction element. This sets the resistance state of each of the storage elements 33 and 34. It is thus possible to set the resistance state of the storage element with less currents. This makes it possible to decrease the area of the semiconductor circuit.

Modification Example 1-1

In the embodiment described, the drive section 22 drives the control lines CTRL one by one, but this is not limitative. Instead, for example, the plurality of control lines CTRL may be collectively driven. The following describes a semiconductor circuit 1A according to the present modification example in detail. This semiconductor circuit 1A includes a memory circuit 20A as with the semiconductor circuit 1 (FIG. 1) according to the embodiment described above. The memory circuit 20A includes a memory cell array 21A and drive sections 22A and 23.

FIG. 8 illustrates a configuration example of the memory circuit 20A. The memory cell array 21A includes the plurality of control lines CTRL. One end of each of the plurality of control lines CTRL is coupled to one end of any of the other control lines CTRL and is coupled to the drive section 22A. As with the drive section 22 according to the embodiment described above, the drive section 22A is configured to apply the signal SWL to the word line WL, apply the signal SCTRL to the control line CTRL, apply the signal SRSTRL to the restore control line RSTRL, apply the signal SSTRLB to the store control line STRLB, and apply the signal SSTRL to the store control line STRL on the basis of a control signal supplied from the control section 11. This configuration causes the drive section 22A to drive the control lines CTRL two by two. It is to be noted that this is not limitative, but the drive section 22A may drive the three or more control lines CTRL as a unit.

In this example, the plurality of control lines CTRL is collectively driven, but this is not limitative. For example, the plurality of restore control lines RSTRL may be collectively driven, the plurality of store control lines STRLB may be collectively driven, or the plurality of store control lines STRL may be collectively driven.

Modification Example 1-2

In the embodiment described above, as illustrated in FIG. 3, the drive section 22 is provided with an inverter (the transistors 24 and 25) that generates the signal SCTRL, but this is not limitative. Instead, for example, each of the memory cells may be provided with an inverter that generates the signal SCTRL. The following describes a semiconductor circuit 1B according to the present modification example in detail. The semiconductor circuit 1B includes a memory circuit 20B as with the semiconductor circuit 1 (FIG. 1) according to the embodiment described above. The memory circuit 20B includes a memory cell array 21B and drive sections 22B and 23.

FIG. 9 illustrates a configuration example of a memory cell 30B in the memory cell array 21B. FIG. 10 illustrates a configuration example of the memory circuit 20B. The memory cell array 21B includes a plurality of control lines CTRLB. In other words, the memory cell array 21B according to the embodiment described above is provided with the plurality of control lines CTRL, but the memory cell array 21B according to the present modification example is provided with the plurality of control lines CTRLB in place of the plurality of control lines CTRL. The control lines CTRLB extend in the horizontal direction in FIGS. 9 and 10. One end of each of the control lines CTRLB is coupled to the drive section 22B. The drive section 22B applies the signal SCTRLB to this control line CTRLB. This signal SCTRLB is an inverted signal of the signal SCTRL according to the embodiment described above.

The memory cell 30B includes transistors 37 and 38. The transistor 37 is a P-type MOS transistor. The transistor 37 has the gate coupled to the control line CTRLB, the source supplied with the power supply voltage VDD, and the drain coupled to the drain of the transistor 38 and the terminal TP of each of the storage elements 33 and 34. The transistor 38 is an N-type MOS transistor. The transistor 38 has the gate coupled to the control line CTRLB, the drain coupled to the drain of the transistor 37 and the terminal TP of each of the storage elements 33 and 34, and the source grounded. These transistors 37 and 38 are included in an inverter. This inverter then generates the signal SCTRL on the basis of the signal SCTRLB for the control line CTRLB and supplies this signal SCTRL to the terminal TP of each of the storage elements 33 and 34.

The drive section 22B is configured to apply the signal SWL to the word line WL, apply the signal SCTRLB to the control line CTRLB, apply the signal SRSTRL to the restore control line RSTRL, apply the signal SSTRLB to the store control line STRLB, and apply the signal SSTRL to the store control line STRL on the basis of a control signal supplied from the control section 11.

Here, the transistor 37 corresponds to a specific example of the "thirteenth transistor" according to the present disclosure. The transistor 38 corresponds to a specific example of the "fourteenth transistor" according to the present disclosure.

Modification Example 1-3

In the embodiment described above, as illustrated in FIGS. 2 and 3, the word line WL, the control line CTRL, the restore control line RSTRL, and the store control lines STRL and STRLB are configured to extend in the horizontal direction in FIGS. 2 and 3 and the bit lines BL and BLB are configured to extend in the vertical direction in FIGS. 2 and 3, but this is not limitative. It is possible to set any extending direction for these wiring liens. The following describes, as an example, a semiconductor circuit 1C in detail. The semiconductor circuit 1C has a configuration in which the control line CTRL extends in the vertical direction. The semiconductor circuit 1C includes a memory circuit 20C as with the semiconductor circuit 1 (FIG. 1) according to the embodiment described above. The memory circuit 20C includes a memory cell array 21C and drive sections 22C and 23C.

FIG. 11 illustrates a configuration example of a memory cell 30C in the memory cell array 21C. FIG. 12 illustrates a configuration example of the memory circuit 20C. The memory cell array 21C includes a plurality of control lines CTRL2. The control lines CTRL2 extend in the vertical direction in FIGS. 11 and 12. One end of each of the control lines CTRL2 is coupled to the drive section 23C. The drive section 23C applies the signal SCTRL to this control line CTRL2. In the memory cell 30C, the terminal TP of each of the storage elements 33 and 34 is coupled to the control line CTRL2.

The drive section 22C is configured to apply the signal SWL to the word line WL, apply the signal SRSTRL to the restore control line RSTRL, apply the signal SSTRLB to the store control line STRLB, and apply the signal SSTRL to the store control line STRL on the basis of a control signal supplied from the control section 11.

The drive section 23C is configured to write data in the memory cell array 21 or read out data from the memory cell array 21C through the bit lines BL and BLB. In addition, the drive section 23C also has a function of applying a signal SCTRL2 to the control line CTRL2 on the basis of a control signal supplied from the control section 11.

As illustrated in FIG. 12, the drive section 23C includes transistors 26 and 27. The transistor 26 is a P-type MOS transistor. The transistor 26 has the gate supplied with the signal SCTRLB, the source supplied with the power supply voltage VDD, and the drain coupled to the control line CTRL2. The transistor 27 is an N-type MOS transistor. The transistor 27 has the gate supplied with the signal SCTRLB, the drain coupled to the control line CTRL2, and the source grounded. These transistors 26 and 27 are included in an inverter. Each of the transistors 26 and 27 generates the signal SCTRL on the basis of the signal SCTRLB. The drive section 23C drives the control line CTRL2 by using this inverter.

Modification Example 14

In the embodiment described above, as illustrated in FIG. 2, each of the memory cells 30 is provided with the eight transistors 51 to 58, but this is not limitative. Instead, for example, the number of transistors may be decreased by replacing the two transistors 51 and 55 with one transistor and replacing the two transistors 54 and 58 with one transistor. The following describes a semiconductor circuit 1D according to the present modification example in detail. The semiconductor circuit 1D includes a memory circuit 20D as with the semiconductor circuit 1 (FIG. 1) according to the embodiment described above. The memory circuit 20D includes a memory cell array 21D and the drive sections 22 and 23.

FIG. 13 illustrates a configuration example of a memory cell 30D in the memory cell array 21D. The memory cell 30D includes transistors 35 and 36. This memory cell 30D is different from the memory cell 30 (FIG. 2) according to the embodiment described above in that the two transistors 51 and 55 are replaced with the one transistor 35 and the two transistors 54 and 58 are replaced with the one transistor 36. The transistor 35 is a P-type MOS transistor. The transistor 35 has the gate coupled to the store control line STRLB, the source supplied with the power supply voltage VDD, and the drain coupled to the sources of the transistors 52 and 56. The transistor 36 is an N-type MOS transistor. The transistor 36 has the gate coupled to the store control line STRL, the drain coupled to the sources of the transistors 53 and 57, and the source grounded.

For example, in the store operation OP2, the transistors 35 and 36 are set on as in a case of the embodiment described above (FIGS. 6B and 6C). In the first step, the drive section 22 then sets the voltage of the signal SCTRL to the low level voltage VL to cause the store current Istr1 to flow in one of the storage elements 33 and 34 through the transistor 35. In the second step, the drive section 22 then sets the voltage of the signal SCTRL to the high level voltage VH to cause the store current Istr2 to flow, through the transistor 36, in the storage element of the storage elements 33 and 34 that has no current flow therein in the first step. As a result, the resistance state of each of the storage elements 33 and 34 is set in the memory cell 30D in accordance with the data stored in the SRAM circuit 40.

Here, the transistor 35 corresponds to a specific example of an "eleventh transistor" according to the present disclosure. The transistor 36 corresponds to a specific example of a "twelfth transistor" according to the present disclosure.

Modification Example 1-5

In the embodiment described above, as illustrated in FIG. 2, the memory cell 30 is provided with the transistors 51, 54, 55, and 58, but this is not limitative. Instead, for example, the drive section 22 may be provided with transistors corresponding to these transistors. The following describes a semiconductor circuit 1E according to the present modification example in detail. The semiconductor circuit 1E includes a memory circuit 20E as with the semiconductor circuit 1 (FIG. 1) according to the embodiment described above. The memory circuit 20E includes a memory cell array 21E and drive sections 22E and 23.

FIG. 14 illustrates a configuration example of a memory cell 30E in the memory cell array 21E. FIG. 15 illustrates a configuration example of the memory circuit 20E. The memory cell array 21E includes a plurality of store control line STRLB2 and a plurality of store control lines STRL2. The store control lines STRLB2 extend in the horizontal direction in FIGS. 14 and 15. One end of each of the store control lines STRLB2 is coupled to the drive section 22E. The drive section 22E applies the signal SSTRLB2 to this store control line STRLB2. The store control lines STRL2 extend in the horizontal direction in FIGS. 14 and 15. One end of each of the store control lines STRL2 is coupled to the drive section 22E. The drive section 22E applies a signal SSTRL2 to this store control line STRL2. In the memory cell 30E, the sources of the transistors 52 and 56 are coupled to the store control line STRLB2 and the sources of the transistors 53 and 57 are coupled to the store control line STRL2.

The drive section 22E is configured to apply the signal SWL to the word line WL, apply the signal SCTRL to the control line CTRL, apply the signal SRSTRL to the restore control line RSTRL, apply the signal SSTRLB2 to the store control line STRLB2, and apply the signal SSTRL2 to the store control line STRL2 on the basis of a control signal supplied from the control section 11.

As illustrated in FIG. 15, the drive section 22E includes transistors 28 and 29. The transistor 28 is a P-type MOS transistor. The transistor 28 has the gate supplied with the signal SSTRLB, the source supplied with the power supply voltage VDD, and the drain coupled to a store control line STRLB2. The transistor 28 corresponds to the transistors 51 and 55 of the memory cell 30 (FIG. 2) according to the embodiment described above. The transistor 29 is an N-type MOS transistor. The transistor 29 has the gate supplied with the signal SSTRL, the drain coupled to a store control line STRL2, and the source grounded. The transistor 29 corresponds to the transistors 54 and 58 of the memory cell 30 (FIG. 2) according to the embodiment described above.

Here, the store control line STRLB2 corresponds to a specific example of a "first control line" according to the present disclosure. The store control line STRL2 corresponds to a specific example of a "second control line" according to the present disclosure. Each of the transistors 28 and 29 corresponds to a specific example of a "first voltage supply section" according to the present disclosure.

Modification Example 1-6

In the embodiment described above, as illustrated in FIG. 2, the drains of the transistors 52 and 53 are coupled to the storage element 34 and the drains of the transistors 56 and 57 are coupled to the storage element 33, but this is not limitative. Instead, for example, the drains of the transistors 52 and 53 may be coupled to the storage element 33 and the drains of the transistors 56 and 57 may be coupled to the storage element 34. The following describes a semiconductor circuit 1F according to the present modification example in detail. The semiconductor circuit 1F includes a memory circuit 20F as with the semiconductor circuit 1 (FIG. 1) according to the embodiment described above. The memory circuit 20F includes a memory cell array 21F and the drive sections 22 and 23.

FIG. 16 illustrates a configuration example of a memory cell 30F in the memory cell array 21F. The drains of the transistors 52 and 53 are coupled to the terminal TP of the storage element 33 and the drains of the transistors 56 and 57 are coupled to the terminal TP of the storage element 34. The storage element 33 has the terminal TP coupled to the drains of the transistors 52 and 53 and the terminal TN coupled to the control line CTRL. The storage element 34 has the terminal TP coupled to the drains of the transistors 56 and 57 and the terminal TN coupled to the control line CTRL.

Here, the terminal T1 of each of the storage elements 33 and 34 corresponds to a specific example of the "first terminal" according to the present disclosure, the terminal TP corresponds to a specific example of the "second terminal" according to the present disclosure, and the terminal TN corresponds to a specific example of the "third terminal" according to the present disclosure. The transistor 52 corresponds to a specific example of the "second transistor" according to the present disclosure. The transistor 53 corresponds to a specific example of the "third transistor" according to the present disclosure. The transistor 56 corresponds to a specific example of the "fifth transistor" according to the present disclosure. The transistor 57 corresponds to a specific example of the "sixth transistor" according to the present disclosure. The transistor 51 corresponds to a specific example of the "seventh transistor" according to the present disclosure. The transistor 54 corresponds to a specific example of the "eighth transistor" according to the present disclosure. The transistor 55 corresponds to a specific example of the "ninth transistor" according to the present disclosure. The transistor 58 corresponds to a specific example of the "tenth transistor" according to the present disclosure.

FIG. 17A illustrates a state in the normal operation OP1, each of FIGS. 17B and 17C illustrates a state in the store operation OP2, FIG. 17D illustrates a state in the standby operation OP3, and FIG. 17E illustrates a state in the restore operation OP4.

In the normal operation OP1, the control section 11 sets the voltage of the power supply control signal SPG at the low level as illustrated in FIG. 5. This tuns on the power supply transistor 12 (FIG. 1) and supplies the memory circuit 20F with the power supply voltage VDD. The drive section 22 then sets the voltage of the signal SRSTRL at the low level as illustrated in FIG. 5. This turns off each of the transistors 31 and 32 as illustrated in FIG. 17A. In addition, as illustrated in FIG. 5, the drive section 22 sets the voltage of the signal SSTRL at the low level and sets the voltage of the signal SSTRLB at the high level. This turns off each of the transistors 51, 54, 55, and 58 as illustrated in FIG. 17A. In addition, the drive section 22 sets the voltage of the signal SCTRL to a low level voltage VL (the ground level) as illustrated in FIG. 5. In this example, the resistance state of the storage element 33 is maintained as the high resistance state RH and the resistance state of the storage element 34 is maintained as the low resistance state RL.

In the store operation OP2, as illustrated in FIG. 5, the drive section 22 sets the voltage of the signal SSTRL at the high level and sets the voltage of the signal SSTRLB at the low level. This turns on each of the transistors 51, 54, 55, and 58 as illustrated in FIGS. 17B and 17C. In addition, the drive section 22 sets the voltage of the signal SWL at the low level as illustrated in FIG. 5. This turns off the transistors 45 and 46.

In the first step, the drive section 22 then sets the voltage of the signal SCTRL to the low level voltage VL as illustrated in FIG. 5. In this example, the voltage VN1 at the node N1 is the low level voltage VL and the voltage VN2 at the node N2 is the high level voltage VH. The transistors 52 and 57 are thus on and the transistors 53 and 56 are off. This causes the store current Istr1 to flow in the memory cell 30F in the order of the transistor 51, the transistor 52, the storage element 33, and the transistor 25 as illustrated in FIG. 17B. In this case, the store current Istr1 flows in the storage element 33 from the terminal TP to the terminal TN. This sets the resistance state of the storage element 33 to the low resistance state RL.

Next, in the second step, the drive section 22 sets the voltage of the signal SCTRL to the high level voltage VH. In this example, as illustrated in FIG. 17C, the store current Istr2 flows in the order of the transistor 24, the storage element 34, the transistor 57, and the transistor 58. In this case, the store current Istr2 flows in the storage element 34 from the terminal TN to the terminal TP. This sets the resistance state of the storage element 34 to the high resistance state RH.

In the standby operation OP3, the control section 11 sets the voltage of the power supply control signal SPG at the high level as illustrated in FIG. 5. This tuns off the power supply transistor 12 (FIG. 1) and stops supplying the memory circuit 20F with power. In this case, the resistance states of the storage elements 33 and 34 are maintained as illustrated in FIG. 17D.

In the restore operation OP4, the control section 11 sets the voltage of the power supply control signal SPG at the low level as illustrated in FIG. 5. This tuns on the power supply transistor 12 (FIG. 1) and supplies the memory circuit 20F with the power supply voltage VDD. The drive section 22 then sets the voltage of the signal SRSTRL at the high level only in the period of a predetermined length immediately after the power supply transistor 12 is turned on. This turns on each of the transistors 31 and 32 in this period as illustrated in FIG. 17E. In addition, as illustrated in FIG. 5, the drive section 22 sets the voltage of the signal SSTRL at the low level and sets the voltage of the signal SSTRLB at the high level. This turns off each of the transistors 51, 54, 55, and 58 as illustrated in FIG. 17E. In addition, the drive section 22 sets the voltage of the signal SCTRL to the low level voltage VL (the ground level) as illustrated in FIG. 5. This causes the node N1 to be grounded through the transistor 31 and the storage element 33. The node N2 is grounded through the transistor 32 and the storage element 34. In this example, the resistance state of the storage element 33 is the low resistance state RL and the resistance state of the storage element 34 is the high resistance state RH. This causes the node N1 to be pulled down with a low resistance value and causes the node N2 to be pulled down with a high resistance value. The voltage VN1 at the node N1 is set to the low level voltage VL and the voltage VN2 at the node N2 is set to the high level voltage VH. In this way, the memory cell 30F causes the SRAM circuit 40 to store data in accordance with the data stored in each of the storage elements 33 and 34.

Modification Example 1-7

In the embodiment described above, a P-type MOS transistor is used to configure the power supply transistor 12, but this is not limitative. Instead, for example, an N-type MOS transistor may be used to configure a power supply transistor as in a semiconductor circuit 1G illustrated in FIG. 18. The semiconductor circuit 1G includes a control section 11G, a power supply transistor 12G, and a memory circuit 20G. The power supply transistor 12G is an N-type MOS transistor in this example. The power supply transistor 12G has the gate supplied with a power supply control signal, the drain coupled to the memory circuit 20G, and the source supplied with a ground voltage VSS1. This configuration causes the semiconductor circuit 1G to turn on the power supply transistor 12G and supply the memory circuit 20G with the ground voltage VSS1 as a ground voltage VSS in a case where the memory circuit 20G is brought into operation. In addition, the power supply transistor 12G is turned off in the semiconductor circuit 1G in a case where the memory circuit 20G is not in operation.

OTHER MODIFICATION EXAMPLES

In addition, two or more of these modification examples may be combined.

2. Second Embodiment

Next, a semiconductor circuit 2 according to a second embodiment is described. In the present embodiment, the memory cell is simplified by omitting the storage element 34 and the transistors 51 to 54 from the memory cell 30 of the semiconductor circuit 1 according to the first embodiment described above. It is to be noted that components that are substantially the same as those of the semiconductor circuit 1 according to the first embodiment described above are denoted by the same reference signs and descriptions thereof are omitted as appropriate.

As illustrated in FIG. 1, the semiconductor circuit 2 includes a memory circuit 60. The memory circuit 60 includes a memory cell array 61 and the drive sections 22 and 23.

FIG. 19 illustrates a configuration example of a memory cell 70 in the memory cell array 61. FIG. 20 illustrates a configuration example of the memory circuit 60. The memory cell 70 includes the SRAM circuit 40, transistors 71, 72, and 55 to 58, and the storage element 33. In the memory cell 70, the storage element 34 and the transistors 51 to 54 are omitted from the memory cell 30 (FIG. 2) according to the first embodiment described above and the transistors 31 and 32 are replaced with the transistors 71 and 72.

The transistors 71 and 72 are N-type MOS transistors. The transistor 71 has the gate coupled to the restore control line RSTRL, the drain coupled to the node N1, and the source coupled to the terminal T1 of the storage element 33. The transistor 72 has the gate coupled to the restore control line RSTRL, the drain coupled to the node N2, and the source coupled to the control line CTRL. The on-resistance of the transistor 72 is set to be greater than the on-resistance of the transistor 71. Specifically, for example, a gate length L72 of the transistor 72 may be greater than a gate length L71 of the transistor 71, a gate width W72 of the transistor 72 may be less than a gate width W71 of the transistor 71, or a threshold voltage Vth72 of the transistor 72 may be higher than a threshold voltage Vth71 of the transistor 71.

Here, the storage element 33 corresponds to a specific example of the "first storage element" according to the present disclosure. The terminal T1 of the storage element 33 corresponds to a specific example of the "first terminal" according to the present disclosure, the terminal TN corresponds to a specific example of the "second terminal" according to the present disclosure, and the terminal TP corresponds to a specific example of the "third terminal" according to the present disclosure. The transistor 71 corresponds to a specific example of the "first transistor" according to the present disclosure. The transistor 56 corresponds to a specific example of the "second transistor" according to the present disclosure. The transistor 57 corresponds to a specific example of the "third transistor" according to the present disclosure. Each of the transistors 55 and 58 corresponds to a specific example of the "first voltage supply section" according to the present disclosure. Each of the transistors 24 and 25 corresponds to a specific example of a "second voltage supply section" according to the present disclosure. The transistor 72 corresponds to a specific example of a "twenty-first transistor" according to the present disclosure.

Each of FIGS. 21, 22A, 22B, 22C, 22D, and 23A, 23B, 23C, and 23D illustrate the operation state of the memory cell 70. FIG. 21 illustrates a state in the normal operation OP1. Each of FIGS. 22A, 22B, 22C, and 22D illustrate a state in a case where the voltage VN1 at the node N1 is the low level voltage VL. Each of FIGS. 22A and 22B illustrates a state in the store operation OP2. FIG. 22C illustrates a state in the standby operation OP3. FIG. 22D illustrates a state in the restore operation OP4. Each of FIGS. 23A, 23B, 23C, and 23D illustrates a state in a case where the voltage VN1 at the node N1 is the high level voltage VH. Each of FIGS. 23A and 23B illustrates a state in the store operation OP2. FIG. 23C illustrates a state in the standby operation OP3. FIG. 23D illustrates a state in the restore operation OP4.

(Normal Operation OP1)

In the normal operation OP1, the control section 11 sets the voltage of the power supply control signal SPG at the low level as illustrated in FIG. 5. This tuns on the power supply transistor 12 (FIG. 1) and supplies the memory circuit 60 with the power supply voltage VDD. The drive section 22 then sets the voltage of the signal SRSTRL at the low level as illustrated in FIG. 5. This turns off the transistors 71 and 72 as illustrated in FIG. 21. In addition, as illustrated in FIG. 5, the drive section 22 sets the voltage of the signal SSTRL at the low level and sets the voltage of the signal SSTRLB at the high level. This turns off each of the transistors 55 and 58 as illustrated in FIG. 21. In addition, the drive section 22 sets the voltage of the signal SCTRL to the low level voltage VL (the ground level) as illustrated in FIG. 5.

In this normal operation OP1, information is written in the SRAM circuit 40 of the memory cell 70 or information is read out from the SRAM circuit 40. In this case, as illustrated in FIG. 21, the transistors 71, 55, and 58 are off. No current therefore flows in the storage element 33. The resistance state of the storage element 33 is thus maintained. In this example, the resistance state of the storage element 33 is maintained as the low resistance state RL.

(Store Operation OP2)

In the store operation OP2, as illustrated in FIG. 5, the drive section 22 sets the voltage of the signal SSTRL at the high level and sets the voltage of the signal SSTRLB at the low level. This turns on each of the transistors 55 and 58 as illustrated in FIGS. 22A, 22B, 23A, and 23B. In addition, the drive section 22 sets the voltage of the signal SWL at the low level as illustrated in FIG. 5. This turns off the transistors 45 and 46.

In this store operation OP2, as illustrated in FIG. 5, the drive section 22 sets the voltage of the signal SCTRL to the low level voltage VL (the ground level) in the first step and sets the voltage of the signal SCTRL to the high level voltage VH (the power supply voltage level) in the second step. This sets the resistance state of the storage element 33 in accordance with the information stored in the SRAM circuit 40.

Specifically, for example, as illustrated in FIGS. 22A and 22B, in a case where the voltage VN1 at the node N1 is the low level voltage VL, the voltage VN2 at the node N2 is the high level voltage VH. This turns on the transistor 57 and turns off the transistor 56. In the first step, no current thus flows in the memory cell 70 as illustrated in FIG. 22A. Meanwhile, in the second step, as illustrated in FIG. 22B, the store current Istr2 flows in the order of the transistor 24, the storage element 33, the transistor 57, and the transistor 58. In this case, the store current Istr2 flows in the storage element 33 from the terminal TP to the terminal TN. As a result, the resistance state of the storage element 33 is set to the low resistance state RL.

In addition, for example, as illustrated in FIGS. 23A and 23B, in a case where the voltage VN1 at the node N1 is the high level voltage VH, the voltage VN2 at the node N2 is the low level voltage VL. This turns on the transistor 56 and turns off the transistor 57. This causes the store current Istr1 to flow in the memory cell 70 in the first step in the order of the transistor 55, the transistor 56, the storage element 33, and the transistor 25 as illustrated in FIG. 23A. In this case, the store current Istr1 flows in the storage element 33 from the terminal TN to the terminal TP. As a result, the resistance state of the storage element 33 is set to the high resistance state RH. Meanwhile, in the second step, no store current flows as illustrated in FIG. 23B. In this way, the resistance state of the storage element 33 is set to the high resistance state RH.

(Standby Operation OP3)

In the standby operation OP3, the control section 11 sets the voltage of the power supply control signal SPG at the high level as illustrated in FIG. 5. This tuns off the power supply transistor 12 (FIG. 1) and stops supplying the memory circuit 60 with power. In this case, the resistance state of the storage element 33 is maintained as illustrated in FIGS. 22C and 23C.

(Restore Operation OP4)

In the restore operation OP4, the control section 11 sets the voltage of the power supply control signal SPG at the low level as illustrated in FIG. 5. This tuns on the power supply transistor 12 (FIG. 1) and supplies the memory circuit 60 with the power supply voltage VDD. The drive section 22 then sets the voltage of the signal SRSTRL at the high level only in the period of a predetermined length immediately after the power supply transistor 12 is turned on. This turns on each of the transistors 71 and 72 in this period as illustrated in FIGS. 22D and 23D. In addition, as illustrated in FIG. 5, the drive section 22 sets the voltage of the signal SSTRLB at the high level and sets the voltage of the signal SSTRL at the low level. This turns off each of the transistors 55 and 58 as illustrated in FIGS. 22D and 23D. In addition, the drive section 22 sets the voltage of the signal SCTRL to the low level voltage VL (the ground level) as illustrated in FIG. 5. This causes the node N1 to be grounded through the transistor 71 and the storage element 33. The node N2 is grounded through the transistor 72. In this case, the resistance value between the node N1 and the ground and the resistance value between the node N2 and the ground have different magnitude relationships in accordance with the resistance state of the storage element 33. This causes the voltage state of the SRAM circuit 40 to be determined.

Specifically, for example, as illustrated in FIG. 22D, in a case where the resistance state of the storage element 33 is the low resistance state RL, the resistance value between the node N1 and the ground is smaller than the resistance value between the node N2 and the ground. This causes the current value of a current 171 flowing from the node N1 to the control line CTRL through the transistor 71 and the storage element 33 to be greater than the current value of a current 172 flowing from the node N2 to the control line CTRL through the transistor 72 immediately after the power supply transistor 12 is turned on. The voltage of the node N1 is thus set to the low level voltage VL.

In addition, for example, as illustrated in FIG. 23D, in a case where the resistance state of the storage element 33 is the high resistance state RH, the resistance value between the node N1 and the ground is greater than the resistance value between the node N2 and the ground. This causes the current value of the current 171 flowing from the node N1 to the control line CTRL through the transistor 71 and the storage element 33 to be smaller than the current value of the current 172 flowing from the node N2 to the control line CTRL through the transistor 72 immediately after the power supply transistor 12 is turned on. The voltage of the node N1 is thus set to the high level voltage VH.

In this way, the memory cell 70 causes the SRAM circuit 40 to store information in accordance with the information stored in the storage element 33.

In this way, each of the memory cells 70 is provided with the one storage element 33 in the semiconductor circuit 2. Specifically, in the semiconductor circuit 2, the storage element 34 and the transistors 51 to 54 are omitted from the memory cell 30 (FIG. 2) according to the first embodiment described above from the memory cell 30 of the semiconductor circuit 1 according to the first embodiment and the transistors 31 and 32 are replaced with the transistors 71 and 72. This configures the memory cell 70. This allows the semiconductor circuit 2 to have a smaller number of elements than those of the semiconductor circuit 1 according to the first embodiment. It is thus possible to decrease the area of the memory cell 70. As a result, it is possible to decrease the area of the entire semiconductor circuit 2.

In addition, in the semiconductor circuit 2, the on-resistance of the transistor 72 is greater than the on-resistance of the transistor 71. Specifically, the transistor 71 and the transistor 72 are different in at least one of gate length, gate width, or threshold voltage. In the restore operation OP4, the current 172 flowing from the node N2 to the control line CTRL through the transistor 72 is then greater than the current 171 flowing from the node N1 to the control line CTRL through the transistor 71 and the storage element 33 in a case where the resistance state of the storage element 33 is the high resistance state RH and the current 172 is less than the current 171 flowing from the node N1 to the control line CTRL through the transistor 71 and the storage element 33 in a case where the resistance state of the storage element 33 is the low resistance state RL. This allows the semiconductor circuit 2 to achieve the restore operation OP4 with the one storage element 33.

As described above, in the present embodiment, each of the memory cells is provided with one storage element. This makes it possible to decrease the area of the semiconductor circuit.

In the present embodiment, the on-resistance of the transistor 72 is greater than the on-resistance of the transistor 71. This makes it possible to achieve the restore operation with one storage element.

The other effects are similar to those of the first embodiment described above.

Modification Example 2-1

In the embodiment described above, the gates of the transistors 71 and 72 are coupled and the source of the transistor 72 is coupled to the control line CTRL, but this is not limitative. For example, as in a memory cell 70H illustrated in FIG. 24, the source of the transistor 72 may be grounded.

In addition, for example, the transistors 71 and 72 may be separately controlled. A semiconductor circuit 2J according to the present modification example includes a memory circuit 60J as with the semiconductor circuit 2 (FIG. 1) according to the second embodiment described above. The memory circuit 60J includes a memory cell array 61J and drive sections 22J and 23. FIG. 25 illustrates a configuration example of a memory cell 70J in the memory cell array 61J. FIG. 26 illustrates a configuration example of the memory circuit 60J. The memory cell array 61J includes a plurality of restore control lines RSTRL1 and a plurality of restore control lines RSTRL2. The restore control lines RSTRL1 extend in the horizontal direction in FIGS. 25 and 26. One end of each of the restore control lines RSTRL1 is coupled to the drive section 22J. The drive section 22J applies a signal SRSTRL1 to this restore control line RSTRL1. The restore control lines RSTRL2 extend in the horizontal direction in FIGS. 25 and 26. One end of each of the restore control lines RSTRL2 is coupled to the drive section 22J. The drive section 22J applies a signal SRSTRL2 to this restore control line RSTRL2. In the memory cell 70J, the gate of the transistor 71 is coupled to the restore control line RSTRL1 and the gate of the transistor 72 are coupled to the restore control line RSTRL2. The drive section 22J is configured to apply the signal SRSTRL1 to the restore control line RSTRL1 and apply the signal SRSTRL2 to the restore control line RSTRL2 on the basis of a control signal supplied from the control section 11. The voltage (the on-voltage) of the signal SRSTRL1 at the high level and the voltage (the on-voltage) of the signal SRSTRL2 at the high level are adjustable. For example, the voltage of the signal SRSTRL2 at the high level is set to a voltage different from the voltage of the signal SRSTRL1 at the high level. In this example, the transistors 71 and 72 are different from each other in on-resistance. For example, the transistors 71 and 72 may, however, have substantially equal on-resistance and the voltage of the signal SRSTRL2 at the high level may be lower than the voltage of the signal SRSTRL1 at the high level.

In addition, for example, as in a memory cell 70K illustrated in FIG. 27, the transistor 72 may be omitted. This memory cell 70 includes a SRAM circuit 80, the transistor 71, the transistors 55 to 58, and the storage element 33. The SRAM circuit 80 includes transistors 81 to 84, 45, and 46. The transistors 81 to 84 respectively correspond to the transistors 41 to 44 in the second embodiment described above. The transistors 81 and 82 are included in an inverter IV3 and the transistors 83 and 84 are included in inverter IV4. The SRAM circuit 80 is configured to, after the power supply is turned on, facilitate the voltage VN1 at the node N1 to be the high level voltage VH immediately after the power supply is turned on. Specifically, for example, a gate width W83 of the transistor 83 may be greater than a gate width W81 of the transistor 81 (W83>W81) and a gate width W82 of the transistor 82 may be greater than a gate width W84 of the transistor 84 (W82>W84). In addition, a gate length L83 of the transistor 83 in the inverter IV4 may be less than a gate length L81 of the transistor 81 in the inverter IV3 (L83<L81) and a gate length L82 of the transistor 82 in the inverter IV3 may be less than a gate length L84 of the transistor 84 in the inverter IV4 (L82<L84). Accordingly, as a result, immediately after the power supply is turned on, the inverter IV4 outputs a high level more easily and the inverter IV3 outputs a low level more easily. As a result, it is possible in the restore operation OP4 in the memory cell 70K to cause a current flowing from the transistor 83 of the inverter IV4 to the node N1 to be greater than a current flowing from the node N1 to the control line CTRL in a case where the resistance state of the storage element 33 is the high resistance state RH and less than a current flowing from the node N1 to the control line CTRL in a case where the resistance state of the storage element 33 is the low resistance state RL. This makes it possible in the restore operation OP4 in the memory cell 70K to cause the voltage VN1 at the node N1 to be the high level voltage VH in a case where the resistance state of the storage element 33 is the high resistance state RH and cause the voltage VN1 at the node N1 to be the low level voltage VL in a case where the resistance state of the storage element 33 is the low resistance state RL. Here, the inverter IV3 corresponds to a specific example of the "first circuit" according to the present disclosure. The inverter IV4 corresponds to a specific example of the "second circuit" according to the present disclosure.

Modification Example 2-2

A modification example of the first embodiment described above may be applied to the semiconductor circuit 2 according to the embodiment described above.

3. Third Embodiment

Next, a semiconductor circuit 3 according to a third embodiment is described. In the present embodiment, a semiconductor circuit is configured by using a memory cell different from the memory cell according to the first embodiment. It is to be noted that components that are substantially the same as those of the semiconductor circuit 1 according to the first embodiment described above are denoted by the same reference signs and descriptions thereof are omitted as appropriate.

The semiconductor circuit 3 includes a control section 111 and a memory circuit 120 as illustrated in FIG. 1. The control section 111 is configured to control an operation of the memory circuit 120 as with the control section 11 according to the first embodiment described above. The memory circuit 120 includes a memory cell array 121 and drive sections 122 and 123.

FIG. 28 illustrates a configuration example of a memory cell 130 in the memory cell array 121. FIG. 29 illustrates a configuration example of the memory circuit 120. The memory cell array 121 includes the plurality of word lines WL, the plurality of bit lines BL, the plurality of bit lines BLB, the plurality of control lines CTRL, the plurality of restore control lines RSTRL, the plurality of store control lines STRLB, and a plurality of reset control lines RESETL. The reset control lines RESETL extend in the horizontal direction in FIGS. 28 and 29. One end of each of the reset control lines RESETL is coupled to the drive section 122. The drive section 122 applies a signal SRESETL to this reset control line RESETL.

The memory cell 130 includes the SRAM circuit 40, the transistors 31, 32, and 51 to 58, and the storage elements 33 and 34.

The transistor 51 has the gate coupled to the store control line STRLB, the source supplied with the power supply voltage VDD, and the drain coupled to the source of the transistor 52. The transistor 52 has the gate coupled to the node N2, the source coupled to the drain of the transistor 51, and the drain coupled to the drain of the transistor 53 and the terminal TN of the storage element 33. The transistor 53 has the gate coupled to the node N1, the drain coupled to the drain of the transistor 52 and the terminal TN of the storage element 33, and the source coupled to the drain of the transistor 54. The transistor 54 has the gate coupled to the reset control line RESETL, the drain coupled to the source of the transistor 53, and the source grounded.

The transistor 55 has the gate coupled to the store control line STRLB, the source supplied with the power supply voltage VDD, and the drain coupled to the source of the transistor 56. The transistor 56 has the gate coupled to the node N1, the source coupled to the drain of the transistor 55, and the drain coupled to the drain of the transistor 57 and the terminal TN of the storage element 34. The transistor 57 has the gate coupled to the node N2, the drain coupled to the drain of the transistor 56 and the terminal TN of the storage element 34, and the source coupled to the drain of the transistor 58. The transistor 58 has the gate coupled to the reset control line RESETL, the drain coupled to the source of the transistor 57, and the source grounded.

The storage element 33 has the terminal T1 coupled to the source of the transistor 31, the terminal TP coupled to the control line CTRL, and the terminal TN coupled to the drains of the transistors 52 and 53. The storage element 34 has the terminal T1 coupled to the source of the transistor 32, the terminal TP coupled to the control line CTRL, and the terminal TN coupled to the drains of the transistors 56 and 57.

The drive section 122 is configured to apply the signal SWL to the word line WL, apply the signal SCTRL to the control line CTRL, apply the signal SRSTRL to the restore control line RSTRL, apply the signal SSTRLB to the store control line STRLB, and apply the signal SRESETL to the reset control line RESETL on the basis of a control signal supplied from the control section 111. The drive section 122 includes the transistors 24 and 25 as with the drive section 22 (FIG. 3) according to the first embodiment. These transistors 24 and 25 are included in an inverter. Each of the transistors 24 and 25 generates the signal SCTRL on the basis of the signal SCTRLB. The drive section 122 drives the control line CTRL by using this inverter.

The drive section 123 is configured to write data in the memory cell array 121 or read out data from the memory cell array 121 through the bit lines BL and BLB.

Here, the terminal T1 of each of the storage elements 33 and 34 corresponds to a specific example of the "first terminal" according to the present disclosure, the terminal TN corresponds to a specific example of the "second terminal" according to the present disclosure, and the terminal TP corresponds to a specific example of the "third terminal" according to the present disclosure. The transistor 52 corresponds to a specific example of the "second transistor"

according to the present disclosure. The transistor 53 corresponds to a specific example of the "third transistor" according to the present disclosure. The transistor 56 corresponds to a specific example of the "fifth transistor" according to the present disclosure. The transistor 57 corresponds to a specific example of the "sixth transistor" according to the present disclosure. The transistor 51 corresponds to a specific example of the "seventh transistor" according to the present disclosure. The transistor 54 corresponds to a specific example of the "eighth transistor" according to the present disclosure. The transistor 55 corresponds to a specific example of the "ninth transistor" according to the present disclosure. The transistor 58 corresponds to a specific example of the "tenth transistor" according to the present disclosure. Each of the drive sections 122 and 123 corresponds to a specific example of the "control section" according to the present disclosure. The control section 111 corresponds to a specific example of the "power supply control section" according to the present disclosure.

In a normal operation OP1, the semiconductor circuit 3 causes the SRAM circuit 40 that is a volatile memory to store data. For example, in a case where the standby operation OP3 is performed by turning off the power supply transistor 12, the semiconductor circuit 3 causes the storage elements 33 and 34 to each store the data stored in the SRAM circuit 40 by performing the store operation OP2 immediately before the standby operation OP3. Each of the storage elements 33 and 34 is a nonvolatile memory. The SRAM circuit 40 is a volatile memory. The semiconductor circuit 3 then causes the SRAM circuit 40 to store the data stored in each of the storage elements 33 and 34 by performing the restore operation OP4 immediately after the standby operation OP3. The semiconductor circuit 3 then resets the resistance state of each of the storage elements 33 and 34 to a predetermined resistance state (the low resistance state RL in this example) by performing a reset operation OP5 immediately after this restore operation OP4. The following describes this operation in detail.

FIG. 30 illustrates an operation example of the certain memory cell 130 of interest in the semiconductor circuit 3. Each of FIGS. 31A, 31B, 31C, 31D, and 31E illustrate the operation state of the memory cell 130. FIG. 31A illustrates a state in the normal operation OP1. FIG. 31B illustrates a state in the store operation OP2. FIG. 31C illustrates a state in the standby operation OP3. FIG. 31D illustrates a state in the restore operation OP4. FIG. 31E illustrates a state in the reset operation OP5.

(Normal Operation OP1)

In the normal operation OP1, the control section 111 sets the voltage of the power supply control signal SPG at the low level as illustrated in FIG. 30. This tuns on the power supply transistor 12 (FIG. 1) and supplies the memory circuit 120 with the power supply voltage VDD. The drive section 122 then sets the voltage of the signal SRSTRL at the low level as illustrated in FIG. 30. This turns off each of the transistors 31 and 32 as illustrated in FIG. 31A. In addition, as illustrated in FIG. 30, the drive section 122 sets the voltage of the signal SSTRLB at the high level and sets the voltage of the signal SRESETL at the low level. This turns off each of the transistors 51, 54, 55, and 58 as illustrated in FIG. 31A. In addition, the drive section 122 sets the voltage of the signal SCTRL to the low level voltage VL (the ground level) as illustrated in FIG. 30.

In this normal operation OP1, data is written in the SRAM circuit 40 of the memory cell 130 or data is read out from the SRAM circuit 40. In this case, as illustrated in FIG. 31A, the transistors 31, 32, 51, 54, 55, and 58 are off. No current therefore flows in the storage elements 33 and 34. The resistance states of the storage elements 33 and 34 are thus maintained. In this example, each of the resistance states of the storage elements 33 and 34 is maintained as the low resistance state RL. In other words, the resistance state of each of the storage elements 33 and 34 is set to the low resistance state RL by the reset operation OP5 in the semiconductor circuit 3.

(Store Operation OP2)

In the store operation OP2, the drive section 122 sets the voltage of the signal SSTRLB at the low level as illustrated in FIG. 30. This turns on each of the transistors 51 and 55 as illustrated in FIG. 31B. In addition, the drive section 122 sets the voltage of the signal SWL at the low level as illustrated in FIG. 30. This turns off the transistors 45 and 46. The store current Istr then flows in any one of the storage elements 33 and 34.

In this example, the voltage VN1 at the node N1 is the low level voltage VL and the voltage VN2 at the node N2 is the high level voltage VH. The transistors 56 and 57 are thus on and the transistors 52 and 53 are off. This causes the store current Istr to flow in the memory cell 130 in the order of the transistor 55, the transistor 56, the storage element 34, and the transistor 25 as illustrated in FIG. 31B. In this case, the store current Istr flows in the storage element 34 from the terminal TN to the terminal TP. This sets the resistance state of the storage element 34 to the high resistance state RH.

It is to be noted that the control line CTRL, the restore control line RSTRL, the store control line STRLB, and the reset control line RESETL extend in the row direction (the horizontal direction in FIGS. 28 and 29) in this example as illustrated in FIGS. 28 and 29. The store operation OP2 is thus performed in units of rows. It is possible to set, by using, for example, the signal SSTRLB, a row that is subjected to the store operation OP2 and a row that is not subjected to the store operation OP2. Specifically, the drive section 122 sets the voltage of the signal SSTRLB at the low level for a row that is subjected to the store operation OP2 as illustrated in FIG. 30. In addition, the drive section 122 sets the voltage of the signal SSTRLB at the high level for a row that is not subjected to the store operation OP2 as illustrated in FIG. 32A.

(Standby Operation OP3)

In the standby operation OP3, the control section 111 sets the voltage of the power supply control signal SPG at the high level as illustrated in FIG. 30. This tuns off the power supply transistor 12 (FIG. 1) and stops supplying the memory circuit 120 with power. This sets the voltage of each of the signals SRESETL, SCTRL, and SRSTRL at the low level and sets the voltage of the signal SSTRLB at the high level. In this case, the resistance states of the storage elements 33 and 34 are maintained as illustrated in FIG. 31C.

(Restore Operation OP4)

In the restore operation OP4, the control section 111 sets the voltage of the power supply control signal SPG at the low level as illustrated in FIG. 30. This tuns on the power supply transistor 12 (FIG. 1) and supplies the memory circuit 120 with the power supply voltage VDD. The drive section 122 then sets the voltage of the signal SRSTRL at the high level only in the period of a predetermined length immediately after the power supply transistor 12 is turned on. This turns on each of the transistors 31 and 32 in this period as illustrated in FIG. 31D. In addition, as illustrated in FIG. 30, the drive section 122 sets the voltage of the signal SSTRLB at the high level and sets the voltage of the signal SRESETL at the low level. This turns off each of the transistors 51, 54, 55, and 58 as illustrated in FIG. 31D. In addition, the drive section 122 sets the voltage of the signal SCTRL to the low level voltage VL (the ground level) as illustrated in FIG. 30. This causes the node N1 to be grounded through the transistor 31 and the storage element 33. The node N2 is grounded through the transistor 32 and the storage element 34.

In this example, the resistance state of the storage element 33 is the low resistance state RL and the resistance state of the storage element 34 is the high resistance state RH. This causes the node N1 to be pulled down with a low resistance value and causes the node N2 to be pulled down with a high resistance value. The voltage VN1 at the node N1 is set to the low level voltage VL and the voltage VN2 at the node N2 is set to the high level voltage VH. In this way, the memory cell 130 causes the SRAM circuit 40 to store data in accordance with the data stored in each of the storage elements 33 and 34.

(Reset Operation OP5)

The semiconductor circuit 3 then resets the resistance state of each of the storage elements 33 and 34 to a predetermined resistance state (the low resistance state RL in this example) by performing the reset operation OP5 immediately after the restore operation OP4.

In the reset operation OP5, the drive section 122 sets the voltage of the signal SRESETL at the high level as illustrated in FIG. 30. This turns on each of the transistors 54 and 58 as illustrated in FIG. 31E. In addition, the drive section 122 sets the voltage of the signal SCTRL to the high level voltage VH (the power supply voltage level) as illustrated in FIG. 30. This causes a reset current Ireset to flow in any one of the storage elements 33 and 34.

In this example, immediately after the restore operation OP4, the voltage VN1 of the node N1 is the low level voltage VL and the voltage VN2 of the node N2 is the high level voltage VH. The transistors 56 and 57 are thus on and the transistors 52 and 53 are off. This causes the reset current Ireset to flow in the memory cell 130 in the order of the transistor 24, the storage element 34, the transistor 57, and the transistor 58 as illustrated in FIG. 31E. In this case, the reset current Ireset flows in the storage element 34 from the terminal TP to the terminal TN. This sets the resistance state of the storage element 34 to the low resistance state RL.

In other words, immediately after the restore operation OP4, the reset operation OP5 is performed in the semiconductor circuit 3 before the information in the SRAM circuit 40 is rewritten. Accordingly, immediately after the restore operation OP4, the voltage VN1 of the node N1 is the low level voltage VL and the voltage VN2 of the node N2 is the high level voltage VH as illustrated in FIG. 31D. Performing the reset operation OP5 after the restore operation OP4 is performed and before the voltages of the nodes N1 and N2 are changed therefore makes it possible to selectively reset the resistance state of the storage element 34 whose resistance state is the high resistance state RH among the two storage elements 33 and 34 to the low resistance state RL.

In this way, both the resistance states of the storage elements 33 and 34 are set to the low resistance state RL by the reset operation OP5.

The reset operation OP5 is performed, for example, in units of rows. It is possible to set, by using, for example, the signal SRESETL, a row that is subjected to the reset operation OP5 and a row that is not subjected to the reset operation OP5. Specifically, the drive section 122 sets the voltage of the signal SRESETL at the high level for a row that is subjected the reset operation OP5 as illustrated in FIG. 30 and the drive section 122 sets the voltage of the signal SRESETL at the low level for a row that is not subjected to the reset operation OP5 as illustrated in FIG. 32A. In addition, in this example, the drive section 122 sets the voltage of the signal SCTRL to the high level voltage VH for a row that is subjected to the reset operation OP5 as illustrated in FIG. 30 and maintains the voltage of the signal SCTRL as the low level voltage VL for a row that is not subjected to the reset operation OP5 as illustrated in FIG. 32A. It is to be noted that this is not limitative, but the voltage of the signal SCTRL may also be set to the high level voltage VH for a row that is not subjected to the reset operation OP5 as illustrated in FIG. 32B.

After that, the semiconductor circuit 3 performs the normal operation OP1 (FIG. 31A). Following this, the semiconductor circuit 1 then repeats the store operation OP2, the standby operation OP3, the restore operation OP4, the reset operation OP5, and the normal operation OP1 in this order.

In this way, the semiconductor circuit 3 sets the resistance state of each of the storage elements 33 and 34 to a predetermined state (the low resistance state RL in this example) by performing the reset operation OP5. Only one of the two storage elements 33 and 34 has to be therefore set in the high resistance state RH in the store operation OP2. This does not request two steps unlike the semiconductor circuit 1 according to the first embodiment. It is thus possible to simplify the store operation OP2.

In addition, immediately after the restore operation OP4, the reset operation OP5 is performed in the semiconductor circuit 3 before the information in the SRAM circuit 40 is rewritten. This allows the semiconductor circuit 3 to selectively reset the resistance state of a storage element whose resistance state is the high resistance state RH among the two storage elements 33 and 34 to the low resistance state RL and prepare for the next store operation OP2.

As described above, in the present embodiment, the resistance state of a storage element is set to a predetermined resistance state by performing the reset operation. It is thus possible to simplify the store operation.

The other effects are similar to those of the first embodiment described above.

Modification Example 3-1

In the embodiment described, the drive section 122 drives the control lines CTRL one by one, but this is not limitative. Instead, for example, as in the modification example 1-1 of the first embodiment described above, the plurality of control lines CTRL may be collectively driven. Similarly, the plurality of restore control lines RSTRL may be collectively driven, the plurality of store control lines STRLB may be collectively driven, or the plurality of reset control lines RESETL may be collectively driven.

Modification Example 3-2

In the embodiment described above, as illustrated in FIG. 29, the drive section 122 is provided with an inverter (the transistors 24 and 25) that generates the signal SCTRL, but this is not limitative. Instead, for example, as in the modification example 1-2 of the first embodiment described above, each of the memory cells may be provided with an inverter that generates the signal SCTRL.

Modification Example 3-3

In the embodiment described above, as illustrated in FIGS. 28 and 29, the word line WL, the control line CTRL, the restore control line RSTRL, the store control line STRLB, and the reset control line RESETL are configured to extend in the horizontal direction in FIGS. 28 and 29 and the bit lines BL and BLB are configured to extend in the vertical direction in FIGS. 28 and 29, but this is not limitative. For example, as in the modification example 1-3 of the first embodiment described above, it is possible to set any extension direction for these wiring lines.

Modification Example 3-4

In the embodiment described above, as illustrated in FIG. 28, each of the memory cells 130 is provided with the eight transistors 51 to 58, but this is not limitative. Instead, for example, the number of transistors may be decreased by replacing the two transistors 51 and 55 with one transistor and replacing the two transistors 54 and 58 with one transistor as in the modification example 1-4 of the first embodiment described above.

Modification Example 3-5

In the embodiment described above, as illustrated in FIG. 28, the memory cell 30 is provided with the transistors 51, 54, 55, and 58, but this is not limitative. Instead, for example, in the modification example 1-5 of the first embodiment described above, the drive section 122 may be provided with transistors corresponding to these transistors.

Modification Example 3-6

In the embodiment described above, as illustrated in FIG. 28, the drains of the transistors 52 and 53 are coupled to the storage element 33 and the drains of the transistors 56 and 57 are coupled to the storage element 34, but this is not limitative. Instead, for example, the drains of the transistors 52 and 53 may be coupled to the storage element 34 and the drains of the transistors 56 and 57 may be coupled to the storage element 33. The following describes a semiconductor circuit 3A according to the present modification example in detail. The semiconductor circuit 3A includes a memory circuit 120A as with the semiconductor circuit 3 (FIG. 1) according to the third embodiment described above. The memory circuit 120A includes a memory cell array 121A and the drive sections 122 and 123.

FIG. 33 illustrates a configuration example of a memory cell 130A in the memory cell array 121A. The drains of the transistors 52 and 53 are coupled to the terminal TP of the storage element 34 and the drains of the transistors 56 and 57 are coupled to the terminal TP of the storage element 33. The storage element 33 has the terminal TP coupled to the drains of the transistors 56 and 57 and the terminal TN coupled to the control line CTRL. The storage element 34 has the terminal TP coupled to the drains of the transistors 52 and 53 and the terminal TN coupled to the control line CTRL.

Here, the terminal T1 of each of the storage elements 33 and 34 corresponds to a specific example of the "first terminal" according to the present disclosure, the terminal TP corresponds to a specific example of the "second terminal" according to the present disclosure, and the terminal TN corresponds to a specific example of the "third terminal" according to the present disclosure. The transistor 56 corresponds to a specific example of the "second transistor" according to the present disclosure. The transistor 57 corresponds to a specific example of the "third transistor" according to the present disclosure. The transistor 52 corresponds to a specific example of the "fifth transistor" according to the present disclosure. The transistor 53 corresponds to a specific example of the "sixth transistor" according to the present disclosure. The transistor 55 corresponds to a specific example of the "seventh transistor" according to the present disclosure. The transistor 58 corresponds to a specific example of the "eighth transistor" according to the present disclosure. The transistor 51 corresponds to a specific example of the "ninth transistor" according to the present disclosure. The transistor 54 corresponds to a specific example of the "tenth transistor" according to the present disclosure.

Each of FIGS. 34A, 34B, 34C, 34D, and 34E illustrate the operation state of the memory cell 130A. FIG. 34A illustrates a state in the normal operation OP1. FIG. 34B illustrates a state in the store operation OP2. FIG. 34C illustrates a state in the standby operation OP3. FIG. 34D illustrates a state in the restore operation OP4. FIG. 34E illustrates a state in the reset operation OP5.

In the normal operation OP1, the control section 111 sets the voltage of the power supply control signal SPG at the low level as illustrated in FIG. 30. This tuns on the power supply transistor 12 (FIG. 1) and supplies the memory circuit 120 with the power supply voltage VDD. The drive section 122 then sets the voltage of the signal SRSTRL at the low level as illustrated in FIG. 30. This turns off each of the transistors 31 and 32 as illustrated in FIG. 34A. In addition, as illustrated in FIG. 30, the drive section 122 sets the voltage of the signal SSTRLB at the high level and sets the voltage of the signal SRESETL at the low level. This turns off each of the transistors 51, 54, 55, and 58 as illustrated in FIG. 34A. In addition, the drive section 122 sets the voltage of the signal SCTRL to the low level voltage VL (the ground level) as illustrated in FIG. 30. In this example, each of the resistance states of the storage elements 33 and 34 is maintained as the high resistance state RH. In other words, the resistance state of each of the storage elements 33 and 34 is set to the high resistance state RH by the reset operation OP5 in the semiconductor circuit 3A.

In the store operation OP2, the drive section 122 sets the voltage of the signal SSTRLB at the low level as illustrated in FIG. 30. This turns on each of the transistors 51 and 55 as illustrated in FIG. 34B. In this example, the voltage VN1 at the node N1 is the low level voltage VL and the voltage VN2 at the node N2 is the high level voltage VH. The transistors 56 and 57 are thus on and the transistors 52 and 53 are off. This causes the store current Istr to flow in the memory cell 130 in the order of the transistor 55, the transistor 56, the storage element 33, and the transistor 25 as illustrated in FIG. 34B. In this case, the store current Istr flows in the storage element 33 from the terminal TP to the terminal TN. This sets the resistance state of the storage element 33 to the low resistance state RL.

In the standby operation OP3, the control section 111 sets the voltage of the power supply control signal SPG at the high level as illustrated in FIG. 30. This tuns off the power supply transistor 12 (FIG. 1) and stops supplying the memory circuit 120A with power. In this case, the resistance states of the storage elements 33 and 34 are maintained as illustrated in FIG. 34C.

In the restore operation OP4, the control section 111 sets the voltage of the power supply control signal SPG at the low level as illustrated in FIG. 30. This tuns on the power supply transistor 12 (FIG. 1) and supplies the memory circuit 120A with the power supply voltage VDD. The drive section 122 then sets the voltage of the signal SRSTRL at the high level only in the period of a predetermined length immediately after the power supply transistor 12 is turned on. This turns on each of the transistors 31 and 32 in this period as illustrated in FIG. 34D. In addition, as illustrated in FIG. 30, the drive section 122 sets the voltage of the signal SSTRLB at the high level and sets the voltage of the signal SRESETL at the low level. This turns off each of the transistors 51, 54, 55, and 58 as illustrated in FIG. 34D. In addition, the drive section 122 sets the voltage of the signal SCTRL to the low level voltage VL (the ground level) as illustrated in FIG. 30. This causes the node N1 to be grounded through the transistor 31 and the storage element 33. The node N2 is grounded through the transistor 32 and the storage element 34. In this example, the resistance state of the storage element 33 is the low resistance state RL and the resistance state of the storage element 34 is the high resistance state RH. This causes the node N1 to be pulled down with a low resistance value and causes the node N2 to be pulled down with a high resistance value. The voltage VN1 at the node N1 is set to the low level voltage VL and the voltage VN2 at the node N2 is set to the high level voltage VH. In this way, the memory cell 130A causes the SRAM circuit 40 to store data in accordance with the data stored in each of the storage elements 33 and 34.

In the reset operation OP5, the drive section 122 sets the voltage of the signal SRESETL at the high level as illustrated in FIG. 30. This turns on each of the transistors 54 and 58 as illustrated in FIG. 34E. In addition, the drive section 122 sets the voltage of the signal SCTRL to the high level voltage VH (the power supply voltage level) as illustrated in FIG. 30. In this example, immediately after the restore operation OP4, the voltage VN1 of the node N1 is the low level voltage VL and the voltage VN2 of the node N2 is the high level voltage VH. The transistors 56 and 57 are thus on and the transistors 52 and 53 are off. This causes the reset current Ireset to flow in the memory cell 130A in the order of the transistor 24, the storage element 33, the transistor 57, and the transistor 58 as illustrated in FIG. 34E. In this case, the reset current Ireset flows in the storage element 33 from the terminal TN to the terminal TP. This sets the resistance state of the storage element 33 to the high resistance state RH. In this way, both the resistance states of the storage elements 33 and 34 are set to the high resistance state RH by the reset operation OP5.

Modification Example 3-7

In the embodiment described above, the transistors 51 and 55 are turned on in the store operation OP2 as illustrated in FIG. 31B and the transistors 54 and 58 are turned on in the reset operation OP5 as illustrated in FIG. 31E, but this is not limitative. Instead, for example, the transistors 54 and 58 may be turned on in the store operation OP2 and the transistors 51 and 55 may be turned on in the reset operation OP5. The following describes the present modification example in detail with reference to several examples.

A semiconductor circuit 3B according to the present modification example includes a memory circuit 120B as with the semiconductor circuit 3 (FIG. 1) according to the third embodiment described above. The memory circuit 120B includes a memory cell array 121B and drive sections 122B and 123.

FIG. 35 illustrates a configuration example of a memory cell 130B in the memory cell array 121B. FIG. 36 illustrates a configuration example of the memory circuit 120B. The memory cell array 121B includes the plurality of word lines WL, the plurality of bit lines BL, the plurality of bit lines BLB, the plurality of control lines CTRL, the plurality of restore control lines RSTRL, a plurality of reset control lines RESETLB, and the plurality of store control lines STRL. The reset control lines RESETLB extend in the horizontal direction in FIGS. 35 and 36. One end of each of the reset control lines RESETLB is coupled to the drive section 122B. The drive section 122B applies a signal SRESETLB to this reset control line RESETLB. The store control lines STRL extend in the horizontal direction in FIGS. 35 and 36. One end of each of the store control lines STRL is coupled to the drive section 122B. The drive section 122B applies the signal SSTRL to this store control line STRL. Each of the transistors 51 and 55 has the gate coupled to the reset control line RESETLB and each of the transistors 54 and 58 has the gate coupled to the store control line STRL. The drains of the transistors 52 and 53 are coupled to the terminal TP of the storage element 33 and the drains of the transistors 56 and 57 are coupled to the terminal TP of the storage element 34. The storage element 33 has the terminal TP coupled to the drains of the transistors 52 and 53 and the terminal TN coupled to the control line CTRL. The storage element 34 has the terminal TP coupled to the drains of the transistors 56 and 57 and the terminal TN coupled to the control line CTRL.

Here, the terminal T1 of each of the storage elements 33 and 34 corresponds to a specific example of the "first terminal" according to the present disclosure, the terminal TP corresponds to a specific example of the "second terminal" according to the present disclosure, and the terminal TN corresponds to a specific example of the "third terminal" according to the present disclosure. The transistor 53 corresponds to a specific example of the "second transistor" according to the present disclosure. The transistor 52 corresponds to a specific example of the "third transistor" according to the present disclosure. The transistor 57 corresponds to a specific example of the "fifth transistor" according to the present disclosure. The transistor 56 corresponds to a specific example of the "sixth transistor" according to the present disclosure. The transistor 54 corresponds to a specific example of the "seventh transistor" according to the present disclosure. The transistor 51 corresponds to a specific example of the "eighth transistor" according to the present disclosure. The transistor 58 corresponds to a specific example of the "ninth transistor" according to the present disclosure. The transistor 55 corresponds to a specific example of the "tenth transistor" according to the present disclosure.

FIG. 37 illustrates an operation example of the certain memory cell 130B of interest in the semiconductor circuit 3B. Each of FIGS. 38A, 38B, 38C, 38D, and 38E illustrate the operation state of the memory cell 130B. FIG. 38A illustrates a state in the normal operation OP1. FIG. 38B illustrates a state in the store operation OP2. FIG. 38C illustrates a state in the standby operation OP3. FIG. 38D illustrates a state in the restore operation OP4. FIG. 38E illustrates a state in the reset operation OP5.

In the normal operation OP1, the control section 111 sets the voltage of the power supply control signal SPG at the low level as illustrated in FIG. 37. This tuns on the power supply transistor 12 (FIG. 1) and supplies the memory circuit 120B with the power supply voltage VDD. The drive section 122B then sets the voltage of the signal SRSTRL at the low level as illustrated in FIG. 37. This turns off each of the transistors 31 and 32 as illustrated in FIG. 38A. In addition, as illustrated in FIG. 37, the drive section 122B sets the voltage of the signal SSTRL at the low level and sets the voltage of the signal SRESETLB at the high level. This turns off each of the transistors 51, 54, 55, and 58 as illustrated in FIG. 38A. In addition, the drive section 122B sets the voltage of the signal SCTRL to the low level voltage VL (the ground level) as illustrated in FIG. 37. In this example, each of the resistance states of the storage elements 33 and 34 is maintained as the low resistance state RL. In other words, the resistance state of each of the storage elements 33 and 34 is set to the low resistance state RL by the reset operation OP5 in the semiconductor circuit 3B.

In the store operation OP2, the drive section 122B sets the voltage of the signal SSTRL at the high level as illustrated in FIG. 37. This turns on each of the transistors 54 and 58 as illustrated in FIG. 38B. In addition, the drive section 122B sets the voltage of the signal SCTRL to the high level voltage VH (the power supply voltage level) as illustrated in FIG. 37. In this example, the voltage VN1 at the node N1 is the low level voltage VL and the voltage VN2 at the node N2 is the high level voltage VH. The transistors 56 and 57 are thus on and the transistors 52 and 53 are off. This causes the store current Istr to flow in the memory cell 130B in the order of the transistor 24, the storage element 34, the transistor 57, and the transistor 58 as illustrated in FIG. 38B. In this case, the store current Istr flows in the storage element 34 from the terminal TN to the terminal TP. This sets the resistance state of the storage element 34 to the high resistance state RH.

In the standby operation OP3, the control section 111 sets the voltage of the power supply control signal SPG at the high level as illustrated in FIG. 37. This tuns off the power supply transistor 12 (FIG. 1) and stops supplying the memory circuit 120B with power. In this case, the resistance states of the storage elements 33 and 34 are maintained as illustrated in FIG. 38C.

In the restore operation OP4, the control section 111 sets the voltage of the power supply control signal SPG at the low level as illustrated in FIG. 37. This tuns on the power supply transistor 12 (FIG. 1) and supplies the memory circuit 120B with the power supply voltage VDD. The drive section 122B then sets the voltage of the signal SRSTRL at the high level only in the period of a predetermined length immediately after the power supply transistor 12 is turned on. This turns on each of the transistors 31 and 32 in this period as illustrated in FIG. 38D. In addition, as illustrated in FIG. 37, the drive section 122B sets the voltage of the signal SSTRL at the low level and sets the voltage of the signal SRESETLB at the high level. This turns off each of the transistors 51, 54, 55, and 58 as illustrated in FIG. 38D. In addition, the drive section 122B sets the voltage of the signal SCTRL to the low level voltage VL (the ground level) as illustrated in FIG. 37. This causes the node N1 to be grounded through the transistor 31 and the storage element 33. The node N2 is grounded through the transistor 32 and the storage element 34. In this example, the resistance state of the storage element 33 is the low resistance state RL and the resistance state of the storage element 34 is the high resistance state RH. This causes the node N1 to be pulled down with a low resistance value and causes the node N2 to be pulled down with a high resistance value. The voltage VN1 at the node N1 is set to the low level voltage VL and the voltage VN2 at the node N2 is set to the high level voltage VH. In this way, the memory cell 130B causes the SRAM circuit 40 to store data in accordance with the data stored in each of the storage elements 33 and 34.

In the reset operation OP5, the drive section 122B sets the voltage of the signal SRESETLB at the low level as illustrated in FIG. 37. This turns on each of the transistors 51 and 55 as illustrated in FIG. 38E. In addition, the drive section 122B sets the voltage of the signal SCTRL to the low level voltage VL (the ground level) as illustrated in FIG. 37. In this example, immediately after the restore operation OP4, the voltage VN1 of the node N1 is the low level voltage VL and the voltage VN2 of the node N2 is the high level voltage VH. The transistors 56 and 57 are thus on and the transistors 52 and 53 are off. This causes the reset current Ireset to flow in the memory cell 130B in the order of the transistor 55, the transistor 56, the storage element 34, and the transistor 25 as illustrated in FIG. 38E. In this case, the reset current Ireset flows in the storage element 34 from the terminal TP to the terminal TN. This sets the resistance state of the storage element 34 to the low resistance state RL. In this way, both the resistance states of the storage elements 33 and 34 are set to the low resistance state RL by the reset operation OP5.

Next, another configuration according to the present modification example is described in detail. Another semiconductor circuit 3C according to the present modification example includes a memory circuit 120C as with the semiconductor circuit 3 (FIG. 1) according to the third embodiment described above. The memory circuit 120C includes a memory cell array 121C and the drive sections 122B and 123.

FIG. 39 illustrates a configuration example of a memory cell 130C in the memory cell array 121C. Each of the transistors 51 and 55 has the gate coupled to the reset control line RESETLB and each of the transistors 54 and 58 has the gate coupled to the store control line STRL. The drains of the transistors 52 and 53 are coupled to the terminal TN of the storage element 34 and the drains of the transistors 56 and 57 are coupled to the terminal TN of the storage element 33. The storage element 33 has the terminal TP coupled to the control line CTRL and the terminal TN coupled to the drains of the transistors 56 and 57. The storage element 34 has the terminal TP coupled to the control line CTRL and the terminal TN coupled to the drains of the transistors 52 and 53.

Here, the terminal T1 of each of the storage elements 33 and 34 corresponds to a specific example of the "first terminal" according to the present disclosure, the terminal TN corresponds to a specific example of the "second terminal" according to the present disclosure, and the terminal TP corresponds to a specific example of the "third terminal" according to the present disclosure. The transistor 57 corresponds to a specific example of the "second transistor" according to the present disclosure. The transistor 56 corresponds to a specific example of the "third transistor" according to the present disclosure. The transistor 53 corresponds to a specific example of the "fifth transistor" according to the present disclosure. The transistor 52 corresponds to a specific example of the "sixth transistor" according to the present disclosure. The transistor 58 corresponds to a specific example of the "seventh transistor" according to the present disclosure. The transistor 55 corresponds to a specific example of the "eighth transistor" according to the present disclosure. The transistor 54 corresponds to a specific example of the "ninth transistor" according to the present disclosure. The transistor 51 corresponds to a specific example of the "tenth transistor" according to the present disclosure.

Each of FIGS. 40A, 40B, 40C, 40D, and 40E illustrate the operation state of the memory cell 130C. FIG. 40A illustrates a state in the normal operation OP1. FIG. 40B illustrates a state in the store operation OP2. FIG. 40C illustrates a state in the standby operation OP3. FIG. 40D illustrates a state in the restore operation OP4. FIG. 40E illustrates a state in the reset operation OP5.

In the normal operation OP1, the control section 111 sets the voltage of the power supply control signal SPG at the low level as illustrated in FIG. 37. This tuns on the power supply transistor 12 (FIG. 1) and supplies the memory circuit 120C with the power supply voltage VDD. The drive section 122B then sets the voltage of the signal SRSTRL at the low level as illustrated in FIG. 37. This turns off each of the transistors 31 and 32 as illustrated in FIG. 40A. In addition, as illustrated in FIG. 37, the drive section 122B sets the voltage of the signal SSTRL at the low level and sets the voltage of the signal SRESETLB at the high level. This turns off each of the transistors 51, 54, 55, and 58 as illustrated in FIG. 40A. In addition, the drive section 122B sets the voltage of the signal SCTRL to the low level voltage VL (the ground level) as illustrated in FIG. 37. In this example, each of the resistance states of the storage elements 33 and 34 is maintained as the high resistance state RH. In other words, the resistance state of each of the storage elements 33 and 34 is set to the high resistance state RH by the reset operation OP5 in the semiconductor circuit 3C.

In the store operation OP2, the drive section 122B sets the voltage of the signal SSTRL at the high level as illustrated in FIG. 37. This turns on each of the transistors 54 and 58 as illustrated in FIG. 40B. In addition, the drive section 122B sets the voltage of the signal SCTRL to the high level voltage VH (the power supply voltage level) as illustrated in FIG. 37. In this example, the voltage VN1 at the node N1 is the low level voltage VL and the voltage VN2 at the node N2 is the high level voltage VH. The transistors 56 and 57 are thus on and the transistors 52 and 53 are off. This causes the store current Istr to flow in the memory cell 130C in the order of the transistor 24, the storage element 33, the transistor 57, and the transistor 58 as illustrated in FIG. 40B. In this case, the store current Istr flows in the storage element 33 from the terminal TP to the terminal TN. This sets the resistance state of the storage element 33 to the low resistance state RL.

In the standby operation OP3, the control section 111 sets the voltage of the power supply control signal SPG at the high level as illustrated in FIG. 37. This tuns off the power supply transistor 12 (FIG. 1) and stops supplying the memory circuit 120C with power. In this case, the resistance states of the storage elements 33 and 34 are maintained as illustrated in FIG. 40C.

In the restore operation OP4, the control section 111 sets the voltage of the power supply control signal SPG at the low level as illustrated in FIG. 37. This tuns on the power supply transistor 12 (FIG. 1) and supplies the memory circuit 120C with the power supply voltage VDD. The drive section 122B then sets the voltage of the signal SRSTRL at the high level only in the period of a predetermined length immediately after the power supply transistor 12 is turned on. This turns on each of the transistors 31 and 32 in this period as illustrated in FIG. 40D. In addition, as illustrated in FIG. 37, the drive section 122B sets the voltage of the signal SSTRL at the low level and sets the voltage of the signal SRESETLB at the high level. This turns off each of the transistors 51, 54, 55, and 58 as illustrated in FIG. 40D. In addition, the drive section 122B sets the voltage of the signal SCTRL to the low level voltage VL (the ground level) as illustrated in FIG. 37. This causes the node N1 to be grounded through the transistor 31 and the storage element 33. The node N2 is grounded through the transistor 32 and the storage element 34. In this example, the resistance state of the storage element 33 is the low resistance state RL and the resistance state of the storage element 34 is the high resistance state RH. This causes the node N1 to be pulled down with a low resistance value and causes the node N2 to be pulled down with a high resistance value. The voltage VN1 at the node N1 is set to the low level voltage VL and the voltage VN2 at the node N2 is set to the high level voltage VH. In this way, the memory cell 130C causes the SRAM circuit 40 to store data in accordance with the data stored in each of the storage elements 33 and 34.

In the reset operation OP5, the drive section 122B sets the voltage of the signal SRESETLB at the low level as illustrated in FIG. 37. This turns on each of the transistors 51 and 55 as illustrated in FIG. 40E. In addition, the drive section 122B sets the voltage of the signal SCTRL to the low level voltage VL (the ground level) as illustrated in FIG. 37. In this example, immediately after the restore operation OP4, the voltage VN1 of the node N1 is the low level voltage VL and the voltage VN2 of the node N2 is the high level voltage VH. The transistors 56 and 57 are thus on and the transistors 52 and 53 are off. This causes the reset current Ireset to flow in the memory cell 130C in the order of the transistor 55, the transistor 56, the storage element 33, and the transistor 25 as illustrated in FIG. 40E. In this case, the reset current Ireset flows in the storage element 33 from the terminal TN to the terminal TP. This sets the resistance state of the storage element 33 to the high resistance state RH. In this way, both the resistance states of the storage elements 33 and 34 are set to the high resistance state RH by the reset operation OP5.

Modification Example 3-8

In the embodiment described above, a P-type MOS transistor is used to configure the power supply transistor 12, but this is not limitative. Instead, for example, an N-type MOS transistor may be used to configure a power supply transistor as in a case of the modification example 1-7 of the first embodiment described above.

OTHER MODIFICATION EXAMPLES

In addition, two or more of these modification examples may be combined.

4. Fourth Embodiment

Next, a semiconductor circuit 4 according to a fourth embodiment is described. In the present embodiment, the memory cell is simplified by omitting the storage element 34 and the transistors 55 to 58 from the memory cell 130 of the semiconductor circuit 3 according to the third embodiment described above. It is to be noted that components that are substantially the same as those of the semiconductor circuit 3 according to the third embodiment described above are denoted by the same reference signs and descriptions thereof are omitted as appropriate.

As illustrated in FIG. 1, the semiconductor circuit 4 includes a memory circuit 160. The memory circuit 160 includes a memory cell array 161 and the drive sections 122 and 123.

FIG. 41 illustrates a configuration example of a memory cell 170 in the memory cell array 161. FIG. 42 illustrates a configuration example of the memory circuit 160. The memory cell 170 includes the SRAM circuit 40, the transistors 71, 72, and 51 to 54, and the storage element 33. In the memory cell 170, the storage element 34 and the transistors 55 to 58 are omitted from the memory cell 130 (FIG. 28) according to the third embodiment described above and the transistors 31 and 32 are replaced with the transistors 71 and 72. As described above, the on-resistance of the transistor 72 is set to be greater than the on-resistance of the transistor 71.

Here, the storage element 33 corresponds to a specific example of the "first storage element" according to the present disclosure. The terminal T1 of the storage element 33 corresponds to a specific example of the "first terminal" according to the present disclosure, the terminal TN corresponds to a specific example of the "second terminal" according to the present disclosure, and the terminal TP corresponds to a specific example of the "third terminal" according to the present disclosure. The transistor 71 corresponds to a specific example of the "first transistor" according to the present disclosure. The transistor 52 corresponds to a specific example of the "second transistor" according to the present disclosure. The transistor 53 corresponds to a specific example of the "third transistor" according to the present disclosure. Each of the transistors 51 and 54 corresponds to a specific example of the "first voltage supply section" according to the present disclosure. Each of the transistors 24 and 25 corresponds to a specific example of the "second voltage supply section" according to the present disclosure. The transistor 72 corresponds to a specific example of the "twenty-first transistor" according to the present disclosure.

Each of FIGS. 43, 44A, 44B, 44C, 44D, and 45A, 45B, 45C, and 44D illustrate the operation state of the memory cell 170. FIG. 43 illustrates a state in the normal operation OP1. Each of FIGS. 44A, 44B, 44C, 44D, and 44E illustrate a state in a case where the voltage VN1 at the node N1 is the low level voltage VL. FIG. 44A illustrates a state in the store operation OP2. FIG. 44B illustrates a state in the standby operation OP3. FIG. 44C illustrates a state in the restore operation OP4. FIG. 44D illustrates a state in the reset operation OP5. Each of FIGS. 45A, 45B, 45C, and 45D illustrate a state in a case where the voltage VN1 at the node N1 is the high level voltage VH. FIG. 45A illustrates a state in the store operation OP2. FIG. 45B illustrates a state in the standby operation OP3. FIG. 45C illustrates a state in the restore operation OP4. FIG. 45D illustrates a state in the reset operation OP5.

(Normal Operation OP1)

In the normal operation OP1, the control section 111 sets the voltage of the power supply control signal SPG at the low level as illustrated in FIG. 30. This tuns on the power supply transistor 12 (FIG. 1) and supplies the memory circuit 160 with the power supply voltage VDD. The drive section 122 then sets the voltage of the signal SRSTRL at the low level as illustrated in FIG. 30. This turns off each of the transistors 71 and 72 as illustrated in FIG. 43. In addition, as illustrated in FIG. 30, the drive section 122 sets the voltage of the signal SSTRLB at the high level and sets the voltage of the signal SRESETL at the low level. This turns off each of the transistors 51, 54, 55, and 58 as illustrated in FIG. 43. In addition, the drive section 122 sets the voltage of the signal SCTRL to the low level voltage VL (the ground level) as illustrated in FIG. 30.

In this normal operation OP1, data is written in the SRAM circuit 40 of the memory cell 130 or data is read out from the SRAM circuit 40. In this case, as illustrated in FIGS. 43A and 44A, the transistors 71, 51, and 54 are off. No current therefore flows in the storage element 33. The resistance state of the storage element 33 is thus maintained. In this example, the resistance state of the storage element 33 is maintained as the low resistance state RL. In other words, the resistance state of the storage element 33 is set to the low resistance state RL by the reset operation OP5 in the semiconductor circuit 4.

(Store Operation OP2)

In the store operation OP2, the drive section 122 sets the voltage of the signal SSTRLB at the low level as illustrated in FIG. 30. This turns on each of the transistor 51 as illustrated in FIGS. 44A and 45A. In addition, the drive section 122 sets the voltage of the signal SWL at the low level as illustrated in FIG. 30. This turns off the transistors 45 and 46.

For example, as illustrated in FIG. 44A, in a case where the voltage VN1 at the node N1 is the low level voltage VL, the voltage VN2 at the node N2 is the high level voltage VH. This turns off both of the transistors 52 and 53. No current therefore flows in the memory cell 170. As a result, the resistance state of the storage element 33 is maintained as the low resistance state RL.

In addition, for example, as illustrated in FIG. 45A, in a case where the voltage VN1 at the node N1 is the high level voltage VH, the voltage VN2 at the node N2 is the low level voltage VL. This turns on both of the transistors 52 and 53. This causes the store current Istr to flow in the memory cell 170 in the order of the transistor 51, the transistor 52, the storage element 33, and the transistor 25 as illustrated in FIG. 45A. In this case, the store current Istr flows in the storage element 33 from the terminal TN to the terminal TP. As a result, the resistance state of the storage element 33 is set to the high resistance state RH.

(Standby Operation OP3)

In the standby operation OP3, the control section 111 sets the voltage of the power supply control signal SPG at the high level as illustrated in FIG. 30. This tuns off the power supply transistor 12 (FIG. 1) and stops supplying the memory circuit 160 with power. In this case, the resistance state of the storage element 33 is maintained as illustrated in FIGS. 44B and 45B.

(Restore Operation OP4)

In the restore operation OP4, the control section 111 sets the voltage of the power supply control signal SPG at the low level as illustrated in FIG. 30. This tuns on the power supply transistor 12 (FIG. 1) and supplies the memory circuit 160 with the power supply voltage VDD. The drive section 122 then sets the voltage of the signal SRSTRL at the high level only in the period of a predetermined length immediately after the power supply transistor 12 is turned on. This turns on each of the transistors 71 and 72 in this period as illustrated in FIGS. 44C and 45C. In addition, as illustrated in FIG. 30, the drive section 122 sets the voltage of the signal SSTRLB at the high level and sets the voltage of the signal SRESETL at the low level. This turns off each of the transistors 51 and 54 as illustrated in FIGS. 44C and 45C. In addition, the drive section 122 sets the voltage of the signal SCTRL to the low level voltage VL (the ground level) as illustrated in FIG. 30. This causes the node N1 to be grounded through the transistor 71 and the storage element 33. The node N2 is grounded through the transistor 72. In this case, the resistance value between the node N1 and the ground and the resistance value between the node N2 and the ground have different magnitude relationships in accordance with the resistance state of the storage element 33. This causes the voltage state of the SRAM circuit 40 to be determined.

Specifically, for example, as illustrated in FIG. 44C, in a case where the resistance state of the storage element 33 is the low resistance state RL, the resistance value between the node N1 and the ground is smaller than the resistance value between the node N2 and the ground. This causes the current value of a current 171 flowing from the node N1 to the control line CTRL through the transistor 71 and the storage element 33 to be greater than the current value of a current 172 flowing from the node N2 to the control line CTRL through the transistor 72 immediately after the power supply transistor 12 is turned on. The voltage of the node N1 is thus set to the low level voltage VL.

In addition, for example, as illustrated in FIG. 45C, in a case where the resistance state of the storage element 33 is the high resistance state RH, the resistance value between the node N1 and the ground is greater than the resistance value between the node N2 and the ground. This causes the current value of the current 171 flowing from the node N1 to the control line CTRL through the transistor 71 and the storage element 33 to be smaller than the current value of the current 172 flowing from the node N2 to the control line CTRL through the transistor 72 immediately after the power supply transistor 12 is turned on. The voltage of the node N1 is thus set to the high level voltage VH.

In this way, the memory cell 170 causes the SRAM circuit 40 to store information in accordance with the information stored in the storage element 33.

(Reset Operation OP5)

In the reset operation OP5, the drive section 122 sets the voltage of the signal SRESETL at the high level as illustrated in FIG. 30. This turns on each of the transistor 54 as illustrated in FIGS. 44D and 45D. In addition, the drive section 122 sets the voltage of the signal SCTRL to the high level voltage VH (the power supply voltage level) as illustrated in FIG. 30.

For example, as illustrated in FIG. 44D, in a case where the voltage VN1 of the node N1 is the low level voltage VL and the voltage VN2 of the node N2 is the high level voltage VH immediately after the restore operation OP4, both of the transistors 52 and 53 are off. No current therefore flows in the memory cell 170. As a result, the resistance state of the storage element 33 is maintained as the low resistance state RL.

In addition, for example, as illustrated in FIG. 45D, in a case where the voltage VN1 of the node N1 is the high level voltage VH and the voltage VN2 of the node N2 is the low level voltage VL immediately after the restore operation OP4, both of the transistors 52 and 53 are on. This causes the reset current Ireset to flow in the memory cell 170 in the order of the transistor 24, the storage element 33, the transistor 53, and the transistor 54 as illustrated in FIG. 45D. In this case, the reset current Ireset flows in the storage element 33 from the terminal TP to the terminal TN. As a result, the resistance state of the storage element 33 is set to the low resistance state RL.

In this way, the resistance state of the storage element 33 is set to the low resistance state RL by the reset operation OP5.

In this way, each of the memory cells 170 is provided with the one storage element 33 in the semiconductor circuit 4. Specifically, in the semiconductor circuit 4, the storage element 34 and the transistors 55 to 58 are omitted from the memory cell 130 (FIG. 28) according to the third embodiment described above and the transistors 31 and 32 are replaced with the transistors 71 and 72. This configures the memory cell 170. This allows the semiconductor circuit 4 to have a smaller number of elements than those of the semiconductor circuit 3 according to the third embodiment. It is thus possible to decrease the area of the memory cell 170. As a result, it is possible to decrease the area of the entire semiconductor circuit 4.

In addition, in the semiconductor circuit 4, the on-resistance of the transistor 72 is greater than the on-resistance of the transistor 71. In the restore operation OP4, the current 172 flowing from the node N2 to the control line CTRL through the transistor 72 is then greater than the current 171 flowing from the node N1 to the control line CTRL through the transistor 71 and the storage element 33 in a case where the resistance state of the storage element 33 is the high resistance state RH and the current 172 is less than the current 171 flowing from the node N1 to the control line CTRL through the transistor 71 and the storage element 33 in a case where the resistance state of the storage element 33 is the low resistance state RL. This allows the semiconductor circuit 4 to achieve the restore operation OP4 with the one storage element 33.

As described above, in the present embodiment, each of the memory cells is provided with one storage element. This makes it possible to decrease the area of the semiconductor circuit.

In the present embodiment, the on-resistance of the transistor 72 is greater than the on-resistance of the transistor 71. This makes it possible to achieve the restore operation with one storage element.

The other effects are similar to those of the third embodiment described above.

Modification Example 4-1

In the embodiment described above, the gates of the transistors 71 and 72 are coupled and the source of the transistor 72 is coupled to the control line CTRL, but this is not limitative. For example, as in the modification example 2-1 of the second embodiment described above, the source of the transistor 72 may be grounded, the transistors 71 and 72 may be separately controlled, or the transistor 72 may be omitted.

Modification Example 4-2

A modification example of the third embodiment described above may be applied to the semiconductor circuit 4 according to the embodiment described above.

5. Application Examples

In the embodiment described above, the present technology is applied to a SRAM circuit, but this is not limitative. For example, the present technology may be applied, for example, to a flip-flop circuit. The following describes the present modification example in detail with reference to several examples.

First, a case where the technology of the memory cell 30 (FIG. 2) according to the first embodiment described above is applied to a flip-flop circuit is described with reference to several examples.

FIG. 46 illustrates a configuration example of a flip-flop circuit 201 according to the present practical application example. The flip-flop circuit 201 includes a master latch circuit 201M and a slave latch circuit 201S. Technology similar to that of the memory cell 30 (FIG. 2) according to the first embodiment described above is applied to this slave latch circuit 201S. The slave latch circuit 201S includes inverters IV13 and IV14, a transmission gate TG12, a transistor TR12, the transistors 31, 32, and 51 to 58, and the storage elements 33 and 34. The inverter IV13 corresponds to the inverter IV1 according to the embodiment described above and the inverter IV14 corresponds to the inverter IV2 according to the embodiment described above. In this example, the transmission gate TG12 and the transistor TR12 are inserted between the output terminal of the inverter IV14 and the input terminal of the inverter IV13. This transistor TR12 is an N-type MOS transistor in this example. The transistor TR12 has the gate supplied with the signal SRSTRL.

FIG. 47 illustrates a configuration example of another flip-flop circuit 202 according to the present practical application example. The flip-flop circuit 202 includes a master latch circuit 202M and a slave latch circuit 202S. Technology similar to that of the memory cell 30 (FIG. 2) according to the embodiment described above is applied to this master latch circuit 202M. The master latch circuit 202M includes inverters IV11 and IV12, a transmission gate TG11, a transistor TR11, the transistors 31, 32, and 51 to 58, and the storage elements 33 and 34. The inverter IV11 corresponds to the inverter IV1 according to the embodiment described above and the inverter IV12 corresponds to the inverter IV2 according to the embodiment described above. In this example, the transmission gate TG11 and the transistor TR11 are inserted between the output terminal of the inverter IV12 and the input terminal of the inverter IV11. This transistor TR11 is an N-type MOS transistor in this example. The transistor TR11 has the gate supplied with the signal SRSTRL.

Although the example in which the technology of the memory cell 30 (FIG. 3) according to the first embodiment is applied to a flip-flop circuit has been described above, the same applies to a case where the technology of the memory cell 130 (FIG. 28) according to the third embodiment is applied to a flip-flop circuit.

Next, a case where the technology of the memory cell 70 (FIG. 19) according to the second embodiment described above is applied to a flip-flop circuit is described with reference to several examples.

FIG. 48 illustrates a configuration example of a flip-flop circuit 211 according to the present practical application example. The flip-flop circuit 211 includes a master latch circuit 211M and a slave latch circuit 211S. Technology similar to that of the memory cell 70 (FIG. 19) according to the second embodiment described above is applied to this slave latch circuit 211S. The slave latch circuit 211S includes inverters IV23 and IV24, a transmission gate TG22, a transistor TR22, the transistors 71, 72, and 55 to 58, and the storage element 33. The inverter IV23 corresponds to the inverter IV1 according to the embodiment described above and the inverter IV24 corresponds to the inverter IV2 according to the embodiment described above. In this example, the transmission gate TG22 and the transistor TR22 are inserted between the output terminal of the inverter IV24 and the input terminal of the inverter IV23. This transistor TR22 is an N-type MOS transistor in this example. The transistor TR22 has the gate supplied with the signal SRSTRL.

It is to be noted that the drain of the transistor 71 is coupled to the input terminal of the inverter IV23 and the drain of the transistor 72 is coupled to the input terminal of the inverter IV24 in this flip-flop circuit 211, but this is not limitative. Instead, for example, as in a flip-flop circuit 212 illustrated in FIG. 49, the drain of the transistor 72 may be coupled to the input terminal of the inverter IV23 and the drain of the transistor 71 may be coupled to the input terminal of the inverter IV24. This flip-flop circuit 212 includes a master latch circuit 212M and a slave latch circuit 212S.

FIG. 50 illustrates a configuration example of a flip-flop circuit 213 according to the present practical application example. The flip-flop circuit 213 includes a master latch circuit 213M and a slave latch circuit 213S. Technology similar to that of the memory cell 70 (FIG. 19) according to the second embodiment described above is applied to this master latch circuit 213M. The master latch circuit 213M includes inverters IV21 and IV22, a transmission gate TG21, a transistor TR21, the transistors 71, 72, and 55 to 58, and the storage element 33. The inverter IV21 corresponds to the inverter IV1 according to the embodiment described above and the inverter IV22 corresponds to the inverter IV2 according to the embodiment described above. In this example, the transmission gate TG21 and the transistor TR21 are inserted between the output terminal of the inverter IV22 and the input terminal of the inverter IV21. This transistor TR21 is an N-type MOS transistor in this example. The transistor TR21 has the gate supplied with the signal SRSTRL.

It is to be noted that the drain of the transistor 71 is coupled to the input terminal of the inverter IV21 and the drain of the transistor 72 is coupled to the input terminal of the inverter IV22 in this flip-flop circuit 213, but this is not limitative. Instead, for example, as in a flip-flop circuit 214 illustrated in FIG. 51, the drain of the transistor 72 may be coupled to the input terminal of the inverter IV21 and the drain of the transistor 71 may be coupled to the input terminal of the inverter IV22. This flip-flop circuit 214 includes a master latch circuit 214M and a slave latch circuit 214S.

Although the example in which the technology of the memory cell 70 (FIG. 19) according to the second embodiment is applied to a flip-flop circuit has been described above, the same applies to a case where the technology of the memory cell 170 (FIG. 41) according to the fourth embodiment is applied to a flip-flop circuit.

6. Practical Application Example

Next, a practical application example of the technology described in the embodiments and the modification examples described above is described.

FIG. 52 illustrates an example of an information processing device 300 according to the present practical application example. This information processing device 300 is a so-called multi-core processor. In this example, the information processing device 300 includes two processor core sections 310 and 320, a secondary cache memory section 330, and a power supply control section 301. It is to be noted that the two processor core sections 310 and 320 are provided in this example, but this is not limitative. There may be provided three or more processor core sections. The information processing device 300 may be achieved with one semiconductor chip or may be achieved by using a plurality of semiconductor chips.

The processor core section 310 includes a power supply transistor 311 and a processor core 312. The power supply transistor 311 is a P-type MOS transistor in this example. The power supply transistor 311 has the gate supplied with a power supply control signal, the source supplied with the power supply voltage VDD1, and the drain coupled to the processor core 312. The processor core 312 includes a flip-flop circuit 313 and a primary cache memory 314. For example, a flip-flop circuit or the like to which the technology according the embodiment described above is applied (e.g., FIGS. 46 to 51 is usable for the flip-flop circuit 313. It is possible to use a variety of memory cells described in the embodiments described above for the primary cache memory 314. In a case where the technology according to the first and second embodiments described above is applied, the processor core 312 is configured to perform the normal operation OP1, the store operation OP2, the standby operation OP3, and the restore operation OP4 on the basis of a control signal supplied from the power supply control section 301. In addition, in a case where the technology according to the third and fourth embodiments described above is applied, the processor core 312 is configured to perform the normal operation OP1, the store operation OP2, the standby operation OP3, the restore operation OP4, and the reset operation OP5 on the basis of a control signal supplied from the power supply control section 301.

The processor core section 320 has a configuration similar to that of the processor core section 310. A power supply transistor 321, a processor core 322, a flip-flop circuit 323, and a primary cache memory 324 of the processor core section 320 respectively correspond to the power supply transistor 311, the processor core 312, the flip-flop circuit 313, and the primary cache memory 314 of the processor core section 310.

The secondary cache memory section 330 includes a power supply transistor 331 and a secondary cache memory 332. The power supply transistor 331 is a P-type MOS transistor in this example. The power supply transistor 331 has the gate supplied with a power supply control signal, the source supplied with the power supply voltage VDD1, and the drain coupled to the secondary cache memory 332. It is possible to use a variety of memory cells described in the embodiments described above for the secondary cache memory 332. In a case where the technology according to the first and second embodiments described above is applied, the secondary cache memory 332 is configured to perform the normal operation OP1, the store operation OP2, the standby operation OP3, and the restore operation OP4 on the basis of a control signal supplied from the power supply control section 301. In addition, in a case where the technology according to the third and fourth embodiments described above is applied, the secondary cache memory 332 is configured to perform the normal operation OP1, the store operation OP2, the standby operation OP3, the restore operation OP4, and the reset operation OP5 on the basis of a control signal supplied from the power supply control section 301.

The power supply control section 301 determines a processor core section to be brought into operation among the processor core sections 310 and 320 on the basis of a load of processing to be performed by the information processing device 300, a method of supplying power to the information processing device 300 (e.g., whether or not power is supplied from a battery), and the like. The power supply control section 301 controls operations of the processor core sections 310 and 320 and the secondary cache memory section 330 on the basis of a result of the determination.

Specifically, for example, in a case where the power supply control section 301 brings the processor core section 310 into operation, but does not bring the processor core section 320 into operation, the power supply control section 301 turns on the power supply transistor 311 of the processor core section 310 and the power supply transistor 331 of the secondary cache memory section 330 and turns off the power supply transistor 321 of the processor core section 320. In addition, for example, in a case where the power supply control section 301 brings the processor core sections 310 and 320 into operation, the power supply control section 301 turns on the power supply transistor 311 of the processor core section 310, the power supply transistor 321 of the processor core section 320, and the power supply transistor 331 of the secondary cache memory section 330. In addition, for example, in a case where the power supply control section 301 does not bring the processor core sections 310 and 320 into operation, the power supply control section 301 turns off the power supply transistor 311 of the processor core section 310, the power supply transistor 321 of the processor core section 320, and the power supply transistor 331 of the secondary cache memory section 330.

In addition, in a case where it is desired to stop an operation of the processor core section 310, the power supply control section 301 instructs the processor core section 310 to perform the store operation OP2, for example, immediately before turning off the power supply transistor 311 of the processor core section 310. In addition, in a case where it is desired to begin an operation of the processor core section 310, the power supply control section 301 instructs the processor core section 310 to perform the restore operation OP4, for example, immediately before turning on the power supply transistor 311 of the processor core section 310. The same applies to the processor core section 320 and the secondary cache memory section 330.

In this information processing device 300, the processor core sections 310 and 320 and the secondary cache memory section 330 are each provided with a power supply transistor, but this is not limitative. Instead, for example, as in an information processing device 300A illustrated in FIG. 53, there may be provided a power supply transistor in a power supply control section. This information processing device 300A includes the processor cores 312 and 322, the secondary cache memory 332, and a power supply control section 340. The power supply control section 340 includes power supply transistors 341 to 343. The power supply transistors 341 to 343 are P-type MOS transistors in this example. The power supply transistor 341 has the source supplied with the power supply voltage VDD1 and the drain coupled to the processor core 312. The power supply transistor 342 has the source supplied with the power supply voltage VDD1 and the drain coupled to the processor core 322. The power supply transistor 343 has the source supplied with the power supply voltage VDD1 and the drain coupled to the secondary cache memory 332.

Although the present technology has been described above with reference to the embodiments, the several modification examples, and the practical application example thereof, the present technology is not limited to the embodiments or the like. A variety of modifications are possible.

For example, in the embodiments or the like described above, the present technology is applied to a SRAM circuit and a D-type flip-flop circuit, but this is not limitative. Specifically, for example, the present technology may be applied to another flip-flop circuit or may be applied to a latch circuit.

It is to be noted that the effects described in this specification are merely illustrative, but not limited. In addition, other effects may be included.

It is to be noted that the present technology may be configured as follows. According to the present technology having the following configurations, it is possible to increase reliability.

(1) A semiconductor circuit including:
    a first circuit configured to generate an inverted voltage of a voltage at a first node, the first circuit being configured to apply the inverted voltage to a second node;

a second circuit configured to generate an inverted voltage of a voltage at the second node, the second circuit being configured to apply the inverted voltage to the first node;

a first storage element including a first terminal, a second terminal, and a third terminal, the first storage element being configured to set a resistance state between the first terminal and the second and the third terminals to a first resistance state or a second resistance state in accordance with a direction of a current flowing between the second terminal and the third terminal;

a first transistor including a drain coupled to the first node, a source coupled to the first terminal of the first storage element, and a gate, the first transistor being configured to couple the first node to the first terminal of the first storage element by being turned on;

a second transistor including a gate coupled to the first node or the second node, a drain coupled to the second terminal of the first storage element, and a source, the second transistor being configured to apply a first voltage to the second terminal of the first storage element by being turned on; and a third transistor including a gate coupled to the first node or the second node, a drain coupled to the second terminal of the first storage element, and a source, the third transistor being configured to apply a second voltage to the second terminal of the first storage element by being turned on, the second voltage being different from the first voltage.

(2) The semiconductor circuit according to (1), further including:

a second storage element including a first terminal, a second terminal, and a third terminal, the second storage element being configured to set a resistance state between the first terminal and the second and the third terminals to the first resistance state or the second resistance state in accordance with a direction of a current flowing between the second terminal and the third terminal;

a fourth transistor including a drain coupled to the second node, a source coupled to the first terminal of the second storage element, and a gate, the fourth transistor being configured to couple the second node to the first terminal of the second storage element by being turned on;

a fifth transistor including a gate coupled to a node of the first node and the second node that is different from the node to which the gate of the second transistor is coupled, a drain coupled to the second terminal of the second storage element, and a source, the fifth transistor being configured to apply the first voltage to the second terminal of the second storage element by being turned on; and a sixth transistor including a gate coupled to a node of the first node and the second node that is different from the node to which the gate of the third transistor is coupled, a drain coupled to the second terminal of the second storage element, and a source, the sixth transistor being configured to apply the second voltage to the second terminal of the second storage element by being turned on.

(3) The semiconductor circuit according to (2), further including:

a first voltage supply section configured to supply the source of the second transistor and the source of the fifth transistor with the first voltage and configured to supply the source of the third transistor and the source of the sixth transistor with the second voltage;

a second voltage supply section configured to supply the third terminal of the first storage element and the third terminal of the second storage element with a control voltage; and a control section configured to control operations of the first transistor, the fourth transistor, the first voltage supply section, and the second voltage supply section.

(4) The semiconductor circuit according to (3), in which the gate of the second transistor and the gate of the third transistor are coupled to the second node, the gate of the fifth transistor and the gate of the sixth transistor are coupled to the first node, and the control section is configured to perform, in a first sub-period of a first period, a first operation of turning off the first transistor and the fourth transistor, performing control to cause the first voltage supply section to supply the source of the second transistor and the source of the fifth transistor with the first voltage, and performing control to cause the second voltage supply section to set the control voltage to a third voltage different from the first voltage, and perform, in a second sub-period of the first period, a second operation of turning off the first transistor and the fourth transistor, performing control to cause the first voltage supply section to supply the source of the third transistor and the source of the sixth transistor with the second voltage, and performing control to cause the second voltage supply section to set the control voltage to a fourth voltage different from the second voltage.

(5) The semiconductor circuit according to (4), in which the control section is configured to set the voltage at the first node to a voltage corresponding to the resistance state of the first storage element and configured to set the voltage at the second node to a voltage corresponding to the resistance state of the second storage element by turning on the first transistor and the fourth transistor in a second period after the first period.

(6) The semiconductor circuit according to (5), further including a power supply control section configured to control power supply to the first circuit and the second circuit, in which the power supply control section supplies the first circuit and the second circuit with power in the first period and the second period, and stops supplying the first circuit and the second circuit with power in a third period between the first period and the second period.

(7) The semiconductor circuit according to (3), in which the gate of the second transistor and the gate of the sixth transistor are coupled to the second node, the gate of the third transistor and the gate of the fifth transistor are coupled to the first node, and the control section is configured to perform, in the first period, a third operation of turning off the first transistor and the fourth transistor, performing control to cause the first voltage supply section to supply the source of the second transistor and the source of the fifth transistor with the first voltage, and performing control to cause the second voltage supply section to set the control voltage to a third voltage different from the first voltage.

(8) The semiconductor circuit according to (7), in which the control section is configured to set the voltage at the first node to a voltage corresponding to the resistance state of the first storage element and configured to set the voltage at the second node to a voltage corresponding to the resistance state of the second storage element by turning on the first transistor and the fourth transistor in a second period after the first period.

(9) The semiconductor circuit according to (8), further including a power supply control section configured to control power supply to the first circuit and the second circuit, in which the power supply control section
supplies the first circuit and the second circuit with power in the first period and the second period, and
stops supplying the first circuit and the second circuit with power in a third period between the first period and the second period.

(10) The semiconductor circuit according to (8) or (9), in which the control section is configured to perform, in a fourth period in which the voltage at the first node and the voltage at the second node have not yet changed, a fourth operation of turning off the first transistor and the fourth transistor, performing control to cause the first voltage supply section to supply the source of the third transistor and the source of the sixth transistor with the second voltage, and performing control to cause the second voltage supply section to set the control voltage to a fourth voltage different from the second voltage, the fourth period coming after the second period.

(11) The semiconductor circuit according to any of (3) to (10), in which the first voltage supply section includes
a seventh transistor including a drain coupled to the source of the second transistor, a source supplied with the first voltage, and a gate,
an eighth transistor including a drain coupled to the source of the third transistor, a source supplied with the second voltage, and a gate,
a ninth transistor including a drain coupled to the source of the fifth transistor, a source supplied with the first voltage, and a gate, and
a tenth transistor including a drain coupled to the source of the sixth transistor, a source supplied with the second voltage, and a gate.

(12) The semiconductor circuit according to any of (3) to (10), in which the first voltage supply section includes
an eleventh transistor including a drain coupled to the source of the second transistor and the source of the fifth transistor, a source supplied with the first voltage, and a gate, and
a twelfth transistor including a drain coupled to the source of the third transistor and the source of the sixth transistor, a source supplied with the second voltage, and a gate.

(13) The semiconductor circuit according to any of (3) to (12), in which the second voltage supply section includes
a thirteenth transistor including a source supplied with a fourth voltage different from the second voltage, a drain coupled to the third terminal of the first storage element and the third terminal of the second storage element, and a gate, and
a fourteenth transistor including a source supplied with a third voltage different from the first voltage, a drain coupled to the third terminal of the first storage element and the third terminal of the second storage element, and a gate.

(14) The semiconductor circuit according to (3), further including:
a third circuit configured to generate an inverted voltage of a voltage at a third node, the third circuit being configured to apply the inverted voltage to a fourth node;
a fourth circuit configured to generate an inverted voltage of a voltage at the fourth node, the fourth circuit being configured to apply the inverted voltage to the third node;
a third storage element including a first terminal, a second terminal, and a third terminal, the third storage element being configured to set a resistance state between the first terminal and the second and the third terminals to the first resistance state or the second resistance state in accordance with a direction of a current flowing between the second terminal and the third terminal;
a fifteenth transistor including a drain coupled to the third node, a source coupled to the first terminal of the third storage element, and a gate, the fifteenth transistor being configured to couple the third node to the first terminal of the third storage element by being turned on;
a sixteenth transistor including a gate coupled to the third node or the fourth node, a drain coupled to the second terminal of the third storage element, and a source, the sixteenth transistor being configured to apply the first voltage to the second terminal of the third storage element by being turned on;
a seventeenth transistor including a gate coupled to the third node or the fourth node, a drain coupled to the second terminal of the third storage element, and a source, the seventeenth transistor being configured to apply the second voltage to the second terminal of the third storage element by being turned on;
a fourth storage element including a first terminal, a second terminal, and a third terminal, the fourth storage element being configured to set a resistance state between the first terminal and the second and the third terminals to the first resistance state or the second resistance state in accordance with a direction of a current flowing between the second terminal and the third terminal;
an eighteenth transistor including a drain coupled to the fourth node, a source coupled to the first terminal of the fourth storage element, and a gate, the eighteenth transistor being configured to couple the fourth node to the first terminal of the fourth storage element by being turned on;
a nineteenth transistor including a gate coupled to a node of the third node and the fourth node that is different from the node to which the gate of the sixteenth transistor is coupled, a drain coupled to the second terminal of the fourth storage element, and a source, the nineteenth transistor being configured to apply the first voltage to the second terminal of the fourth storage element by being turned on; and
a twentieth transistor including a gate coupled to a node of the third node and the fourth node that is different from the node to which the gate of the seventeenth transistor is coupled, a drain coupled to the second terminal of the fourth storage element, and a source, the twentieth transistor being configured to apply the second voltage to the second terminal of the fourth storage element by being turned on.

(15) The semiconductor circuit according to (14), further including:
- a first control line coupled to the source of the second transistor, the source of the fifth transistor, the source of the sixteenth transistor, and the source of the nineteenth transistor; and
- a second control line coupled to the source of the third transistor, the source of the sixth transistor, the source of the seventeenth transistor, and the source of the twentieth transistor, in which
- the first voltage supply section is configured to supply the first control line with the first voltage and configured to supply the second control line with the second voltage.

(16) The semiconductor circuit according to (14) or (15), further including a third control line coupled to the third terminal of the first storage element, the third terminal of the second storage element, the third terminal of the third storage element, and the third terminal of the fourth storage element, in which
- the second voltage supply section is configured to supply the third control line with the control voltage.

(17) The semiconductor circuit according to (1), further including:
- a first voltage supply section configured to supply the source of the second transistor with the first voltage and configured to supply the source of the third transistor with the second voltage;
- a second voltage supply section configured to supply the third terminal of the first storage element with a control voltage; and
- a control section configured to control operations of the first transistor, the first voltage supply section, and the second voltage supply section.

(18) The semiconductor circuit according to (17), in which
- the gate of the second transistor and the gate of the third transistor are coupled to the second node, and
- the control section is configured to
    - perform, in a first sub-period of a first period, a first operation of turning off the first transistor, performing control to cause the first voltage supply section to supply the source of the second transistor with the first voltage, and performing control to cause the second voltage supply section to set the control voltage to a third voltage different from the first voltage, and
    - perform, in a second sub-period of the first period, a second operation of turning off the first transistor, performing control to cause the first voltage supply section to supply the source of the source of the third transistor with the second voltage, and performing control to cause the second voltage supply section to set the control voltage to a fourth voltage different from the second voltage.

(19) The semiconductor circuit according to (18), in which the control section is configured to set the voltage at the first node to a voltage corresponding to the resistance state of the first storage element by turning on the first transistor in a second period after the first period.

(20) The semiconductor circuit according to (19), further including a power supply control section configured to control power supply to the first circuit and the second circuit, in which
- the power supply control section
    - supplies the first circuit and the second circuit with power in the first period and the second period, and
    - stops supplying the first circuit and the second circuit with power in a third period between the first period and the second period.

(21) The semiconductor circuit according to (17), in which
- the gate of the second transistor is coupled to the second node,
- the gate of the third transistor is coupled to the first node, and
- the control section is configured to
    - perform, in the first period, a third operation of turning off the first transistor, performing control to cause the first voltage supply section to supply the source of the second transistor with the first voltage, and performing control to cause the second voltage supply section to set the control voltage to a third voltage different from the first voltage.

(22) The semiconductor circuit according to (21), in which the control section is configured to set the voltage at the first node to a voltage corresponding to the resistance state of the first storage element by turning on the first transistor in a second period after the first period.

(23) The semiconductor circuit according to (22), further including a power supply control section configured to control power supply to the first circuit and the second circuit, in which
- the power supply control section
    - supplies the first circuit and the second circuit with power in the first period and the second period, and
    - stops supplying the first circuit and the second circuit with power in a third period between the first period and the second period.

(24) The semiconductor circuit according to (22) or (23), in which the control section is configured to perform, in a fourth period in which the voltage at the first node and the voltage at the second node have not yet changed, a fourth operation of turning off the first transistor, performing control to cause the first voltage supply section to supply the source of the third transistor with the second voltage, and performing control to cause the second voltage supply section to set the control voltage to a fourth voltage different from the second voltage, the fourth period coming after the second period.

(25) The semiconductor circuit according to any of (17) to (24), further including a twenty-first transistor including a drain coupled to the second node, a source coupled to the third terminal of the first storage element, and a gate.

(26) The semiconductor circuit according to any of (17) to (24), further including a twenty-first transistor including a drain coupled to the second node, a source supplied with a fifth voltage, and a gate.

(27) The semiconductor circuit according to (25) or (26), in which the first transistor and the twenty-first transistor are different in at least one of gate length, gate width, or threshold voltage.

(28) The semiconductor circuit according to any of (25) to (27), in which
- the control section is configured to control an operation of the twenty-first transistor, and
- an on-voltage supplied to the gate of the first transistor for turning on the first transistor is different from an on-voltage supplied to the gate of the twenty-first transistor for turning on the twenty-first transistor.

(29) The semiconductor circuit according to any of (25) to (28), in which
the control section is configured to turn on the first transistor and the twenty-first transistor in a second period, and
in the second period, a current value of a current flowing from the first circuit to the twenty-first transistor through the second node after a power supply is turned on includes a current value between a first current value of a current flowing from the second circuit to the first transistor through the first node in a case where a resistance state of the first storage element includes the first resistance state and a second current value of a current flowing from the second circuit to the first transistor through the first node in a case where the resistance state of the first storage element includes the second resistance state.

(30) The semiconductor circuit according to any of (17) to (24), in which the first circuit and the second circuit are configured to facilitate the voltage at the first node to be a predetermined voltage after a power supply is turned on.

(31) The semiconductor circuit according to (30), in which
the first circuit includes a twenty-second transistor configured to couple a first power supply node and the second node by being turned on, the first power supply node being configured to
supply the predetermined voltage,
the second circuit includes a twenty-third transistor configured to couple the first power supply node and the first node by being turned on, and
the twenty-second transistor and the twenty-third transistor are different in at least one of gate length, gate width, or threshold voltage.

(32) The semiconductor circuit according to (30) or (31), in which
the second circuit includes a twenty-fourth transistor configured to couple a second power supply node and the first node by being turned on, the second power supply node being different from the first power supply node configured to supply the predetermined voltage,
the first circuit includes a twenty-fifth transistor configured to couple the second power supply node and the second node by being turned on, and
the twenty-fourth transistor and the twenty-fifth transistor are different in at least one of gate length, gate width, or threshold voltage.

(33) The semiconductor circuit according to any of (30) to (32), in which
the second circuit includes a twenty-third transistor configured to couple a first power supply node and the first node by being turned on, the first power supply node being configured to supply the predetermined voltage,
the control section is configured to turn on the first transistor in a second period, and
in the second period, a current value of a current flowing from the first power supply node to the first node through the twenty-third transistor after a power supply is turned on includes a current value between a first current value of a current flowing from the first node to the first storage element through the first transistor in a case where a resistance state of the first storage element includes the first resistance state and a second current value of a current flowing from the first node to the first storage element through the first transistor in a case where the resistance state of the first storage element includes the second resistance state.

(34) The semiconductor circuit according to any of (1) to (33), further including a power supply transistor configured to supply the first circuit and the second circuit with power by being turned on.

(35) The semiconductor circuit according to any of (1) to (34), in which the first storage element is configured to store information by using a reversible change in a resistance state, the reversible change corresponding to a direction of a current flowing between the second terminal and the third terminal.

(36) The semiconductor circuit according to any of (1) to (35), in which the first storage element is configured to change a resistance state by using spin orbit interaction.

(37) The semiconductor circuit according to any of (1) to (36), in which the first circuit and the second circuit are included in an SRAM circuit.

(38) The semiconductor circuit according to any of (1) to (36), in which the first circuit and the second circuit are included in a latch circuit.

(39) A semiconductor circuit system including:
a storage section; and
a control section configured to control power supply to the storage section, in which
the storage section includes
a first circuit configured to generate an inverted voltage of a voltage at a first node, the first circuit being configured to apply the inverted voltage to a second node,
a second circuit configured to generate an inverted voltage of a voltage at the second node, the second circuit being configured to apply the inverted voltage to the first node,
a first storage element including a first terminal, a second terminal, and a third terminal, the first storage element being configured to set a resistance state between the first terminal and the second and the third terminals to a first resistance state or a second resistance state in accordance with a direction of a current flowing between the second terminal and the third terminal,
a first transistor including a drain coupled to the first node, a source coupled to the first terminal of the first storage element, and a gate, the first transistor being configured to couple the first node to the first terminal of the first storage element by being turned on,
a second transistor including a gate coupled to the first node or the second node, a drain coupled to the second terminal of the first storage element, and a source, the second transistor being configured to apply a first voltage to the second terminal of the first storage element by being turned on, and
a third transistor including a gate coupled to the first node or the second node, a drain coupled to the second terminal of the first storage element, and a source, the third transistor being configured to apply a second voltage to the second terminal of the first storage element by being turned on, the second voltage being different from the first voltage.

The present application claims the priority on the basis of Japanese Patent Application No. 2019-160528 filed on Sep. 3, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor circuit comprising:
a first circuit configured to generate an inverted voltage of a voltage at a first node, the first circuit being configured to apply the inverted voltage to a second node;
a second circuit configured to generate an inverted voltage of a voltage at the second node, the second circuit being configured to apply the inverted voltage to the first node;
a first storage element including a first terminal, a second terminal, and a third terminal, the first storage element being configured to set a resistance state between the first terminal, the second terminal, and the third terminal to a first resistance state or a second resistance state in accordance with a direction of a current flowing between the second terminal and the third terminal;
a first transistor including a drain coupled to the first node, a source coupled to the first terminal of the first storage element, and a gate, the first transistor being configured to couple the first node to the first terminal of the first storage element by being turned on;
a second transistor including a gate coupled to the first node or the second node, a drain coupled to the second terminal of the first storage element, and a source, the second transistor being configured to apply a first voltage to the second terminal of the first storage element by being turned on; and
a third transistor including a gate coupled to the first node or the second node, a drain coupled to the second terminal of the first storage element, and a source, the third transistor being configured to apply a second voltage to the second terminal of the first storage element by being turned on, the second voltage being different from the first voltage.

2. The semiconductor circuit according to claim 1, further comprising:
a second storage element including a fourth terminal, a fifth terminal, and a sixth terminal, the second storage element being configured to set a resistance state between the fourth terminal, the fifth terminal, and the sixth terminal to the first resistance state or the second resistance state in accordance with a direction of a current flowing between the fifth terminal and the sixth terminal;
a fourth transistor including a drain coupled to the second node, a source coupled to the fourth terminal of the second storage element, and a gate, the fourth transistor being configured to couple the second node to the fourth terminal of the second storage element by being turned on;
a fifth transistor including a gate coupled to a node of the first node and the second node that is different from the node to which the gate of the second transistor is coupled, a drain coupled to the fifth terminal of the second storage element, and a source, the fifth transistor being configured to apply the first voltage to the fifth terminal of the second storage element by being turned on; and
a sixth transistor including a gate coupled to a node of the first node and the second node that is different from the node to which the gate of the third transistor is coupled, a drain coupled to the fifth terminal of the second storage element, and a source, the sixth transistor being configured to apply the second voltage to the fifth terminal of the second storage element by being turned on.

3. The semiconductor circuit according to claim 2, further comprising:
a first voltage supply section configured to supply the source of the second transistor and the source of the fifth transistor with the first voltage and configured to supply the source of the third transistor and the source of the sixth transistor with the second voltage;
a second voltage supply section configured to supply the third terminal of the first storage element and the sixth terminal of the second storage element with a control voltage; and
a control section configured to control operations of the first transistor, the fourth transistor, the first voltage supply section, and the second voltage supply section.

4. The semiconductor circuit according to claim 3, wherein
the gate of the second transistor and the gate of the third transistor are coupled to the second node,
the gate of the fifth transistor and the gate of the sixth transistor are coupled to the first node, and
the control section is configured to
perform, in a first sub-period of a first period, a first operation of turning off the first transistor and the fourth transistor, performing control to cause the first voltage supply section to supply the source of the second transistor and the source of the fifth transistor with the first voltage, and performing control to cause the second voltage supply section to set the control voltage to a third voltage different from the first voltage, and
perform, in a second sub-period of the first period, a second operation of turning off the first transistor and the fourth transistor, performing control to cause the first voltage supply section to supply the source of the third transistor and the source of the sixth transistor with the second voltage, and performing control to cause the second voltage supply section to set the control voltage to a fourth voltage different from the second voltage.

5. The semiconductor circuit according to claim 4, wherein the control section is configured to set the voltage at the first node to a voltage corresponding to the resistance state of the first storage element and configured to set the voltage at the second node to a voltage corresponding to the resistance state of the second storage element by turning on the first transistor and the fourth transistor in a second period after the first period.

6. The semiconductor circuit according to claim 5, further comprising a power supply control section configured to control power supply to the first circuit and the second circuit, wherein
the power supply control section
supplies the first circuit and the second circuit with power in the first period and the second period, and
stops supplying the first circuit and the second circuit with power in a third period between the first period and the second period.

7. The semiconductor circuit according to claim 3, wherein
the gate of the second transistor and the gate of the sixth transistor are coupled to the second node,
the gate of the third transistor and the gate of the fifth transistor are coupled to the first node, and the control section is configured to
perform, in a first period, a third operation of turning off the first transistor and the fourth transistor, performing control to cause the first voltage supply section to supply the source of the second transistor and the source of the fifth transistor with the first voltage, and performing control to cause the second voltage supply section to set the control voltage to a third voltage different from the first voltage.

8. The semiconductor circuit according to claim 7, wherein the control section is configured to set the voltage at the first node to a voltage corresponding to the resistance state of the first storage element and configured to set the voltage at the second node to a voltage corresponding to the resistance state of the second storage element by turning on the first transistor and the fourth transistor in a second period after the first period.

9. The semiconductor circuit according to claim 8, further comprising a power supply control section configured to control power supply to the first circuit and the second circuit, wherein
the power supply control section
supplies the first circuit and the second circuit with power in the first period and the second period, and
stops supplying the first circuit and the second circuit with power in a third period between the first period and the second period.

10. The semiconductor circuit according to claim 8, wherein the control section is configured to perform, in a fourth period in which the voltage at the first node and the voltage at the second node have not yet changed, a fourth operation of turning off the first transistor and the fourth transistor, performing control to cause the first voltage supply section to supply the source of the third transistor and the source of the sixth transistor with the second voltage, and performing control to cause the second voltage supply section to set the control voltage to a fourth voltage different from the second voltage, the fourth period coming after the second period.

11. The semiconductor circuit according to claim 3, wherein the first voltage supply section includes
a seventh transistor including a drain coupled to the source of the second transistor, a source supplied with the first voltage, and a gate,
an eighth transistor including a drain coupled to the source of the third transistor, a source supplied with the second voltage, and a gate,
a ninth transistor including a drain coupled to the source of the fifth transistor, a source supplied with the first voltage, and a gate, and
a tenth transistor including a drain coupled to the source of the sixth transistor, a source supplied with the second voltage, and a gate.

12. The semiconductor circuit according to claim 3, wherein the first voltage supply section includes
an eleventh transistor including a drain coupled to the source of the second transistor and the source of the fifth transistor, a source supplied with the first voltage, and a gate, and
a twelfth transistor including a drain coupled to the source of the third transistor and the source of the sixth transistor, a source supplied with the second voltage, and a gate.

13. The semiconductor circuit according to claim 3, wherein the second voltage supply section includes:
a thirteenth transistor including a source supplied with a fourth voltage different from the second voltage, a drain coupled to the third terminal of the first storage element and the sixth terminal of the second storage element, and a gate, and
a fourteenth transistor including a source supplied with a third voltage different from the first voltage, a drain coupled to the third terminal of the first storage element and the sixth terminal of the second storage element, and a gate.

14. The semiconductor circuit according to claim 3, further comprising:
a third circuit configured to generate an inverted voltage of a voltage at a third node, the third circuit being configured to apply the inverted voltage to a fourth node;
a fourth circuit configured to generate an inverted voltage of a voltage at the fourth node, the fourth circuit being configured to apply the inverted voltage to the third node;
a third storage element including a seventh terminal, an eighth terminal, and a ninth terminal, the third storage element being configured to set a resistance state between the seventh terminal, the eighth terminal, and the ninth terminal to the first resistance state or the second resistance state in accordance with a direction of a current flowing between the eighth terminal and the ninth terminal;
a fifteenth transistor including a drain coupled to the third node, a source coupled to the seventh terminal of the third storage element, and a gate, the fifteenth transistor being configured to couple the third node to the seventh terminal of the third storage element by being turned on;
a sixteenth transistor including a gate coupled to the third node or the fourth node, a drain coupled to the eighth terminal of the third storage element, and a source, the sixteenth transistor being configured to apply the first voltage to the eighth terminal of the third storage element by being turned on;
a seventeenth transistor including a gate coupled to the third node or the fourth node, a drain coupled to the eighth terminal of the third storage element, and a source, the seventeenth transistor being configured to apply the second voltage to the eighth terminal of the third storage element by being turned on;
a fourth storage element including a tenth terminal, a eleventh terminal, and a twelfth terminal, the fourth storage element being configured to set a resistance state between the tenth terminal, the eleventh terminal, and the twelfth terminal to the first resistance state or the second resistance state in accordance with a direction of a current flowing between the eleventh terminal and the twelfth terminal;
an eighteenth transistor including a drain coupled to the fourth node, a source coupled to the tenth terminal of the fourth storage element, and a gate, the eighteenth transistor being configured to couple the fourth node to the tenth terminal of the fourth storage element by being turned on;
a nineteenth transistor including a gate coupled to a node of the third node and the fourth node that is different from the node to which the gate of the sixteenth transistor is coupled, a drain coupled to the eleventh terminal of the fourth storage element, and a source, the nineteenth transistor being configured to apply the first voltage to the eleventh terminal of the fourth storage element by being turned on; and a twentieth transistor including a gate coupled to a node of the third node and the fourth node that is different from the node to which the gate of the seventeenth transistor is coupled, a drain coupled to the eleventh terminal of the fourth storage element, and a source, the twentieth transistor being configured to apply the second voltage to the eleventh terminal of the fourth storage element by being turned on.

15. The semiconductor circuit according to claim 14, further comprising:
  a first control line coupled to the source of the second transistor, the source of the fifth transistor, the source of the sixteenth transistor, and the source of the nineteenth transistor; and
  a second control line coupled to the source of the third transistor, the source of the sixth transistor, the source of the seventeenth transistor, and the source of the twentieth transistor, wherein
  the first voltage supply section is configured to supply the first control line with the first voltage and configured to supply the second control line with the second voltage.

16. The semiconductor circuit according to claim 14, further comprising a third control line coupled to the third terminal of the first storage element, the sixth terminal of the second storage element, the ninth terminal of the third storage element, and the twelfth terminal of the fourth storage element, wherein
  the second voltage supply section is configured to supply the third control line with the control voltage.

17. The semiconductor circuit according to claim 1, further comprising:
  a first voltage supply section configured to supply the source of the second transistor with the first voltage and configured to supply the source of the third transistor with the second voltage;
  a second voltage supply section configured to supply the third terminal of the first storage element with a control voltage; and
  a control section configured to control operations of the first transistor, the first voltage supply section, and the second voltage supply section.

18. The semiconductor circuit according to claim 17, wherein
  the gate of the second transistor and the gate of the third transistor are coupled to the second node, and
  the control section is configured to
    perform, in a first sub-period of a first period, a first operation of turning off the first transistor, performing control to cause the first voltage supply section to supply the source of the second transistor with the first voltage, and performing control to cause the second voltage supply section to set the control voltage to a third voltage different from the first voltage, and
    perform, in a second sub-period of the first period, a second operation of turning off the first transistor, performing control to cause the first voltage supply section to supply the source of the source of the third transistor with the second voltage, and performing control to cause the second voltage supply section to set the control voltage to a fourth voltage different from the second voltage.

19. The semiconductor circuit according to claim 18, wherein the control section is configured to set the voltage at the first node to a voltage corresponding to the resistance state of the first storage element by turning on the first transistor in a second period after the first period.

20. The semiconductor circuit according to claim 19, further comprising a power supply control section configured to control power supply to the first circuit and the second circuit, wherein
  the power supply control section
    supplies the first circuit and the second circuit with power in the first period and the second period, and
    stops supplying the first circuit and the second circuit with power in a third period between the first period and the second period.

21. The semiconductor circuit according to claim 17, wherein
  the gate of the second transistor is coupled to the second node,
  the gate of the third transistor is coupled to the first node, and
  the control section is configured to
    perform, in a first period, a third operation of turning off the first transistor, performing control to cause the first voltage supply section to supply the source of the second transistor with the first voltage, and performing control to cause the second voltage supply section to set the control voltage to a third voltage different from the first voltage.

22. The semiconductor circuit according to claim 21, wherein the control section is configured to set the voltage at the first node to a voltage corresponding to the resistance state of the first storage element by turning on the first transistor in a second period after the first period.

23. The semiconductor circuit according to claim 22, further comprising a power supply control section configured to control power supply to the first circuit and the second circuit, wherein
  the power supply control section
    supplies the first circuit and the second circuit with power in the first period and the second period, and
    stops supplying the first circuit and the second circuit with power in a third period between the first period and the second period.

24. The semiconductor circuit according to claim 22, wherein the control section is configured to perform, in a fourth period in which the voltage at the first node and the voltage at the second node have not yet changed, a fourth operation of turning off the first transistor, performing control to cause the first voltage supply section to supply the source of the third transistor with the second voltage, and performing control to cause the second voltage supply section to set the control voltage to a fourth voltage different from the second voltage, the fourth period coming after the second period.

25. The semiconductor circuit according to claim 17, further comprising a twenty-first transistor including a drain coupled to the second node, a source coupled to the third terminal of the first storage element, and a gate.

26. The semiconductor circuit according to claim 17, further comprising a twenty-first transistor including a drain coupled to the second node, a source supplied with a fifth voltage, and a gate.

27. The semiconductor circuit according to claim 25, wherein the first transistor and the twenty-first transistor are different in at least one of gate length, gate width, or threshold voltage.

28. The semiconductor circuit according to claim 25, wherein
  the control section is configured to control an operation of the twenty-first transistor, and an on-voltage supplied to the gate of the first transistor for turning on the first transistor is different from an on-voltage supplied to the gate of the twenty-first transistor for turning on the twenty-first transistor.

29. The semiconductor circuit according to claim 25, wherein
the control section is configured to turn on the first transistor and the twenty-first transistor in a second period, and
in the second period, a current value of a current flowing from the first circuit to the twenty-first transistor through the second node after a power supply is turned on includes a current value between a first current value of a current flowing from the second circuit to the first transistor through the first node in a case where a resistance state of the first storage element includes the first resistance state and a second current value of a current flowing from the second circuit to the first transistor through the first node in a case where the resistance state of the first storage element includes the second resistance state.

30. The semiconductor circuit according to claim 17, wherein the first circuit and the second circuit are configured to facilitate the voltage at the first node to be a predetermined voltage after a power supply is turned on.

31. The semiconductor circuit according to claim 30, wherein
the first circuit includes a twenty-second transistor configured to couple a first power supply node and the second node by being turned on, the first power supply node being configured to supply the predetermined voltage,
the second circuit includes a twenty-third transistor configured to couple the first power supply node and the first node by being turned on, and
the twenty-second transistor and the twenty-third transistor are different in at least one of gate length, gate width, or threshold voltage.

32. The semiconductor circuit according to claim 30, wherein
the second circuit includes a twenty-fourth transistor configured to couple a second power supply node and the first node by being turned on, the second power supply node being different from the first power supply node configured to supply the predetermined voltage,
the first circuit includes a twenty-fifth transistor configured to couple the second power supply node and the second node by being turned on, and
the twenty-fourth transistor and the twenty-fifth transistor are different in at least one of gate length, gate width, or threshold voltage.

33. The semiconductor circuit according to claim 30, wherein
the second circuit includes a twenty-third transistor configured to couple a first power supply node and the first node by being turned on, the first power supply node being configured to supply the predetermined voltage,
the control section is configured to turn on the first transistor in a second period, and
in the second period, a current value of a current flowing from the first power supply node to the first node through the twenty-third transistor after a power supply is turned on includes a current value between a first current value of a current flowing from the first node to the first storage element through the first transistor in a case where a resistance state of the first storage element includes the first resistance state and a second current value of a current flowing from the first node to the first storage element through the first transistor in a case where the resistance state of the first storage element includes the second resistance state.

34. The semiconductor circuit according to claim 1, further comprising a power supply transistor configured to supply the first circuit and the second circuit with power by being turned on.

35. The semiconductor circuit according to claim 1, wherein the first storage element is configured to store information by using a reversible change in a resistance state, the reversible change corresponding to a direction of a current flowing between the second terminal and the third terminal.

36. The semiconductor circuit according to claim 1, wherein the first storage element is configured to change a resistance state by using spin orbit interaction.

37. The semiconductor circuit according to claim 1, wherein the first circuit and the second circuit are included in an SRAM circuit.

38. The semiconductor circuit according to claim 1, wherein the first circuit and the second circuit are included in a latch circuit.

39. A semiconductor circuit system comprising:
a storage section; and
a control section configured to control power supply to the storage section, wherein
the storage section includes:
a first circuit configured to generate an inverted voltage of a voltage at a first node, the first circuit being configured to apply the inverted voltage to a second node,
a second circuit configured to generate an inverted voltage of a voltage at the second node, the second circuit being configured to apply the inverted voltage to the first node,
a first storage element including a first terminal, a second terminal, and a third terminal, the first storage element being configured to set a resistance state between the first terminal, the second terminal, and the third terminal to a first resistance state or a second resistance state in accordance with a direction of a current flowing between the second terminal and the third terminal,
a first transistor including a drain coupled to the first node, a source coupled to the first terminal of the first storage element, and a gate, the first transistor being configured to couple the first node to the first terminal of the first storage element by being turned on,
a second transistor including a gate coupled to the first node or the second node, a drain coupled to the second terminal of the first storage element, and a source, the second transistor being configured to apply a first voltage to the second terminal of the first storage element by being turned on, and
a third transistor including a gate coupled to the first node or the second node, a drain coupled to the second terminal of the first storage element, and a source, the third transistor being configured to apply a second voltage to the second terminal of the first storage element by being turned on, the second voltage being different from the first voltage.

* * * * *